United States Patent
Nishide et al.

(10) Patent No.: US 10,600,983 B2
(45) Date of Patent: Mar. 24, 2020

(54) ORGANIC ELECTROLUMINESCENT DEVICE COMPRISING DELAYED FLUORESCENT MATERIALS

(71) Applicant: KYUSHU UNIVERSITY NATIONAL UNIVERSITY CORPORATION, Fukuoka-shi, Fukuoka (JP)

(72) Inventors: Junichi Nishide, Fukuoka (JP); Kensuke Masui, Kanagawa (JP); Hajime Nakanotani, Fukuoka (JP); Chihaya Adachi, Fukuoka (JP)

(73) Assignee: KYULUX, INC., Fukuoka (JP)

( * ) Notice: Subject to any disclaimer, the term of this patent is extended or adjusted under 35 U.S.C. 154(b) by 32 days.

(21) Appl. No.: 14/781,083

(22) PCT Filed: Mar. 28, 2014

(86) PCT No.: PCT/JP2014/059121
§ 371 (c)(1),
(2) Date: Sep. 29, 2015

(87) PCT Pub. No.: WO2014/157619
PCT Pub. Date: Oct. 2, 2014

(65) Prior Publication Data
US 2016/0329512 A1    Nov. 10, 2016

(30) Foreign Application Priority Data
Mar. 29, 2013  (JP) ................. 2013-074419

(51) Int. Cl.
H01L 51/50    (2006.01)
H01L 51/00    (2006.01)

(52) U.S. Cl.
CPC ........ *H01L 51/504* (2013.01); *H01L 51/5028* (2013.01); *H01L 51/5036* (2013.01);
(Continued)

(58) Field of Classification Search
CPC .................................................. H01L 51/5024
See application file for complete search history.

(56) References Cited

U.S. PATENT DOCUMENTS

| 9,153,788 B2 | 10/2015 | Adachi et al. |
| 2010/0090238 A1 | 4/2010 | Mori et al. |

(Continued)

FOREIGN PATENT DOCUMENTS

| CN | 101728417 A | 6/2010 |
| CN | 101728490 A | 6/2010 |

(Continued)

OTHER PUBLICATIONS

Uoyama, H. et al. "Highly Efficient Organic Light-Emitting Diodes from Delayed Fluorescence" Nature, vol. 492, pp. 234-240. Dec. 13, 2012. (Year: 2012).*

(Continued)

*Primary Examiner* — Mohsen Ahmadi
*Assistant Examiner* — Christopher M Roland
(74) *Attorney, Agent, or Firm* — Browdy and Neimark, PLLC

(57) ABSTRACT

An organic electroluminescent device containing a cathode, an anode, and one or more organic layers containing plural light emitting materials between the cathode and the anode, wherein the organic electroluminescent device is a multiple wavelength light emitting organic electroluminescent device emitting light from the plural light emitting materials, and which is designed so that light that has the shortest wavelength contains delayed fluorescent light can improve light emission efficiency of a short wavelength light and color tone and has a large degree of freedom in design and a simple structure.

17 Claims, 11 Drawing Sheets

(52) U.S. Cl.
CPC .......... *H01L 51/005* (2013.01); *H01L 51/006* (2013.01); *H01L 51/0058* (2013.01); *H01L 51/0067* (2013.01); *H01L 51/0071* (2013.01); *H01L 51/0072* (2013.01); *H01L 51/0074* (2013.01); *H01L 51/5024* (2013.01); *H01L 51/5056* (2013.01); *H01L 51/5072* (2013.01); *H01L 51/5088* (2013.01); *H01L 51/5092* (2013.01); *H01L 51/5096* (2013.01)

(56) References Cited

U.S. PATENT DOCUMENTS

| | | | |
|---|---|---|---|
| 2010/0090592 A1* | 4/2010 | Shiobara | H01L 27/3211 313/504 |
| 2012/0097998 A1 | 4/2012 | Pieh et al. | |
| 2012/0121933 A1* | 5/2012 | Ma | H01L 51/5036 428/704 |
| 2012/0248968 A1 | 10/2012 | Ogiwara et al. | |
| 2014/0138669 A1 | 5/2014 | Nakagawa et al. | |
| 2014/0138670 A1 | 5/2014 | Nakagawa et al. | |
| 2014/0336379 A1 | 11/2014 | Adachi et al. | |
| 2015/0048338 A1 | 2/2015 | Adachi et al. | |
| 2015/0141642 A1 | 5/2015 | Adachi et al. | |
| 2015/0249218 A1* | 9/2015 | Yokoyama | C07D 401/04 257/40 |
| 2015/0280158 A1* | 10/2015 | Ogiwara | H01L 51/5016 257/40 |

FOREIGN PATENT DOCUMENTS

| | | |
|---|---|---|
| CN | 102456847 A | 5/2012 |
| EP | 2175503 A2 | 10/2009 |
| JP | 2002-008867 A | 1/2002 |
| JP | 2010-114070 A | 5/2010 |
| JP | 2010-114429 A | 5/2010 |
| JP | 2012013757 A | 1/2012 |
| JP | 2012-089513 A | 5/2012 |
| JP | 2013-116975 A | 6/2013 |
| JP | 5208270 B2 | 6/2013 |
| JP | 2013-256490 A | 12/2013 |
| JP | 2014-009224 A | 1/2014 |
| JP | 2014-009352 A | 1/2014 |
| JP | 2014045179 A | 3/2014 |
| JP | 2014-075249 A | 4/2014 |
| JP | 5925308 B2 | 5/2016 |
| KR | 100841363 A | 5/2008 |
| KR | 1020200133352 A | 12/2010 |
| TW | 200637898 A | 11/2006 |
| TW | 201230430 A | 7/2012 |
| TW | 201248965 A | 12/2012 |
| WO | WO 2012/064987 A1 | 5/2012 |
| WO | WO 2012/133188 A1 | 10/2012 |
| WO | WO 2013/011954 A1 | 1/2013 |
| WO | WO 2013/011955 A1 | 1/2013 |
| WO | WO 2013/081088 A1 | 6/2013 |
| WO | WO 2013/133359 A1 | 9/2013 |
| WO | 2013/161437 A1 | 10/2013 |
| WO | WO 2013/161437 A1 | 10/2013 |

OTHER PUBLICATIONS

Zhu, M. et al. "Blue Fluorescent Emitters: Design Tactics and Applications in Organic Light-Emitting Diodes" Chem. Soc. Rev., 42, pp. 4963-4976. Feb. 25, 2013. (Year: 2013).*
Official Action issued in in corresponding Chinese Patent Application No. 201480019195.2, dated Oct. 10, 2016 and partial English translation thereof.
International Preliminary Report on Patentability of Chapter II dated Oct. 1, 2015, in corresponding Japanese Patent Application No_ PCT/JP2014/059121, and English translation thereof.
International Search Report dated Jun. 3, 2014, in corresponding Japanese Patent Application No. PCT/JP2014/059121.
Supplementary European Search Report dated Sep. 26, 2016, in corresponding European Patent Application No. 14773887.6.
Official Action issued in in corresponding Japanese Patent Application No. 2015-508759, dated Mar. 6, 2018, and machine English translation thereof.
Heo et al., Novel light emitting diode using organic electroluminescence microcapsules, Macromol. Chem. Phys., 204(16):2002-2006 (2003), DOI: 10.1002/macp.200350055.
Vestweber et al., Highly efficient and stabel organic light-emitting diodes, Synthetic Metals, 91:181-185 (1997), DOI: 10.1016/S0379-6779(97)04014-9.
Joyama et al, Nature 492:234-238 (2012), DOI: 10.1038/nature11687.
Nishide et al, High-efficiency white organic light-emitting diodes using thermally activated delayed fluorescence, Appl. Phys. Lett. 104:233304 (2014), DOI: 10.1063/1.4882456.
Office Action dated Oct. 2, 2018, in corresponding Japanese Patent Application No. 2015-508759, with English Machine Translation.
Office Action dated Oct. 4, 2018, in corresponding Taiwanese Patent Application No. 103111858, with English Machine Translation.
Official Action issued in corresponding Taiwanese Patent Application No. 103111858, dated Apr. 18, 2018, and English translation thereof.
Zhang et al., Design of efficient thermally activated delayed flluorescence materials for pure blue organic light emitting diodes, JACS, 134:14706-14709 (2012).
Office Action dated Oct. 31, 2019 issued in the corresponding Korean patent application No. 10-2015-7030984.

* cited by examiner (1-1)  (1-2)  (1-3)  (1-4)  (1-5)

ORGANIC ELECTROLUMINESCENT DEVICE COMPRISING DELAYED FLUORESCENT MATERIALS

TECHNICAL FIELD

The present invention relates to a multiple wavelength light emitting organic electroluminescent device.

BACKGROUND ART

Studies have been actively performed on an organic electroluminescent device having a structure containing a cathode, an anode, and a light emitting layer containing a light emitting material that is formed between the anode and the cathode. Most of the studies are to develop a monochrome light emitting organic electroluminescent device by adding one light emitting material having a particular light emission wavelength to the light emitting layer, and some of them are to develop a multiple wavelength light emitting organic electroluminescent device by using plural light emitting materials that have different light emission wavelengths. For example, such one has been studied that a light emitting layer containing a blue light emitting material, a light emitting layer containing a green light emitting material and a light emitting layer containing a red light emitting material are formed, and white light emission is to be achieved by mixing light emission from the light emitting materials.

Patent Document 1 describes an organic electroluminescent device having a light emitting layer containing a blue or blue-green fluorescent light emitting material and a light emitting layer containing a phosphorescent light emitting material other than blue, in which the lowest excitation triplet energy level of the fluorescent light emitting material is larger than the lowest excitation triplet energy level of the phosphorescent light emitting material. In the examples thereof, such an organic electroluminescent device is described that contains an anode, a hole transporting layer, a hole-side intermediate layer, an orange-red light emitting layer, a blue light emitting layer, a green light emitting layer, an electron-side intermediate layer, an electron transporting layer, and a cathode, which are formed in this order. The blue light emitting layer is formed of α-NPD, the orange-red light emitting layer is doped with iridium(III) bis(2-methyl-dibenzo[f,h]quinoxaline (acetylacetonate) as a light emitting material, and the green light emitting layer is doped with fac-tris(2-phenylpyridine) iridium ((Ir(ppy)$_3$)). However, Patent Document 1 does not describe the use of a delayed fluorescent material.

Patent Document 2 describes an organic electroluminescent device having a light emitting layer containing a green light emitting layer containing a green delayed fluorescent material formed in contact with a hole transporting layer, a red phosphorescent light emitting layer containing a red light emitting material formed in contact with the green light emitting layer, and a blue light emitting layer containing a blue light emitting material formed in contact with the red light emitting layer. The organic electroluminescent device is designed in such a manner that the HOMO of the green delayed fluorescent material is deeper than the HOMO of the material of the hole transporting layer and is shallower than the HOMO of the red phosphorescent light emitting material. Patent Document 2 described that according to the design, the barrier between the HOMOs of the hole transporting layer and the green light emitting layer is reduced, and thus red phosphorescent light may be emitted with a high efficiency.

CITATION LIST

Patent Documents

Patent Document 1: JP-A-2012-89513
Patent Document 2: JP-A-2010-114070

SUMMARY OF INVENTION

Technical Problem

As described above, some studies have been made to develop a multiple wavelength light emitting organic electroluminescent device by using plural light emitting materials having different light emission wavelengths. However, the organic electroluminescent device described in Patent Document 1 fails to make the internal quantum efficiency of blue fluorescent light from the blue fluorescent material exceeding 25%, and thus has a problem of an insufficient blue light intensity. This is the principled limitation, and thus the problem cannot be solved as long as the constitution of Patent Document 1 is employed. On the other hand, the organic electroluminescent device described in Patent Document 2 may enhance the light emission efficiency of red phosphorescent light, but there is no suggestion relating to the effective enhancement of the light emission efficiency of light having a short wavelength, such as blue light. Furthermore, there are many structural limitations, for example, the green light emitting layer is necessarily formed on the most anode-side.

Under the current technical situation, the present inventors have made investigations for providing a multiple wavelength light emitting organic electroluminescent device that is improved in color tone through the enhancement of the light emission efficiency of light having a relatively short wavelength, such as blue light, and has a large degree of freedom in design to achieve a simple structure.

Solution to Problem

As a result of earnest investigations performed, the inventors have found that the intended multiple wavelength light emitting organic electroluminescent device may be provided by utilizing delayed fluorescent light to satisfy the particular condition. The organic electroluminescent device developed by the inventors is based on the unprecedented technological concept and has high practical usefulness due to the large degree of freedom thereof. Based on the knowledge, the inventors thus provide the invention described below as a measure for solving the problem.

(1) An organic electroluminescent device containing a cathode, an anode, and one or more organic layers containing plural light emitting materials between the cathode and the anode, wherein the organic electroluminescent device is a multiple wavelength light emitting organic electroluminescent device emitting light from the plural light emitting materials, and in the light thus emitted from the light emitting materials, light that has the shortest wavelength contains delayed fluorescent light.

(2) The organic electroluminescent device according to the item (1), wherein the light emitting material that emits light having the shortest wavelength also functions as a host material of another light emitting material, or forms one of the organic layers alone.

(3) The organic electroluminescent device according to the item (1) or (2), wherein the light emitting material that emits light having the shortest wavelength has an energy difference ($\Delta E_{ST}$) between the lowest excitation triplet energy level and the lowest excitation singlet energy level at 5 K of 0.3 eV or less.

(4) The organic electroluminescent device according to any one of the items (1) to (3), wherein the light emitting material that emits light, having the shortest wavelength is a blue light emitting material.

(5) The organic electroluminescent device according to any one of the items (1) to (4), wherein the light emitting material that emits light having the shortest wavelength has a light emission intensity of more than 20% based on the total light emission.

(6) The organic electroluminescent device according to any one of the items (1) to (5), wherein one of the organic layers contains the light emitting material that emits light having the shortest wavelength and at least one kind of a light emitting material that emits light having a different wavelength, and the light emitting material that emits light having the shortest wavelength also functions as a host material.

(7) The organic electroluminescent device according to any one of the items (1) to (5), wherein one of the organic layers contains the light emitting material that emits light having the shortest wavelength and at least two kinds of light emitting materials that each emit light having a different wavelength, and the light emitting material that emits light having the shortest wavelength also functions as a host material.

(8) The organic electroluminescent device according to any one of the items (1) to (7), wherein the light emitting material that emits light having the shortest wavelength forms at least one layer of the organic layers alone.

(9) The organic electroluminescent device according to any one of the items (1) to (8), wherein the organic electroluminescent device contains two or more layers each containing a light emitting material, and among the layers, a layer that is the closest to the cathode and a layer that is the closest to the anode each contain the light emitting material that emits light having the shortest wavelength.

(10) The organic electroluminescent device according to the claim (9), wherein the organic electroluminescent device, contains a layer that contains the light emitting material that emits light having the shortest wavelength as a host material between the layer that is the closest to the cathode and the layer that is the closest to the anode.

(11) The organic electroluminescent device according to any one of the items (1) to (10), wherein the organic electroluminescent device contains a layer containing a blue light emitting material doped with a green light emitting material or a red light emitting material.

(12) The organic electroluminescent device according to any one of the items (1) to (10), wherein the organic electroluminescent device contains a laminate of a layer containing a blue light emitting material, a layer containing a blue light emitting material doped with a green light emitting material or a red light emitting material, and a layer containing a blue light emitting material.

(13) The organic electroluminescent device according to any one of the items (1) to (12), wherein the plural light emitting materials contain a blue light emitting material, a green light emitting material, and a red light emitting material.

(14) The organic electroluminescent device according to any one of the items (1) to (13), wherein the organic electroluminescent device contains a layer containing a blue tight emitting material doped with a green light emitting material and a red light emitting material.

(15) The organic electroluminescent device according to any one of the items (1) to (14), wherein the organic electroluminescent device contains a laminate of a layer containing a green light emitting material, a layer containing a green light emitting material doped with a red light emitting material, and a layer containing a blue light emitting material.

(16) The organic electroluminescent device according to any one of the items (1) to (15), wherein all the plural light emitting materials emit delayed fluorescent light.

(17) The organic electroluminescent device according to any one of the items (1) to (15), wherein at least one of the plural light emitting materials emits phosphorescent light.

(18) The organic electroluminescent device according to any one of the items (1) to (17), wherein the organic electroluminescent device emits white light through color mixing of light emitted from the plural light emitting materials.

Advantageous Effects of Invention

In the multiple wavelength light emitting organic electroluminescent device of the invention, the light emitting material that emits light having the shortest wavelength also emits delayed fluorescent light. Accordingly, the color tone may be improved even though the light emission efficiency of the light having a short wavelength, such as blue light, is enhanced. According to the organic electroluminescent device, of the invention, the intended multiple wavelength light emitting organic electroluminescent device may be produced due to the large degree of freedom in design and the simple structure thereof.

BRIEF DESCRIPTION OF DRAWINGS

FIG. 5 is a schematic cross sectional illustration showing examples of the structure of the light emitting layer of the organic electroluminescent device of the invention.

FIG. 6 is a schematic cross sectional illustration showing examples of the structure of the light emitting layer of the organic electroluminescent device of the invention.

DESCRIPTION OF EMBODIMENTS

Figure 1:
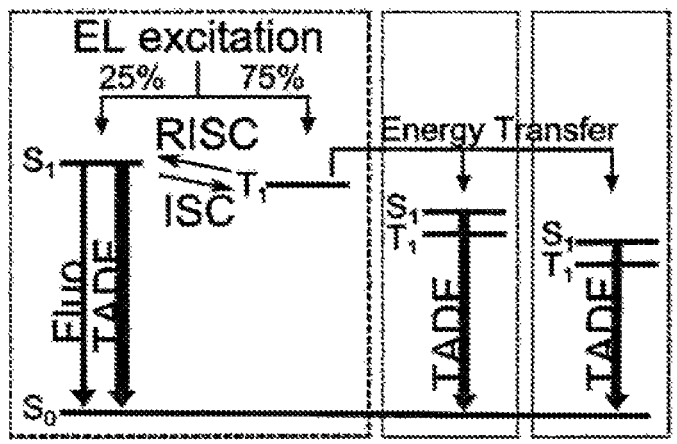
FIG. 1 is a schematic illustration showing the mechanism of light emission in the invention.

The contents of the invention will be described in detail below. The constitutional elements may be described below with reference to representative embodiments and specific examples of the invention, but the invention is not limited to the embodiments and the examples. In the description, a numerical range expressed with reference to the expressions, an upper limit or less and/or a lower limit or more, means a range that includes the upper limit and/or the lower limit.
Basic Structure of Organic Electroluminescent Device The multiple wavelength light emitting organic electroluminescent device of the invention contains at least a cathode, an anode, and one or more organic layers intervening therebetween. The one or more organic layers formed may contain at least one layer, and the one or more organic layers contain plural light emitting materials. The plural light emitting materials may be contained in different organic layers or may be contained in the same organic layer. For example, in the case where three kinds of light emitting materials, i.e., a blue light emitting material, a green light emitting material and a red light emitting material, are used, the three light emitting materials may be contained in one light, emitting layer, or may be contained in each of three organic layers, respectively. Furthermore, a particular light emitting material may be contained in plural organic layers. In the organic electroluminescent device of the invention, the plural light emitting materials each emit light, and thus the device functions as a multiple wavelength light emitting device.

In the description of the invention, a light emitting material that has a maximum light emission wavelength in a range of 400 nm or more and 490 nm or less is referred to as a blue light emitting material, a light emitting material that has a maximum light emission wavelength in a range of more than 490 nm and 580 nm or less is referred to as a green light emitting material, and a light emitting material that has a maximum light emission wavelength in a range of more than 580 nm and 700 nm or less is referred to as a red light emitting material.
Delayed Fluorescent Light In the organic electroluminescent device of the invention, the light that has the shortest wavelength in the light emitted from the light emitting materials contained in the device contains delayed fluorescent light. The delayed fluorescent light may be emitted by selecting a light emitting material that emits delayed fluorescent light (i.e., a delayed fluorescent material) as a light emitting material, and using the material in the organic electroluminescent device. The use of the delayed fluorescent material may enhance the light emission efficiency at the fluorescent wavelength of the delayed fluorescent material. The principle of the features may be described as follows.

In an organic electroluminescent device, carriers are injected from an anode and a cathode, to a light emitting material to form an excited state for the light emitting material, with which light is emitted. In the case of a carrier injection type organic electroluminescent device, in general, excitons that are excited to the excited singlet state are 25% of the total excitons generated, and the remaining 75% thereof are excited to the excited triplet state. Accordingly, the use of phosphorescence, which is light emission from the excited triplet state, provides a high energy use efficiency. However, the excited triplet state has a long lifetime and thus causes saturation of the excited state and deactivation of energy through mutual action with the excitons in the excited triplet state, and therefore the quantum yield of phosphorescence may generally be often not high. A delayed fluorescent material emits fluorescent light through the mechanism that the energy of excitons transits to the excited triplet state through intersystem crossing or the like, and then transits to the excited singlet state through reverse intersystem crossing due to triplet-triplet annihilation or absorption of thermal energy, thereby emitting fluorescent light. It is considered that among the materials, a thermal activation type delayed fluorescent material emitting light through absorption of thermal energy is particularly useful for an organic electroluminescent device. In the case where a delayed fluorescent material is used in an organic electroluminescent device, the excitons in the excited singlet state normally emit fluorescent light. On the other hand, the excitons in the excited triplet state emit fluorescent light through intersystem crossing to the excited singlet state by absorbing the heat generated by the device. At this time, the light emitted through reverse intersystem crossing from the excited triplet state to the excited single state has the same wavelength as fluorescent light since it is light emission from the excited single state, but has a longer lifetime (light emission lifetime) than the normal fluorescent light and phosphorescent light, and thus the light is observed as fluorescent light that is delayed from the normal fluorescent light and phosphorescent light. The light may be defined as delayed fluorescent light. The use of the thermal activation type exciton transition mechanism may raise the proportion of the compound in the excited single state, which is generally formed in a proportion only of 25%, to 25% or more through the absorption of the thermal energy after the carrier injection. A compound that emits strong fluorescent light and delayed fluorescent light at a low temperature of lower than 100° C. undergoes the intersystem crossing from the excited triplet state to the excited singlet state sufficiently with the heat of the device, thereby emitting delayed fluorescent light, and thus the use of the compound may drastically enhance the light emission efficiency. The delayed fluorescent material preferably has an energy difference ($\Delta E_{ST}$) between the lowest excitation triplet energy level and the lowest excitation singlet energy level at 77° K of 0.2 eV or less, and more preferably 0.1 eV or less.

In the organic electroluminescent device of the invention, such a light emitting material that emits delayed fluorescent light is selected as the light emitting material that emits light having the shortest wavelength. According to the procedure, not only the light emission efficiency at the light emission wavelength thereof is drastically enhanced, but also an advantage is obtained that the excitons in the excited triplet state are transferred to the excited triplet state of another (second) light emitting material emitting light having a longer wavelength, so as to enhance the light emission efficiency of the second light emitting material as shown in FIG. 1. The second light emitting material may be one emitting phosphorescent light and may be one emitting fluorescent light, and in the case where the second light emitting material is a delayed fluorescent material, the second light emitting material may emit delayed fluorescent light. In the case where a delayed fluorescent material is selected as the second light emitting material, the light emission efficiency of the second light emitting materials may be drastically enhanced through the same mechanism as described above. As the second light emitting material referred herein, not only one kind thereof but also two or more kinds thereof may be used.

FIG. 1 is an illustration showing, as one example, an embodiment using three light emitting materials, i.e., a blue light emitting material, a green light emitting material and a red light emitting material. In the embodiment described herein, all the three light emitting materials are delayed fluorescent materials, but in the invention, it is sufficient that only the blue light emitting material, which is the light emitting material emitting light having a shortest wavelength, is a delayed fluorescent material. In other words, the green light emitting material and the red light emitting material may be an ordinary phosphorescent light emitting material, and one of them may be a delayed fluorescent material, whereas the other may be a phosphorescent light emitting material. In the embodiment shown in FIG. 1, a delayed fluorescent material is used as the blue light emitting material, and thus blue delayed fluorescent light (TADF) is emitted, along with ordinary blue fluorescent light (Fluo), thereby the blue light emission efficiency is drastically enhanced. Furthermore, the excitons in the excited triplet state of the blue light emitting material are transferred to the excited triplet state of the green light emitting material and the excited triplet state of the red light emitting material, and thereby the light emitting materials each emit phosphorescent light and delayed fluorescent light. According to the embodiment employed, the blue color tone may be improved while enhancing the quantum efficiency. The blue light emission, the green light emission and the red light emission may be recognized as white light emission through color mixing.

The kind of the delayed fluorescent material that may be used in the invention is not particularly limited, and may be selected from ones capable of emitting delayed fluorescent light in consideration of the light emission wavelength. A delayed fluorescent material generally has a structure containing an acceptor moiety (A) and a donor moiety (D) bonded to each other. The numbers of the acceptor moiety and the donor moiety each may be one or more, and the number of the acceptor moiety and the number of the donor moiety in one molecule may be the same as or different from each other. For example, there are delayed fluorescent materials having various structures, such as an A-D type, an A-(D)$_n$ type, an (A)$_n$-D type and an -(A-D)$_n$-type, wherein n represents an integer of 2 or more, and may be, for example, an integer of from 2 to 6.

The molecular weight of the delayed fluorescent material is preferably 1,500 or less, more preferably 1,200 or less, further preferably 1,000 or less, and still further preferably 800 or less, in the case where a light emitting layer is intended to be formed as a film by a vapor deposition method. The delayed fluorescent material may be formed into a fills by a coating method irrespective of the molecular weight thereof. The compound that has a relatively large molecular weight may be formed into a film by a coating method.

Specific examples of the preferred delayed fluorescent material that may be used in the invention are shown below, but the delayed fluorescent material that may be used in the invention is not construed as being limited to the examples.

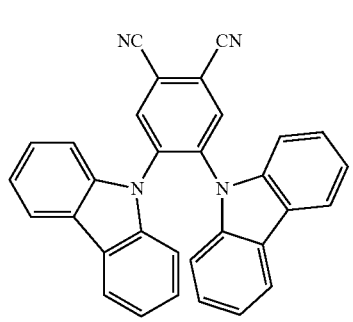
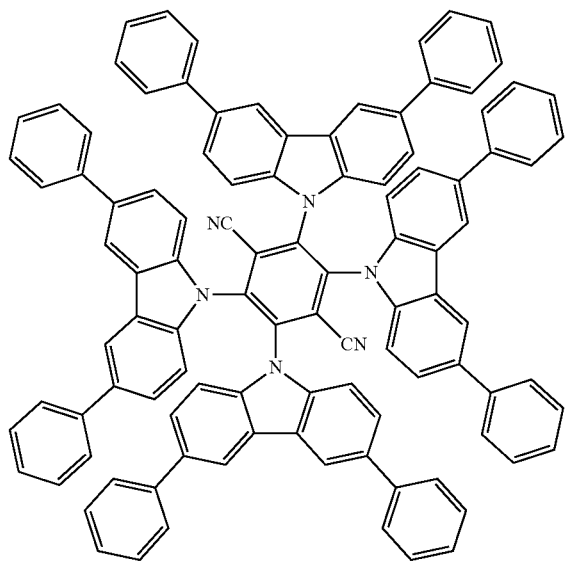

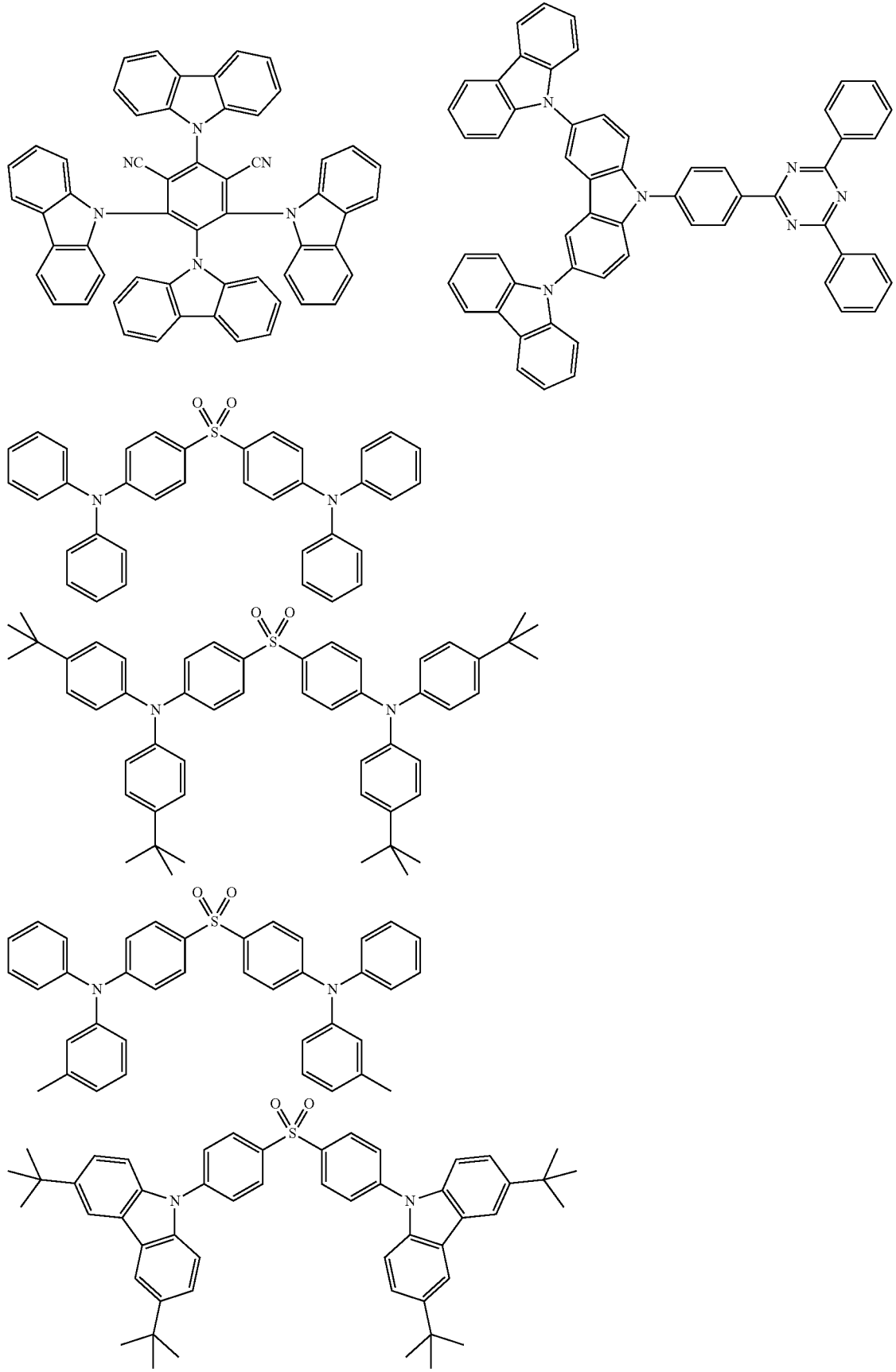

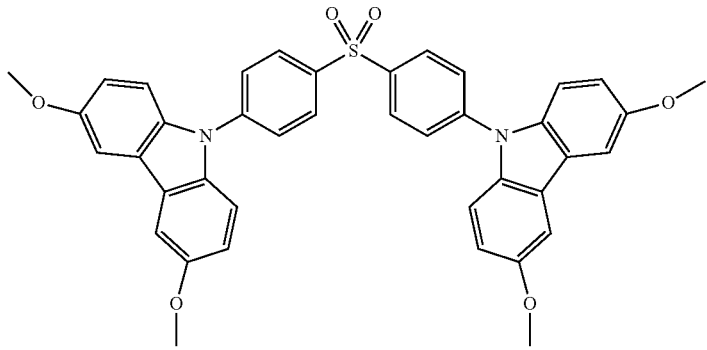
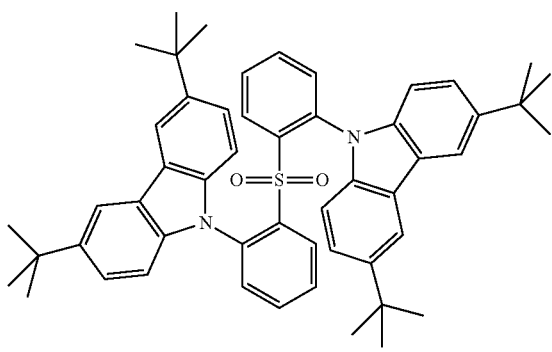
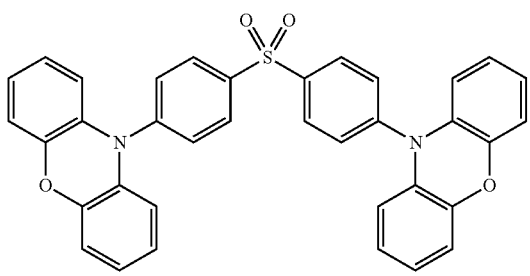
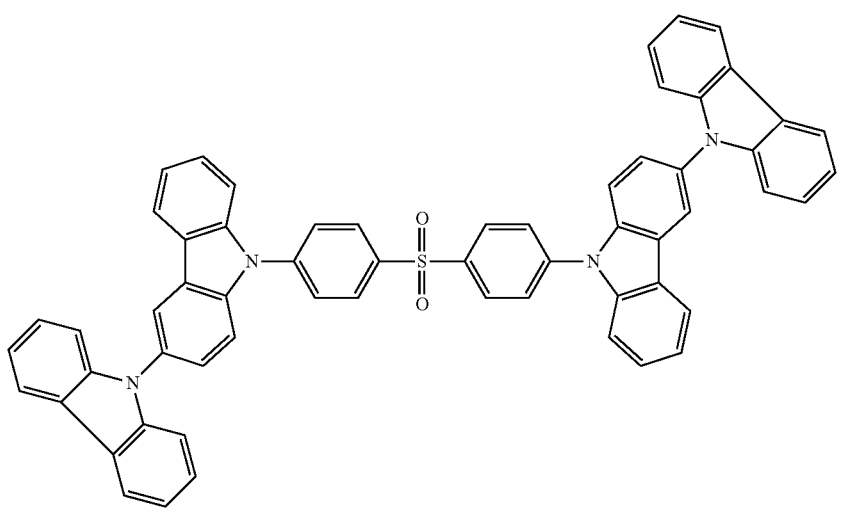

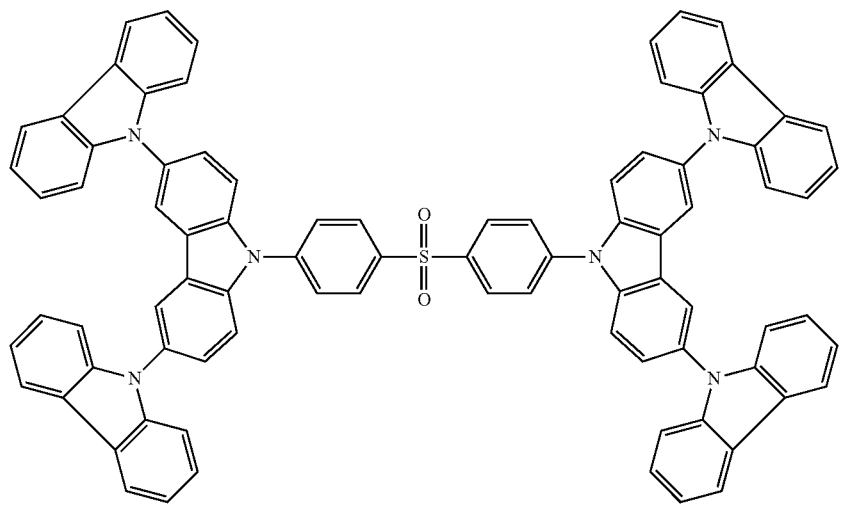
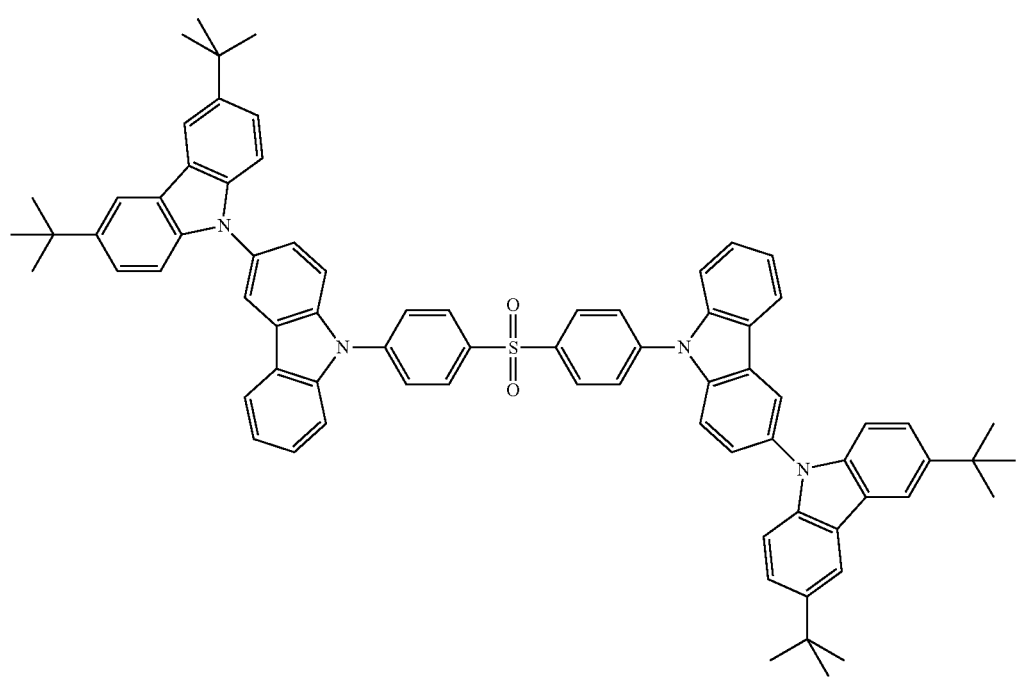

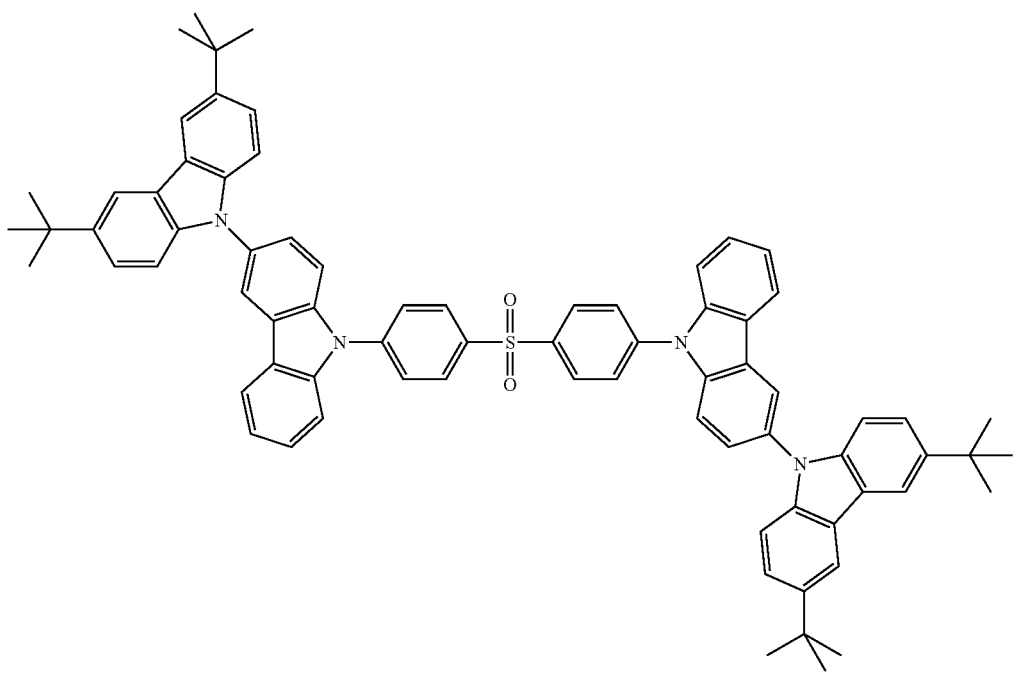
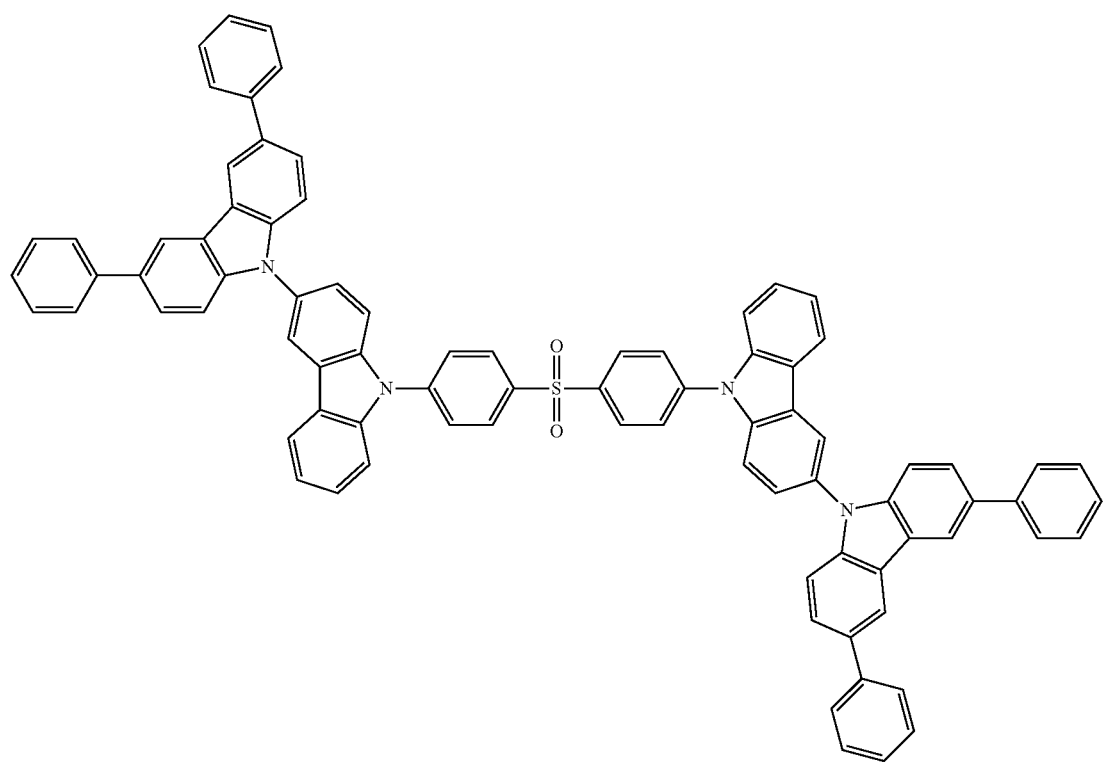

-continued

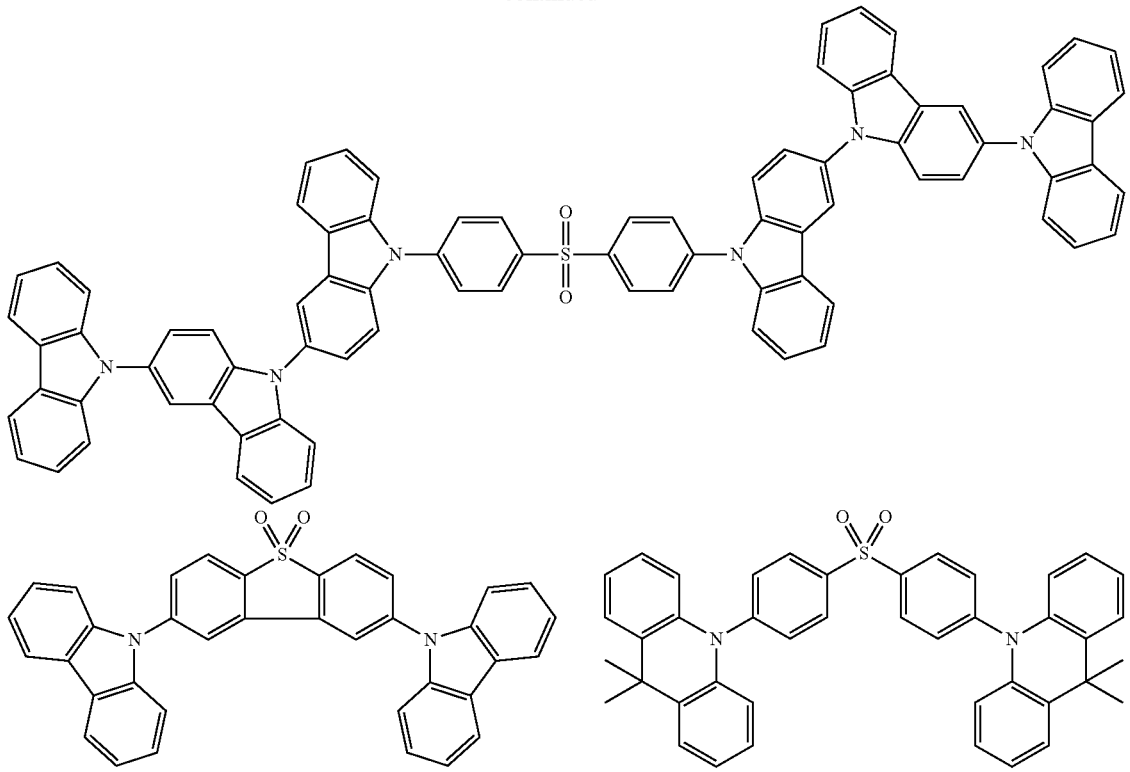

Examples of the preferred light emitting material capable of emitting delayed fluorescent light include compounds represented by the following general formula (101). The entire description of WO 2013/154064 including the paragraphs 0008 to 0048 and 0095 to 0133 is incorporated herein by reference.

General Formula (101)

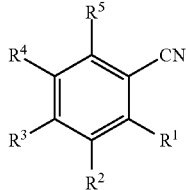

wherein in the general formula (101), at least one of $R^1$ to represents a cyano group, at least one of $R^1$ to $R^5$ represents a group represented by the following general formula (111), and the balance of $R^1$ to $R^5$ each represent a hydrogen atom or a substituent, General Formula (111)

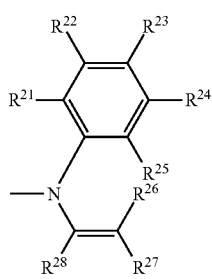

wherein in the general formula (111), $R^{21}$ to $R^{28}$ each Independently represent, a hydrogen atom or a substituent, provided that at least one of the following conditions (A) and (B) is satisfied:

(A) $R^{25}$ and $R^{26}$ together form a single bond, and (B) $R^{27}$ and $R^{28}$ together represent an atomic group that is necessary for forming a substituted or unsubstituted benzene ring.

In the general formula (101), at least one of $R^1$ to $R^5$ preferably represents a group represented by any one of the following general formulae (112) to (115).

General Formula (112)

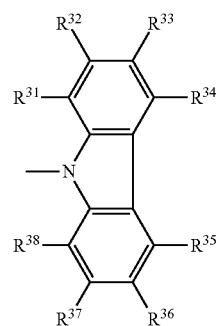

wherein in the general formula (112), to $R^{31}$ to $R^{38}$ each independently represent a hydrogen atom or a substituent.

General Formula (113)

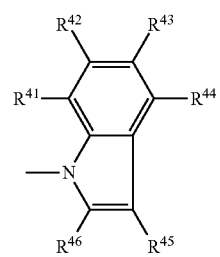

wherein in the general formula (113), $R^{41}$ to $R^{46}$ each independently represent a hydrogen atom or a substituent, General Formula (114)

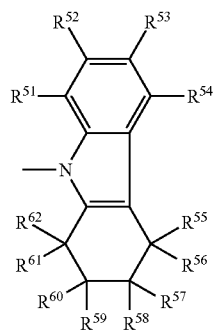

wherein in the general formula (114), $R^{51}$ to $R^{62}$ each independently represent a hydrogen atom or a substituent, General Formula (115)

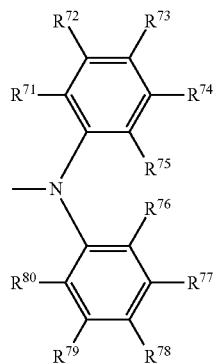

wherein in the general formula (115), $R^{71}$ to $R^{80}$ each independently represent a hydrogen atom or a substituent.

Specific examples of the compounds include the compounds shown in the following tables. In the case where two or more groups represented by any one of the general formulae (112) to (115) are present in the molecule of the following example compounds, all the groups have the same structure. The formulae (121) to (124) in the tables represent the following formulae, respectively, and n represents the number of the repeating units.

Formula (121)

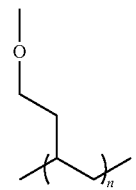

Formula (122)

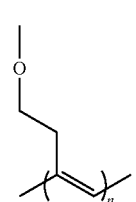

Formula (123)

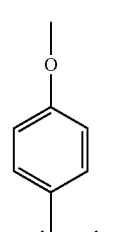

Formula (124)

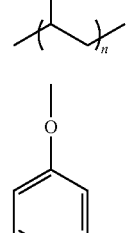

TABLE 1-1

| Compound No. | General formula (1) | | | | | General formula (112) | | | |
|---|---|---|---|---|---|---|---|---|---|
| | $R^1$ | $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 1 | General formula (112) | General formula (112) | CN | General formula (112) | General formula (112) | H | H | H | H |
| 2 | General formula (112) | General formula (112) | CN | General formula (112) | General formula (112) | H | $CH_3$ | H | H |
| 3 | General formula (112) | General formula (112) | CN | General formula (112) | General formula (112) | H | $CH_3O$ | H | H |
| 4 | General formula (112) | General formula (112) | CN | General formula (112) | General formula (112) | H | H | $CH_3$ | H |
| 5 | General formula (112) | General formula (112) | CN | General formula (112) | General formula (112) | H | H | $CH_3O$ | H |
| 6 | General formula (112) | General formula (112) | CN | General formula (112) | General formula (112) | H | H | $t\text{-}C_4H_9$ | H |
| 7 | General formula (112) | General formula (112) | CN | General formula (112) | General formula (112) | H | H | Cl | H |
| 8 | General formula (112) | General formula (112) | CN | General formula (112) | General formula (112) | H | H | F | H |
| 9 | General formula (112) | General formula (112) | CN | General formula (112) | General formula (112) | H | H | H | $CH_3$ |
| 10 | General formula (112) | General formula (112) | CN | General formula (112) | General formula (112) | H | H | H | $CH_3O$ |

TABLE 1-1-continued

| Compound No. | General formula (1) | | | | | General formula (112) | | | |
|---|---|---|---|---|---|---|---|---|---|
| | $R^1$ | $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 11 | General formula (112) | General formula (112) | CN | General formula (112) | H | H | H | H | H |
| 12 | General formula (112) | General formula (112) | CN | General formula (112) | H | H | $CH_3$ | H | H |
| 13 | General formula (112) | General formula (112) | CN | General formula (112) | H | H | $CH_3O$ | H | H |
| 14 | General formula (112) | General formula (112) | CN | General formula (112) | H | H | H | $CH_3$ | H |
| 15 | General formula (112) | General formula (112) | CN | General formula (112) | H | H | H | $CH_3O$ | H |
| 16 | General formula (112) | General formula (112) | CN | General formula (112) | H | H | H | $t-C_4H_9$ | H |
| 17 | General formula (112) | General formula (112) | CN | General formula (112) | H | H | H | Cl | H |
| 18 | General formula (112) | General formula (112) | CN | General formula (112) | H | H | H | F | H |
| 19 | General formula (112) | General formula (112) | CN | General formula (112) | H | H | H | H | $CH_3$ |
| 20 | General formula (112) | General formula (112) | CN | General formula (112) | H | H | H | H | $CH_3O$ |
| 21 | General formula (112) | General formula (112) | CN | H | H | H | H | H | H |
| 22 | General formula (112) | General formula (112) | CN | H | H | H | $CH_3$ | H | H |
| 23 | General formula (112) | General formula (112) | CN | H | H | H | $CH_3O$ | H | H |
| 24 | General formula (112) | General formula (112) | CN | H | H | H | H | $CH_3$ | H |
| 25 | General formula (112) | General formula (112) | CN | H | H | H | H | $CH_3O$ | H |
| 26 | General formula (112) | General formula (112) | CN | H | H | H | H | $t-C_4H_9$ | H |
| 27 | General formula (112) | General formula (112) | CN | H | H | H | H | Cl | H |
| 28 | General formula (112) | General formula (112) | CN | H | H | H | H | F | H |
| 29 | General formula (112) | General formula (112) | CN | H | H | H | H | H | $CH_3$ |
| 30 | General formula (112) | General formula (112) | CN | H | H | H | H | H | $CH_3O$ |
| 31 | General formula (112) | H | CN | General formula (112) | H | H | H | H | H |
| 32 | General formula (112) | H | CN | General formula (112) | H | H | $CH_3$ | H | H |
| 33 | General formula (112) | H | CN | General formula (112) | H | H | $CH_3O$ | H | H |
| 34 | General formula (112) | H | CN | General formula (112) | H | H | H | $CH_3$ | H |
| 35 | General formula (112) | H | CN | General formula (112) | H | H | H | $CH_3O$ | H |
| 36 | General formula (112) | H | CN | General formula (112) | H | H | H | $t-C_4H_9$ | H |
| 37 | General formula (112) | H | CN | General formula (112) | H | H | H | Cl | H |
| 38 | General formula (112) | H | CN | General formula (112) | H | H | H | F | H |
| 39 | General formula (112) | H | CN | General formula (112) | H | H | H | H | $CH_3$ |
| 40 | General formula (112) | H | CN | General formula (112) | H | H | H | H | $CH_3O$ |
| 41 | General formula (112) | H | CN | H | General formula (112) | H | H | H | H |
| 42 | General formula (112) | H | CN | H | General formula (112) | H | $CH_3$ | H | H |
| 43 | General formula (112) | H | CN | H | General formula (112) | H | $CH_3O$ | H | H |
| 44 | General formula (112) | H | CN | H | General formula (112) | H | H | $CH_3$ | H |
| 45 | General formula (112) | H | CN | H | General formula (112) | H | H | $CH_3O$ | H |
| 46 | General formula (112) | H | CN | H | General formula (112) | H | H | $t-C_4H_9$ | H |
| 47 | General formula (112) | H | CN | H | General formula (112) | H | H | Cl | H |
| 48 | General formula (112) | H | CN | H | General formula (112) | H | H | F | H |

TABLE 1-1-continued

| Compound No. | General formula (1) | | | | | General formula (112) | | | |
|---|---|---|---|---|---|---|---|---|---|
| | R¹ | R² | R³ | R⁴ | R⁵ | R³¹, R³⁸ | R³², R³⁷ | R³³, R³⁶ | R³⁴, R³⁵ |
| 49 | General formula (112) | H | CN | H | General formula (112) | H | H | H | CH₃ |
| 50 | General formula (112) | H | CN | H | General formula (112) | H | H | H | CH₃O |
| 51 | General formula (112) | H | CN | H | H | H | H | H | H |
| 52 | General formula (112) | H | CN | H | H | H | CH₃ | H | H |
| 53 | General formula (112) | H | CN | H | H | H | CH₃O | H | H |
| 54 | General formula (112) | H | CN | H | H | H | H | CH₃ | H |
| 55 | General formula (112) | H | CN | H | H | H | H | CH₃O | H |
| 56 | General formula (112) | H | CN | H | H | H | H | t-C₄H₉ | H |
| 57 | General formula (112) | H | CN | H | H | H | H | Cl | H |
| 58 | General formula (112) | H | CN | H | H | H | H | F | H |
| 59 | General formula (112) | H | CN | H | H | H | H | H | CH₃ |
| 60 | General formula (112) | H | CN | H | H | H | H | H | CH₃O |

TABLE 1-2

| Compound No. | General formula (1) | | | | | General formula (112) | | | |
|---|---|---|---|---|---|---|---|---|---|
| | R¹ | R² | R³ | R⁴ | R⁵ | R³¹, R³⁸ | R³², R³⁷ | R³³, R³⁶ | R³⁴, R³⁵ |
| 61 | General formula (112) | General formula (112) | CN | General formula (112) | F | H | H | H | H |
| 62 | General formula (112) | General formula (112) | CN | General formula (112) | F | H | CH₃ | H | H |
| 63 | General formula (112) | General formula (112) | CN | General formula (112) | F | H | CH₃O | H | H |
| 64 | General formula (112) | General formula (112) | CN | General formula (112) | F | H | H | CH₃ | H |
| 65 | General formula (112) | General formula (112) | CN | General formula (112) | F | H | H | CH₃O | H |
| 66 | General formula (112) | General formula (112) | CN | General formula (112) | F | H | H | t-C₄H₉ | H |
| 67 | General formula (112) | General formula (112) | CN | General formula (112) | F | H | H | Cl | H |
| 68 | General formula (112) | General formula (112) | CN | General formula (112) | F | H | H | F | H |
| 69 | General formula (112) | General formula (112) | CN | General formula (112) | F | H | H | H | CH₃ |
| 70 | General formula (112) | General formula (112) | CN | General formula (112) | F | H | H | H | CH₃O |
| 71 | General formula (112) | General formula (112) | CN | F | F | H | H | H | H |
| 72 | General formula (112) | General formula (112) | CN | F | F | H | CH₃ | H | H |
| 73 | General formula (112) | General formula (112) | CN | F | F | H | CH₃O | H | H |
| 74 | General formula (112) | General formula (112) | CN | F | F | H | H | CH₃ | H |
| 75 | General formula (112) | General formula (112) | CN | F | F | H | H | CH₃O | H |
| 76 | General formula (112) | General formula (112) | CN | F | F | H | H | t-C₄H₉ | H |
| 77 | General formula (112) | General formula (112) | CN | F | F | H | H | Cl | H |
| 78 | General formula (112) | General formula (112) | CN | F | F | H | H | F | H |
| 79 | General formula (112) | General formula (112) | CN | F | F | H | H | H | CH₃ |
| 80 | General formula (112) | General formula (112) | CN | F | F | H | H | H | CH₃O |
| 81 | General formula (112) | F | CN | General formula (112) | F | H | H | H | H |

TABLE 1-2-continued

| Compound No. | General formula (1) | | | | | General formula (112) | | | |
|---|---|---|---|---|---|---|---|---|---|
| | $R^1$ | $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 82 | General formula (112) | F | CN | General formula (112) | F | H | $CH_3$ | H | H |
| 83 | General formula (112) | F | CN | General formula (112) | F | H | $CH_3O$ | H | H |
| 84 | General formula (112) | F | CN | General formula (112) | F | H | H | $CH_3$ | H |
| 85 | General formula (112) | F | CN | General formula (112) | F | H | H | $CH_3O$ | H |
| 86 | General formula (112) | F | CN | General formula (112) | F | H | H | $t-C_4H_9$ | H |
| 87 | General formula (112) | F | CN | General formula (112) | F | H | H | Cl | H |
| 88 | General formula (112) | F | CN | General formula (112) | F | H | H | F | H |
| 89 | General formula (112) | F | CN | General formula (112) | F | H | H | H | $CH_3$ |
| 90 | General formula (112) | F | CN | General formula (112) | F | H | H | H | $CH_3O$ |
| 91 | General formula (112) | F | CN | F | General formula (112) | H | H | H | H |
| 92 | General formula (112) | F | CN | F | General formula (112) | H | $CH_3$ | H | H |
| 93 | General formula (112) | F | CN | F | General formula (112) | H | $CH_3O$ | H | H |
| 94 | General formula (112) | F | CN | F | General formula (112) | H | H | $CH_3$ | H |
| 95 | General formula (112) | F | CN | F | General formula (112) | H | H | $CH_3O$ | H |
| 96 | General formula (112) | F | CN | F | General formula (112) | H | H | $t-C_4H_9$ | H |
| 97 | General formula (112) | F | CN | F | General formula (112) | H | H | Cl | H |
| 98 | General formula (112) | F | CN | F | General formula (112) | H | H | F | H |
| 99 | General formula (112) | F | CN | F | General formula (112) | H | H | H | $CH_3$ |
| 100 | General formula (112) | F | CN | F | General formula (112) | H | H | H | $CH_3O$ |
| 101 | General formula (112) | F | CN | F | F | H | H | H | H |
| 102 | General formula (112) | F | CN | F | F | H | $CH_3$ | H | H |
| 103 | General formula (112) | F | CN | F | F | H | $CH_3O$ | H | H |
| 104 | General formula (112) | F | CN | F | F | H | H | $CH_3$ | H |
| 105 | General formula (112) | F | CN | F | F | H | H | $CH_3O$ | H |
| 106 | General formula (112) | F | CN | F | F | H | H | $t-C_4H_9$ | H |
| 107 | General formula (112) | F | CN | F | F | H | H | Cl | H |
| 108 | General formula (112) | F | CN | F | F | H | H | F | H |
| 109 | General formula (112) | F | CN | F | F | H | H | H | $CH_3$ |
| 110 | General formula (112) | F | CN | F | F | H | H | H | $CH_3O$ |

TABLE 1-3

| Compound No. | General formula (1) | | | | | General formula (112) | | | |
|---|---|---|---|---|---|---|---|---|---|
| | $R^1$ | $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 111 | General formula (112) | General formula (112) | CN | General formula (112) | OH | H | H | H | H |
| 112 | General formula (112) | General formula (112) | CN | General formula (112) | OH | H | $CH_3$ | H | H |
| 113 | General formula (112) | General formula (112) | CN | General formula (112) | OH | H | $CH_3O$ | H | H |
| 114 | General formula (112) | General formula (112) | CN | General formula (112) | OH | H | H | $CH_3$ | H |

TABLE 1-3-continued

| Compound No. | General formula (1) | | | | | General formula (112) | | | |
|---|---|---|---|---|---|---|---|---|---|
| | $R^1$ | $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 115 | General formula (112) | General formula (112) | CN | General formula (112) | OH | H | H | CH$_3$O | H |
| 116 | General formula (112) | General formula (112) | CN | General formula (112) | OH | H | H | t-C$_4$H$_9$ | H |
| 117 | General formula (112) | General formula (112) | CN | General formula (112) | OH | H | H | Cl | H |
| 118 | General formula (112) | General formula (112) | CN | General formula (112) | OH | H | H | F | H |
| 119 | General formula (112) | General formula (112) | CN | General formula (112) | OH | H | H | H | CH$_3$ |
| 120 | General formula (112) | General formula (112) | CN | General formula (112) | OH | H | H | H | CH$_3$O |
| 121 | General formula (112) | General formula (112) | CN | OH | OH | H | H | H | H |
| 122 | General formula (112) | General formula (112) | CN | OH | OH | H | CH$_3$ | H | H |
| 123 | General formula (112) | General formula (112) | CN | OH | OH | H | CH$_3$O | H | H |
| 124 | General formula (112) | General formula (112) | CN | OH | OH | H | H | CH$_3$ | H |
| 125 | General formula (112) | General formula (112) | CN | OH | OH | H | H | CH$_3$O | H |
| 126 | General formula (112) | General formula (112) | CN | OH | OH | H | H | t-C$_4$H$_9$ | H |
| 127 | General formula (112) | General formula (112) | CN | OH | OH | H | H | Cl | H |
| 128 | General formula (112) | General formula (112) | CN | OH | OH | H | H | F | H |
| 129 | General formula (112) | General formula (112) | CN | OH | OH | H | H | H | CH$_3$ |
| 130 | General formula (112) | General formula (112) | CN | OH | OH | H | H | H | CH$_3$O |
| 131 | General formula (112) | OH | CN | General formula (112) | OH | H | H | H | H |
| 132 | General formula (112) | OH | CN | General formula (112) | OH | H | CH$_3$ | H | H |
| 133 | General formula (112) | OH | CN | General formula (112) | OH | H | CH$_3$O | H | H |
| 134 | General formula (112) | OH | CN | General formula (112) | OH | H | H | CH$_3$ | H |
| 135 | General formula (112) | OH | CN | General formula (112) | OH | H | H | CH$_3$O | H |
| 136 | General formula (112) | OH | CN | General formula (112) | OH | H | H | t-C$_4$H$_9$ | H |
| 137 | General formula (112) | OH | CN | General formula (112) | OH | H | H | Cl | H |
| 138 | General formula (112) | OH | CN | General formula (112) | OH | H | H | F | H |
| 139 | General formula (112) | OH | CN | General formula (112) | OH | H | H | H | CH$_3$ |
| 140 | General formula (112) | OH | CN | General formula (112) | OH | H | H | H | CH$_3$O |
| 141 | General formula (112) | OH | CN | OH | General formula (112) | H | H | H | H |
| 142 | General formula (112) | OH | CN | OH | General formula (112) | H | CH$_3$ | H | H |
| 143 | General formula (112) | OH | CN | OH | General formula (112) | H | CH$_3$O | H | H |
| 144 | General formula (112) | OH | CN | OH | General formula (112) | H | H | CH$_3$ | H |
| 145 | General formula (112) | OH | CN | OH | General formula (112) | H | H | CH$_3$O | H |
| 146 | General formula (112) | OH | CN | OH | General formula (112) | H | H | t-C$_4$H$_9$ | H |
| 147 | General formula (112) | OH | CN | OH | General formula (112) | H | H | Cl | H |
| 148 | General formula (112) | OH | CN | OH | General formula (112) | H | H | F | H |
| 149 | General formula (112) | OH | CN | OH | General formula (112) | H | H | H | CH$_3$ |
| 150 | General formula (112) | OH | CN | OH | General formula (112) | H | H | H | CH$_3$O |
| 151 | General formula (112) | OH | CN | OH | OH | H | H | H | H |
| 152 | General formula (112) | OH | CN | OH | OH | H | CH$_3$ | H | H |

TABLE 1-3-continued

| Compound No. | General formula (1) | | | | | General formula (112) | | | |
|---|---|---|---|---|---|---|---|---|---|
| | $R^1$ | $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 153 | General formula (112) | OH | CN | OH | OH | H | $CH_3O$ | H | H |
| 154 | General formula (112) | OH | CN | OH | OH | H | H | $CH_3$ | H |
| 155 | General formula (112) | OH | CN | OH | OH | H | H | $CH_3O$ | H |
| 156 | General formula (112) | OH | CN | OH | OH | H | H | $t-C_4H_9$ | H |
| 157 | General formula (112) | OH | CN | OH | OH | H | H | Cl | H |
| 158 | General formula (112) | OH | CN | OH | OH | H | H | F | H |
| 159 | General formula (112) | OH | CN | OH | OH | H | H | H | $CH_3$ |
| 160 | General formula (112) | OH | CN | OH | OH | H | H | H | $CH_3O$ |
| 161 | General formula (112) | General formula (112) | CN | General formula (112) | Cl | H | H | H | H |
| 162 | General formula (112) | General formula (112) | CN | General formula (112) | Cl | H | $CH_3$ | H | H |
| 163 | General formula (112) | General formula (112) | CN | General formula (112) | Cl | H | $CH_3O$ | H | H |
| 164 | General formula (112) | General formula (112) | CN | General formula (112) | Cl | H | H | $CH_3$ | H |
| 165 | General formula (112) | General formula (112) | CN | General formula (112) | Cl | H | H | $CH_3O$ | H |
| 166 | General formula (112) | General formula (112) | CN | General formula (112) | Cl | H | H | $t-C_4H_9$ | H |
| 167 | General formula (112) | General formula (112) | CN | General formula (112) | Cl | H | H | Cl | H |
| 168 | General formula (112) | General formula (112) | CN | General formula (112) | Cl | H | H | F | H |
| 169 | General formula (112) | General formula (112) | CN | General formula (112) | Cl | H | H | H | $CH_3$ |
| 170 | General formula (112) | General formula (112) | CN | General formula (112) | Cl | H | H | H | $CH_3O$ |
| 171 | General formula (112) | General formula (112) | CN | General formula (112) | F | H | H | H | H |
| 172 | General formula (112) | General formula (112) | CN | General formula (112) | F | H | $CH_3$ | H | H |
| 173 | General formula (112) | General formula (112) | CN | General formula (112) | F | H | $CH_3O$ | H | H |
| 174 | General formula (112) | General formula (112) | CN | General formula (112) | F | H | H | $CH_3$ | H |
| 175 | General formula (112) | General formula (112) | CN | General formula (112) | F | H | H | $CH_3O$ | H |

TABLE 1-4

| Compound No. | General formula (1) | | | | | General formula (112) | | | |
|---|---|---|---|---|---|---|---|---|---|
| | $R^1$ | $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 176 | General formula (112) | General formula (112) | CN | General formula (112) | F | H | H | $t-C_4H_9$ | H |
| 177 | General formula (112) | General formula (112) | CN | General formula (112) | F | H | H | Cl | H |
| 178 | General formula (112) | General formula (112) | CN | General formula (112) | F | H | H | F | H |
| 179 | General formula (112) | General formula (112) | CN | General formula (112) | F | H | H | H | $CH_3$ |
| 180 | General formula (112) | General formula (112) | CN | General formula (112) | F | H | H | H | $CH_3O$ |
| 181 | General formula (112) | General formula (112) | CN | General formula (112) | $CH_3O$ | H | H | H | H |
| 182 | General formula (112) | General formula (112) | CN | General formula (112) | $CH_3O$ | H | $CH_3$ | H | H |
| 183 | General formula (112) | General formula (112) | CN | General formula (112) | $CH_3O$ | H | $CH_3O$ | H | H |
| 184 | General formula (112) | General formula (112) | CN | General formula (112) | $CH_3O$ | H | H | $CH_3$ | H |
| 185 | General formula (112) | General formula (112) | CN | General formula (112) | $CH_3O$ | H | H | $CH_3O$ | H |

TABLE 1-4-continued

| Compound No. | General formula (1) | | | | | General formula (112) | | | |
|---|---|---|---|---|---|---|---|---|---|
| | $R^1$ | $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 186 | General formula (112) | General formula (112) | CN | General formula (112) | $CH_3O$ | H | H | $t\text{-}C_4H_9$ | H |
| 187 | General formula (112) | General formula (112) | CN | General formula (112) | $CH_3O$ | H | H | Cl | H |
| 188 | General formula (112) | General formula (112) | CN | General formula (112) | $CH_3O$ | H | H | F | H |
| 189 | General formula (112) | General formula (112) | CN | General formula (112) | $C_2H_5O$ | H | H | H | $CH_3$ |
| 190 | General formula (112) | General formula (112) | CN | General formula (112) | $C_2H_5O$ | H | H | H | $CH_3O$ |
| 191 | General formula (112) | General formula (112) | CN | General formula (112) | $C_2H_5O$ | H | H | H | H |
| 192 | General formula (112) | General formula (112) | CN | General formula (112) | $C_2H_5O$ | H | $CH_3$ | H | H |
| 193 | General formula (112) | General formula (112) | CN | General formula (112) | $C_2H_5O$ | H | $CH_3O$ | H | H |
| 194 | General formula (112) | General formula (112) | CN | General formula (112) | $C_2H_5O$ | H | H | $CH_3$ | H |
| 195 | General formula (112) | General formula (112) | CN | General formula (112) | $C_2H_5O$ | H | H | $CH_3O$ | H |
| 196 | General formula (112) | General formula (112) | CN | General formula (112) | $C_2H_5O$ | H | H | $t\text{-}C_4H_9$ | H |
| 197 | General formula (112) | General formula (112) | CN | General formula (112) | $C_2H_5O$ | H | H | Cl | H |
| 198 | General formula (112) | General formula (112) | CN | General formula (112) | $C_2H_5O$ | H | H | F | H |
| 199 | General formula (112) | General formula (112) | CN | General formula (112) | $C_2H_5O$ | H | H | H | $CH_3$ |
| 200 | General formula (112) | General formula (112) | CN | General formula (112) | $C_2H_5O$ | H | H | H | $CH_3O$ |
| 201 | General formula (112) | General formula (112) | CN | General formula (112) | $C_6H_5O$ | H | H | H | H |
| 202 | General formula (112) | General formula (112) | CN | General formula (112) | $C_6H_5O$ | H | $CH_3$ | H | H |
| 203 | General formula (112) | General formula (112) | CN | General formula (112) | $C_6H_5O$ | H | $CH_3O$ | H | H |
| 204 | General formula (112) | General formula (112) | CN | General formula (112) | $C_6H_5O$ | H | H | $CH_3$ | H |
| 205 | General formula (112) | General formula (112) | CN | General formula (112) | $C_6H_5O$ | H | H | $CH_3O$ | H |
| 206 | General formula (112) | General formula (112) | CN | General formula (112) | $C_6H_5O$ | H | H | $t\text{-}C_4H_9$ | H |
| 207 | General formula (112) | General formula (112) | CN | General formula (112) | $C_6H_5O$ | H | H | Cl | H |
| 208 | General formula (112) | General formula (112) | CN | General formula (112) | $C_6H_5O$ | H | H | F | H |
| 209 | General formula (112) | General formula (112) | CN | General formula (112) | $C_6H_5O$ | H | H | H | $CH_3$ |
| 210 | General formula (112) | General formula (112) | CN | General formula (112) | $C_6H_5O$ | H | H | H | $CH_3O$ |
| 211 | General formula (112) | General formula (112) | CN | General formula (112) | Formula (121) | H | H | H | H |
| 212 | General formula (112) | General formula (112) | CN | General formula (112) | Formula (121) | H | $CH_3$ | H | H |
| 213 | General formula (112) | General formula (112) | CN | General formula (112) | Formula (121) | H | $CH_3O$ | H | H |
| 214 | General formula (112) | General formula (112) | CN | General formula (112) | Formula (121) | H | H | $CH_3$ | H |
| 215 | General formula (112) | General formula (112) | CN | General formula (112) | Formula (121) | H | H | $CH_3O$ | H |
| 216 | General formula (112) | General formula (112) | CN | General formula (112) | Formula (121) | H | H | $t\text{-}C_4H_9$ | H |
| 217 | General formula (112) | General formula (112) | CN | General formula (112) | Formula (121) | H | H | Cl | H |
| 218 | General formula (112) | General formula (112) | CN | General formula (112) | Formula (121) | H | H | F | H |
| 219 | General formula (112) | General formula (112) | CN | General formula (112) | Formula (121) | H | H | H | $CH_3$ |
| 220 | General formula (112) | General formula (112) | CN | General formula (112) | Formula (121) | H | H | H | $CH_3O$ |
| 221 | General formula (112) | General formula (112) | CN | General formula (112) | Formula (122) | H | H | H | H |
| 222 | General formula (112) | General formula (112) | CN | General formula (112) | Formula (122) | H | $CH_3$ | H | H |
| 223 | General formula (112) | General formula (112) | CN | General formula (112) | Formula (122) | H | $CH_3O$ | H | H |

TABLE 1-4-continued

| Compound No. | General formula (1) | | | | | General formula (112) | | | |
|---|---|---|---|---|---|---|---|---|---|
| | $R^1$ | $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 224 | General formula (112) | General formula (112) | CN | General formula (112) | Formula (122) | H | H | $CH_3$ | H |
| 225 | General formula (112) | General formula (112) | CN | General formula (112) | Formula (122) | H | H | $CH_3O$ | H |
| 226 | General formula (112) | General formula (112) | CN | General formula (112) | Formula (122) | H | H | $t-C_4H_9$ | H |
| 227 | General formula (112) | General formula (112) | CN | General formula (112) | Formula (122) | H | H | Cl | H |
| 228 | General formula (112) | General formula (112) | CN | General formula (112) | Formula (122) | H | H | F | H |
| 229 | General formula (112) | General formula (112) | CN | General formula (112) | Formula (122) | H | H | H | $CH_3$ |
| 230 | General formula (112) | General formula (112) | CN | General formula (112) | Formula (122) | H | H | H | $CH_3O$ |
| 231 | General formula (112) | General formula (112) | CN | General formula (112) | Formula (123) | H | H | H | H |
| 232 | General formula (112) | General formula (112) | CN | General formula (112) | Formula (123) | H | $CH_3$ | H | H |
| 233 | General formula (112) | General formula (112) | CN | General formula (112) | Formula (123) | H | $CH_3O$ | H | H |
| 234 | General formula (112) | General formula (112) | CN | General formula (112) | Formula (123) | H | H | $CH_3$ | H |
| 235 | General formula (112) | General formula (112) | CN | General formula (112) | Formula (123) | H | H | $CH_3O$ | H |
| 236 | General formula (112) | General formula (112) | CN | General formula (112) | Formula (123) | H | H | $t-C_4H_9$ | H |
| 237 | General formula (112) | General formula (112) | CN | General formula (112) | Formula (123) | H | H | Cl | H |
| 238 | General formula (112) | General formula (112) | CN | General formula (112) | Formula (123) | H | H | F | H |
| 239 | General formula (112) | General formula (112) | CN | General formula (112) | Formula (123) | H | H | H | $CH_3$ |
| 240 | General formula (112) | General formula (112) | CN | General formula (112) | Formula (123) | H | H | H | $CH_3O$ |

TABLE 1-5

| Compound No. | General formula (1) | | | | | General formula (112) | | | |
|---|---|---|---|---|---|---|---|---|---|
| | $R^1$ | $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 241 | General formula (112) | General formula (112) | CN | General formula (112) | Formula (124) | H | H | H | H |
| 242 | General formula (112) | General formula (112) | CN | General formula (112) | Formula (124) | H | $CH_3$ | H | H |
| 243 | General formula (112) | General formula (112) | CN | General formula (112) | Formula (124) | H | $CH_3O$ | H | H |
| 244 | General formula (112) | General formula (112) | CN | General formula (112) | Formula (124) | H | H | $CH_3$ | H |
| 245 | General formula (112) | General formula (112) | CN | General formula (112) | Formula (124) | H | H | $CH_3O$ | H |
| 246 | General formula (112) | General formula (112) | CN | General formula (112) | Formula (124) | H | H | $t-C_4H_9$ | H |
| 247 | General formula (112) | General formula (112) | CN | General formula (112) | Formula (124) | H | H | Cl | H |
| 248 | General formula (112) | General formula (112) | CN | General formula (112) | Formula (124) | H | H | F | H |
| 249 | General formula (112) | General formula (112) | CN | General formula (112) | Formula (124) | H | H | H | $CH_3$ |
| 250 | General formula (112) | General formula (112) | CN | General formula (112) | Formula (124) | H | H | H | $CH_3O$ |
| 251 | General formula (112) | General formula (112) | CN | General formula (112) | General formula (112) | H | $C_6H_5$ | H | H |
| 252 | General formula (112) | General formula (112) | CN | General formula (112) | General formula (112) | H | H | $C_5H_6$ | H |
| 253 | General formula (112) | General formula (112) | CN | General formula (112) | H | H | $C_6H_5$ | H | H |
| 254 | General formula (112) | General formula (112) | CN | General formula (112) | H | H | H | $C_5H_6$ | H |
| 255 | General formula (112) | General formula (112) | CN | H | H | H | $C_6H_5$ | H | H |
| 256 | General formula (112) | General formula (112) | CN | H | H | H | H | $C_6H_5$ | H |

TABLE 1-5-continued

| Compound No. | General formula (1) R$^1$ | R$^2$ | R$^3$ | R$^4$ | R$^5$ | General formula (112) R$^{31}$, R$^{38}$ | R$^{32}$, R$^{37}$ | R$^{33}$, R$^{36}$ | R$^{34}$, R$^{35}$ |
|---|---|---|---|---|---|---|---|---|---|
| 257 | General formula (112) | H | CN | General formula (112) | H | H | C$_6$H$_5$ | H | H |
| 258 | General formula (112) | H | CN | General formula (112) | H | H | H | C$_6$H$_5$ | H |
| 259 | General formula (112) | H | CN | H | General formula (112) | H | C$_6$H$_5$ | H | H |
| 260 | General formula (112) | H | CN | H | General formula (112) | H | H | C$_6$H$_5$ | H |
| 261 | General formula (112) | H | CN | H | H | H | C$_6$H$_5$ | H | H |
| 262 | General formula (112) | H | CN | H | H | H | H | C$_6$H$_5$ | H |
| 263 | General formula (112) | General formula (112) | CN | General formula (112) | F | H | C$_6$H$_5$ | H | H |
| 264 | General formula (112) | General formula (112) | CN | General formula (112) | F | H | H | C$_6$H$_5$ | H |
| 265 | General formula (112) | General formula (112) | CN | F | F | H | C$_6$H$_5$ | H | H |
| 266 | General formula (112) | General formula (112) | CN | F | F | H | H | C$_6$H$_5$ | H |
| 267 | General formula (112) | F | CN | General formula (112) | F | H | C$_6$H$_5$ | H | H |
| 268 | General formula (112) | F | CN | General formula (112) | F | H | H | C$_6$H$_5$ | H |
| 269 | General formula (112) | F | CN | F | General formula (112) | H | C$_6$H$_5$ | H | H |
| 270 | General formula (112) | F | CN | F | General formula (112) | H | H | C$_6$H$_5$ | H |
| 271 | General formula (112) | F | CN | F | F | H | C$_6$H$_5$ | H | H |
| 272 | General formula (112) | F | CN | F | F | H | H | C$_6$H$_5$ | H |
| 273 | General formula (112) | General formula (112) | CN | General formula (112) | OH | H | C$_6$H$_5$ | H | H |
| 274 | General formula (112) | General formula (112) | CN | General formula (112) | OH | H | H | C$_6$H$_5$ | H |
| 275 | General formula (112) | General formula (112) | CN | OH | OH | H | C$_6$H$_5$ | H | H |
| 276 | General formula (112) | General formula (112) | CN | OH | OH | H | H | C$_6$H$_5$ | H |
| 277 | General formula (112) | OH | CN | General formula (112) | OH | H | C$_6$H$_5$ | H | H |
| 278 | General formula (112) | OH | CN | General formula (112) | OH | H | H | C$_6$H$_5$ | H |
| 279 | General formula (112) | OH | CN | OH | General formula (112) | H | C$_6$H$_5$ | H | H |
| 280 | General formula (112) | OH | CN | OH | General formula (112) | H | H | C$_6$H$_5$ | H |
| 281 | General formula (112) | OH | CN | OH | OH | H | C$_6$H$_5$ | H | H |
| 282 | General formula (112) | OH | CN | OH | OH | H | H | C$_6$H$_5$ | H |
| 283 | General formula (112) | General formula (112) | CN | General formula (112) | Cl | H | C$_6$H$_5$ | H | H |
| 284 | General formula (112) | General formula (112) | CN | General formula (112) | Cl | H | H | C$_6$H$_5$ | H |
| 285 | General formula (112) | General formula (112) | CN | General formula (112) | F | H | C$_6$H$_5$ | H | H |
| 286 | General formula (112) | General formula (112) | CN | General formula (112) | F | H | H | C$_6$H$_5$ | H |
| 287 | General formula (112) | General formula (112) | CN | General formula (112) | CH$_3$O | H | C$_6$H$_5$ | H | H |
| 288 | General formula (112) | General formula (112) | CN | General formula (112) | CH$_3$O | H | H | C$_6$H$_5$ | H |
| 289 | General formula (112) | General formula (112) | CN | General formula (112) | C$_2$H$_3$O | H | C$_6$H$_5$ | H | H |
| 290 | General formula (112) | General formula (112) | CN | General formula (112) | C$_2$H$_3$O | H | H | C$_6$H$_5$ | H |
| 291 | General formula (112) | General formula (112) | CN | General formula (112) | C$_6$H$_5$O | H | C$_6$H$_5$ | H | H |
| 292 | General formula (112) | General formula (112) | CN | General formula (112) | C$_6$H$_5$O | H | H | C$_6$H$_5$ | H |
| 293 | General formula (112) | General formula (112) | CN | General formula (112) | Formula (121) | H | C$_6$H$_5$ | H | H |
| 294 | General formula (112) | General formula (112) | CN | General formula (112) | Formula (121) | H | H | C$_6$H$_5$ | H |

TABLE 1-5-continued

| Compound No. | General formula (1) | | | | | General formula (112) | | | |
|---|---|---|---|---|---|---|---|---|---|
| | $R^1$ | $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 295 | General formula (112) | General formula (112) | CN | General formula (112) | Formula (122) | H | $C_6H_5$ | H | H |
| 296 | General formula (112) | General formula (112) | CN | General formula (112) | Formula (122) | H | H | $C_6H_5$ | H |
| 297 | General formula (112) | General formula (112) | CN | General formula (112) | Formula (123) | H | $C_6H_5$ | H | H |
| 298 | General formula (112) | General formula (112) | CN | General formula (112) | Formula (123) | H | H | $C_6H_5$ | H |
| 299 | General formula (112) | General formula (112) | CN | General formula (112) | Formula (124) | H | $C_6H_5$ | H | H |
| 300 | General formula (112) | General formula (112) | CN | General formula (112) | Formula (124) | H | H | $C_6H_5$ | H |

TABLE 2-1

| Compound No. | General formula (1) | | | | | General formula (112) | | | |
|---|---|---|---|---|---|---|---|---|---|
| | $R^1$ | $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 301 | General formula (112) | CN | General formula (112) | General formula (112) | General formula (112) | H | H | H | H |
| 302 | General formula (112) | CN | General formula (112) | General formula (112) | General formula (112) | H | $CH_3$ | H | H |
| 303 | General formula (112) | CN | General formula (112) | General formula (112) | General formula (112) | H | $CH_3O$ | H | H |
| 304 | General formula (112) | CN | General formula (112) | General formula (112) | General formula (112) | H | H | $CH_3$ | H |
| 305 | General formula (112) | CN | General formula (112) | General formula (112) | General formula (112) | H | H | $CH_3O$ | H |
| 306 | General formula (112) | CN | General formula (112) | General formula (112) | General formula (112) | H | H | $t\text{-}C_4H_9$ | H |
| 307 | General formula (112) | CN | General formula (112) | General formula (112) | General formula (112) | H | H | Cl | H |
| 308 | General formula (112) | CN | General formula (112) | General formula (112) | General formula (112) | H | H | F | H |
| 309 | General formula (112) | CN | General formula (112) | General formula (112) | General formula (112) | H | H | H | $CH_3$ |
| 310 | General formula (112) | CN | General formula (112) | General formula (112) | General formula (112) | H | H | H | $CH_3O$ |
| 311 | General formula (112) | CN | General formula (112) | General formula (112) | H | H | H | H | H |
| 312 | General formula (112) | CN | General formula (112) | General formula (112) | H | H | H | $CH_3$ | H |
| 313 | General formula (112) | CN | General formula (112) | General formula (112) | H | H | H | $CH_3O$ | H |
| 314 | General formula (112) | CN | General formula (112) | H | General formula (112) | H | H | H | H |
| 315 | General formula (112) | CN | General formula (112) | H | General formula (112) | H | H | $CH_3$ | H |
| 316 | General formula (112) | CN | General formula (112) | H | General formula (112) | H | H | $CH_3O$ | H |
| 317 | General formula (112) | CN | H | General formula (112) | General formula (112) | H | H | H | H |
| 318 | General formula (112) | CN | H | General formula (112) | General formula (112) | H | H | $CH_3$ | H |
| 319 | General formula (112) | CN | H | General formula (112) | General formula (112) | H | H | $CH_3O$ | H |
| 320 | H | CN | General formula (112) | General formula (112) | General formula (112) | H | H | H | H |
| 321 | H | CN | General formula (112) | General formula (112) | General formula (112) | H | H | $CH_3$ | H |
| 322 | H | CN | General formula (112) | General formula (112) | General formula (112) | H | H | $CH_3O$ | H |
| 323 | General formula (112) | CN | General formula (112) | H | H | H | H | H | H |
| 324 | General formula (112) | CN | General formula (112) | H | H | H | H | $CH_3$ | H |
| 325 | General formula (112) | CN | General formula (112) | H | H | H | H | $CH_3O$ | H |
| 326 | General formula (112) | CN | H | General formula (112) | H | H | H | H | H |
| 327 | General formula (112) | CN | H | General formula (112) | H | H | H | $CH_3$ | H |

TABLE 2-1-continued

| Compound No. | General formula (1) | | | | | General formula (112) | | | |
|---|---|---|---|---|---|---|---|---|---|
| | $R^1$ | $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 328 | General formula (112) | CN | H | General formula (112) | H | H | H | CH$_3$O | H |
| 329 | H | CN | General formula (112) | General formula (112) | H | H | H | H | H |
| 330 | H | CN | General formula (112) | General formula (112) | H | H | H | CH$_3$ | H |
| 331 | H | CN | General formula (112) | General formula (112) | H | H | H | CH$_3$O | H |
| 332 | General formula (112) | CN | H | H | General formula (112) | H | H | H | H |
| 333 | General formula (112) | CN | H | H | General formula (112) | H | H | CH$_3$ | H |
| 334 | General formula (112) | CN | H | H | General formula (112) | H | H | CH$_3$O | H |
| 335 | H | CN | General formula (112) | H | General formula (112) | H | H | H | H |
| 336 | H | CN | General formula (112) | H | General formula (112) | H | H | CH$_3$ | H |
| 337 | H | CN | General formula (112) | H | General formula (112) | H | H | CH$_3$O | H |
| 338 | H | CN | H | General formula (112) | General formula (112) | H | H | H | H |
| 339 | H | CN | H | General formula (112) | General formula (112) | H | H | CH$_3$ | H |
| 340 | H | CN | H | General formula (112) | General formula (112) | H | H | CH$_3$O | H |
| 341 | General formula (112) | CN | H | H | H | H | H | H | H |
| 342 | General formula (112) | CN | H | H | H | H | H | CH$_3$ | H |
| 343 | General formula (112) | CN | H | H | H | H | H | CH$_3$O | H |
| 344 | H | CN | General formula (112) | H | H | H | H | H | H |
| 345 | H | CN | General formula (112) | H | H | H | H | CH$_3$ | H |
| 346 | H | CN | General formula (112) | H | H | H | H | CH$_3$O | H |
| 347 | H | CN | H | General formula (112) | H | H | H | H | H |
| 348 | H | CN | H | General formula (112) | H | H | H | CH$_3$ | H |
| 349 | H | CN | H | General formula (112) | H | H | H | CH$_3$O | H |
| 350 | General formula (112) | CN | General formula (112) | General formula (112) | F | H | H | H | H |
| 351 | General formula (112) | CN | General formula (112) | General formula (112) | F | H | H | CH$_3$ | H |
| 352 | General formula (112) | CN | General formula (112) | General formula (112) | F | H | H | CH$_3$O | H |
| 353 | General formula (112) | CN | General formula (112) | F | General formula (112) | H | H | H | H |
| 354 | General formula (112) | CN | General formula (112) | F | General formula (112) | H | H | CH$_3$ | H |
| 355 | General formula (112) | CN | General formula (112) | F | General formula (112) | H | H | CH$_3$O | H |
| 356 | General formula (112) | CN | F | General formula (112) | General formula (112) | H | H | H | H |
| 357 | General formula (112) | CN | F | General formula (112) | General formula (112) | H | H | CH$_3$ | H |
| 358 | General formula (112) | CN | F | General formula (112) | General formula (112) | H | H | CH$_3$O | H |
| 359 | F | CN | General formula (112) | General formula (112) | General formula (112) | H | H | H | H |
| 360 | F | CN | General formula (112) | General formula (112) | General formula (112) | H | H | CH$_3$ | H |

TABLE 2-2

| Compound No. | General formula (1) | | | | | General formula (112) | | | |
|---|---|---|---|---|---|---|---|---|---|
| | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 361 | F | CN | General formula (112) | General formula (112) | General formula (112) | H | H | CH$_3$O | H |
| 362 | General formula (112) | CN | General formula (112) | F | F | H | H | H | H |
| 363 | General formula (112) | CN | General formula (112) | F | F | H | H | CH$_3$ | H |
| 364 | General formula (112) | CN | General formula (112) | F | F | H | H | CH$_3$O | H |
| 365 | General formula (112) | CN | F | General formula (112) | F | H | H | H | H |
| 366 | General formula (112) | CN | F | General formula (112) | F | H | H | CH$_3$ | H |
| 367 | General formula (112) | CN | F | General formula (112) | F | H | H | CH$_3$O | H |
| 368 | F | CN | General formula (112) | General formula (112) | F | H | H | H | H |
| 369 | F | CN | General formula (112) | General formula (112) | F | H | H | CH$_3$ | H |
| 370 | F | CN | General formula (112) | General formula (112) | F | H | H | CH$_3$O | H |
| 371 | General formula (112) | CN | F | F | General formula (112) | H | H | H | H |
| 372 | General formula (112) | CN | F | F | General formula (112) | H | H | CH$_3$ | H |
| 373 | General formula (112) | CN | F | F | General formula (112) | H | H | CH$_3$O | H |
| 374 | F | CN | General formula (112) | F | General formula (112) | H | H | H | H |
| 375 | F | CN | General formula (112) | F | General formula (112) | H | H | CH$_3$ | H |
| 376 | F | CN | General formula (112) | F | General formula (112) | H | H | CH$_3$O | H |
| 377 | F | CN | F | General formula (112) | General formula (112) | H | H | H | H |
| 378 | F | CN | F | General formula (112) | General formula (112) | H | H | CH$_3$ | H |
| 379 | F | CN | F | General formula (112) | General formula (112) | H | H | CH$_3$O | H |
| 380 | General formula (112) | CN | F | F | F | H | H | H | H |
| 381 | General formula (112) | CN | F | F | F | H | H | CH$_3$ | H |
| 382 | General formula (112) | CN | F | F | F | H | H | CH$_3$O | H |
| 383 | F | CN | General formula (112) | F | F | H | H | H | H |
| 384 | F | CN | General formula (112) | F | F | H | H | CH$_3$ | H |
| 385 | F | CN | General formula (112) | F | F | H | H | CH$_3$O | H |
| 386 | F | CN | F | General formula (112) | F | H | H | H | H |
| 387 | F | CN | F | General formula (112) | F | H | H | CH$_3$ | H |
| 388 | F | CN | F | General formula (112) | F | H | H | CH$_3$O | H |
| 389 | General formula (112) | CN | General formula (112) | General formula (112) | OH | H | H | H | H |
| 390 | General formula (112) | CN | General formula (112) | General formula (112) | OH | H | H | CH$_3$ | H |
| 391 | General formula (112) | CN | General formula (112) | General formula (112) | OH | H | H | CH$_3$O | H |
| 392 | General formula (112) | CN | General formula (112) | OH | General formula (112) | H | H | H | H |
| 393 | General formula (112) | CN | General formula (112) | OH | General formula (112) | H | H | CH$_3$ | H |
| 394 | General formula (112) | CN | General formula (112) | OH | General formula (112) | H | H | CH$_3$O | H |
| 395 | General formula (112) | CN | General formula (112) | OH | General formula (112) | H | H | t-C$_4$H$_9$ | H |
| 396 | General formula (112) | CN | General formula (112) | OH | General formula (112) | H | H | Cl | H |
| 397 | General formula (112) | CN | General formula (112) | OH | General formula (112) | H | H | F | H |
| 398 | General formula (112) | CN | OH | General formula (112) | General formula (112) | H | H | H | H |

TABLE 2-2-continued

| Compound No. | General formula (1) | | | | | General formula (112) | | | |
|---|---|---|---|---|---|---|---|---|---|
| | $R^1$ | $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 399 | General formula (112) | CN | OH | General formula (112) | General formula (112) | H | H | $CH_3$ | H |
| 400 | General formula (112) | CN | OH | General formula (112) | General formula (112) | H | H | $CH_3O$ | H |
| 401 | OH | CN | General formula (112) | General formula (112) | General formula (112) | H | H | H | H |
| 402 | OH | CN | General formula (112) | General formula (112) | General formula (112) | H | H | $CH_3$ | H |
| 403 | OH | CN | General formula (112) | General formula (112) | General formula (112) | H | H | $CH_3O$ | H |
| 404 | General formula (112) | CN | General formula (112) | OH | OH | H | H | H | H |
| 405 | General formula (112) | CN | General formula (112) | OH | OH | H | H | $CH_3$ | H |
| 406 | General formula (112) | CN | General formula (112) | OH | OH | H | H | $CH_3O$ | H |
| 407 | General formula (112) | CN | OH | General formula (112) | OH | H | H | H | H |
| 408 | General formula (112) | CN | OH | General formula (112) | OH | H | H | $CH_3$ | H |
| 409 | General formula (112) | CN | OH | General formula (112) | OH | H | H | $CH_3O$ | H |
| 410 | OH | CN | General formula (112) | General formula (112) | OH | H | H | H | H |
| 411 | OH | CN | General formula (112) | General formula (112) | OH | H | H | $CH_3$ | H |
| 412 | OH | CN | General formula (112) | General formula (112) | OH | H | H | $CH_3O$ | H |
| 413 | General formula (112) | CN | OH | OH | General formula (112) | H | H | H | H |
| 414 | General formula (112) | CN | OH | OH | General formula (112) | H | H | $CH_3$ | H |
| 415 | General formula (112) | CN | OH | OH | General formula (112) | H | H | $CH_3O$ | H |
| 416 | OH | CN | General formula (112) | OH | General formula (112) | H | H | H | H |
| 417 | OH | CN | General formula (112) | OH | General formula (112) | H | H | $CH_3$ | H |
| 418 | OH | CN | General formula (112) | OH | General formula (112) | H | H | $CH_3O$ | H |
| 419 | OH | CN | OH | General formula (112) | General formula (112) | H | H | H | H |
| 420 | OH | CN | OH | General formula (112) | General formula (112) | H | H | $CH_3$ | H |
| 421 | OH | CN | OH | General formula (112) | General formula (112) | H | H | $CH_3O$ | H |
| 422 | General formula (112) | CN | OH | OH | OH | H | H | H | H |
| 423 | General formula (112) | CN | OH | OH | OH | H | H | $CH_3$ | H |
| 424 | General formula (112) | CN | OH | OH | OH | H | H | $CH_3O$ | H |
| 425 | OH | CN | General formula (112) | OH | OH | H | H | H | H |

TABLE 2-3

| Compound No. | General formula (1) | | | | | General formula (112) | | | |
|---|---|---|---|---|---|---|---|---|---|
| | $R^1$ | $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 426 | OH | CN | General formula (112) | OH | OH | H | H | $CH_3$ | H |
| 427 | OH | CN | General formula (112) | OH | OH | H | H | $CH_3O$ | H |
| 428 | OH | CN | OH | General formula (112) | OH | H | H | H | H |
| 429 | OH | CN | OH | General formula (112) | OH | H | H | $CH_3$ | H |
| 430 | OH | CN | OH | General formula (112) | OH | H | H | $CH_3O$ | H |
| 431 | OH | CN | OH | OH | General formula (112) | H | H | H | H |

TABLE 2-3-continued

| Compound No. | General formula (1) | | | | | General formula (112) | | | |
|---|---|---|---|---|---|---|---|---|---|
| | R¹ | R² | R³ | R⁴ | R⁵ | R³¹, R³⁸ | R³², R³⁷ | R³³, R³⁶ | R³⁴, R³⁵ |
| 432 | OH | CN | OH | OH | General formula (112) | H | H | CH₃ | H |
| 433 | OH | CN | OH | OH | General formula (112) | H | H | CH₃O | H |
| 434 | General formula (112) | CN | General formula (112) | Cl | General formula (112) | H | H | H | H |
| 435 | General formula (112) | CN | General formula (112) | Cl | General formula (112) | H | H | CH₃ | H |
| 436 | General formula (112) | CN | General formula (112) | Cl | General formula (112) | H | H | CH₃O | H |
| 437 | General formula (112) | CN | General formula (112) | Cl | General formula (112) | H | H | t-C₄H₉ | H |
| 438 | General formula (112) | CN | General formula (112) | Cl | General formula (112) | H | H | Cl | H |
| 439 | General formula (112) | CN | General formula (112) | Cl | General formula (112) | H | H | F | H |
| 440 | General formula (112) | CN | General formula (112) | F | General formula (112) | H | H | H | H |
| 441 | General formula (112) | CN | General formula (112) | F | General formula (112) | H | H | CH₃ | H |
| 442 | General formula (112) | CN | General formula (112) | F | General formula (112) | H | H | CH₃O | H |
| 443 | General formula (112) | CN | General formula (112) | F | General formula (112) | H | H | t-C₄H₉ | H |
| 444 | General formula (112) | CN | General formula (112) | F | General formula (112) | H | H | Cl | H |
| 445 | General formula (112) | CN | General formula (112) | F | General formula (112) | H | H | F | H |
| 446 | General formula (112) | CN | General formula (112) | CH₃O | General formula (112) | H | H | H | H |
| 447 | General formula (112) | CN | General formula (112) | CH₃O | General formula (112) | H | H | CH₃ | H |
| 448 | General formula (112) | CN | General formula (112) | CH₃O | General formula (112) | H | H | CH₃O | H |
| 449 | General formula (112) | CN | General formula (112) | CH₃O | General formula (112) | H | H | t-C₄H₉ | H |
| 450 | General formula (112) | CN | General formula (112) | CH₃O | General formula (112) | H | H | Cl | H |
| 451 | General formula (112) | CN | General formula (112) | CH₃O | General formula (112) | H | H | F | H |
| 452 | General formula (112) | CN | General formula (112) | C₂H₅O | General formula (112) | H | H | H | H |
| 453 | General formula (112) | CN | General formula (112) | C₂H₅O | General formula (112) | H | H | CH₃ | H |
| 454 | General formula (112) | CN | General formula (112) | C₂H₅O | General formula (112) | H | H | CH₃O | H |
| 455 | General formula (112) | CN | General formula (112) | C₂H₅O | General formula (112) | H | H | t-C₄H₉ | H |
| 456 | General formula (112) | CN | General formula (112) | C₂H₅O | General formula (112) | H | H | Cl | H |
| 457 | General formula (112) | CN | General formula (112) | C₂H₅O | General formula (112) | H | H | F | H |
| 458 | General formula (112) | CN | General formula (112) | C₆H₅O | General formula (112) | H | H | H | H |
| 459 | General formula (112) | CN | General formula (112) | C₆H₅O | General formula (112) | H | H | CH₃ | H |
| 460 | General formula (112) | CN | General formula (112) | C₆H₅O | General formula (112) | H | H | CH₃O | H |
| 461 | General formula (112) | CN | General formula (112) | C₆H₅O | General formula (112) | H | H | t-C₄H₉ | H |
| 462 | General formula (112) | CN | General formula (112) | C₆H₅O | General formula (112) | H | H | Cl | H |
| 463 | General formula (112) | CN | General formula (112) | C₆H₅O | General formula (112) | H | H | F | H |
| 464 | General formula (112) | CN | General formula (112) | Formula (121) | General formula (112) | H | H | H | H |
| 465 | General formula (112) | CN | General formula (112) | Formula (121) | General formula (112) | H | H | CH₃ | H |
| 466 | General formula (112) | CN | General formula (112) | Formula (121) | General formula (112) | H | H | CH₃O | H |
| 467 | General formula (112) | CN | General formula (112) | Formula (121) | General formula (112) | H | H | t-C₄H₉ | H |
| 468 | General formula (112) | CN | General formula (112) | Formula (121) | General formula (112) | H | H | Cl | H |
| 469 | General formula (112) | CN | General formula (112) | Formula (121) | General formula (112) | H | H | F | H |

TABLE 2-3-continued

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 470 | General formula (112) | CN | General formula (112) | Formula (122) | General formula (112) | H | H | H | H |
| 471 | General formula (112) | CN | General formula (112) | Formula (122) | General formula (112) | H | H | CH$_3$ | H |
| 472 | General formula (112) | CN | General formula (112) | Formula (122) | General formula (112) | H | H | CH$_3$O | H |
| 473 | General formula (112) | CN | General formula (112) | Formula (122) | General formula (112) | H | H | t-C$_4$H$_9$ | H |
| 474 | General formula (112) | CN | General formula (112) | Formula (122) | General formula (112) | H | H | Cl | H |
| 475 | General formula (112) | CN | General formula (112) | Formula (122) | General formula (112) | H | H | F | H |
| 476 | General formula (112) | CN | General formula (112) | Formula (123) | General formula (112) | H | H | H | H |
| 477 | General formula (112) | CN | General formula (112) | Formula (123) | General formula (112) | H | H | CH$_3$ | H |
| 478 | General formula (112) | CN | General formula (112) | Formula (123) | General formula (112) | H | H | CH$_3$O | H |
| 479 | General formula (112) | CN | General formula (112) | Formula (123) | General formula (112) | H | H | t-C$_4$H$_9$ | H |
| 480 | General formula (112) | CN | General formula (112) | Formula (123) | General formula (112) | H | H | Cl | H |
| 481 | General formula (112) | CN | General formula (112) | Formula (123) | General formula (112) | H | H | F | H |
| 482 | General formula (112) | CN | General formula (112) | Formula (124) | General formula (112) | H | H | H | H |
| 483 | General formula (112) | CN | General formula (112) | Formula (124) | General formula (112) | H | H | CH$_3$ | H |
| 484 | General formula (112) | CN | General formula (112) | Formula (124) | General formula (112) | H | H | CH$_3$O | H |
| 485 | General formula (112) | CN | General formula (112) | Formula (124) | General formula (112) | H | H | t-C$_4$H$_9$ | H |
| 486 | General formula (112) | CN | General formula (112) | Formula (124) | General formula (112) | H | H | Cl | H |
| 487 | General formula (112) | CN | General formula (112) | Formula (124) | General formula (112) | H | H | F | H |

TABLE 2-4

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 488 | General formula (112) | CN | General formula (112) | General formula (112) | General formula (112) | H | C$_6$H$_5$ | H | H |
| 489 | General formula (112) | CN | General formula (112) | General formula (112) | General formula (112) | H | H | C$_6$H$_5$ | H |
| 490 | General formula (112) | CN | General formula (112) | General formula (112) | H | H | C$_6$H$_5$ | H | H |
| 491 | General formula (112) | CN | General formula (112) | General formula (112) | H | H | H | C$_6$H$_5$ | H |
| 492 | General formula (112) | CN | General formula (112) | H | General formula (112) | H | C$_6$H$_5$ | H | H |
| 493 | General formula (112) | CN | General formula (112) | H | General formula (112) | H | H | C$_6$H$_5$ | H |
| 494 | General formula (112) | CN | H | General formula (112) | General formula (112) | H | C$_6$H$_5$ | H | H |
| 495 | General formula (112) | CN | H | General formula (112) | General formula (112) | H | H | C$_6$H$_5$ | H |
| 496 | H | CN | General formula (112) | General formula (112) | General formula (112) | H | C$_6$H$_5$ | H | H |
| 497 | H | CN | General formula (112) | General formula (112) | General formula (112) | H | H | C$_6$H$_5$ | H |
| 498 | General formula (112) | CN | General formula (112) | H | H | H | C$_6$H$_5$ | H | H |
| 499 | General formula (112) | CN | General formula (112) | H | H | H | H | C$_6$H$_5$ | H |
| 500-1 | General formula (112) | CN | H | General formula (112) | H | H | C$_6$H$_5$ | H | H |
| 500-2 | General formula (112) | CN | H | General formula (112) | H | H | H | C$_6$H$_5$ | H |
| 500-3 | H | CN | General formula (112) | General formula (112) | H | H | C$_6$H$_5$ | H | H |

TABLE 2-4-continued

| Compound No. | General formula (1) | | | | | General formula (112) | | | |
|---|---|---|---|---|---|---|---|---|---|
| | $R^1$ | $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 500-4 | H | CN | General formula (112) | General formula (112) | H | H | H | $C_6H_5$ | H |
| 500-5 | General formula (112) | CN | H | H | General formula (112) | H | $C_6H_5$ | H | H |
| 500-6 | General formula (112) | CN | H | H | General formula (112) | H | H | $C_6H_5$ | H |
| 500-7 | H | CN | General formula (112) | H | General formula (112) | H | $C_6H_5$ | H | H |
| 500-8 | H | CN | General formula (112) | H | General formula (112) | H | H | $C_6H_5$ | H |
| 500-9 | H | CN | H | General formula (112) | General formula (112) | H | $C_6H_5$ | H | H |
| 500-10 | H | CN | H | General formula (112) | General formula (112) | H | H | $C_6H_5$ | H |
| 500-11 | General formula (112) | CN | H | H | H | H | $C_6H_5$ | H | H |
| 500-12 | General formula (112) | CN | H | H | H | H | H | $C_6H_5$ | H |
| 500-13 | H | CN | General formula (112) | H | H | H | $C_6H_5$ | H | H |
| 500-14 | H | CN | General formula (112) | H | H | H | H | $C_6H_5$ | H |
| 500-15 | H | CN | H | General formula (112) | H | H | $C_6H_5$ | H | H |
| 500-16 | H | CN | H | General formula (112) | H | H | H | $C_6H_5$ | H |
| 500-17 | General formula (112) | CN | General formula (112) | General formula (112) | F | H | H | $C_6H_5$ | H |
| 500-18 | General formula (112) | CN | General formula (112) | F | General formula (112) | H | H | $C_6H_5$ | H |
| 500-19 | General formula (112) | CN | F | General formula (112) | General formula (112) | H | H | $C_6H_5$ | H |
| 500-20 | F | CN | General formula (112) | General formula (112) | General formula (112) | H | H | $C_6H_5$ | H |
| 500-21 | General formula (112) | CN | General formula (112) | F | F | H | H | $C_6H_5$ | H |
| 500-22 | General formula (112) | CN | F | General formula (112) | F | H | H | $C_6H_5$ | H |
| 500-23 | F | CN | General formula (112) | General formula (112) | F | H | H | $C_6H_5$ | H |
| 500-24 | General formula (112) | CN | F | F | General formula (112) | H | H | $C_6H_5$ | H |
| 500-25 | F | CN | General formula (112) | F | General formula (112) | H | H | $C_6H_5$ | H |
| 500-26 | F | CN | F | General formula (112) | General formula (112) | H | H | $C_6H_5$ | H |
| 500-27 | General formula (112) | CN | F | F | F | H | H | $C_6H_5$ | H |
| 500-28 | F | CN | General formula (112) | F | F | H | H | $C_6H_5$ | H |
| 500-29 | F | CN | F | General formula (112) | F | H | H | $C_6H_5$ | H |
| 500-30 | General formula (112) | CN | General formula (112) | General formula (112) | OH | H | H | $C_6H_5$ | H |
| 500-31 | General formula (112) | CN | General formula (112) | OH | General formula (112) | H | H | $C_6H_5$ | H |
| 500-32 | General formula (112) | CN | OH | General formula (112) | General formula (112) | H | H | $C_6H_5$ | H |
| 500-33 | OH | CN | General formula (112) | General formula (112) | General formula (112) | H | H | $C_6H_5$ | H |
| 500-34 | General formula (112) | CN | General formula (112) | OH | OH | H | H | $C_6H_5$ | H |
| 500-35 | General formula (112) | CN | OH | General formula (112) | OH | H | H | $C_6H_5$ | H |
| 500-36 | OH | CN | General formula (112) | General formula (112) | OH | H | H | $C_6H_5$ | H |
| 500-37 | General formula (112) | CN | OH | OH | General formula (112) | H | H | $C_6H_5$ | H |
| 500-38 | OH | CN | General formula (112) | OH | General formula (112) | H | H | $C_6H_5$ | H |
| 500-39 | OH | CN | OH | General formula (112) | General formula (112) | H | H | $C_6H_5$ | H |
| 500-40 | General formula (112) | CN | OH | OH | OH | H | H | $C_6H_5$ | H |
| 500-41 | OH | CN | General formula (112) | OH | OH | H | H | $C_6H_5$ | H |

TABLE 2-4-continued

| Compound No. | General formula (1) R¹ | R² | R³ | R⁴ | R⁵ | General formula (112) $R^{31}, R^{38}$ | $R^{32}, R^{37}$ | $R^{33}, R^{36}$ | $R^{34}, R^{35}$ |
|---|---|---|---|---|---|---|---|---|---|
| 500-42 | OH | CN | OH | General formula (112) | OH | H | H | $C_6H_5$ | H |
| 500-43 | OH | CN | OH | OH | General formula (112) | H | H | $C_6H_5$ | H |
| 500-44 | General formula (112) | CN | General formula (112) | Cl | General formula (112) | H | H | $C_6H_5$ | H |
| 500-45 | General formula (112) | CN | General formula (112) | F | General formula (112) | H | H | $C_6H_5$ | H |
| 500-46 | General formula (112) | CN | General formula (112) | $CH_3O$ | General formula (112) | H | H | $C_6H_5$ | H |
| 500-47 | General formula (112) | CN | General formula (112) | $C_2H_5O$ | General formula (112) | H | H | $C_6H_5$ | H |
| 500-48 | General formula (112) | CN | General formula (112) | $C_6H_5O$ | General formula (112) | H | H | $C_6H_5$ | H |
| 500-49 | General formula (112) | CN | General formula (112) | Formula (121) | General formula (112) | H | H | $C_6H_5$ | H |
| 500-50 | General formula (112) | CN | General formula (112) | Formula (122) | General formula (112) | H | H | $C_6H_5$ | H |
| 500-51 | General formula (112) | CN | General formula (112) | Formula (123) | General formula (112) | H | H | $C_6H_5$ | H |
| 500-52 | General formula (112) | CN | General formula (112) | Formula (124) | General formula (112) | H | H | $C_6H_5$ | H |

TABLE 3-1

| Compound No. | General formula (1) R¹ | R² | R³ | R⁴ | R⁵ | General formula (112) $R^{31}, R^{38}$ | $R^{32}, R^{37}$ | $R^{33}, R^{36}$ | $R^{34}, R^{35}$ |
|---|---|---|---|---|---|---|---|---|---|
| 501 | CN | General formula (112) | General formula (112) | General formula (112) | General formula (112) | H | H | H | H |
| 502 | CN | General formula (112) | General formula (112) | General formula (112) | General formula (112) | H | $CH_3$ | H | H |
| 503 | CN | General formula (112) | General formula (112) | General formula (112) | General formula (112) | H | $CH_3O$ | H | H |
| 504 | CN | General formula (112) | General formula (112) | General formula (112) | General formula (112) | H | H | $CH_3$ | H |
| 505 | CN | General formula (112) | General formula (112) | General formula (112) | General formula (112) | H | H | $CH_3O$ | H |
| 506 | CN | General formula (112) | General formula (112) | General formula (112) | General formula (112) | H | H | $t\text{-}C_4H_9$ | H |
| 507 | CN | General formula (112) | General formula (112) | General formula (112) | General formula (112) | H | H | Cl | H |
| 508 | CN | General formula (112) | General formula (112) | General formula (112) | General formula (112) | H | H | F | H |
| 509 | CN | General formula (112) | General formula (112) | General formula (112) | General formula (112) | H | H | H | $CH_3$ |
| 510 | CN | General formula (112) | General formula (112) | General formula (112) | General formula (112) | H | H | H | $CH_3O$ |
| 511 | CN | General formula (112) | General formula (112) | General formula (112) | H | H | H | H | H |
| 512 | CN | General formula (112) | General formula (112) | General formula (112) | H | H | H | $CH_3$ | H |
| 513 | CN | General formula (112) | General formula (112) | General formula (112) | H | H | H | $CH_3O$ | H |
| 514 | CN | General formula (112) | General formula (112) | H | General formula (112) | H | H | H | H |
| 515 | CN | General formula (112) | General formula (112) | H | General formula (112) | H | H | $CH_3$ | H |
| 516 | CN | General formula (112) | General formula (112) | H | General formula (112) | H | H | $CH_3O$ | H |
| 517 | CN | General formula (112) | General formula (112) | H | H | H | H | H | H |
| 518 | CN | General formula (112) | General formula (112) | H | H | H | H | $CH_3$ | H |
| 519 | CN | General formula (112) | General formula (112) | H | H | H | H | $CH_3O$ | H |
| 520 | CN | General formula (112) | H | General formula (112) | H | H | H | H | H |
| 521 | CN | General formula (112) | H | General formula (112) | H | H | H | $CH_3$ | H |
| 522 | CN | General formula (112) | H | General formula (112) | H | H | H | $CH_3O$ | H |

TABLE 3-1-continued

| Compound No. | \multicolumn{5}{c|}{General formula (1)} | \multicolumn{4}{c|}{General formula (112)} |
| --- | --- | --- | --- | --- | --- | --- | --- | --- | --- |
| | $R^1$ | $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 523 | CN | H | General formula (112) | General formula (112) | H | H | H | H | H |
| 524 | CN | H | General formula (112) | General formula (112) | H | H | H | $CH_3$ | H |
| 525 | CN | H | General formula (112) | General formula (112) | H | H | H | $CH_3O$ | H |
| 526 | CN | General formula (112) | H | H | General formula (112) | H | H | H | H |
| 527 | CN | General formula (112) | H | H | General formula (112) | H | H | $CH_3$ | H |
| 528 | CN | General formula (112) | H | H | General formula (112) | H | H | $CH_3O$ | H |
| 529 | CN | General formula (112) | H | H | H | H | H | H | H |
| 530 | CN | General formula (112) | H | H | H | H | H | $CH_3$ | H |
| 531 | CN | General formula (112) | H | H | H | H | H | $CH_3O$ | H |
| 532 | CN | H | General formula (112) | H | H | H | H | H | H |
| 533 | CN | H | General formula (112) | H | H | H | H | $CH_3$ | H |
| 534 | CN | H | General formula (112) | H | H | H | H | $CH_3O$ | H |
| 535 | CN | General formula (112) | General formula (112) | F | H | H | H | H | H |
| 536 | CN | General formula (112) | General formula (112) | General formula (112) | F | H | H | $CH_3$ | H |
| 537 | CN | General formula (112) | General formula (112) | General formula (112) | F | H | H | $CH_3O$ | H |
| 538 | CN | General formula (112) | General formula (112) | F | General formula (112) | H | H | H | H |
| 539 | CN | General formula (112) | General formula (112) | F | General formula (112) | H | H | $CH_3$ | H |
| 540 | CN | General formula (112) | General formula (112) | F | General formula (112) | H | H | $CH_3O$ | H |
| 541 | CN | General formula (112) | General formula (112) | F | F | H | H | H | H |
| 542 | CN | General formula (112) | General formula (112) | F | F | H | H | $CH_3$ | H |
| 543 | CN | General formula (112) | General formula (112) | F | F | H | H | $CH_3O$ | H |
| 544 | CN | General formula (112) | F | General formula (112) | F | H | H | H | H |
| 545 | CN | General formula (112) | F | General formula (112) | F | H | H | $CH_3$ | H |
| 546 | CN | General formula (112) | F | General formula (112) | F | H | H | $CH_3O$ | H |
| 547 | CN | F | General formula (112) | General formula (112) | F | H | H | H | H |
| 548 | CN | F | General formula (112) | General formula (112) | F | H | H | $CH_3$ | H |
| 549 | CN | F | General formula (112) | General formula (112) | F | H | H | $CH_3O$ | H |
| 550 | CN | General formula (112) | F | F | General formula (112) | H | H | H | H |
| 551 | CN | General formula (112) | F | F | General formula (112) | H | H | $CH_3$ | H |
| 552 | CN | General formula (112) | F | F | General formula (112) | H | H | $CH_3O$ | H |
| 553 | CN | General formula (112) | F | F | F | H | H | H | H |
| 554 | CN | General formula (112) | F | F | F | H | H | $CH_3$ | H |
| 555 | CN | General formula (112) | F | F | F | H | H | $CH_3O$ | H |
| 556 | CN | F | General formula (112) | F | F | H | H | H | H |
| 557 | CN | F | General formula (112) | F | F | H | H | $CH_3$ | H |
| 558 | CN | F | General formula (112) | F | F | H | H | $CH_3O$ | H |

TABLE 3-2

| Compound No. | General formula (1) | | | | | General formula (112) | | | |
|---|---|---|---|---|---|---|---|---|---|
| | $R^1$ | $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 559 | CN | General formula (112) | General formula (112) | General formula (112) | OH | H | H | H | H |
| 560 | CN | General formula (112) | General formula (112) | General formula (112) | OH | H | H | $CH_3$ | H |
| 561 | CN | General formula (112) | General formula (112) | General formula (112) | OH | H | H | $CH_3O$ | H |
| 562 | CN | General formula (112) | General formula (112) | OH | General formula (112) | H | H | H | H |
| 563 | CN | General formula (112) | General formula (112) | OH | General formula (112) | H | H | $CH_3$ | H |
| 654 | CN | General formula (112) | General formula (112) | OH | General formula (112) | H | H | $CH_3O$ | H |
| 565 | CN | General formula (112) | General formula (112) | OH | General formula (112) | H | H | Cl | H |
| 566 | CN | General formula (112) | General formula (112) | OH | General formula (112) | H | H | F | H |
| 567 | CN | General formula (112) | General formula (112) | OH | OH | H | H | H | H |
| 568 | CN | General formula (112) | General formula (112) | OH | OH | H | H | $CH_3$ | H |
| 569 | CN | General formula (112) | General formula (112) | OH | OH | H | H | $CH_3O$ | H |
| 570 | CN | General formula (112) | OH | General formula (112) | OH | H | H | H | H |
| 571 | CN | General formula (112) | OH | General formula (112) | OH | H | H | $CH_3$ | H |
| 572 | CN | General formula (112) | OH | General formula (112) | OH | H | H | $CH_3O$ | H |
| 573 | CN | OH | General formula (112) | General formula (112) | OH | H | H | H | H |
| 574 | CN | OH | General formula (112) | General formula (112) | OH | H | H | $CH_3$ | H |
| 575 | CN | OH | General formula (112) | General formula (112) | OH | H | H | $CH_3O$ | H |
| 576 | CN | General formula (112) | OH | OH | General formula (112) | H | H | H | H |
| 577 | CN | General formula (112) | OH | OH | General formula (112) | H | H | $CH_3$ | H |
| 578 | CN | General formula (112) | OH | OH | General formula (112) | H | H | $CH_3O$ | H |
| 579 | CN | General formula (112) | OH | OH | OH | H | H | H | H |
| 580 | CN | General formula (112) | OH | OH | OH | H | H | $CH_3$ | H |
| 581 | CN | General formula (112) | OH | OH | OH | H | H | $CH_3O$ | H |
| 582 | CN | OH | General formula (112) | OH | OH | H | H | H | H |
| 583 | CN | OH | General formula (112) | OH | OH | H | H | $CH_3$ | H |
| 584 | CN | OH | General formula (112) | OH | OH | H | H | $CH_3O$ | H |
| 585 | CN | General formula (112) | General formula (112) | Cl | General formula (112) | H | H | H | H |
| 586 | CN | General formula (112) | General formula (112) | Cl | General formula (112) | H | H | $CH_3$ | H |
| 587 | CN | General formula (112) | General formula (112) | Cl | General formula (112) | H | H | $CH_3O$ | H |
| 588 | CN | General formula (112) | General formula (112) | Cl | General formula (112) | H | H | $t-C_4H_9$ | H |
| 589 | CN | General formula (112) | General formula (112) | Cl | General formula (112) | H | H | Cl | H |
| 590 | CN | General formula (112) | General formula (112) | Cl | General formula (112) | H | H | F | H |
| 591 | CN | General formula (112) | General formula (112) | F | General formula (112) | H | H | H | H |
| 592 | CN | General formula (112) | General formula (112) | F | General formula (112) | H | H | $CH_3$ | H |
| 593 | CN | General formula (112) | General formula (112) | F | General formula (112) | H | H | $CH_3O$ | H |
| 594 | CN | General formula (112) | General formula (112) | F | General formula (112) | H | H | $t-C_4H_9$ | H |
| 595 | CN | General formula (112) | General formula (112) | F | General formula (112) | H | H | Cl | H |
| 596 | CN | General formula (112) | General formula (112) | F | General formula (112) | H | H | F | H |

TABLE 3-2-continued

| | General formula (1) | | | | General formula (112) | | | |
|---|---|---|---|---|---|---|---|---|
| Compound No. | $R^1$ | $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 597 | CN | General formula (112) | General formula (112) | $CH_3O$ | General formula (112) | H | H | H | H |
| 598 | CN | General formula (112) | General formula (112) | $CH_3O$ | General formula (112) | H | H | $CH_3$ | H |
| 599 | CN | General formula (112) | General formula (112) | $CH_3O$ | General formula (112) | H | H | $CH_3O$ | H |
| 600 | CN | General formula (112) | General formula (112) | $CH_3O$ | General formula (112) | H | H | $t-C_4H_9$ | H |
| 601 | CN | General formula (112) | General formula (112) | $CH_3O$ | General formula (112) | H | H | Cl | H |
| 602 | CN | General formula (112) | General formula (112) | $CH_3O$ | General formula (112) | H | H | F | H |
| 603 | CN | General formula (112) | General formula (112) | $C_2H_5O$ | General formula (112) | H | H | H | H |
| 604 | CN | General formula (112) | General formula (112) | $C_2H_5O$ | General formula (112) | H | H | $CH_3$ | H |
| 605 | CN | General formula (112) | General formula (112) | $C_2H_5O$ | General formula (112) | H | H | $CH_3O$ | H |
| 606 | CN | General formula (112) | General formula (112) | $C_2H_5O$ | General formula (112) | H | H | $t-C_4H_9$ | H |
| 607 | CN | General formula (112) | General formula (112) | $C_2H_5O$ | General formula (112) | H | H | Cl | H |
| 608 | CN | General formula (112) | General formula (112) | $C_2H_5O$ | General formula (112) | H | H | F | H |
| 609 | CN | General formula (112) | General formula (112) | $C_6H_5O$ | General formula (112) | H | H | H | H |
| 610 | CN | General formula (112) | General formula (112) | $C_6H_5O$ | General formula (112) | H | H | $CH_3$ | H |
| 611 | CN | General formula (112) | General formula (112) | $C_6H_5O$ | General formula (112) | H | H | $CH_3O$ | H |
| 612 | CN | General formula (112) | General formula (112) | $C_6H_5O$ | General formula (112) | H | H | $t-C_4H_9$ | H |
| 613 | CN | General formula (112) | General formula (112) | $C_6H_5O$ | General formula (112) | H | H | Cl | H |
| 614 | CN | General formula (112) | General formula (112) | $C_6H_5O$ | General formula (112) | H | H | F | H |
| 615 | CN | General formula (112) | General formula (112) | formula (121) | General formula (112) | H | H | H | H |
| 616 | CN | General formula (112) | General formula (112) | formula (121) | General formula (112) | H | H | $CH_3$ | H |
| 617 | CN | General formula (112) | General formula (112) | formula (121) | General formula (112) | H | H | $CH_3O$ | H |
| 618 | CN | General formula (112) | General formula (112) | formula (121) | General formula (112) | H | H | $t-C_4H_9$ | H |
| 619 | CN | General formula (112) | General formula (112) | formula (121) | General formula (112) | H | H | Cl | H |
| 620 | CN | General formula (112) | General formula (112) | formula (121) | General formula (112) | H | H | F | H |

TABLE 3-3

| | General formula (1) | | | | General formula (112) | | | |
|---|---|---|---|---|---|---|---|---|
| Compound No. | $R^1$ | $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 621 | CN | General formula (112) | General formula (112) | formula (122) | General formula (112) | H | H | H | H |
| 622 | CN | General formula (112) | General formula (112) | formula (122) | General formula (112) | H | H | $CH_3$ | H |
| 623 | CN | General formula (112) | General formula (112) | formula (122) | General formula (112) | H | H | $CH_3O$ | H |
| 624 | CN | General formula (112) | General formula (112) | formula (122) | General formula (112) | H | H | $t-C_4H_9$ | H |
| 625 | CN | General formula (112) | General formula (112) | formula (122) | General formula (112) | H | H | Cl | H |
| 626 | CN | General formula (112) | General formula (112) | formula (122) | General formula (112) | H | H | F | H |
| 627 | CN | General formula (112) | General formula (112) | formula (123) | General formula (112) | H | H | H | H |
| 628 | CN | General formula (112) | General formula (112) | formula (123) | General formula (112) | H | H | $CH_3$ | H |
| 629 | CN | General formula (112) | General formula (112) | formula (123) | General formula (112) | H | H | $CH_3O$ | H |

TABLE 3-3-continued

| | | General formula (1) | | | | General formula (112) | | |
|---|---|---|---|---|---|---|---|---|
| Compound No. | R$^1$ | R$^2$ | R$^3$ | R$^4$ | R$^5$ | R$^{31}$, R$^{38}$ | R$^{32}$, R$^{37}$ | R$^{33}$, R$^{36}$ | R$^{34}$, R$^{35}$ |
| 630 | CN | General formula (112) | General formula (112) | formula (123) | General formula (112) | H | H | t-C$_4$H$_9$ | H |
| 631 | CN | General formula (112) | General formula (112) | formula (123) | General formula (112) | H | H | Cl | H |
| 632 | CN | General formula (112) | General formula (112) | formula (123) | General formula (112) | H | H | F | H |
| 633 | CN | General formula (112) | General formula (112) | formula (124) | General formula (112) | H | H | H | H |
| 634 | CN | General formula (112) | General formula (112) | formula (124) | General formula (112) | H | H | CH$_3$ | H |
| 635 | CN | General formula (112) | General formula (112) | formula (124) | General formula (112) | H | H | CH$_3$O | H |
| 636 | CN | General formula (112) | General formula (112) | Formula (124) | General formula (112) | H | H | t-C$_4$H$_9$ | H |
| 637 | CN | General formula (112) | General formula (112) | Formula (124) | General formula (112) | H | H | Cl | H |
| 638 | CN | General formula (112) | General formula (112) | Formula (124) | General formula (112) | H | H | F | H |
| 639 | CN | General formula (112) | General formula (112) | General formula (112) | General formula (112) | H | C$_6$H$_5$ | H | H |
| 640 | CN | General formula (112) | General formula (112) | General formula (112) | General formula (112) | H | H | C$_6$H$_5$ | H |
| 641 | CN | General formula (112) | General formula (112) | General formula (112) | H | H | C$_6$H$_5$ | H | H |
| 642 | CN | General formula (112) | General formula (112) | General formula (112) | H | H | H | C$_6$H$_5$ | H |
| 643 | CN | General formula (112) | General formula (112) | H | General formula (112) | H | C$_6$H$_5$ | H | H |
| 644 | CN | General formula (112) | General formula (112) | H | General formula (112) | H | H | C$_6$H$_5$ | H |
| 645 | CN | General formula (112) | General formula (112) | H | H | H | C$_6$H$_5$ | H | H |
| 646 | CN | General formula (112) | General formula (112) | H | H | H | H | C$_6$H$_5$ | H |
| 647 | CN | General formula (112) | H | General formula (112) | H | H | C$_6$H$_5$ | H | H |
| 648 | CN | General formula (112) | H | General formula (112) | H | H | H | C$_6$H$_5$ | H |
| 649 | CN | H | General formula (112) | General formula (112) | H | H | C$_6$H$_5$ | H | H |
| 650 | CN | H | General formula (112) | General formula (112) | H | H | H | C$_6$H$_5$ | H |
| 651 | CN | H | H | General formula (112) | General formula (112) | H | C$_6$H$_5$ | H | H |
| 652 | CN | H | H | General formula (112) | General formula (112) | H | H | C$_6$H$_5$ | H |
| 653 | CN | General formula (112) | H | H | H | H | C$_6$H$_5$ | H | H |
| 654 | CN | General formula (112) | H | H | H | H | H | C$_6$H$_5$ | H |
| 655 | CN | H | General formula (112) | H | H | H | C$_6$H$_5$ | H | H |
| 656 | CN | H | General formula (112) | H | H | H | H | C$_6$H$_5$ | H |
| 657 | CN | General formula (112) | General formula (112) | General formula (112) | F | H | H | C$_6$H$_5$ | H |
| 658 | CN | General formula (112) | General formula (112) | F | General formula (112) | H | H | C$_6$H$_5$ | H |
| 659 | CN | General formula (112) | General formula (112) | F | F | H | H | C$_6$H$_5$ | H |
| 660 | CN | General formula (112) | F | General formula (112) | F | H | H | C$_6$H$_5$ | H |
| 661 | CN | F | General formula (112) | General formula (112) | F | H | H | C$_6$H$_5$ | H |
| 662 | CN | F | F | General formula (112) | General formula (112) | H | H | C$_6$H$_5$ | H |
| 663 | CN | General formula (112) | F | F | F | H | H | C$_6$H$_5$ | H |
| 664 | CN | F | General formula (112) | F | F | H | H | C$_6$H$_5$ | H |
| 665 | CN | General formula (112) | General formula (112) | General formula (112) | OH | H | H | C$_6$H$_5$ | H |
| 666 | CN | General formula (112) | General formula (112) | OH | General formula (112) | H | H | C$_6$H$_5$ | H |
| 667 | CN | General formula (112) | General formula (112) | OH | OH | H | H | C$_6$H$_5$ | H |

TABLE 3-3-continued

| | General formula (1) | | | | General formula (112) | | | |
|---|---|---|---|---|---|---|---|---|
| Compound No. | $R^1$ $R^2$ | $R^3$ | $R^4$ | $R^5$ | $R^{31}, R^{38}$ | $R^{32}, R^{37}$ | $R^{33}, R^{36}$ | $R^{34}, R^{35}$ |
| 668 | CN General formula (112) | OH | General formula (112) | OH | H | H | $C_6H_5$ | H |
| 669 | CN OH | General formula (112) | General formula (112) | OH | H | H | $C_6H_5$ | H |
| 670 | CN OH | OH | General formula (112) | General formula (112) | H | H | $C_6H_5$ | H |
| 671 | CN General formula (112) | OH | OH | OH | H | H | $C_6H_5$ | H |
| 672 | CN OH | General formula (112) | OH | OH | H | H | $C_6H_5$ | H |
| 673 | CN General formula (112) | General formula (112) | Cl | General formula (112) | H | H | $C_6H_5$ | H |
| 674 | CN General formula (112) | General formula (112) | F | General formula (112) | H | H | $C_6H_5$ | H |
| 675 | CN General formula (112) | General formula (112) | $CH_3O$ | General formula (112) | H | H | $C_6H_5$ | H |
| 676 | CN General formula (112) | General formula (112) | $C_2H_5O$ | General formula (112) | H | H | $C_6H_5$ | H |
| 677 | CN General formula (112) | General formula (112) | $C_6H_5O$ | General formula (112) | H | H | $C_6H_5$ | H |
| 678 | CN General formula (112) | General formula (112) | Formula (121) | General formula (112) | H | H | $C_6H_5$ | H |
| 679 | CN General formula (112) | General formula (112) | Formula (122) | General formula (112) | H | H | $C_6H_5$ | H |
| 680 | CN General formula (112) | General formula (112) | Formula (123) | General formula (112) | H | H | $C_6H_5$ | H |
| 681 | CN General formula (112) | General formula (112) | Formula (124) | General formula (112) | H | H | $C_6H_5$ | H |

TABLE 4-1

| | General formula (1) | | | | | General formula (113) | |
|---|---|---|---|---|---|---|---|
| Compound No. | $R^1$ | $R^2$ | $R^3$ | $R^4$ | $R^5$ | $R^{41}$ | $R^{42}$ |
| 701 | General formula (113) | General formula (113) | CN | General formula (113) | General formula (113) | H | H |
| 702 | General formula (113) | General formula (113) | CN | General formula (113) | General formula (113) | H | $CH_3$ |
| 703 | General formula (113) | General formula (113) | CN | General formula (113) | General formula (113) | H | $CH_3O$ |
| 704 | General formula (113) | General formula (113) | CN | General formula (113) | General formula (113) | H | H |
| 705 | General formula (113) | General formula (113) | CN | General formula (113) | General formula (113) | H | H |
| 706 | General formula (113) | General formula (113) | CN | General formula (113) | General formula (113) | H | H |
| 707 | General formula (113) | General formula (113) | CN | General formula (113) | General formula (113) | H | H |
| 708 | General formula (113) | General formula (113) | CN | General formula (113) | General formula (113) | H | H |
| 709 | General formula (113) | General formula (113) | CN | General formula (113) | General formula (113) | H | H |
| 710 | General formula (113) | General formula (113) | CN | General formula (113) | General formula (113) | H | H |
| 711 | General formula (113) | General formula (113) | CN | General formula (113) | General formula (113) | H | H |
| 712 | General formula (113) | General formula (113) | CN | General formula (113) | General formula (113) | H | H |
| 713 | General formula (113) | General formula (113) | CN | General formula (113) | General formula (113) | H | H |
| 714 | General formula (113) | General formula (113) | CN | General formula (113) | General formula (113) | H | H |
| 715 | General formula (113) | General formula (113) | CN | General formula (113) | General formula (113) | H | H |
| 716 | General formula (113) | General formula (113) | CN | General formula (113) | General formula (113) | H | H |
| 717 | General formula (113) | General formula (113) | CN | General formula (113) | General formula (113) | H | H |
| 718 | General formula (113) | General formula (113) | CN | General formula (113) | General formula (113) | H | H |

TABLE 4-1-continued

| | | | | | | | |
|---|---|---|---|---|---|---|---|
| 719 | General formula (113) | General formula (113) | CN | General formula (113) | General formula (113) | H | H |
| 720 | General formula (113) | General formula (113) | CN | General formula (113) | General formula (113) | H | H |
| 721 | General formula (113) | General formula (113) | CN | General formula (113) | General formula (113) | H | H |
| 722 | General formula (113) | General formula (113) | CN | General formula (113) | General formula (113) | H | H |
| 723 | General formula (113) | General formula (113) | CN | General formula (113) | General formula (113) | H | H |
| 724 | General formula (113) | General formula (113) | CN | General formula (113) | General formula (113) | H | H |
| 725 | General formula (113) | General formula (113) | CN | General formula (113) | General formula (113) | H | H |
| 726 | General formula (113) | General formula (113) | CN | General formula (113) | General formula (113) | H | H |
| 727 | General formula (113) | General formula (113) | CN | General formula (113) | General formula (113) | H | H |
| 728 | General formula (113) | General formula (113) | CN | General formula (113) | General formula (113) | H | H |
| 729 | General formula (113) | General formula (113) | CN | General formula (113) | General formula (113) | H | H |
| 730 | General formula (113) | General formula (113) | CN | General formula (113) | General formula (113) | H | H |
| 731 | General formula (113) | General formula (113) | CN | General formula (113) | General formula (113) | H | H |
| 732 | General formula (113) | General formula (113) | CN | General formula (113) | General formula (113) | H | H |
| 733 | General formula (113) | General formula (113) | CN | General formula (113) | General formula (113) | H | H |
| 734 | General formula (113) | General formula (113) | CN | General formula (113) | General formula (113) | H | H |
| 735 | General formula (113) | General formula (113) | CN | General formula (113) | H | H | H |
| 736 | General formula (113) | General formula (113) | CN | H | General formula (113) | H | H |
| 737 | General formula (113) | General formula (113) | CN | H | H | H | H |
| 738 | General formula (113) | H | CN | General formula (113) | H | H | H |
| 739 | H | General formula (113) | CN | General formula (113) | H | H | H |
| 740 | General formula (113) | H | CN | H | H | H | H |
| 741 | General formula (113) | General formula (113) | CN | General formula (113) | F | H | H |
| 742 | General formula (113) | General formula (113) | CN | F | General formula (113) | H | H |
| 743 | General formula (113) | General formula (113) | CN | F | F | H | H |
| 744 | General formula (113) | F | CN | General formula (113) | F | H | H |
| 745 | F | General formula (113) | CN | General formula (113) | F | H | H |
| 746 | General formula (113) | F | CN | F | F | H | H |
| 747 | General formula (113) | General formula (113) | CN | General formula (113) | OH | H | H |
| 748 | General formula (113) | General formula (113) | CN | OH | General formula (113) | H | H |
| 749 | General formula (113) | General formula (113) | CN | OH | OH | H | H |
| 750 | General formula (113) | OH | CN | General formula (113) | OH | H | H |
| 751 | OH | General formula (113) | CN | General formula (113) | OH | H | H |
| 752 | General formula (113) | OH | CN | OH | OH | H | H |
| 753 | General formula (113) | General formula (113) | CN | Cl | General formula (113) | H | H |
| 754 | General formula (113) | General formula (113) | CN | Cl | General formula (113) | H | H |
| 755 | General formula (113) | General formula (113) | CN | Cl | General formula (113) | H | H |
| 756 | General formula (113) | General formula (113) | CN | Cl | General formula (113) | H | H |
| 757 | General formula (113) | General formula (113) | CN | Cl | General formula (113) | H | H |
| 758 | General formula (113) | General formula (113) | CN | Cl | General formula (113) | H | H |

TABLE 4-1-continued

| | | | | | | | |
|---|---|---|---|---|---|---|---|
| 759 | General formula (113) | General formula (113) | CN | F | General formula (113) | H | H |
| 760 | General formula (113) | General formula (113) | CN | F | General formula (113) | H | H |
| 761 | General formula (113) | General formula (113) | CN | F | General formula (113) | H | H |
| 762 | General formula (113) | General formula (113) | CN | F | General formula (113) | H | H |
| 763 | General formula (113) | General formula (113) | CN | F | General formula (113) | H | H |
| 764 | General formula (113) | General formula (113) | CN | F | General formula (113) | H | H |
| 765 | General formula (113) | General formula (113) | CN | CH$_3$O | General formula (113) | H | H |

| Compound No. | General formula (113) | | | |
|---|---|---|---|---|
| | $R^{43}$ | $R^{44}$ | $R^{45}$ | $R^{46}$ |
| 701 | H | H | H | H |
| 702 | H | H | H | H |
| 703 | H | H | H | H |
| 704 | CH$_3$ | H | H | H |
| 705 | CH$_3$O | H | H | H |
| 706 | t-C$_4$H$_9$ | H | H | H |
| 707 | Cl | H | H | H |
| 708 | F | H | H | H |
| 709 | H | CH$_3$ | H | H |
| 710 | H | CH$_3$O | H | H |
| 711 | H | H | CH$_3$ | H |
| 712 | H | H | CH$_3$O | H |
| 713 | H | H | t-C$_4$H$_9$ | H |
| 714 | H | H | Cl | H |
| 715 | H | H | F | H |
| 716 | H | H | C$_6$H$_5$ | H |
| 717 | H | H | p-CH$_3$C$_6$H$_4$ | H |
| 718 | H | H | 2,4,6-(CH$_3$)$_3$C$_6$H$_2$ | H |
| 719 | H | H | p-CH$_3$OC$_6$H$_4$ | H |
| 720 | H | H | p-(CH$_3$)$_2$NC$_6$H$_4$ | H |
| 721 | H | H | p-FC$_6$H$_4$ | H |
| 722 | H | H | p-CNC$_6$H$_4$ | H |
| 723 | H | H | H | CH$_3$ |
| 724 | H | H | H | CH$_3$O |
| 725 | H | H | H | t-C$_4$H$_9$ |
| 726 | H | H | H | Cl |
| 727 | H | H | H | F |
| 728 | H | H | H | C$_6$H$_5$ |
| 729 | H | H | H | p-CH$_3$C$_6$H$_4$ |
| 730 | H | H | H | 2,4,6-(CH$_3$)$_3$C$_6$H$_2$ |
| 731 | H | H | H | p-CH$_3$OC$_6$H$_4$ |
| 732 | H | H | H | p-(CH$_3$)$_2$NC$_6$H$_4$ |
| 733 | H | H | H | p-FC$_6$H$_4$ |
| 734 | H | H | H | p-CNC$_6$H$_4$ |
| 735 | H | H | H | H |
| 736 | H | H | H | H |
| 737 | H | H | H | H |
| 738 | H | H | H | H |
| 739 | H | H | H | H |
| 740 | H | H | H | H |
| 741 | H | H | H | H |
| 742 | H | H | H | H |
| 743 | H | H | H | H |
| 744 | H | H | H | H |
| 745 | H | H | H | H |
| 746 | H | H | H | H |
| 747 | H | H | H | H |
| 748 | H | H | H | H |
| 749 | H | H | H | H |
| 750 | H | H | H | H |
| 751 | H | H | H | H |
| 752 | H | H | H | H |
| 753 | H | H | H | H |
| 754 | CH$_3$ | H | H | H |
| 755 | CH$_3$O | H | H | H |
| 756 | t-C$_4$H$_8$ | H | H | H |
| 757 | Cl | H | H | H |
| 758 | F | H | H | H |
| 759 | H | H | H | H |
| 760 | CH$_3$ | H | H | H |
| 761 | CH$_3$O | H | H | H |

TABLE 4-1-continued

| | | | | |
|---|---|---|---|---|
| 762 | t-C$_4$H$_8$ | H | H | H |
| 763 | Cl | H | H | H |
| 764 | F | H | H | H |
| 765 | H | H | H | H |

TABLE 4-2

| Compound No. | General formula (1) | | | | | General formula (113) | | | | | |
|---|---|---|---|---|---|---|---|---|---|---|---|
| | $R^1$ | $R^2$ | $R^3$ | $R^4$ | $R^5$ | $R^{41}$ | $R^{42}$ | $R^{43}$ | $R^{44}$ | $R^{45}$ | $R^{46}$ |
| 766 | General formula (113) | General formula (113) | CN | CH$_3$O | General formula (113) | H | H | CH$_3$ | H | H | H |
| 767 | General formula (113) | General formula (113) | CN | CH$_3$O | General formula (113) | H | H | CH$_3$O | H | H | H |
| 768 | General formula (113) | General formula (113) | CN | CH$_3$O | General formula (113) | H | H | t-C$_4$H$_8$ | H | H | H |
| 769 | General formula (113) | General formula (113) | CN | CH$_3$O | General formula (113) | H | H | Cl | H | H | H |
| 770 | General formula (113) | General formula (113) | CN | CH$_3$O | General formula (113) | H | H | F | H | H | H |
| 771 | General formula (113) | General formula (113) | CN | C$_2$H$_5$O | General formula (113) | H | H | H | H | H | H |
| 772 | General formula (113) | General formula (113) | CN | C$_2$H$_5$O | General formula (113) | H | H | CH$_3$ | H | H | H |
| 773 | General formula (113) | General formula (113) | CN | C$_2$H$_5$O | General formula (113) | H | H | CH$_2$O | H | H | H |
| 774 | General formula (113) | General formula (113) | CN | C$_2$H$_5$O | General formula (113) | H | H | t-C$_4$H$_8$ | H | H | H |
| 775 | General formula (113) | General formula (113) | CN | C$_2$H$_5$O | General formula (113) | H | H | Cl | H | H | H |
| 776 | General formula (113) | General formula (113) | CN | C$_2$H$_5$O | General formula (113) | H | H | F | H | H | H |
| 777 | General formula (113) | General formula (113) | CN | C$_6$H$_5$O | General formula (113) | H | H | H | H | H | H |
| 778 | General formula (113) | General formula (113) | CN | C$_6$H$_5$O | General formula (113) | H | H | CH$_3$ | H | H | H |
| 779 | General formula (113) | General formula (113) | CN | C$_6$H$_5$O | General formula (113) | H | H | CH$_3$O | H | H | H |
| 780 | General formula (113) | General formula (113) | CN | C$_6$H$_5$O | General formula (113) | H | H | t-C$_4$H$_9$ | H | H | H |
| 781 | General formula (113) | General formula (113) | CN | C$_6$H$_5$O | General formula (113) | H | H | Cl | H | H | H |
| 782 | General formula (113) | General formula (113) | CN | C$_6$H$_5$O | General formula (113) | H | H | F | H | H | H |
| 783 | General formula (113) | General formula (113) | CN | Formula (121) | General formula (113) | H | H | H | H | H | H |
| 784 | General formula (113) | General formula (113) | CN | Formula (121) | General formula (113) | H | H | CH$_3$ | H | H | H |
| 785 | General formula (113) | General formula (113) | CN | Formula (121) | General formula (113) | H | H | CH$_3$O | H | H | H |
| 786 | General formula (113) | General formula (113) | CN | Formula (121) | General formula (113) | H | H | t-C$_4$H$_9$ | H | H | H |
| 787 | General formula (113) | General formula (113) | CN | Formula (121) | General formula (113) | H | H | Cl | H | H | H |
| 788 | General formula (113) | General formula (113) | CN | Formula (121) | General formula (113) | H | H | F | H | H | H |
| 789 | General formula (113) | General formula (113) | CN | Formula (122) | General formula (113) | H | H | H | H | H | H |
| 790 | General formula (113) | General formula (113) | CN | Formula (122) | General formula (113) | H | H | CH$_3$ | H | H | H |
| 791 | General formula (113) | General formula (113) | CN | Formula (122) | General formula (113) | H | H | CH$_3$O | H | H | H |
| 792 | General formula (113) | General formula (113) | CN | Formula (122) | General formula (113) | H | H | t-C$_4$H$_9$ | H | H | H |
| 793 | General formula (113) | General formula (113) | CN | Formula (122) | General formula (113) | H | H | Cl | H | H | H |
| 794 | General formula (113) | General formula (113) | CN | Formula (122) | General formula (113) | H | H | F | H | H | H |
| 795 | General formula (113) | General formula (113) | CN | Formula (123) | General formula (113) | H | H | H | H | H | H |
| 796 | General formula (113) | General formula (113) | CN | Formula (123) | General formula (113) | H | H | CH$_3$ | H | H | H |
| 797 | General formula (113) | General formula (113) | CN | Formula (123) | General formula (113) | H | H | CH$_3$O | H | H | H |
| 798 | General formula (113) | General formula (113) | CN | Formula (123) | General formula (113) | H | H | t-C$_4$H$_9$ | H | H | H |

TABLE 4-2-continued

| Compound | General formula (1) | | | | | General formula (113) | | | | | |
|---|---|---|---|---|---|---|---|---|---|---|---|
| No. | $R^1$ | $R^2$ | $R^3$ | $R^4$ | $R^5$ | $R^{41}$ | $R^{42}$ | $R^{43}$ | $R^{44}$ | $R^{45}$ | $R^{46}$ |
| 799 | General formula (113) | General formula (113) | CN | Formula (123) | General formula (113) | H | H | Cl | H | H | H |
| 800 | General formula (113) | General formula (113) | CN | Formula (123) | General formula (113) | H | H | F | H | H | H |
| 801 | General formula (113) | General formula (113) | CN | Formula (124) | General formula (113) | H | H | H | H | H | H |
| 802 | General formula (113) | General formula (113) | CN | Formula (124) | General formula (113) | H | H | $CH_3$ | H | H | H |
| 803 | General formula (113) | General formula (113) | CN | Formula (124) | General formula (113) | H | H | $CH_3O$ | H | H | H |
| 804 | General formula (113) | General formula (113) | CN | Formula (124) | General formula (113) | H | H | $t-C_4H_9$ | H | H | H |
| 805 | General formula (113) | General formula (113) | CN | Formula (124) | General formula (113) | H | H | Cl | H | H | H |
| 806 | General formula (113) | General formula (113) | CN | Formula (124) | General formula (113) | H | H | F | H | H | H |

TABLE 5-1

| Compound | General formula (1) | | | | | General formula (114) | |
|---|---|---|---|---|---|---|---|
| No. | $R^1$ | $R^2$ | $R^3$ | $R^4$ | $R^5$ | $R^{52}$ | $R^{53}$ |
| 901 | General formula (114) | General formula (114) | CN | General formula (114) | General formula (114) | H | H |
| 902 | General formula (114) | General formula (114) | CN | General formula (114) | General formula (114) | $CH_3$ | H |
| 903 | General formula (114) | General formula (114) | CN | General formula (114) | General formula (114) | $CH_3O$ | H |
| 904 | General formula (114) | General formula (114) | CN | General formula (114) | General formula (114) | H | $CH_3$ |
| 905 | General formula (114) | General formula (114) | CN | General formula (114) | General formula (114) | H | $CH_3O$ |
| 906 | General formula (114) | General formula (114) | CN | General formula (114) | General formula (114) | H | $t-C_4H_9$ |
| 907 | General formula (114) | General formula (114) | CN | General formula (114) | General formula (114) | H | Cl |
| 908 | General formula (114) | General formula (114) | CN | General formula (114) | General formula (114) | H | F |
| 909 | General formula (114) | General formula (114) | CN | General formula (114) | General formula (114) | H | H |
| 910 | General formula (114) | General formula (114) | CN | General formula (114) | General formula (114) | H | H |
| 911 | General formula (114) | General formula (114) | CN | General formula (114) | General formula (114) | H | H |
| 912 | General formula (114) | General formula (114) | CN | General formula (114) | General formula (114) | H | H |
| 913 | General formula (114) | General formula (114) | CN | General formula (114) | General formula (114) | H | H |
| 914 | General formula (114) | General formula (114) | CN | General formula (114) | General formula (114) | H | H |
| 915 | General formula (114) | General formula (114) | CN | General formula (114) | General formula (114) | H | H |
| 916 | General formula (114) | General formula (114) | CN | General formula (114) | General formula (114) | H | H |
| 917 | General formula (114) | General formula (114) | CN | General formula (114) | General formula (114) | H | H |
| 918 | General formula (114) | General formula (114) | CN | General formula (114) | General formula (114) | H | H |
| 919 | General formula (114) | General formula (114) | CN | General formula (114) | H | H | H |
| 920 | General formula (114) | General formula (114) | CN | H | General formula (114) | H | H |
| 921 | General formula (114) | General formula (114) | CN | H | H | H | H |
| 922 | General formula (114) | H | CN | General formula (114) | H | H | H |
| 923 | H | General formula (114) | CN | General formula (114) | H | H | H |
| 924 | General formula (114) | H | CN | H | H | H | H |

TABLE 5-1-continued

| | | | | | | | |
|---|---|---|---|---|---|---|---|
| 925 | General formula (114) | General formula (114) | CN | General formula (114) | F | H | H |
| 926 | General formula (114) | General formula (114) | CN | F | General formula (114) | H | H |
| 927 | General formula (114) | General formula (114) | CN | F | F | H | H |
| 928 | General formula (114) | F | CN | General formula (114) | F | H | H |
| 929 | F | General formula (114) | CN | General formula (114) | F | H | H |
| 930 | General formula (114) | F | CN | F | F | H | H |
| 931 | General formula (114) | General formula (114) | CN | General formula (114) | OH | H | H |
| 932 | General formula (114) | General formula (114) | CN | OH | General formula (114) | H | H |
| 933 | General formula (114) | General formula (114) | CN | OH | OH | H | H |
| 934 | General formula (114) | OH | CN | General formula (114) | OH | H | H |
| 935 | OH | General formula (114) | CN | General formula (114) | OH | H | H |
| 936 | General formula (114) | OH | CN | OH | OH | H | H |
| 937 | General formula (114) | General formula (114) | CN | Cl | General formula (114) | H | H |
| 938 | General formula (114) | General formula (114) | CN | Cl | General formula (114) | H | $CH_3$ |
| 939 | General formula (114) | General formula (114) | CN | Cl | General formula (114) | H | $CH_3O$ |
| 940 | General formula (114) | General formula (114) | CN | Cl | General formula (114) | H | $t\text{-}C_4H_9$ |
| 941 | General formula (114) | General formula (114) | CN | Cl | General formula (114) | H | Cl |
| 942 | General formula (114) | General formula (114) | CN | Cl | General formula (114) | H | F |
| 943 | General formula (114) | General formula (114) | CN | F | General formula (114) | H | H |
| 944 | General formula (114) | General formula (114) | CN | F | General formula (114) | H | $CH_3$ |
| 945 | General formula (114) | General formula (114) | CN | F | General formula (114) | H | $CH_3O$ |
| 946 | General formula (114) | General formula (114) | CN | F | General formula (114) | H | $t\text{-}C_4H_9$ |
| 947 | General formula (114) | General formula (114) | CN | F | General formula (114) | H | Cl |
| 948 | General formula (114) | General formula (114) | CN | F | General formula (114) | H | F |
| 949 | General formula (114) | General formula (114) | CN | $CH_3O$ | General formula (114) | H | H |
| 950 | General formula (114) | General formula (114) | CN | $CH_3O$ | General formula (114) | H | $CH_3$ |
| 951 | General formula (114) | General formula (114) | CN | $CH_3O$ | General formula (114) | H | $CH_3O$ |
| 952 | General formula (114) | General formula (114) | CN | $CH_3O$ | General formula (114) | H | $t\text{-}C_4H_9$ |
| 953 | General formula (114) | General formula (114) | CN | $CH_3O$ | General formula (114) | H | Cl |
| 954 | General formula (114) | General formula (114) | CN | $CH_3O$ | General formula (114) | H | F |
| 955 | General formula (114) | General formula (114) | CN | $C_2H_5O$ | General formula (114) | H | H |
| 956 | General formula (114) | General formula (114) | CN | $C_2H_5O$ | General formula (114) | H | $CH_3$ |
| 957 | General formula (114) | General formula (114) | CN | $C_2H_5O$ | General formula (114) | H | $CH_3O$ |
| 958 | General formula (114) | General formula (114) | CN | $C_2H_5O$ | General formula (114) | H | $t\text{-}C_4H_9$ |
| 959 | General formula (114) | General formula (114) | CN | $C_2H_5O$ | General formula (114) | H | Cl |
| 960 | General formula (114) | General formula (114) | CN | $C_2H_5O$ | General formula (114) | H | F |
| 961 | General formula (114) | General formula (114) | CN | $C_6H_5O$ | General formula (114) | H | H |
| 962 | General formula (114) | General formula (114) | CN | $C_6H_5O$ | General formula (114) | H | $CH_3$ |
| 963 | General formula (114) | General formula (114) | CN | $C_6H_5O$ | General formula (114) | H | $CH_3O$ |
| 964 | General formula (114) | General formula (114) | CN | $C_6H_5O$ | General formula (114) | H | $t\text{-}C_4H_9$ |

TABLE 5-1-continued

| | | | | | | | |
|---|---|---|---|---|---|---|---|
| 965 | General formula (114) | General formula (114) | CN | C$_6$H$_5$O | General formula (114) | H | Cl |

| | General formula (114) | | | | | |
|---|---|---|---|---|---|---|
| Compound No. | R$^{54}$ | R$^{56}$ | R$^{57}$ | R$^{58}$ | R$^{61}$ | R$^{51}$, R$^{56}$, R$^{58}$, R$^{60}$, R$^{62}$ |
| 901 | H | H | H | H | H | H |
| 902 | H | H | H | H | H | H |
| 903 | H | H | H | H | H | H |
| 904 | H | H | H | H | H | H |
| 905 | H | H | H | H | H | H |
| 906 | H | H | H | H | H | H |
| 907 | H | H | H | H | H | H |
| 908 | H | H | H | H | H | H |
| 909 | CH$_3$ | H | H | H | H | H |
| 910 | CH$_3$O | H | H | H | H | H |
| 911 | H | CH$_3$ | H | H | H | H |
| 912 | H | CH$_3$O | H | H | H | H |
| 913 | H | H | CH$_3$ | H | H | H |
| 914 | H | H | CH$_3$O | H | H | H |
| 915 | H | H | H | CH$_3$ | H | H |
| 916 | H | H | H | CH$_3$O | H | H |
| 917 | H | H | H | H | CH$_3$ | H |
| 918 | H | H | H | H | CH$_3$O | H |
| 919 | H | H | H | H | H | H |
| 920 | H | H | H | H | H | H |
| 921 | H | H | H | H | H | H |
| 922 | H | H | H | H | H | H |
| 923 | H | H | H | H | H | H |
| 924 | H | H | H | H | H | H |
| 925 | H | H | H | H | H | H |
| 926 | H | H | H | H | H | H |
| 927 | H | H | H | H | H | H |
| 928 | H | H | H | H | H | H |
| 929 | H | H | H | H | H | H |
| 930 | H | H | H | H | H | H |
| 931 | H | H | H | H | H | H |
| 932 | H | H | H | H | H | H |
| 933 | H | H | H | H | H | H |
| 934 | H | H | H | H | H | H |
| 935 | H | H | H | H | H | H |
| 936 | H | H | H | H | H | H |
| 937 | H | H | H | H | H | H |
| 938 | H | H | H | H | H | H |
| 939 | H | H | H | H | H | H |
| 940 | H | H | H | H | H | H |
| 941 | H | H | H | H | H | H |
| 942 | H | H | H | H | H | H |
| 943 | H | H | H | H | H | H |
| 944 | H | H | H | H | H | H |
| 945 | H | H | H | H | H | H |
| 946 | H | H | H | H | H | H |
| 947 | H | H | H | H | H | H |
| 948 | H | H | H | H | H | H |
| 949 | H | H | H | H | H | H |
| 950 | H | H | H | H | H | H |
| 951 | H | H | H | H | H | H |
| 952 | H | H | H | H | H | H |
| 953 | H | H | H | H | H | H |
| 954 | H | H | H | H | H | H |
| 955 | H | H | H | H | H | H |
| 956 | H | H | H | H | H | H |
| 957 | H | H | H | H | H | H |
| 958 | H | H | H | H | H | H |
| 959 | H | H | H | H | H | H |
| 960 | H | H | H | H | H | H |
| 961 | H | H | H | H | H | H |
| 962 | H | H | H | H | H | H |
| 963 | H | H | H | H | H | H |
| 964 | H | H | H | H | H | H |
| 965 | H | H | H | H | H | H |

TABLE 5-2

| Compound No. | General formula (1) R$^1$ | R$^2$ | R$^3$ | R$^4$ | R$^5$ | General formula (114) R$^{52}$ | R$^{53}$ | R$^{54}$ | R$^{56}$ | R$^{57}$ | R$^{58}$ | R$^{61}$ | R$^{51}$, R$^{56}$, R$^{58}$, R$^{60}$, R$^{62}$ |
|---|---|---|---|---|---|---|---|---|---|---|---|---|---|
| 966 | General formula (114) | General formula (114) | CN | C$_6$H$_5$O | General formula (114) | H | F | H | H | H | H | H | H |
| 967 | General formula (114) | General formula (114) | CN | Formula (121) | General formula (114) | H | H | H | H | H | H | H | H |
| 968 | General formula (114) | General formula (114) | CN | Formula (121) | General formula (114) | H | CH$_3$ | H | H | H | H | H | H |
| 969 | General formula (114) | General formula (114) | CN | Formula (121) | General formula (114) | H | CH$_3$O | H | H | H | H | H | H |
| 970 | General formula (114) | General formula (114) | CN | Formula (121) | General formula (114) | H | t-C$_4$H$_9$ | H | H | H | H | H | H |
| 971 | General formula (114) | General formula (114) | CN | Formula (121) | General formula (114) | H | Cl | H | H | H | H | H | H |
| 972 | General formula (114) | General formula (114) | CN | Formula (121) | General formula (114) | H | F | H | H | H | H | H | H |
| 973 | General formula (114) | General formula (114) | CN | Formula (122) | General formula (114) | H | H | H | H | H | H | H | H |
| 974 | General formula (114) | General formula (114) | CN | Formula (122) | General formula (114) | H | CH$_3$ | H | H | H | H | H | H |
| 975 | General formula (114) | General formula (114) | CN | Formula (122) | General formula (114) | H | CH$_3$O | H | H | H | H | H | H |
| 976 | General formula (114) | General formula (114) | CN | Formula (122) | General formula (114) | H | t-C$_4$H$_9$ | H | H | H | H | H | H |
| 977 | General formula (114) | General formula (114) | CN | Formula (122) | General formula (114) | H | Cl | H | H | H | H | H | H |
| 978 | General formula (114) | General formula (114) | CN | Formula (122) | General formula (114) | H | F | H | H | H | H | H | H |
| 989 | General formula (114) | General formula (114) | CN | Formula (123) | General formula (114) | H | H | H | H | H | H | H | H |
| 980 | General formula (114) | General formula (114) | CN | Formula (123) | General formula (114) | H | CH$_3$ | H | H | H | H | H | H |
| 981 | General formula (114) | General formula (114) | CN | Formula (123) | General formula (114) | H | CH$_3$O | H | H | H | H | H | H |
| 982 | General formula (114) | General formula (114) | CN | Formula (123) | General formula (114) | H | t-C$_4$H$_9$ | H | H | H | H | H | H |
| 983 | General formula (114) | General formula (114) | CN | Formula (123) | General formula (114) | H | Cl | H | H | H | H | H | H |
| 984 | General formula (114) | General formula (114) | CN | Formula (123) | General formula (114) | H | F | H | H | H | H | H | H |
| 985 | General formula (114) | General formula (114) | CN | Formula (124) | General formula (114) | H | H | H | H | H | H | H | H |
| 986 | General formula (114) | General formula (114) | CN | Formula (124) | General formula (114) | H | CH$_3$ | H | H | H | H | H | H |
| 987 | General formula (114) | General formula (114) | CN | Formula (124) | General formula (114) | H | CH$_3$O | H | H | H | H | H | H |
| 988 | General formula (114) | General formula (114) | CN | Formula (124) | General formula (114) | H | t-C$_4$H$_9$ | H | H | H | H | H | H |
| 989 | General formula (114) | General formula (114) | CN | Formula (124) | General formula (114) | H | Cl | H | H | H | H | H | H |
| 990 | General formula (114) | General formula (114) | CN | Formula (124) | General formula (114) | H | F | H | H | H | H | H | H |

TABLE 6-1

| Compound No. | General formula (1) R$^1$ | R$^2$ | R$^3$ | R$^4$ | R$^5$ | General formula (115) R$^{71}$, R$^{80}$ | R$^{72}$, R$^{79}$ | R$^{73}$, R$^{78}$ | R$^{74}$, R$^{77}$ | R$^{75}$, R$^{76}$ |
|---|---|---|---|---|---|---|---|---|---|---|
| 1001 | General formula (115) | General formula (115) | CN | General formula (115) | General formula (115) | H | H | H | H | H |
| 1002 | General formula (115) | General formula (115) | CN | General formula (115) | General formula (115) | H | CH$_3$ | H | H | H |
| 1003 | General formula (115) | General formula (115) | CN | General formula (115) | General formula (115) | H | CH$_3$O | H | H | H |
| 1004 | General formula (115) | General formula (115) | CN | General formula (115) | General formula (115) | H | C$_6$H$_5$ | H | H | H |
| 1005 | General formula (115) | General formula (115) | CN | General formula (115) | General formula (115) | H | CH$_3$ | H | CH$_3$ | H |
| 1006 | General formula (115) | General formula (115) | CN | General formula (115) | General formula (115) | H | CH$_3$O | H | CH$_3$O | H |

TABLE 6-1-continued

| Compound No. | General formula (1) | | | | | General formula (115) | | | | |
|---|---|---|---|---|---|---|---|---|---|---|
| | $R^1$ | $R^2$ | $R^3$ | $R^4$ | $R^5$ | $R^{71}, R^{80}$ | $R^{72}, R^{79}$ | $R^{73}, R^{78}$ | $R^{74}, R^{77}$ | $R^{75}, R^{76}$ |
| 1007 | General formula (115) | General formula (115) | CN | General formula (115) | General formula (115) | H | $C_6H_5$ | H | $C_6H_5$ | H |
| 1008 | General formula (115) | General formula (115) | CN | General formula (115) | General formula (115) | H | H | $CH_3$ | H | H |
| 1009 | General formula (115) | General formula (115) | CN | General formula (115) | General formula (115) | H | H | $CH_3O$ | H | H |
| 1010 | General formula (115) | General formula (115) | CN | General formula (115) | General formula (115) | H | H | $t\text{-}C_4H_9$ | H | H |
| 1011 | General formula (115) | General formula (115) | CN | General formula (115) | General formula (115) | H | H | Cl | H | H |
| 1012 | General formula (115) | General formula (115) | CN | General formula (115) | General formula (115) | H | H | F | H | H |
| 1013 | General formula (115) | General formula (115) | CN | General formula (115) | General formula (115) | H | H | $C_6H_5$ | H | H |
| 1014 | General formula (115) | General formula (115) | CN | General formula (115) | General formula (115) | H | H | $p\text{-}C_6H_5\text{—}C_6H_4$ | H | H |
| 1015 | General formula (115) | General formula (115) | CN | General formula (115) | H | H | H | H | H | H |
| 1016 | General formula (115) | General formula (115) | CN | H | General formula (115) | H | H | H | H | H |
| 1017 | General formula (115) | General formula (115) | CN | H | H | H | H | H | H | H |
| 1018 | General formula (115) | H | CN | General formula (115) | H | H | H | H | H | H |
| 1019 | H | General formula (115) | CN | General formula (115) | H | H | H | H | H | H |
| 1020 | General formula (115) | H | CN | H | H | H | H | H | H | H |
| 1021 | General formula (115) | General formula (115) | CN | General formula (115) | F | H | H | H | H | H |
| 1022 | General formula (115) | General formula (115) | CN | F | General formula (115) | H | H | H | H | H |
| 1023 | General formula (115) | General formula (115) | CN | F | F | H | H | H | H | H |
| 1024 | General formula (115) | F | CN | General formula (115) | F | H | H | H | H | H |
| 1025 | F | General formula (115) | CN | General formula (115) | F | H | H | H | H | H |
| 1026 | General formula (115) | F | CN | F | F | H | H | H | H | H |
| 1027 | General formula (115) | General formula (115) | CN | General formula (115) | OH | H | H | H | H | H |
| 1028 | General formula (115) | General formula (115) | CN | OH | General formula (115) | H | H | H | H | H |
| 1029 | General formula (115) | General formula (115) | CN | OH | OH | H | H | H | H | H |
| 1030 | General formula (115) | OH | CN | General formula (115) | OH | H | H | H | H | H |
| 1031 | OH | General formula (115) | CN | General formula (115) | OH | H | H | H | H | H |
| 1032 | General formula (115) | OH | CN | OH | OH | H | H | H | H | H |
| 1033 | General formula (115) | General formula (115) | CN | Cl | General formula (115) | H | H | H | H | H |
| 1034 | General formula (115) | General formula (115) | CN | Cl | General formula (115) | H | H | $CH_3$ | H | H |
| 1035 | General formula (115) | General formula (115) | CN | Cl | General formula (115) | H | H | $CH_3O$ | H | H |
| 1036 | General formula (115) | General formula (115) | CN | Cl | General formula (115) | H | H | $t\text{-}C_4H_9$ | H | H |
| 1037 | General formula (115) | General formula (115) | CN | Cl | General formula (115) | H | H | Cl | H | H |
| 1038 | General formula (115) | General formula (115) | CN | Cl | General formula (115) | H | H | F | H | H |
| 1039 | General formula (115) | General formula (115) | CN | F | General formula (115) | H | H | H | H | H |
| 1040 | General formula (115) | General formula (115) | CN | F | General formula (115) | H | H | $CH_3$ | H | H |
| 1041 | General formula (115) | General formula (115) | CN | F | General formula (115) | H | H | $CH_3O$ | H | H |
| 1042 | General formula (115) | General formula (115) | CN | F | General formula (115) | H | H | $t\text{-}C_4H_9$ | H | H |
| 1043 | General formula (115) | General formula (115) | CN | F | General formula (115) | H | H | Cl | H | H |
| 1044 | General formula (115) | General formula (115) | CN | F | General formula (115) | H | H | F | H | H |

TABLE 6-1-continued

| Compound No. | General formula (1) | | | | | General formula (115) | | | | |
|---|---|---|---|---|---|---|---|---|---|---|
| | $R^1$ | $R^2$ | $R^3$ | $R^4$ | $R^5$ | $R^{71}, R^{80}$ | $R^{72}, R^{79}$ | $R^{73}, R^{78}$ | $R^{74}, R^{77}$ | $R^{75}, R^{76}$ |
| 1045 | General formula (115) | General formula (115) | CN | CH$_3$O | General formula (115) | H | H | H | H | H |
| 1046 | General formula (115) | General formula (115) | CN | CH$_3$O | General formula (115) | H | H | CH$_3$ | H | H |
| 1047 | General formula (115) | General formula (115) | CN | CH$_3$O | General formula (115) | H | H | CH$_3$O | H | H |
| 1048 | General formula (115) | General formula (115) | CN | CH$_3$O | General formula (115) | H | H | t-C$_4$H$_9$ | H | H |
| 1049 | General formula (115) | General formula (115) | CN | CH$_3$O | General formula (115) | H | H | Cl | H | H |
| 1050 | General formula (115) | General formula (115) | CN | CH$_3$O | General formula (115) | H | H | F | H | H |
| 1051 | General formula (115) | General formula (115) | CN | C$_2$H$_5$O | General formula (115) | H | H | H | H | H |
| 1052 | General formula (115) | General formula (115) | CN | C$_2$H$_5$O | General formula (115) | H | H | CH$_3$ | H | H |
| 1053 | General formula (115) | General formula (115) | CN | C$_2$H$_5$O | General formula (115) | H | H | CH$_3$O | H | H |
| 1054 | General formula (115) | General formula (115) | CN | C$_2$H$_5$O | General formula (115) | H | H | t-C$_4$H$_9$ | H | H |
| 1055 | General formula (115) | General formula (115) | CN | C$_2$H$_5$O | General formula (115) | H | H | Cl | H | H |
| 1056 | General formula (115) | General formula (115) | CN | C$_2$H$_5$O | General formula (115) | H | H | F | H | H |
| 1057 | General formula (115) | General formula (115) | CN | C$_6$H$_5$O | General formula (115) | H | H | H | H | H |
| 1058 | General formula (115) | General formula (115) | CN | C$_6$H$_5$O | General formula (115) | H | H | CH$_3$ | H | H |
| 1059 | General formula (115) | General formula (115) | CN | C$_6$H$_5$O | General formula (115) | H | H | CH$_3$O | H | H |
| 1060 | General formula (115) | General formula (115) | CN | C$_6$H$_5$O | General formula (115) | H | H | t-C$_4$H$_9$ | H | H |

TABLE 6-2

| Compound No. | General formula (1) | | | | | General formula (115) | | | | |
|---|---|---|---|---|---|---|---|---|---|---|
| | $R^1$ | $R^2$ | $R^3$ | $R^4$ | $R^5$ | $R^{71}, R^{80}$ | $R^{72}, R^{79}$ | $R^{73}, R^{78}$ | $R^{74}, R^{77}$ | $R^{75}, R^{76}$ |
| 1061 | General formula (115) | General formula (115) | CN | C$_6$H$_5$O | General formula (115) | H | H | Cl | H | H |
| 1062 | General formula (115) | General formula (115) | CN | C$_6$H$_5$O | General formula (115) | H | H | F | H | H |
| 1063 | General formula (115) | General formula (115) | CN | Formula (121) | General formula (115) | H | H | H | H | H |
| 1064 | General formula (115) | General formula (115) | CN | Formula (121) | General formula (115) | H | H | CH$_3$ | H | H |
| 1065 | General formula (115) | General formula (115) | CN | Formula (121) | General formula (115) | H | H | CH$_3$O | H | H |
| 1066 | General formula (115) | General formula (115) | CN | Formula (121) | General formula (115) | H | H | t-C$_4$H$_9$ | H | H |
| 1067 | General formula (115) | General formula (115) | CN | Formula (121) | General formula (115) | H | H | Cl | H | H |
| 1068 | General formula (115) | General formula (115) | CN | Formula (121) | General formula (115) | H | H | F | H | H |
| 1069 | General formula (115) | General formula (115) | CN | Formula (122) | General formula (115) | H | H | H | H | H |
| 1070 | General formula (115) | General formula (115) | CN | Formula (122) | General formula (115) | H | H | CH$_3$ | H | H |
| 1071 | General formula (115) | General formula (115) | CN | Formula (122) | General formula (115) | H | H | CH$_3$O | H | H |
| 1072 | General formula (115) | General formula (115) | CN | Formula (122) | General formula (115) | H | H | t-C$_4$H$_9$ | H | H |
| 1073 | General formula (115) | General formula (115) | CN | Formula (122) | General formula (115) | H | H | Cl | H | H |
| 1074 | General formula (115) | General formula (115) | CN | Formula (122) | General formula (115) | H | H | F | H | H |
| 1075 | General formula (115) | General formula (115) | CN | Formula (123) | General formula (115) | H | H | H | H | H |
| 1076 | General formula (115) | General formula (115) | CN | Formula (123) | General formula (115) | H | H | CH$_3$ | H | H |
| 1077 | General formula (115) | General formula (115) | CN | Formula (123) | General formula (115) | H | H | CH$_3$O | H | H |

TABLE 6-2-continued

| Compound No. | General formula (1) | | | | | General formula (115) | | | | |
|---|---|---|---|---|---|---|---|---|---|---|
| | $R^1$ | $R^2$ | $R^3$ | $R^4$ | $R^5$ | $R^{71}, R^{80}$ | $R^{72}, R^{79}$ | $R^{73}, R^{78}$ | $R^{74}, R^{77}$ | $R^{75}, R^{76}$ |
| 1078 | General formula (115) | General formula (115) | CN | Formula (123) | General formula (115) | H | H | t-$C_4H_9$ | H | H |
| 1079 | General formula (115) | General formula (115) | CN | Formula (123) | General formula (115) | H | H | Cl | H | H |
| 1080 | General formula (115) | General formula (115) | CN | Formula (123) | General formula (115) | H | H | F | H | H |
| 1081 | General formula (115) | General formula (115) | CN | Formula (124) | General formula (115) | H | H | H | H | H |
| 1082 | General formula (115) | General formula (115) | CN | Formula (124) | General formula (115) | H | H | $CH_3$ | H | H |
| 1083 | General formula (115) | General formula (115) | CN | Formula (124) | General formula (115) | H | H | $CH_3O$ | H | H |
| 1084 | General formula (115) | General formula (115) | CN | Formula (124) | General formula (115) | H | H | t-$C_4H_9$ | H | H |
| 1085 | General formula (115) | General formula (115) | CN | Formula (124) | General formula (115) | H | H | Cl | H | H |
| 1086 | General formula (115) | General formula (115) | CN | Formula (124) | General formula (115) | H | H | F | H | H |

Examples of the preferred light, emitting material capable of emitting delayed fluorescent light include the following compounds.

(1) A compound represented by the following general formula (131):

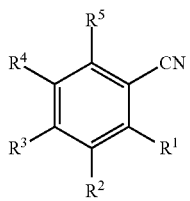

General Formula (131)

wherein in the general formula (131), from 0 to 1 of $R^1$ to $R^5$ represents a cyano group, from 1 to 5 of $R^1$ to $R^5$ each represent a group represented by the following general formula (132), and the balance of $R^1$ to $R^5$ each represent a hydrogen atom or a substituent other than the above,

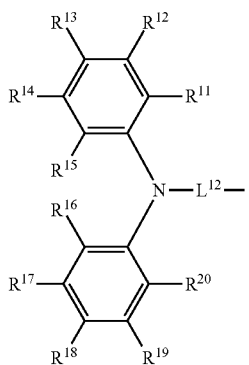

General Formula (132)

wherein in the general formula (132), $R^{11}$ to $R^{20}$ each independently represent a hydrogen atom or a substituent, provided that $R^{11}$ and $R^{12}$, $R^{12}$ and $R^{13}$, $R^{13}$ and $R^{14}$, $R^{14}$ and $R^{15}$, $R^{15}$ and $R^{16}$, $R^{16}$ and $R^{17}$, $R^{17}$ and $R^{18}$, $R^{18}$ and $R^{19}$, and $R^{19}$ and $R^{20}$ each may be bonded to each other to form a ring structure; and $L^{12}$ represents a substituted or unsubstituted arylene group or a substituted or unsubstituted heteroarylene group.

(2) The compound according to the item (1), wherein the group represented by the general formula (132) is a group represented by any one of the following general formulae (133) to (138):

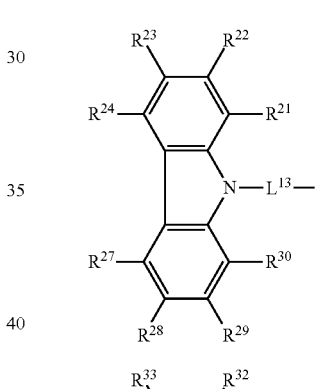

General Formula (133)

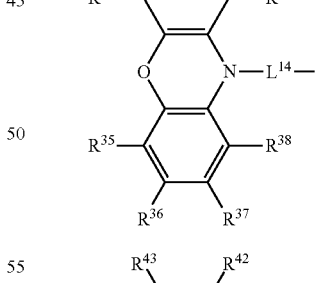

General Formula (134)

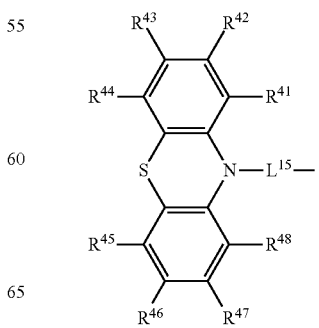

General Formula (135)

-continued

General Formula (136)

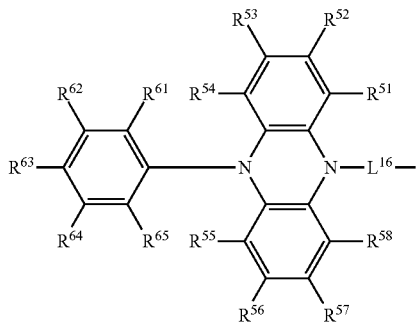

General Formula (137)

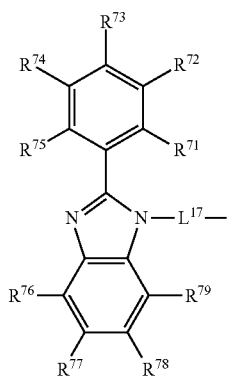

General Formula (138)

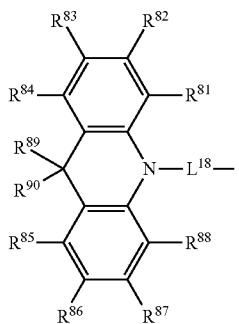

wherein in the general formulae (133) to (138), $R^{21}$ to $R^{24}$, $R^{27}$ to $R^{38}$, $R^{41}$ to $R^{48}$, $R^{51}$ to $R^{56}$, $R^{61}$ to $R^{65}$, $R^{71}$ to $R^{79}$, $R^{81}$ to $R^{90}$ each independently represent a hydrogen atom or a substituent, provided that $R^{21}$ to $R^{22}$, $R^{22}$ to $R^{23}$, $R^{23}$ to $R^{24}$, $R^{27}$ and $R^{28}$, $R^{28}$ and $R^{29}$, $R^{29}$ and $R^{30}$, $R^{31}$ and $R^{32}$, $R^{32}$ and $R^{33}$, $R^{33}$ and $R^{34}$, $R^{35}$ and $R^{36}$, $R^{36}$ and $R^{37}$, $R^{37}$ and $R^{38}$, $R^{41}$ and $R^{42}$, $R^{42}$ and $R^{43}$, $R^{43}$ and $R^{44}$, $R^{45}$ and $R^{46}$, $R^{46}$ and $R^{47}$, $R^{47}$ and $R^{48}$, $R^{51}$ and $R^{52}$, $R^{52}$ and $R^{53}$, $R^{53}$ and $R^{54}$, $R^{55}$ and $R^{56}$, $R^{56}$ and $R^{57}$, $R^{57}$ and $R^{58}$, $R^{61}$ and $R^{62}$, $R^{62}$ and $R^{63}$, $R^{63}$ and $R^{64}$, $R^{64}$ and $R^{65}$, $R^{54}$ and $R^{61}$, $R^{55}$ and $R^{66}$, $R^{71}$ and $R^{62}$, $R^{72}$ and $R^{73}$, $R^{73}$ and $R^{74}$, $R^{74}$ and $R^{75}$, $R^{76}$ and $R^{77}$, $R^{77}$ and $R^{78}$, $R^{78}$ and $R^{79}$, $R^{81}$ and $R^{82}$, $R^{82}$ and $R^{83}$, $R^{83}$ and $R^{84}$, $R^{85}$ and $R^{86}$, $R^{86}$ and $R^{87}$, $R^{87}$ and $R^{88}$, and $R^{89}$ and $R^{90}$ each may be bonded to each other to form a ring structure; and $L^{13}$ to $L^{18}$ each independently represent a substituted or unsubstituted arylene group or a substituted or unsubstituted heteroarylene group.

(3) The compound according to the item (1) or (2), wherein in the general formula (131), $R^3$ represents a cyano group.

(4) The compound according to any one of the items (1) to (3), wherein in the general formula (131), $R^1$ and $R^4$ each represent a group represented by the general formula (132).

(5) The compound according to any one of the items (1) to (4), wherein in the general formula (132), represents a phenylene group.

(6) The compound according to any one of the items (1) to (5), wherein the group represented by the general formula (132) is a group represented by the general formula (133).

(7) the compound according to the item (6), wherein in the general formula (133), $L^{13}$ represents a 1,3-phenylene group.

(8) The compound according to any one of the items (1) to (5), wherein the group represented by the general formula (132) is a group represented by the general formula (134).

(9) The compound according to the item (8), wherein in the general formula (134), $L^{14}$ represents a 1,4-phenylene group.

(10) The compound according to any one of the items (1) to (5), wherein the group represented by the general formula (132) is a group represented by the general formula (138).

(11) The compound according to the item (10), wherein in the general formula (138), represents a 1,4-phenylene group.

Examples of the compound include the following compounds.

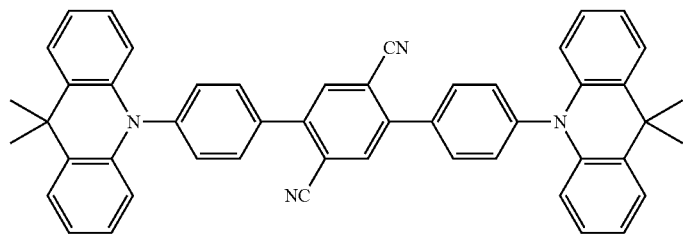

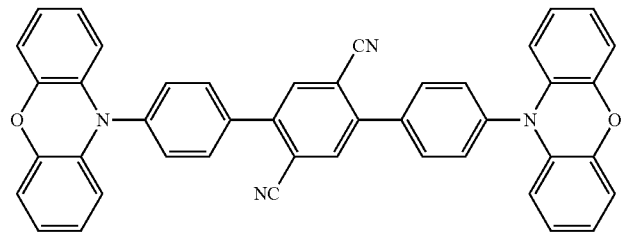

-continued
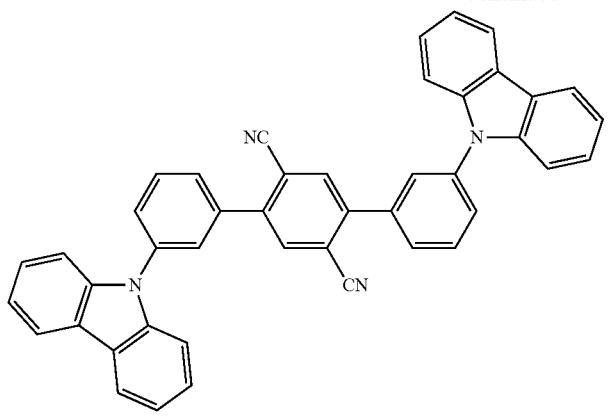
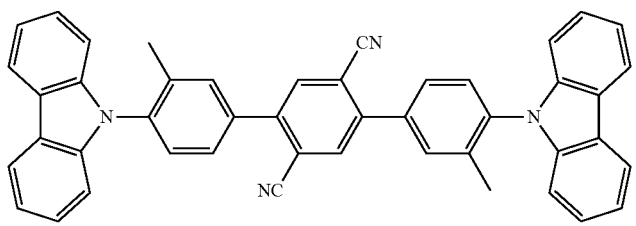
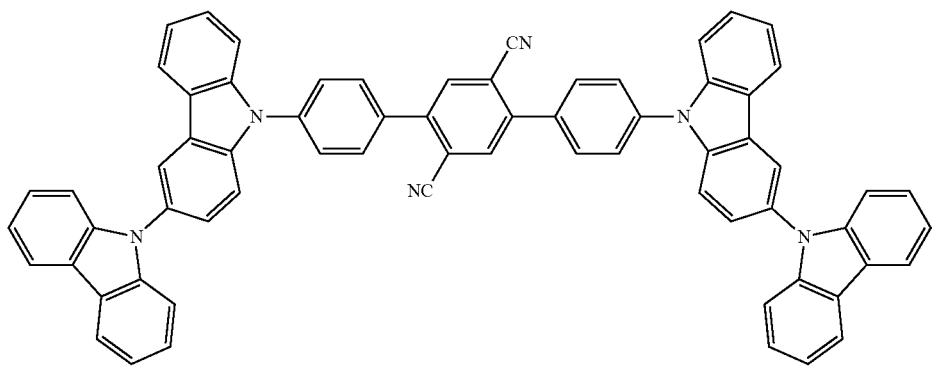
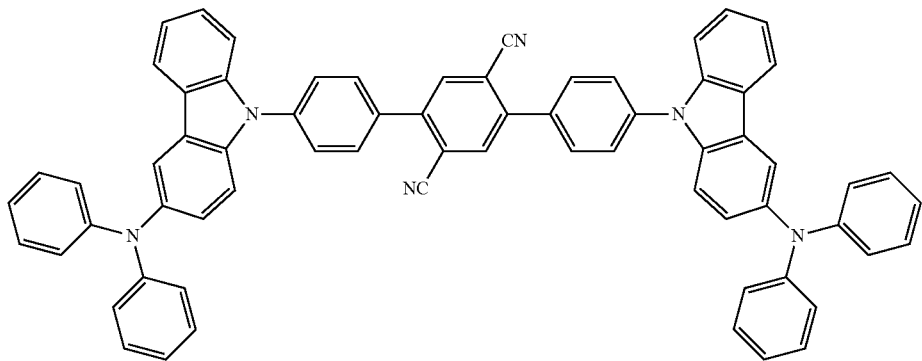

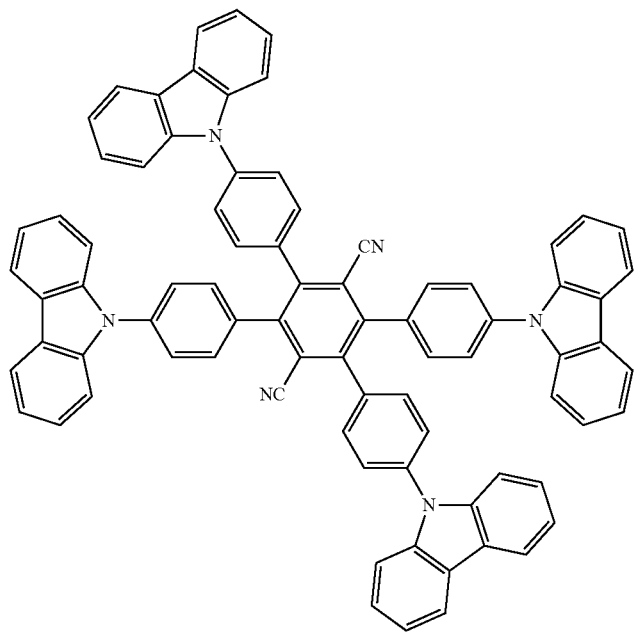
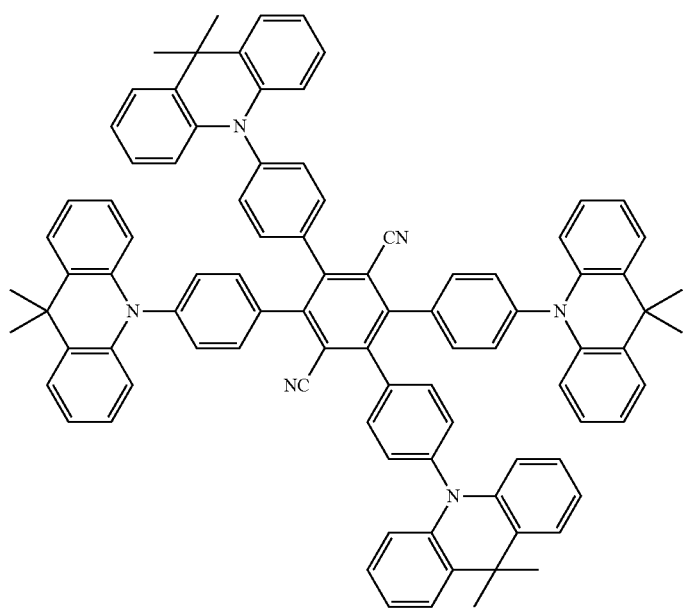

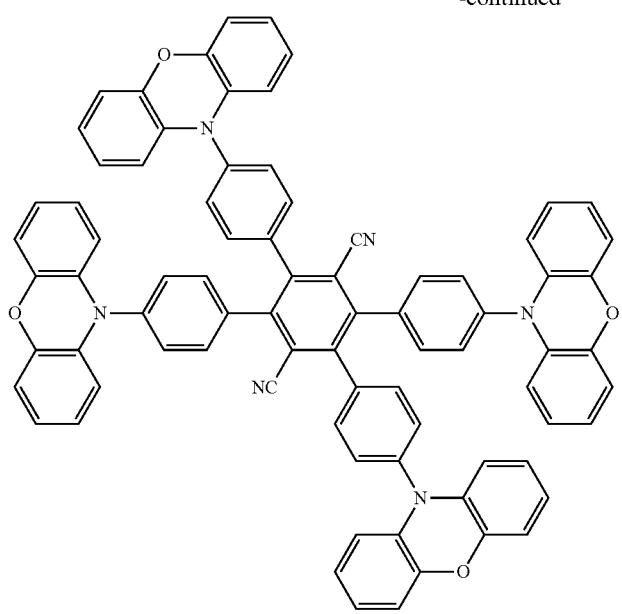
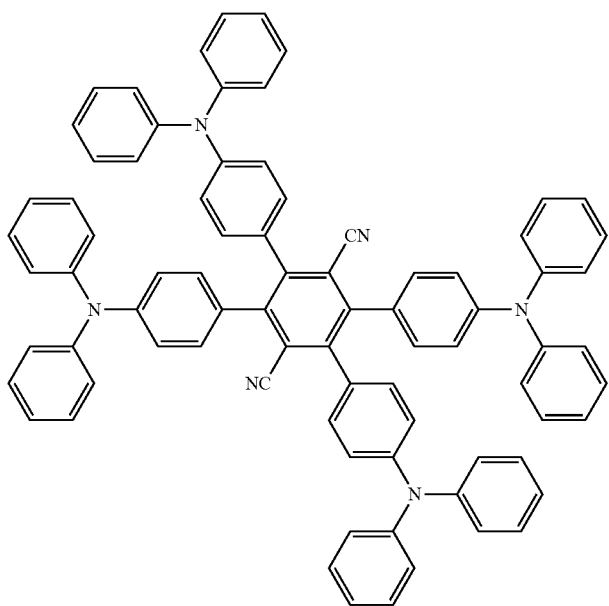
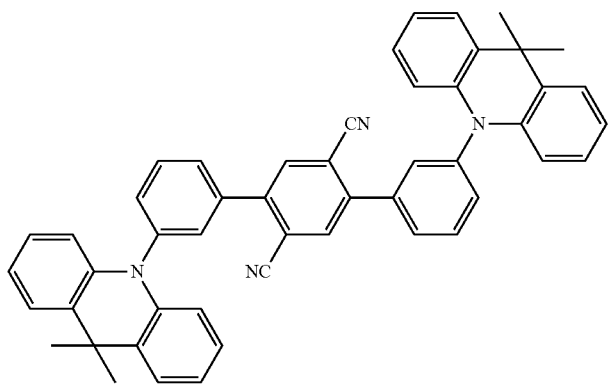

-continued
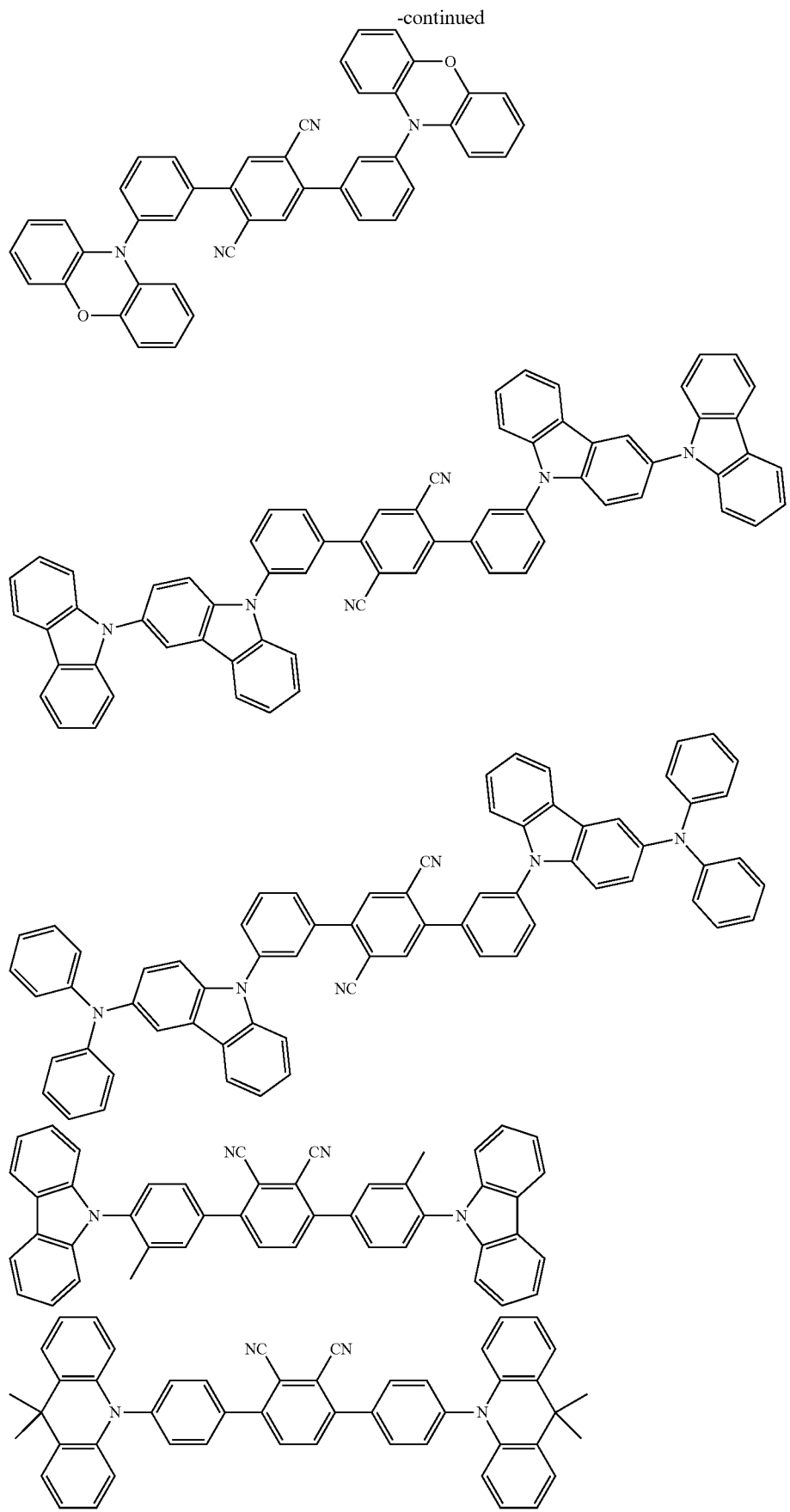

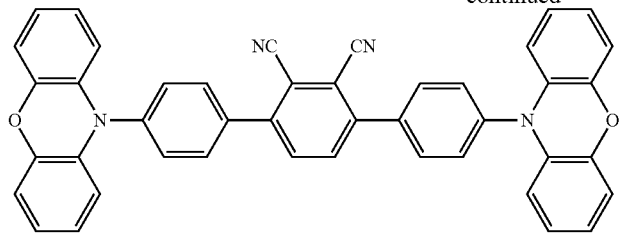
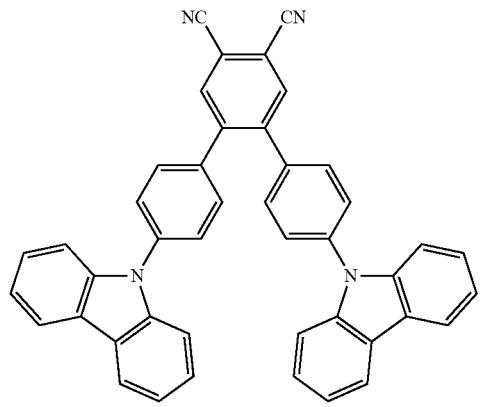
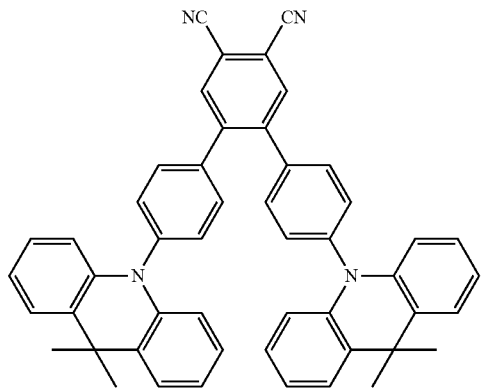
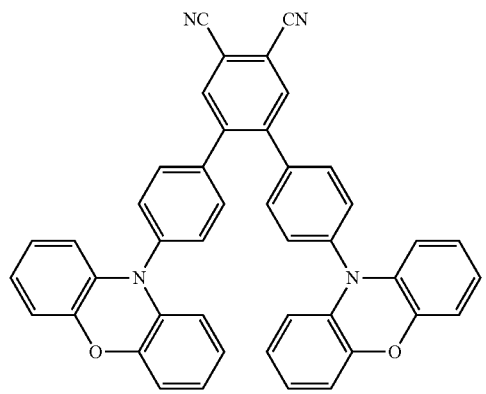
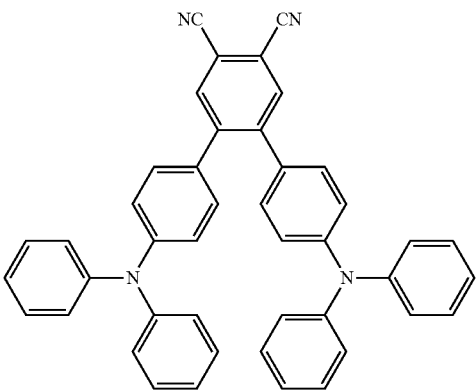
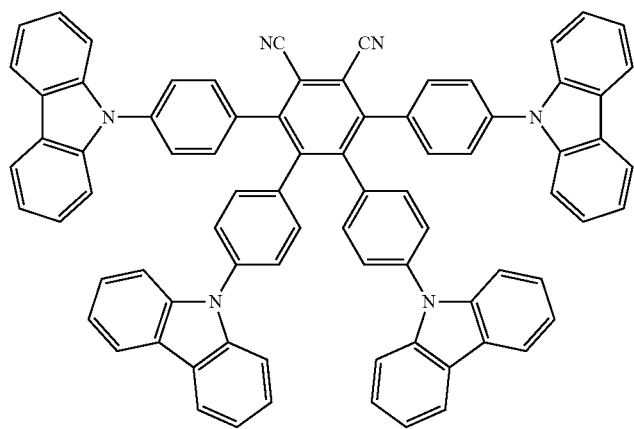

-continued
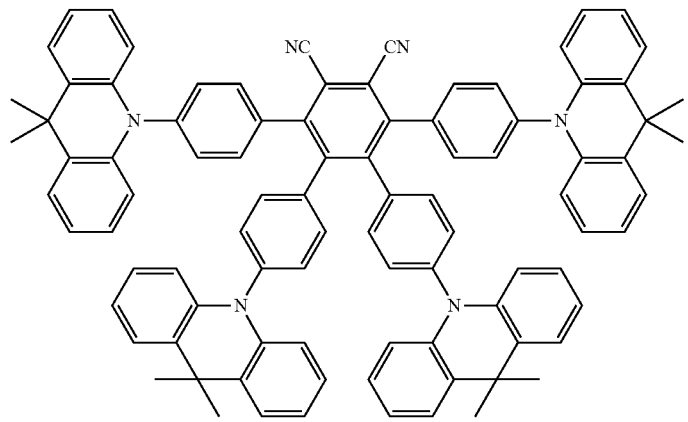
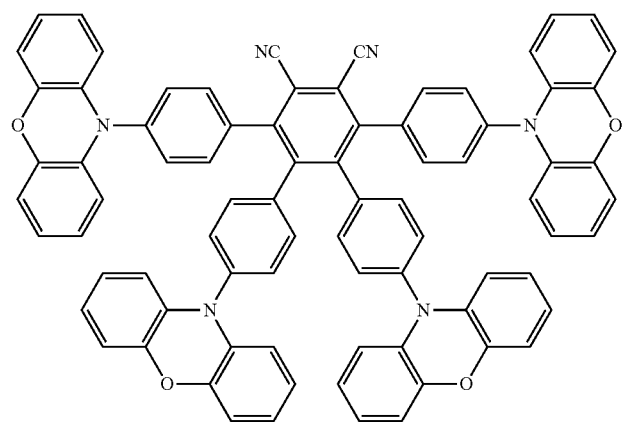
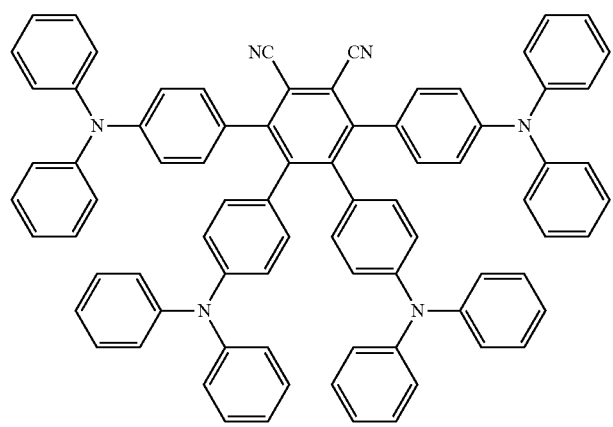
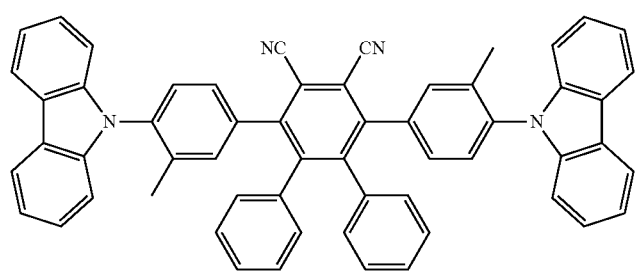

-continued
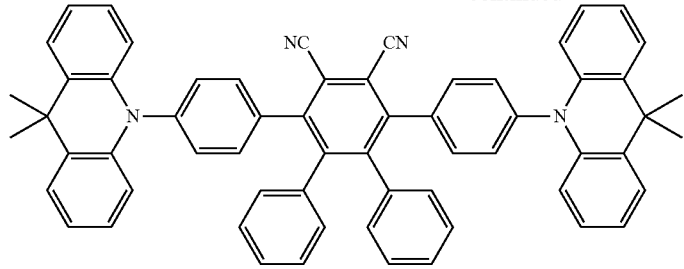
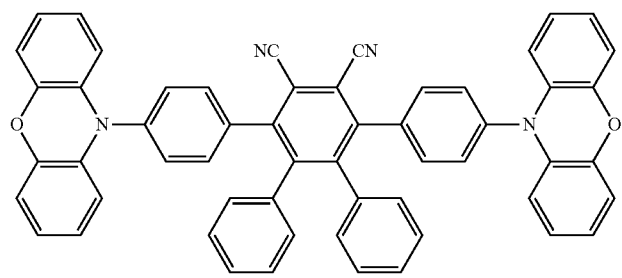
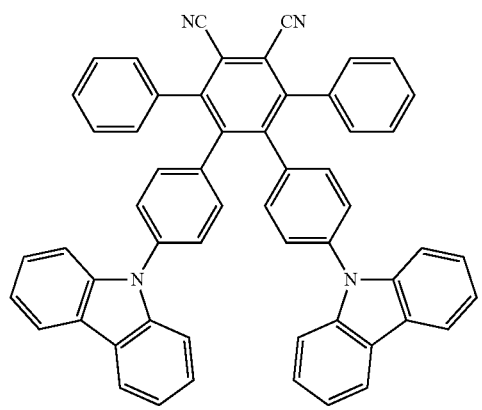 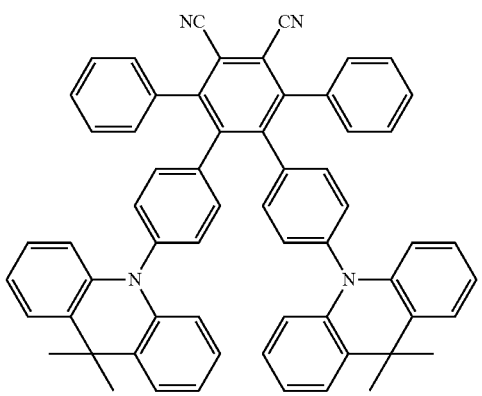
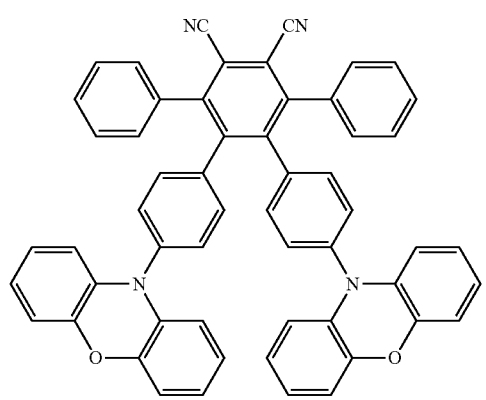 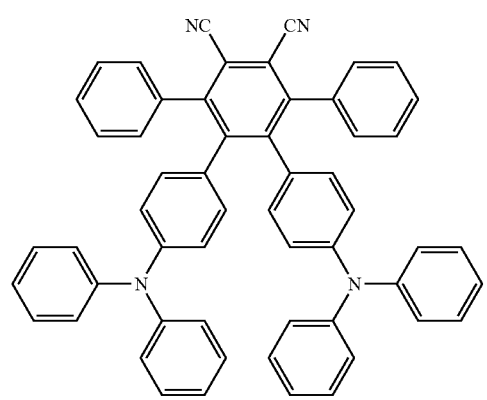
Examples of the preferred light emitting material capable of emitting delayed fluorescent light include compounds represented by the following general formula (141), The entire description of WO 2013/011954 including the paragraphs 0007 to 0047 and 0073 to 0085 is incorporated herein by reference.

General Formula (141)

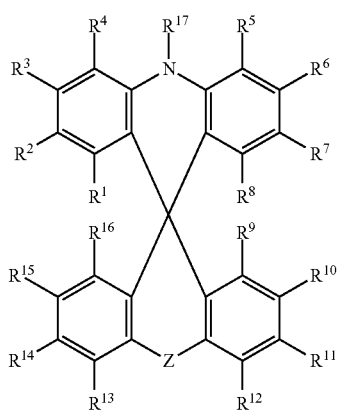

wherein in the general formula (141), $R^1$, $R^2$, $R^3$, $R^4$, $R^5$, $R^6$, $R^7$, $R^8$ and $R^{17}$ each independently represent a hydrogen atom or an electron donating group, provided that at least one thereof represents an electron donating group; $R^9$, $R^{10}$, $R^{11}$, $R^{12}$, $R^{13}$, $R^{14}$, $R^{15}$ and $R^{16}$ each independently represent a hydrogen atom or an electron withdrawing group having no unshared electron pair at the α-position; and Z represents a single bond or >C=Y, wherein Y represents O, S, C(CN)$_2$ or C(COOH)$_2$, provided that when Z represents a single bond, at least one of $R^9$, $R^{10}$, $R^{11}$, $R^{12}$, $R^{13}$, $R^{14}$, $R^{15}$ and $R^{16}$ represents an electron withdrawing group having no unshared electron pair at the α-position.

Specific examples of the compounds include the compounds shown in the following tables. In the tables, D1 to D3 represent the following aryl groups substituted by an electron donating group, respectively; A1 to A5 represent the following electron withdrawing groups, respectively; H represents a hydrogen atom; and Ph represents a phenyl group.

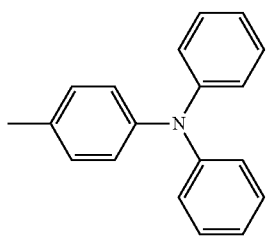
D1

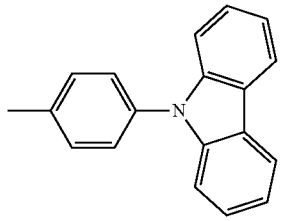
D2

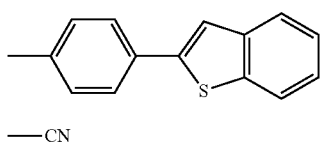
D3

—CN
A1

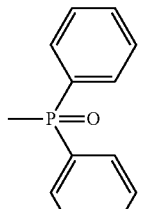
A2

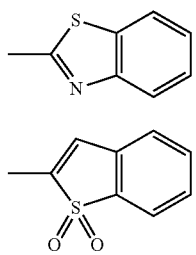
A3

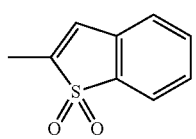
A4

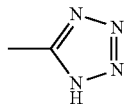
A5

TABLE 7

| Compound No. | $R^2$ | $R^7$ | $R^{10}$ | $R^{15}$ | $R^{17}$ | Z | Other Rs |
|---|---|---|---|---|---|---|---|
| 2001 | H | H | A1 | A1 | Ph | single bond | H |
| 2002 | H | D1 | A1 | A1 | Ph | single bond | H |
| 2003 | H | D2 | A1 | A1 | Ph | single bond | H |
| 2004 | H | D3 | A1 | A1 | Ph | single bond | H |
| 2005 | H | H | A2 | A2 | Ph | single bond | H |
| 2006 | H | D1 | A2 | A2 | Ph | single bond | H |
| 2007 | H | D2 | A2 | A2 | Ph | single bond | H |
| 2008 | H | D3 | A2 | A2 | Ph | single bond | H |
| 2009 | H | H | A3 | A3 | Ph | single bond | H |
| 2010 | H | D1 | A3 | A3 | Ph | single bond | H |
| 2011 | H | D2 | A3 | A3 | Ph | single bond | H |
| 2012 | H | D3 | A3 | A3 | Ph | single bond | H |
| 2013 | H | H | A4 | A4 | Ph | single bond | H |
| 2014 | H | D1 | A4 | A4 | Ph | single bond | H |
| 2015 | H | D2 | A4 | A4 | Ph | single bond | H |
| 2016 | H | D3 | A4 | A4 | Ph | single bond | H |
| 2017 | H | H | A5 | A5 | Ph | single bond | H |
| 2018 | H | D1 | A5 | A5 | Ph | single bond | H |
| 2019 | H | D2 | A5 | A5 | Ph | single bond | H |
| 2020 | H | D3 | A5 | A5 | Ph | single bond | H |
| 2021 | D1 | D1 | A1 | A1 | Ph | single bond | H |
| 2022 | D2 | D2 | A1 | A1 | Ph | single bond | H |
| 2023 | D3 | D3 | A1 | A1 | Ph | single bond | H |
| 2024 | D1 | D1 | A2 | A2 | Ph | single bond | H |
| 2025 | D2 | D2 | A2 | A2 | Ph | single bond | H |
| 2026 | D3 | D3 | A2 | A2 | Ph | single bond | H |
| 2027 | D1 | D1 | A3 | A3 | Ph | single bond | H |
| 2028 | D2 | D2 | A3 | A3 | Ph | single bond | H |
| 2029 | D3 | D3 | A3 | A3 | Ph | single bond | H |
| 2030 | D1 | D1 | A4 | A4 | Ph | single bond | H |
| 2031 | D2 | D2 | A4 | A4 | Ph | single bond | H |
| 2032 | D3 | D3 | A4 | A4 | Ph | single bond | H |
| 2033 | D1 | D1 | A5 | A5 | Ph | single bond | H |
| 2034 | D2 | D2 | A5 | A5 | Ph | single bond | H |
| 2035 | D3 | D3 | A5 | A5 | Ph | single bond | H |

TABLE 8

| Compound No. | $R^2$ | $R^6$ | $R^{11}$ | $R^{14}$ | $R^{17}$ | Z | Other Rs |
|---|---|---|---|---|---|---|---|
| 2036 | H | H | H | A1 | Ph | single bond | H |
| 2037 | H | D1 | H | A1 | Ph | single bond | H |

TABLE 8-continued

| Compound No. | R² | R⁶ | R¹¹ | R¹⁴ | R¹⁷ | Z | Other Rs |
|---|---|---|---|---|---|---|---|
| 2038 | H | D2 | H | A1 | Ph | single bond | H |
| 2039 | H | D3 | H | A1 | Ph | single bond | H |
| 2040 | H | H | H | A2 | Ph | single bond | H |
| 2041 | H | D1 | H | A2 | Ph | single bond | H |
| 2042 | H | D2 | H | A2 | Ph | single bond | H |
| 2043 | H | D3 | H | A2 | Ph | single bond | H |
| 2044 | H | H | H | A3 | Ph | single bond | H |
| 2045 | H | D1 | H | A3 | Ph | single bond | H |
| 2046 | H | D2 | H | A3 | Ph | single bond | H |
| 2047 | H | D3 | H | A3 | Ph | single bond | H |
| 2048 | H | H | H | A4 | Ph | single bond | H |
| 2049 | H | D1 | H | A4 | Ph | single bond | H |
| 2050 | H | D2 | H | A4 | Ph | single bond | H |
| 2051 | H | D3 | H | A4 | Ph | single bond | H |
| 2052 | H | H | H | A5 | Ph | single bond | H |
| 2053 | H | D1 | H | A5 | Ph | single bond | H |
| 2054 | H | D2 | H | A5 | Ph | single bond | H |
| 2055 | H | D3 | H | A5 | Ph | single bond | H |
| 2056 | D1 | D1 | H | A1 | Ph | single bond | H |
| 2057 | D2 | D2 | H | A1 | Ph | single bond | H |
| 2058 | D3 | D3 | H | A1 | Ph | single bond | H |
| 2059 | D1 | D1 | H | A2 | Ph | single bond | H |
| 2060 | D2 | D2 | H | A2 | Ph | single bond | H |
| 2061 | D3 | D3 | H | A2 | Ph | single bond | H |
| 2062 | D1 | D1 | H | A3 | Ph | single bond | H |
| 2063 | D2 | D2 | H | A3 | Ph | single bond | H |
| 2064 | D3 | D3 | H | A3 | Ph | single bond | H |
| 2065 | D1 | D1 | H | A4 | Ph | single bond | H |
| 2066 | D2 | D2 | H | A4 | Ph | single bond | H |
| 2067 | D3 | D3 | H | A4 | Ph | single bond | H |
| 2068 | D1 | D1 | H | A5 | Ph | single bond | H |
| 2069 | D2 | D2 | H | A5 | Ph | single bond | H |
| 2070 | D3 | D3 | H | A5 | Ph | single bond | H |

TABLE 9

| Compound No. | R² | R⁷ | R¹⁰ | R¹⁵ | R¹⁷ | Z | Other Rs |
|---|---|---|---|---|---|---|---|
| 2071 | H | H | A1 | A1 | Ph | C=O | H |
| 2072 | H | D1 | A1 | A1 | Ph | C=O | H |
| 2073 | H | D2 | A1 | A1 | Ph | C=O | H |
| 2074 | H | D3 | A1 | A1 | Ph | C=O | H |
| 2075 | H | H | A2 | A2 | Ph | C=O | H |
| 2076 | H | D1 | A2 | A2 | Ph | C=O | H |
| 2077 | H | D2 | A2 | A2 | Ph | C=O | H |
| 2078 | H | D3 | A2 | A2 | Ph | C=O | H |
| 2079 | H | H | A3 | A3 | Ph | C=O | H |
| 2080 | H | D1 | A3 | A3 | Ph | C=O | H |
| 2081 | H | D2 | A3 | A3 | Ph | C=O | H |
| 2082 | H | D3 | A3 | A3 | Ph | C=O | H |
| 2083 | H | H | A4 | A4 | Ph | C=O | H |
| 2084 | H | D1 | A4 | A4 | Ph | C=O | H |
| 2085 | H | D2 | A4 | A4 | Ph | C=O | H |
| 2086 | H | D3 | A4 | A4 | Ph | C=O | H |
| 2087 | H | H | A5 | A5 | Ph | C=O | H |
| 2088 | H | D1 | A5 | A5 | Ph | C=O | H |
| 2089 | H | D2 | A5 | A5 | Ph | C=O | H |
| 2090 | H | D3 | A5 | A5 | Ph | C=O | H |
| 2091 | D1 | D1 | A1 | A1 | Ph | C=O | H |
| 2092 | D2 | D2 | A1 | A1 | Ph | C=O | H |
| 2093 | D3 | D3 | A1 | A1 | Ph | C=O | H |
| 2094 | D1 | D1 | A2 | A2 | Ph | C=O | H |
| 2095 | D2 | D2 | A2 | A2 | Ph | C=O | H |
| 2096 | D3 | D3 | A2 | A2 | Ph | C=O | H |
| 2097 | D1 | D1 | A3 | A3 | Ph | C=O | H |
| 2098 | D2 | D2 | A3 | A3 | Ph | C=O | H |
| 2099 | D3 | D3 | A3 | A3 | Ph | C=O | H |
| 2100 | D1 | D1 | A4 | A4 | Ph | C=O | H |
| 2101 | D2 | D2 | A4 | A4 | Ph | C=O | H |
| 2102 | D3 | D3 | A4 | A4 | Ph | C=O | H |
| 2103 | D1 | D1 | A5 | A5 | Ph | C=O | H |
| 2104 | D2 | D2 | A5 | A5 | Ph | C=O | H |
| 2105 | D3 | D3 | A5 | A5 | Ph | C=O | H |

TABLE 10

| Compound No. | R³ | R⁶ | R¹¹ | R¹⁴ | R¹⁷ | Z | Other Rs |
|---|---|---|---|---|---|---|---|
| 2106 | H | H | H | A1 | Ph | C=O | H |
| 2107 | H | D1 | H | A1 | Ph | C=O | H |
| 2108 | H | D2 | H | A1 | Ph | C=O | H |
| 2109 | H | D3 | H | A1 | Ph | C=O | H |
| 2110 | H | H | H | A2 | Ph | C=O | H |
| 2111 | H | D1 | H | A2 | Ph | C=O | H |
| 2112 | H | D2 | H | A2 | Ph | C=O | H |
| 2113 | H | D3 | H | A2 | Ph | C=O | H |
| 2114 | H | H | H | A3 | Ph | C=O | H |
| 2115 | H | D1 | H | A3 | Ph | C=O | H |
| 2116 | H | D2 | H | A3 | Ph | C=O | H |
| 2117 | H | D3 | H | A3 | Ph | C=O | H |
| 2118 | H | H | H | A4 | Ph | C=O | H |
| 2119 | H | D1 | H | A4 | Ph | C=O | H |
| 2120 | H | D2 | H | A4 | Ph | C=O | H |
| 2121 | H | D3 | H | A4 | Ph | C=O | H |
| 2122 | H | H | H | A5 | Ph | C=O | H |
| 2123 | H | D1 | H | A5 | Ph | C=O | H |
| 2124 | H | D2 | H | A5 | Ph | C=O | H |
| 2125 | H | D3 | H | A5 | Ph | C=O | H |
| 2126 | D1 | D1 | H | A1 | Ph | C=O | H |
| 2127 | D2 | D2 | H | A1 | Ph | C=O | H |
| 2128 | D3 | D3 | H | A1 | Ph | C=O | H |
| 2129 | D1 | D1 | H | A2 | Ph | C=O | H |
| 2130 | D2 | D2 | H | A2 | Ph | C=O | H |
| 2131 | D3 | D3 | H | A2 | Ph | C=O | H |
| 2132 | D1 | D1 | H | A3 | Ph | C=O | H |
| 2133 | D2 | D2 | H | A3 | Ph | C=O | H |
| 2134 | D3 | D3 | H | A3 | Ph | C=O | H |
| 2135 | D1 | D1 | H | A4 | Ph | C=O | H |
| 2136 | D2 | D2 | H | A4 | Ph | C=O | H |
| 2137 | D3 | D3 | H | A4 | Ph | C=O | H |
| 2138 | D1 | D1 | H | A5 | Ph | C=O | H |
| 2139 | D2 | D2 | H | A5 | Ph | C=O | H |
| 2140 | D3 | D3 | H | A5 | Ph | C=O | H |
| 2141 | H | H | H | H | Ph | C=O | H |

TABLE 11

| Compound No. | R² | R⁷ | R¹⁰ | R¹⁵ | R¹⁷ | Z | Other Rs |
|---|---|---|---|---|---|---|---|
| 2142 | H | H | A1 | A1 | Ph | C=S | H |
| 2143 | H | D1 | A1 | A1 | Ph | C=S | H |
| 2144 | H | D2 | A1 | A1 | Ph | C=S | H |
| 2145 | H | D3 | A1 | A1 | Ph | C=S | H |
| 2146 | H | H | A2 | A2 | Ph | C=S | H |
| 2147 | H | D1 | A2 | A2 | Ph | C=S | H |
| 2148 | H | D2 | A2 | A2 | Ph | C=S | H |
| 2149 | H | D3 | A2 | A2 | Ph | C=S | H |
| 2150 | H | H | A3 | A3 | Ph | C=S | H |
| 2151 | H | D1 | A3 | A3 | Ph | C=S | H |
| 2152 | H | D2 | A3 | A3 | Ph | C=S | H |
| 2153 | H | D3 | A3 | A3 | Ph | C=S | H |
| 2154 | H | H | A4 | A4 | Ph | C=S | H |
| 2155 | H | D1 | A4 | A4 | Ph | C=S | H |
| 2156 | H | D2 | A4 | A4 | Ph | C=S | H |
| 2157 | H | D3 | A4 | A4 | Ph | C=S | H |
| 2158 | H | H | A5 | A5 | Ph | C=S | H |
| 2159 | H | D1 | A5 | A5 | Ph | C=S | H |
| 2160 | H | D2 | A5 | A5 | Ph | C=S | H |
| 2161 | H | D3 | A5 | A5 | Ph | C=S | H |
| 2162 | D1 | D1 | A1 | A1 | Ph | C=S | H |
| 2163 | D2 | D2 | A1 | A1 | Ph | C=S | H |
| 2164 | D3 | D3 | A1 | A1 | Ph | C=S | H |
| 2165 | D1 | D1 | A2 | A2 | Ph | C=S | H |
| 2166 | D2 | D2 | A2 | A2 | Ph | C=S | H |
| 2167 | D3 | D3 | A2 | A2 | Ph | C=S | H |
| 2168 | D1 | D1 | A3 | A3 | Ph | C=S | H |
| 2169 | D2 | D2 | A3 | A3 | Ph | C=S | H |
| 2170 | D3 | D3 | A3 | A3 | Ph | C=S | H |
| 2171 | D1 | D1 | A4 | A4 | Ph | C=S | H |
| 2172 | D2 | D2 | A4 | A4 | Ph | C=S | H |
| 2173 | D3 | D3 | A4 | A4 | Ph | C=S | H |
| 2174 | D1 | D1 | A5 | A5 | Ph | C=S | H |

TABLE 11-continued

| Compound No. | R² | R⁷ | R¹⁰ | R¹⁵ | R¹⁷ | Z | Other Rs |
|---|---|---|---|---|---|---|---|
| 2175 | D2 | D2 | A5 | A5 | Ph | C=S | H |
| 2176 | D3 | D3 | A5 | A5 | Ph | C=S | H |

TABLE 12

| Compound No. | R³ | R⁶ | R¹¹ | R¹⁴ | R¹⁷ | Z | Other Rs |
|---|---|---|---|---|---|---|---|
| 2177 | H | H | H | A1 | Ph | C=S | H |
| 2178 | H | D1 | H | A1 | Ph | C=S | H |
| 2179 | H | D2 | H | A1 | Ph | C=S | H |
| 2180 | H | D3 | H | A1 | Ph | C=S | H |
| 2181 | H | H | H | A2 | Ph | C=S | H |
| 2182 | H | D1 | H | A2 | Ph | C=S | H |
| 2183 | H | D2 | H | A2 | Ph | C=S | H |
| 2184 | H | D3 | H | A2 | Ph | C=S | H |
| 2185 | H | H | H | A3 | Ph | C=S | H |
| 2186 | H | D1 | H | A3 | Ph | C=S | H |
| 2187 | H | D2 | H | A3 | Ph | C=S | H |
| 2188 | H | D3 | H | A3 | Ph | C=S | H |
| 2189 | H | H | H | A4 | Ph | C=S | H |
| 2190 | H | D1 | H | A4 | Ph | C=S | H |
| 2191 | H | D2 | H | A4 | Ph | C=S | H |
| 2192 | H | D3 | H | A4 | Ph | C=S | H |
| 2193 | H | H | H | A5 | Ph | C=S | H |
| 2194 | H | D1 | H | A5 | Ph | C=S | H |
| 2195 | H | D2 | H | A5 | Ph | C=S | H |
| 2196 | H | D3 | H | A5 | Ph | C=S | H |
| 2197 | D1 | D1 | H | A1 | Ph | C=S | H |
| 2198 | D2 | D2 | H | A1 | Ph | C=S | H |
| 2199 | D3 | D3 | H | A1 | Ph | C=S | H |
| 2200 | D1 | D1 | H | A2 | Ph | C=S | H |
| 2201 | D2 | D2 | H | A2 | Ph | C=S | H |
| 2202 | D3 | D3 | H | A2 | Ph | C=S | H |
| 2203 | D1 | D1 | H | A3 | Ph | C=S | H |
| 2204 | D2 | D2 | H | A3 | Ph | C=S | H |
| 2205 | D3 | D3 | H | A3 | Ph | C=S | H |
| 2206 | D1 | D1 | H | A4 | Ph | C=S | H |
| 2207 | D2 | D2 | H | A4 | Ph | C=S | H |
| 2208 | D3 | D3 | H | A4 | Ph | C=S | H |
| 2209 | D1 | D1 | H | A5 | Ph | C=S | H |
| 2210 | D2 | D2 | H | A5 | Ph | C=S | H |
| 2211 | D3 | D3 | H | A5 | Ph | C=S | H |
| 2212 | H | H | H | H | Ph | C=S | H |

TABLE 13

| Compound No. | R² | R⁷ | R¹⁰ | R¹⁵ | R¹⁷ | Z | Other Rs |
|---|---|---|---|---|---|---|---|
| 2213 | H | H | A1 | A1 | Ph | C=C(CN)₂ | H |
| 2214 | H | D1 | A1 | A1 | Ph | C=C(CN)₂ | H |
| 2215 | H | D2 | A1 | A1 | Ph | C=C(CN)₂ | H |
| 2216 | H | D3 | A1 | A1 | Ph | C=C(CN)₂ | H |
| 2217 | H | H | A2 | A2 | Ph | C=C(CN)₂ | H |
| 2218 | H | D1 | A2 | A2 | Ph | C=C(CN)₂ | H |
| 2219 | H | D2 | A2 | A2 | Ph | C=C(CN)₂ | H |
| 2220 | H | D3 | A2 | A2 | Ph | C=C(CN)₂ | H |
| 2221 | H | H | A3 | A3 | Ph | C=C(CN)₂ | H |
| 2222 | H | D1 | A3 | A3 | Ph | C=C(CN)₂ | H |
| 2223 | H | D2 | A3 | A3 | Ph | C=C(CN)₂ | H |
| 2224 | H | D3 | A3 | A3 | Ph | C=C(CN)₂ | H |
| 2225 | H | H | A4 | A4 | Ph | C=C(CN)₂ | H |
| 2226 | H | D1 | A4 | A4 | Ph | C=C(CN)₂ | H |
| 2227 | H | D2 | A4 | A4 | Ph | C=C(CN)₂ | H |
| 2228 | H | D3 | A4 | A4 | Ph | C=C(CN)₂ | H |
| 2229 | H | H | A5 | A5 | Ph | C=C(CN)₂ | H |
| 2230 | H | D1 | A5 | A5 | Ph | C=C(CN)₂ | H |
| 2231 | H | D2 | A5 | A5 | Ph | C=C(CN)₂ | H |
| 2232 | H | D3 | A5 | A5 | Ph | C=C(CN)₂ | H |
| 2233 | D1 | D1 | A1 | A1 | Ph | C=C(CN)₂ | H |
| 2234 | D2 | D2 | A1 | A1 | Ph | C=C(CN)₂ | H |
| 2235 | D3 | D3 | A1 | A1 | Ph | C=C(CN)₂ | H |
| 2236 | D1 | D1 | A2 | A2 | Ph | C=C(CN)₂ | H |
| 2237 | D2 | D2 | A2 | A2 | Ph | C=C(CN)₂ | H |
| 2238 | D3 | D3 | A2 | A2 | Ph | C=C(CN)₂ | H |
| 2239 | D1 | D1 | A3 | A3 | Ph | C=C(CN)₂ | H |
| 2240 | D2 | D2 | A3 | A3 | Ph | C=C(CN)₂ | H |
| 2241 | D3 | D3 | A3 | A3 | Ph | C=C(CN)₂ | H |
| 2242 | D1 | D1 | A4 | A4 | Ph | C=C(CN)₂ | H |
| 2243 | D2 | D2 | A4 | A4 | Ph | C=C(CN)₂ | H |
| 2244 | D3 | D3 | A4 | A4 | Ph | C=C(CN)₂ | H |
| 2245 | D1 | D1 | A5 | A5 | Ph | C=C(CN)₂ | H |
| 2246 | D2 | D2 | A5 | A5 | Ph | C=C(CN)₂ | H |
| 2247 | D3 | D3 | A5 | A5 | Ph | C=C(CN)₂ | H |

TABLE 14

| Compound No. | R³ | R⁶ | R¹¹ | R¹⁴ | R¹⁷ | Z | Other Rs |
|---|---|---|---|---|---|---|---|
| 2248 | H | H | H | A1 | Ph | C=C(CN)₂ | H |
| 2249 | H | D1 | H | A1 | Ph | C=C(CN)₂ | H |
| 2250 | H | D2 | H | A1 | Ph | C=C(CN)₂ | H |
| 2251 | H | D3 | H | A1 | Ph | C=C(CN)₂ | H |
| 2252 | H | H | H | A2 | Ph | C=C(CN)₂ | H |
| 2253 | H | D1 | H | A2 | Ph | C=C(CN)₂ | H |
| 2254 | H | D2 | H | A2 | Ph | C=C(CN)₂ | H |
| 2255 | H | D3 | H | A2 | Ph | C=C(CN)₂ | H |
| 2256 | H | H | H | A3 | Ph | C=C(CN)₂ | H |
| 2257 | H | D1 | H | A3 | Ph | C=C(CN)₂ | H |
| 2258 | H | D2 | H | A3 | Ph | C=C(CN)₂ | H |
| 2259 | H | D3 | H | A3 | Ph | C=C(CN)₂ | H |
| 2260 | H | H | H | A4 | Ph | C=C(CN)₂ | H |
| 2261 | H | D1 | H | A4 | Ph | C=C(CN)₂ | H |
| 2262 | H | D2 | H | A4 | Ph | C=C(CN)₂ | H |
| 2263 | H | D3 | H | A4 | Ph | C=C(CN)₂ | H |
| 2264 | H | H | H | A5 | Ph | C=C(CN)₂ | H |
| 2265 | H | D1 | H | A5 | Ph | C=C(CN)₂ | H |
| 2266 | H | D2 | H | A5 | Ph | C=C(CN)₂ | H |
| 2267 | H | D3 | H | A5 | Ph | C=C(CN)₂ | H |
| 2268 | D1 | D1 | H | A1 | Ph | C=C(CN)₂ | H |
| 2269 | D2 | D2 | H | A1 | Ph | C=C(CN)₂ | H |
| 2270 | D3 | D3 | H | A1 | Ph | C=C(CN)₂ | H |
| 2271 | D1 | D1 | H | A2 | Ph | C=C(CN)₂ | H |
| 2272 | D2 | D2 | H | A2 | Ph | C=C(CN)₂ | H |
| 2273 | D3 | D3 | H | A2 | Ph | C=C(CN)₂ | H |
| 2274 | D1 | D1 | H | A3 | Ph | C=C(CN)₂ | H |
| 2275 | D2 | D2 | H | A3 | Ph | C=C(CN)₂ | H |
| 2276 | D3 | D3 | H | A3 | Ph | C=C(CN)₂ | H |
| 2277 | D1 | D1 | H | A4 | Ph | C=C(CN)₂ | H |
| 2278 | D2 | D2 | H | A4 | Ph | C=C(CN)₂ | H |
| 2279 | D3 | D3 | H | A4 | Ph | C=C(CN)₂ | H |
| 2280 | D1 | D1 | H | A5 | Ph | C=C(CN)₂ | H |
| 2281 | D2 | D2 | H | A5 | Ph | C=C(CN)₂ | H |
| 2282 | D3 | D3 | H | A5 | Ph | C=C(CN)₂ | H |
| 2283 | H | H | H | H | Ph | C=C(CN)₂ | H |

TABLE 15

| Compound No. | R² | R⁷ | R¹⁰ | R¹⁵ | R¹⁷ | Z | Other Rs |
|---|---|---|---|---|---|---|---|
| 2284 | H | H | A1 | A1 | Ph | C=C(COOH)₂ | H |
| 2285 | H | D1 | A1 | A1 | Ph | C=C(COOH)₂ | H |
| 2286 | H | D2 | A1 | A1 | Ph | C=C(COOH)₂ | H |
| 2287 | H | D3 | A1 | A1 | Ph | C=C(COOH)₂ | H |
| 2288 | H | H | A2 | A2 | Ph | C=C(COOH)₂ | H |
| 2289 | H | D1 | A2 | A2 | Ph | C=C(COOH)₂ | H |
| 2290 | H | D2 | A2 | A2 | Ph | C=C(COOH)₂ | H |
| 2291 | H | D3 | A2 | A2 | Ph | C=C(COOH)₂ | H |
| 2292 | H | H | A3 | A3 | Ph | C=C(COOH)₂ | H |
| 2293 | H | D1 | A3 | A3 | Ph | C=C(COOH)₂ | H |
| 2294 | H | D2 | A3 | A3 | Ph | C=C(COOH)₂ | H |
| 2295 | H | D3 | A3 | A3 | Ph | C=C(COOH)₂ | H |
| 2296 | H | H | A4 | A4 | Ph | C=C(COOH)₂ | H |
| 2297 | H | D1 | A4 | A4 | Ph | C=C(COOH)₂ | H |
| 2298 | H | D2 | A4 | A4 | Ph | C=C(COOH)₂ | H |
| 2299 | H | D3 | A4 | A4 | Ph | C=C(COOH)₂ | H |

TABLE 15-continued

| Compound No. | R² | R⁷ | R¹⁰ | R¹⁵ | R¹⁷ | Z | Other Rs |
|---|---|---|---|---|---|---|---|
| 2300 | H | H | A5 | A5 | Ph | C=C(COOH)₂ | H |
| 2301 | H | D1 | A5 | A5 | Ph | C=C(COOH)₂ | H |
| 2302 | H | D2 | A5 | A5 | Ph | C=C(COOH)₂ | H |
| 2303 | H | D3 | A5 | A5 | Ph | C=C(COOH)₂ | H |
| 2304 | D1 | D1 | A1 | A1 | Ph | C=C(COOH)₂ | H |
| 2305 | D2 | D2 | A1 | A1 | Ph | C=C(COOH)₂ | H |
| 2306 | D3 | D3 | A1 | A1 | Ph | C=C(COOH)₂ | H |
| 2307 | D1 | D1 | A2 | A2 | Ph | C=C(COOH)₂ | H |
| 2308 | D2 | D2 | A2 | A2 | Ph | C=C(COOH)₂ | H |
| 2309 | D3 | D3 | A2 | A2 | Ph | C=C(COOH)₂ | H |
| 2310 | D1 | D1 | A3 | A3 | Ph | C=C(COOH)₂ | H |
| 2311 | D2 | D2 | A3 | A3 | Ph | C=C(COOH)₂ | H |
| 2312 | D3 | D3 | A3 | A3 | Ph | C=C(COOH)₂ | H |
| 2313 | D1 | D1 | A4 | A4 | Ph | C=C(COOH)₂ | H |
| 2314 | D2 | D2 | A4 | A4 | Ph | C=C(COOH)₂ | H |
| 2315 | D3 | D3 | A4 | A4 | Ph | C=C(COOH)₂ | H |
| 2316 | D1 | D1 | A5 | A5 | Ph | C=C(COOH)₂ | H |
| 2317 | D2 | D2 | A5 | A5 | Ph | C=C(COOH)₂ | H |
| 2318 | D3 | D3 | A5 | A5 | Ph | C=C(COOH)₂ | H |

TABLE 16

| Compound No. | R³ | R⁶ | R¹¹ | R¹⁴ | R¹⁷ | Z | Other Rs |
|---|---|---|---|---|---|---|---|
| 2319 | H | H | H | A1 | Ph | C=C(COOH)₂ | H |
| 2320 | H | D1 | H | A1 | Ph | C=C(COOH)₂ | H |
| 2321 | H | D2 | H | A1 | Ph | C=C(COOH)₂ | H |
| 2322 | H | D3 | H | A1 | Ph | C=C(COOH)₂ | H |
| 2323 | H | H | H | A2 | Ph | C=C(COOH)₂ | H |
| 2324 | H | D1 | H | A2 | Ph | C=C(COOH)₂ | H |
| 2325 | H | D2 | H | A2 | Ph | C=C(COOH)₂ | H |
| 2326 | H | D3 | H | A2 | Ph | C=C(COOH)₂ | H |
| 2327 | H | H | H | A3 | Ph | C=C(COOH)₂ | H |
| 2328 | H | D1 | H | A3 | Ph | C=C(COOH)₂ | H |
| 2329 | H | D2 | H | A3 | Ph | C=C(COOH)₂ | H |
| 2330 | H | D3 | H | A3 | Ph | C=C(COOH)₂ | H |
| 2331 | H | H | H | A4 | Ph | C=C(COOH)₂ | H |
| 2332 | H | D1 | H | A4 | Ph | C=C(COOH)₂ | H |
| 2333 | H | D2 | H | A4 | Ph | C=C(COOH)₂ | H |
| 2334 | H | D3 | H | A4 | Ph | C=C(COOH)₂ | H |
| 2335 | H | H | H | A5 | Ph | C=C(COOH)₂ | H |
| 2336 | H | D1 | H | A5 | Ph | C=C(COOH)₂ | H |
| 2337 | H | D2 | H | A5 | Ph | C=C(COOH)₂ | H |
| 2338 | H | D3 | H | A5 | Ph | C=C(COOH)₂ | H |
| 2339 | D1 | D1 | H | A1 | Ph | C=C(COOH)₂ | H |
| 2340 | D2 | D2 | H | A1 | Ph | C=C(COOH)₂ | H |
| 2341 | D3 | D3 | H | A1 | Ph | C=C(COOH)₂ | H |
| 2342 | D1 | D1 | H | A2 | Ph | C=C(COOH)₂ | H |
| 2343 | D2 | D2 | H | A2 | Ph | C=C(COOH)₂ | H |
| 2344 | D3 | D3 | H | A2 | Ph | C=C(COOH)₂ | H |
| 2345 | D1 | D1 | H | A3 | Ph | C=C(COOH)₂ | H |
| 2346 | D2 | D2 | H | A3 | Ph | C=C(COOH)₂ | H |
| 2347 | D3 | D3 | H | A3 | Ph | C=C(COOH)₂ | H |
| 2348 | D1 | D1 | H | A4 | Ph | C=C(COOH)₂ | H |
| 2349 | D2 | D2 | H | A4 | Ph | C=C(COOH)₂ | H |
| 2350 | D3 | D3 | H | A4 | Ph | C=C(COOH)₂ | H |
| 2351 | D1 | D1 | H | A5 | Ph | C=C(COOH)₂ | H |
| 2352 | D2 | D2 | H | A5 | Ph | C=C(COOH)₂ | H |
| 2353 | D3 | D3 | H | A5 | Ph | C=C(COOH)₂ | H |
| 2354 | H | H | H | H | Ph | C=C(COOH)₂ | H |

Examples of the preferred light emitting material capable of emitting delayed fluorescent light include compounds represented by the following general formula (151). The entire description of WO 2013/011955 including the paragraphs 0007 to 0033 and 0059 to 0066 is incorporated herein by reference.

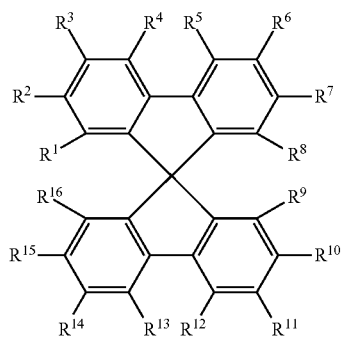

General Formula (151)

wherein in the general formula (151), $R^1$, $R^2$, $R^3$, $R^4$, $R^5$, $R^6$, $R^7$, and $R^8$ each independently represent a hydrogen atom or an electron donating group, provided that at least one thereof represents an electron donating group; $R^9$, $R^{10}$, $R^{11}$, $R^{12}$, $R^{13}$, $R^{14}$, $R^{15}$ and $R^{16}$ each independently represent a hydrogen atom or an electron withdrawing group, provided, that, at least one thereof represents an electron withdrawing group.

Specific examples of the compounds include the compounds shown in the following tables. In the tables, D1 to D10 represent the unsubstituted electron donating groups having the following structures, respectively.

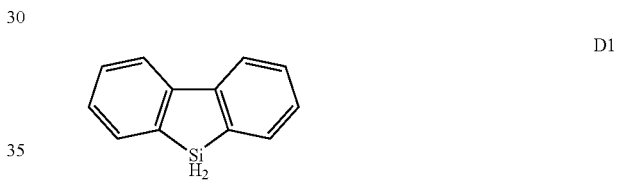

D1

D2

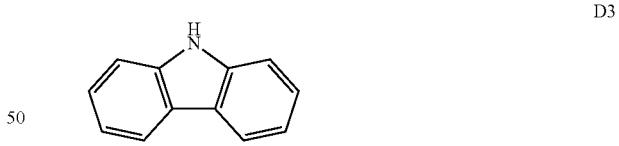

D3

D4

D5

-continued

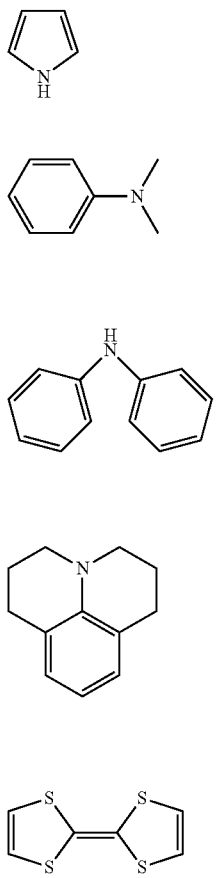

TABLE 17

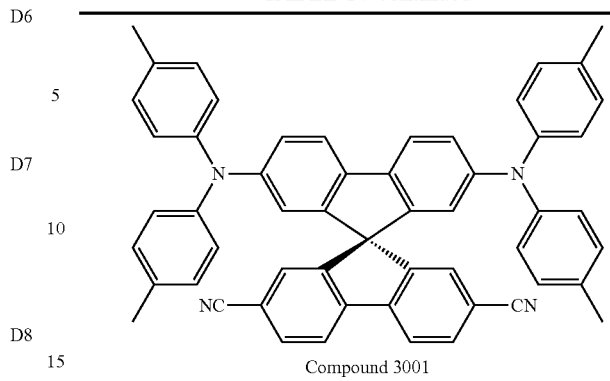

Compound 3001

| Compound No. | R² | R⁷ | R¹⁰ | R¹⁵ | Other Rs |
|---|---|---|---|---|---|
| 3002 | D1 | D1 | CN | CN | H |
| 3003 | D2 | D2 | CN | CN | H |

TABLE 17-continued

| Compound No. | R² | R⁷ | R¹⁰ | R¹⁵ | Other Rs |
|---|---|---|---|---|---|
| 3004 | D3 | D3 | CN | CN | H |
| 3005 | D4 | D4 | CN | CN | H |
| 3006 | D5 | D5 | CN | CN | H |
| 3007 | D6 | D6 | CN | CN | H |
| 3008 | D7 | D7 | CN | CN | H |
| 3009 | D8 | D8 | CN | CN | H |
| 3010 | D9 | D9 | CN | CN | H |
| 3011 | D10 | D10 | CN | CN | H |
| 3012 | H | D1 | H | CN | H |
| 3013 | H | D2 | H | CN | H |
| 3014 | H | D3 | H | CN | H |
| 3015 | H | D4 | H | CN | H |
| 3016 | H | D5 | H | CN | H |
| 3017 | H | D6 | H | CN | H |
| 3018 | H | D7 | H | CN | H |
| 3019 | H | D8 | H | CN | H |
| 3020 | H | D9 | H | CN | H |
| 3021 | H | D10 | H | CN | H |

TABLE 18

| Compound No. | R³ | R⁶ | R¹¹ | R¹⁴ | Other Rs |
|---|---|---|---|---|---|
| 3022 | D1 | D1 | CN | CN | H |
| 3023 | D2 | D2 | CN | CN | H |
| 3024 | D3 | D3 | CN | CN | H |
| 3025 | D4 | D4 | CN | CN | H |
| 3026 | D5 | D5 | CN | CN | H |
| 3027 | D6 | D6 | CN | CN | H |
| 3028 | D7 | D7 | CN | CN | H |
| 3029 | D8 | D8 | CN | CN | H |
| 3030 | D9 | D9 | CN | CN | H |
| 3031 | D10 | D10 | CN | CN | H |
| 3032 | H | D1 | H | CN | H |
| 3033 | H | D2 | H | CN | H |
| 3034 | H | D3 | H | CN | H |
| 3035 | H | D4 | H | CN | H |
| 3036 | H | D5 | H | CN | H |
| 3037 | H | D6 | H | CN | H |
| 3038 | H | D7 | H | CN | H |
| 3039 | H | D8 | H | CN | H |
| 3040 | H | D9 | H | CN | H |
| 3041 | H | D10 | H | CN | H |

TABLE 19

| Compound No. | R², R⁷ | R³, R⁶ | R¹⁰, R¹⁵ | R¹¹, R¹⁴ | Other Rs |
|---|---|---|---|---|---|
| 3042 | diphenylamino group | H | CN | H | H |
| 3043 | bis(2-methylphenyl)amino group | H | CN | H | H |
| 3044 | bis(3-methylphenyl)amino group | H | CN | H | H |
| 3045 | bis(2,4-dimethylphenyl)amino group | H | CN | H | H |

TABLE 19-continued

| Compound No. | $R^2$, $R^7$ | $R^3$, $R^6$ | $R^{10}$, $R^{15}$ | $R^{11}$, $R^{14}$ | Other Rs |
|---|---|---|---|---|---|
| 3046 | bis(2,6-dimethylphenyl)amino group | H | CN | H | H |
| 3047 | bis(3,5-dimethylphenyl)amino group | H | CN | H | H |
| 3048 | bis(2,4,6-trimethylphenyl)amino group | H | CN | H | H |
| 3049 | bis(4-ethylphenyl)amino group | H | CN | H | H |
| 3050 | bis(4-propylphenyl)amino group | H | CN | H | H |
| 3051 | diphenylamino group | H | H | CN | H |
| 3052 | bis(2-methylphenyl)amino group | H | H | CN | H |
| 3053 | bis(3-methylphenyl)amino group | H | H | CN | H |
| 3054 | bis(4-methylphenyl)amino group | H | H | CN | H |
| 3055 | bis(2,4-dimethylphenyl)amino group | H | H | CN | H |
| 3056 | bis(2,6-dimethylphenyl)amino group | H | H | CN | H |
| 3057 | bis(3,5-dimethylphenyl)amino group | H | H | CN | H |
| 3058 | bis(2,4,6-trimethylphenyl)amino group | H | H | CN | H |
| 3059 | bis(4-ethylphenyl)amino group | H | H | CN | H |
| 3060 | bis(4-propylphenyl)amino group | H | H | CN | H |

TABLE 20

| Compound No. | $R^2$, $R^7$ | $R^3$, $R^8$ | $R^{10}$, $R^{15}$ | $R^{11}$, $R^{14}$ | Other Rs |
|---|---|---|---|---|---|
| 3061 | H | diphenylamino group | CN | H | H |
| 3062 | H | bis(2-methylphenyl)amino group | CN | H | H |
| 3063 | H | bis(3-methylphenyl)amino group | CN | H | H |
| 3064 | H | bis(4-methylphenyl)amino group | CN | H | H |
| 3065 | H | bis(2,4-dimethylphenyl)amino group | CN | H | H |
| 3066 | H | bis(2,6-dimethylphenyl)amino group | CN | H | H |
| 3067 | H | bis(3,5-dimethylphenyl)amino group | CN | H | H |
| 3068 | H | bis(2,4,6-trimethylphenyl)amino group | CN | H | H |
| 3069 | H | bis(4-ethylphenyl)amino group | CN | H | H |
| 3070 | H | bis(4-propylphenyl)amino group | CN | H | H |
| 3071 | H | diphenylamino group | H | CN | H |
| 3072 | H | bis(2-methylphenyl)amino group | H | CN | H |
| 3073 | H | bis(3-methylphenyl)amino group | H | CN | H |
| 3074 | H | bis(4-methylphenyl)amino group | H | CN | H |
| 3075 | H | bis(2,4-dimethylphenyl)amino group | H | CN | H |
| 3076 | H | bis(2,6-dimethylphenyl)amino group | H | CN | H |
| 3077 | H | bis(3,5-dimethylphenyl)amino group | H | CN | H |
| 3078 | H | bis(2,4,6-trimethylphenyl)amino group | H | CN | H |
| 3079 | H | bis(4-ethylphenyl)amino group | H | CN | H |
| 3080 | H | bis(4-propylphenyl)amino group | H | CN | H |

Examples of the preferred light emitting material capable of emitting delayed fluorescent light include compounds represented by the following general formula (161). The entire description of WO 2013/081088 including the paragraphs 0006 to 0071 and 0118 to 0133 is incorporated, herein by reference.

General Formula (161)

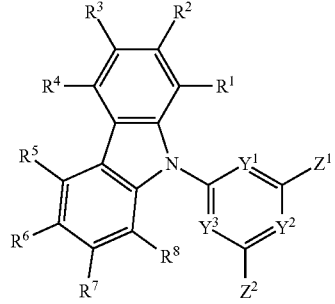

wherein in the general formula (161), any two or $Y^1$, $Y^2$ and $Y^3$ each represent a nitrogen atom, and the balance thereof represents a methane group, of all $Y^1$, $Y^2$ and $Y^3$ each represent a nitrogen atom; $Z^1$ and $Z^2$ each independently represent a hydrogen atom or a substituent; and $R^1$ to $R^8$ each independently represent, a hydrogen atom or a substituent, provided that at least one of $R^1$ to $R^8$ represents a substituted or unsubstituted diarylamino group or a substituted or unsubstituted carbazolyl group. The compound represented by the general, formula (161) has at least two carbazole structures in the molecule thereof.

Examples of the compound include the following compounds.

1

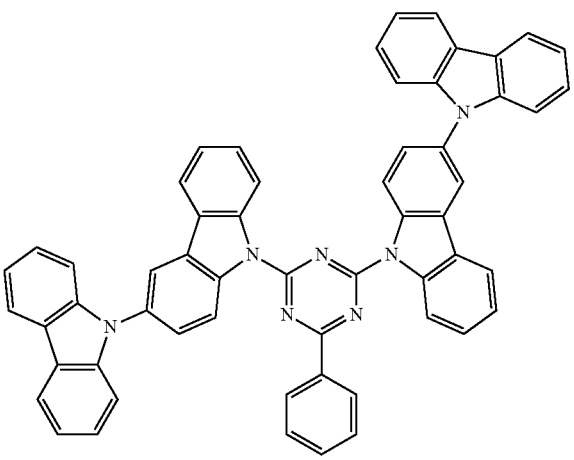

-continued
2
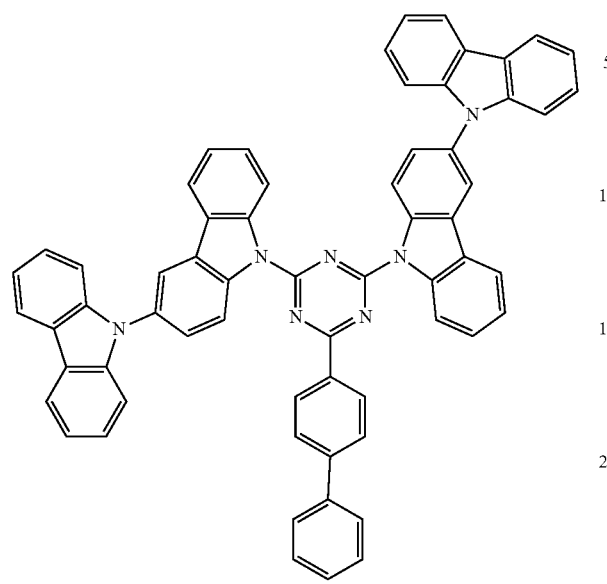
3
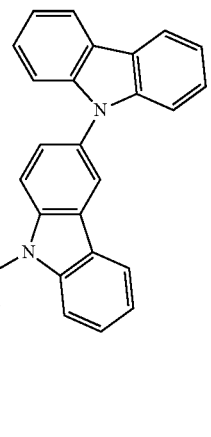
4
-continued
5

6
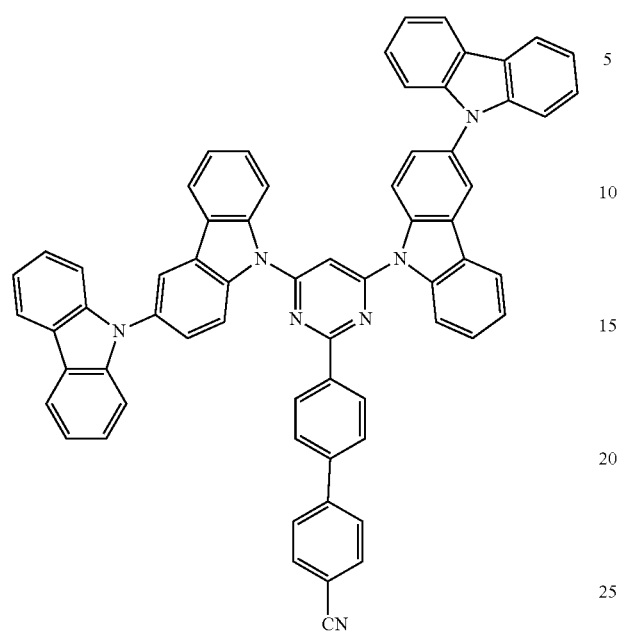
7
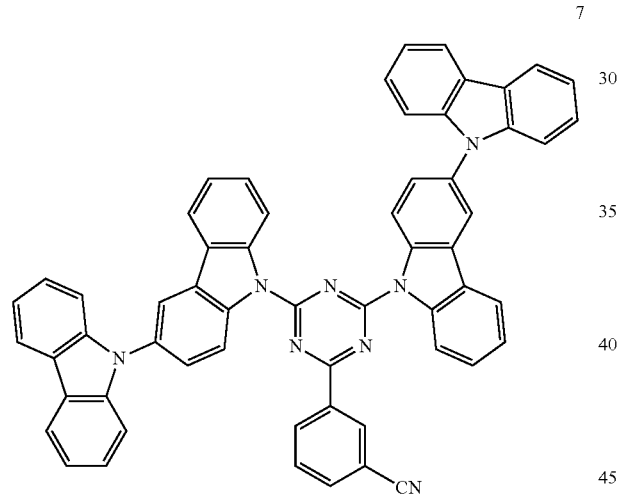
8
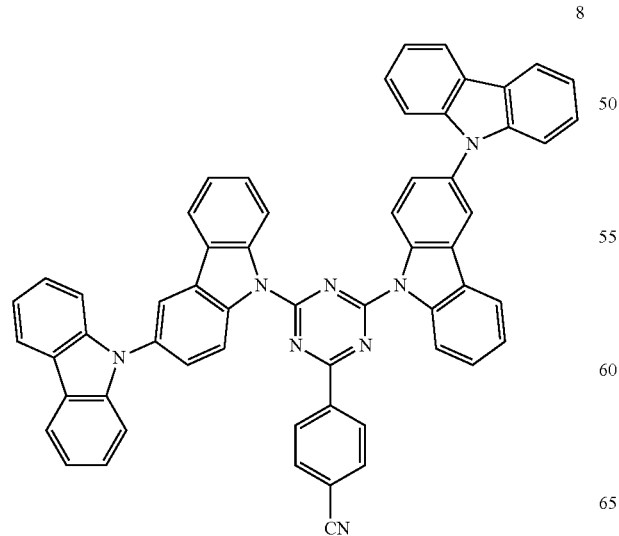
9
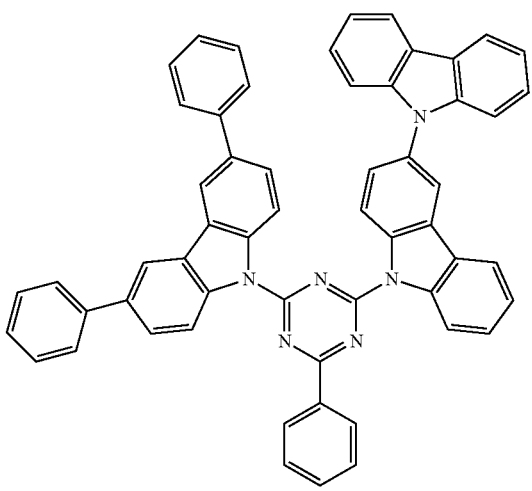
10
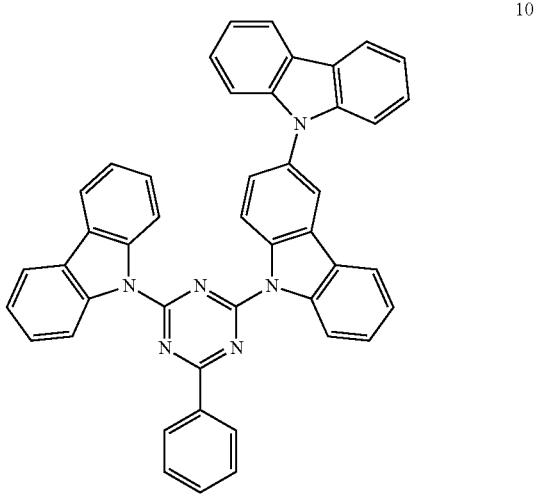
11

115
-continued
12
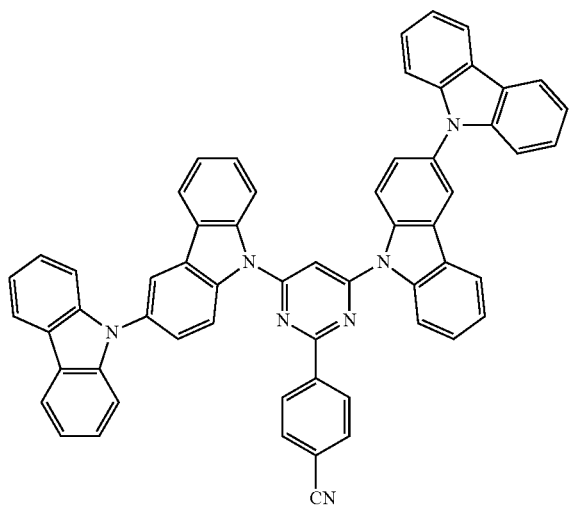
13
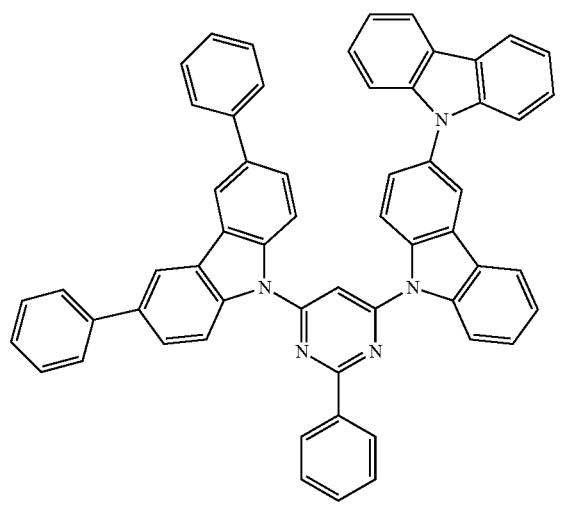
14
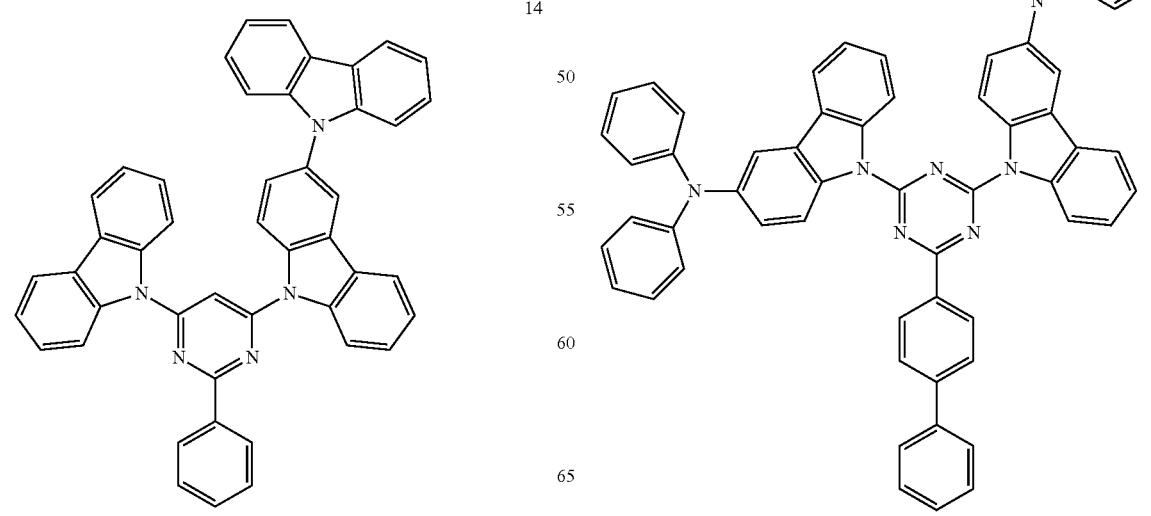
116
-continued
15
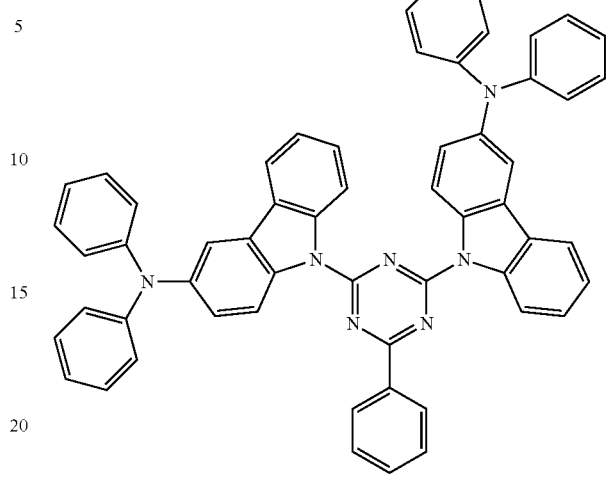
16

17
-continued
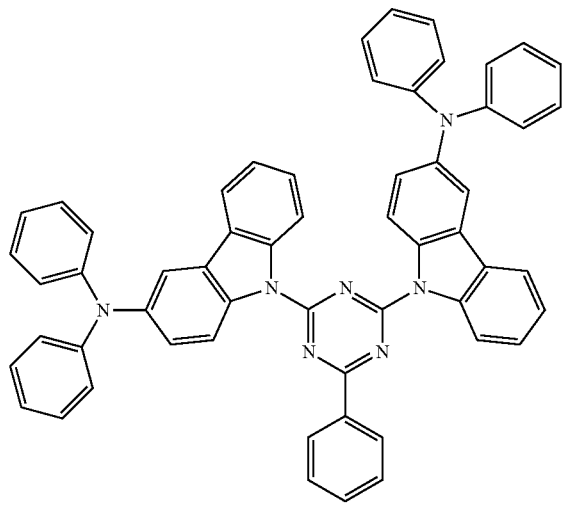
18
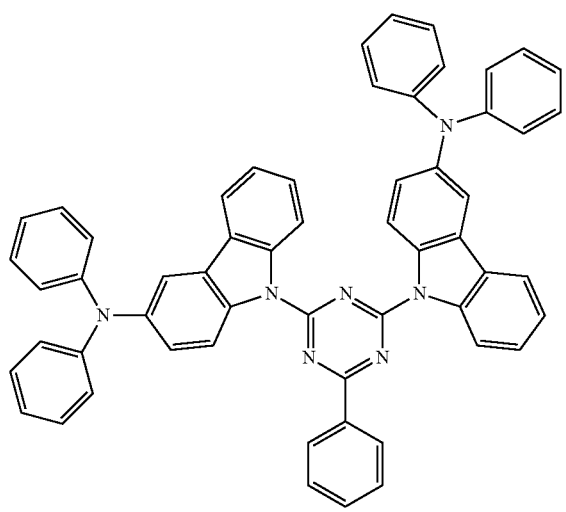
118
-continued
19
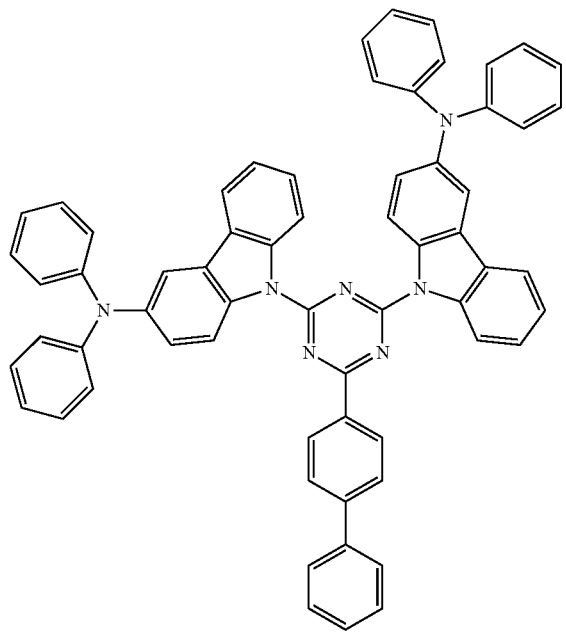
20
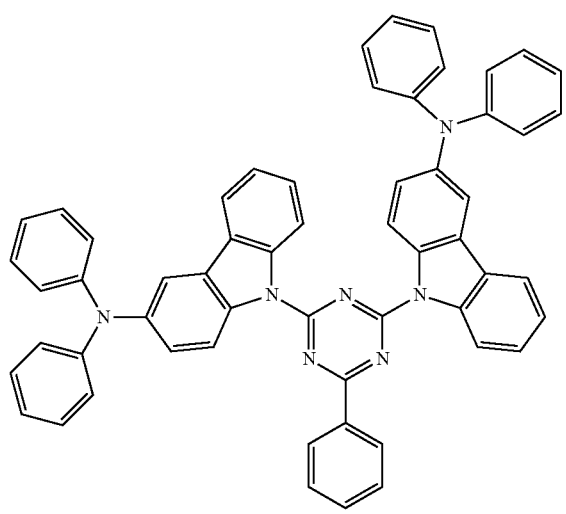

21
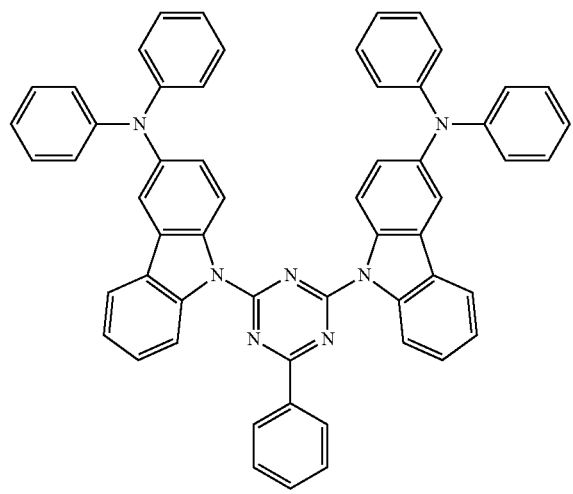
22
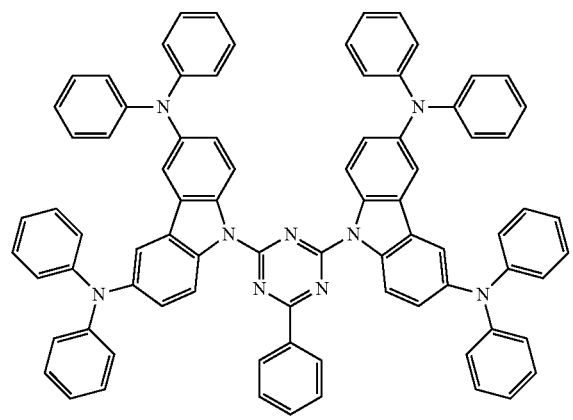
23
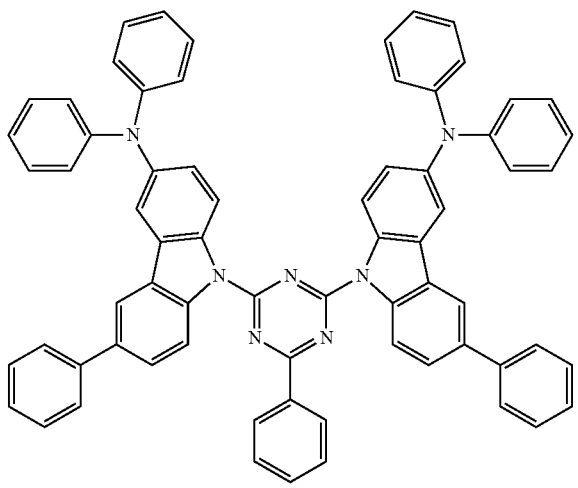
24
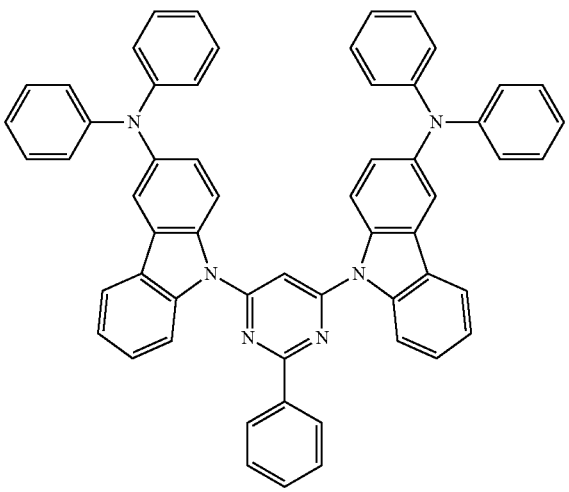
25
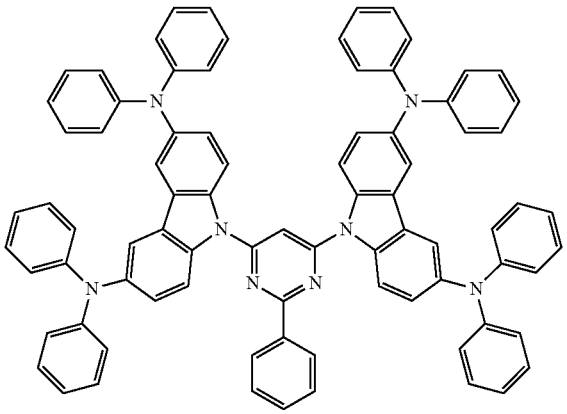
26
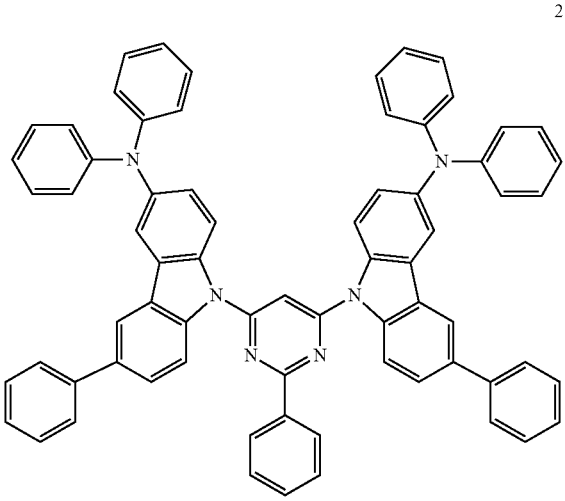

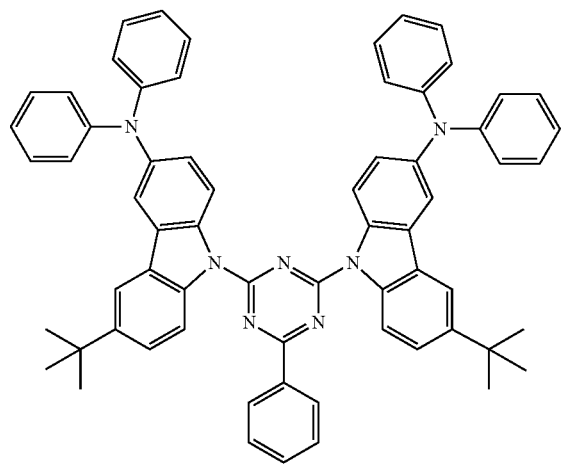
27
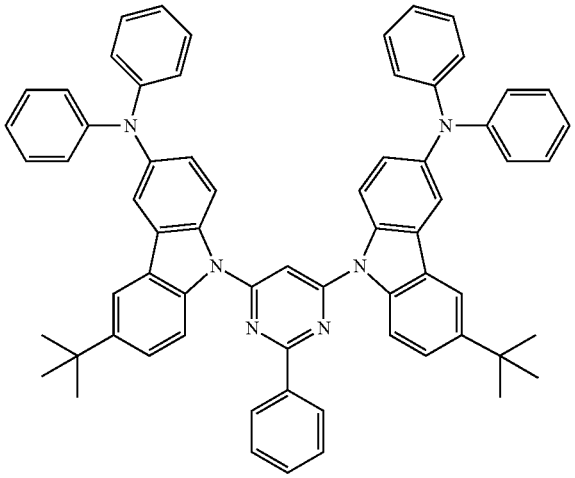
30
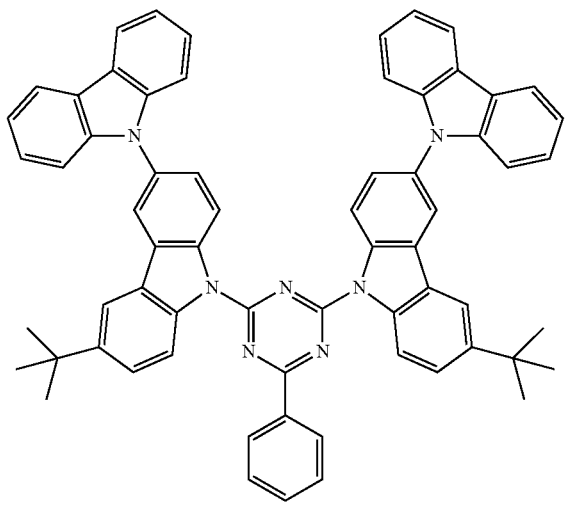
28
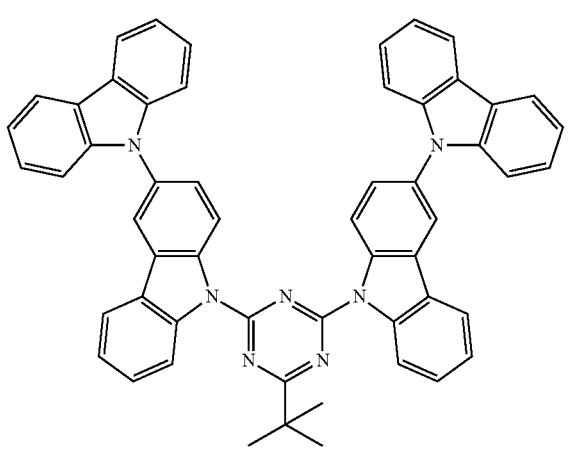
29
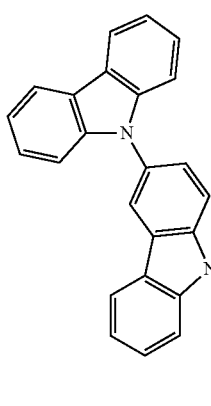
31
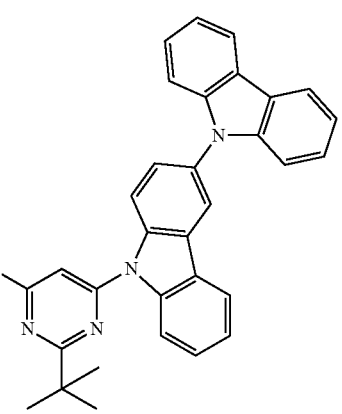
32

33
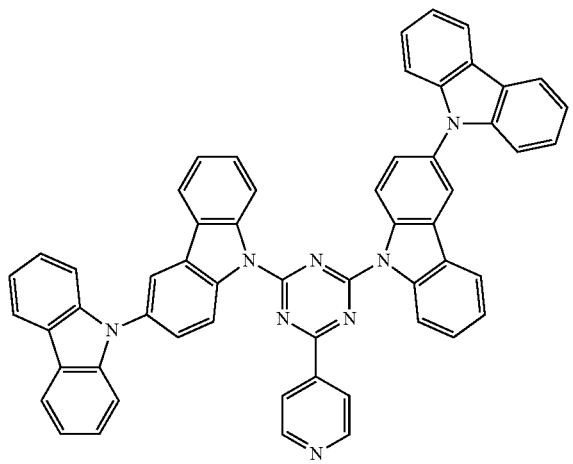
34
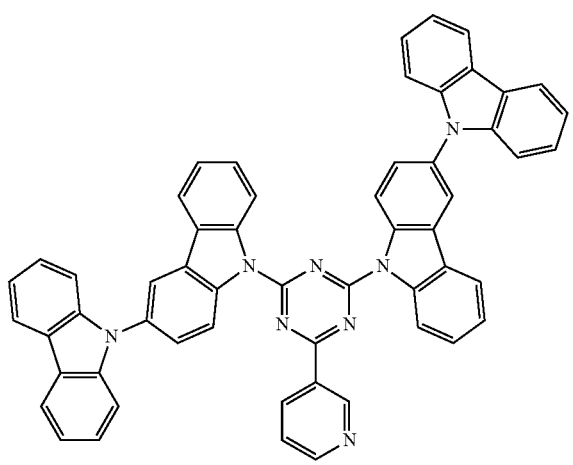
35
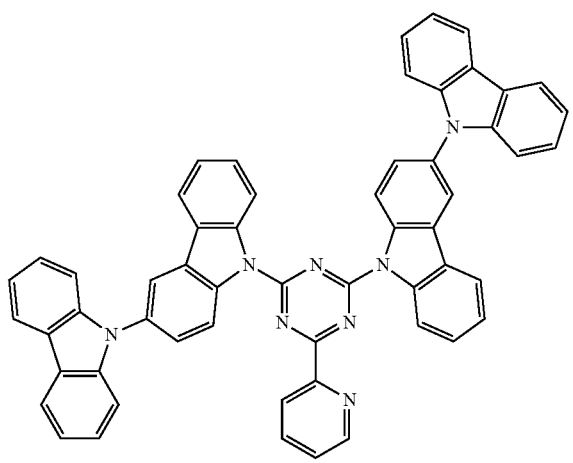
36
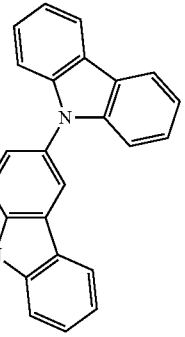
37
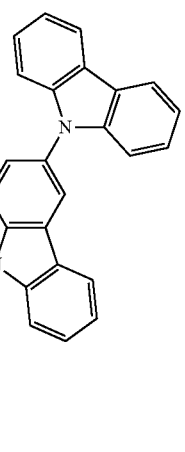
38

39
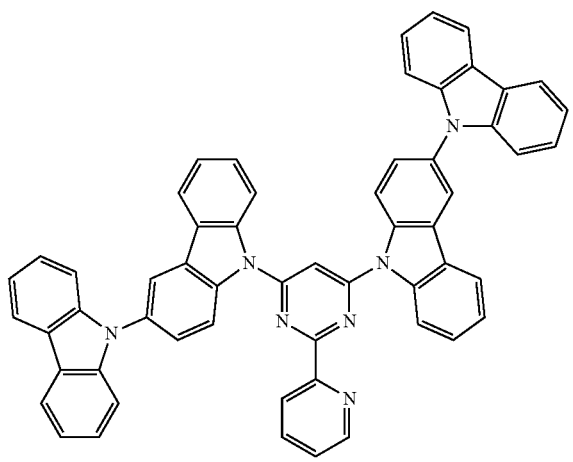
40
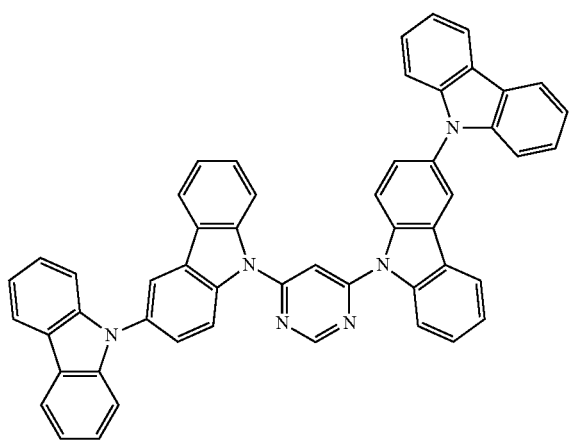
41
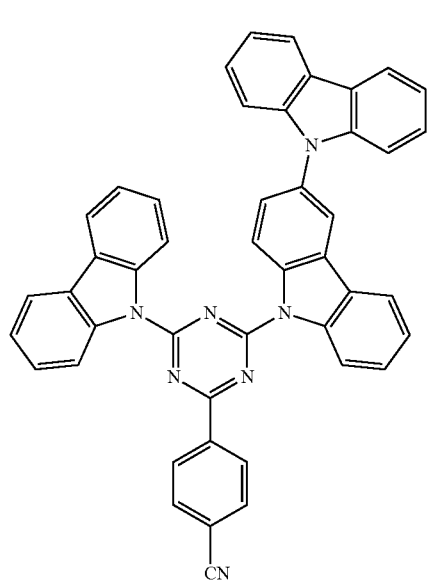
42
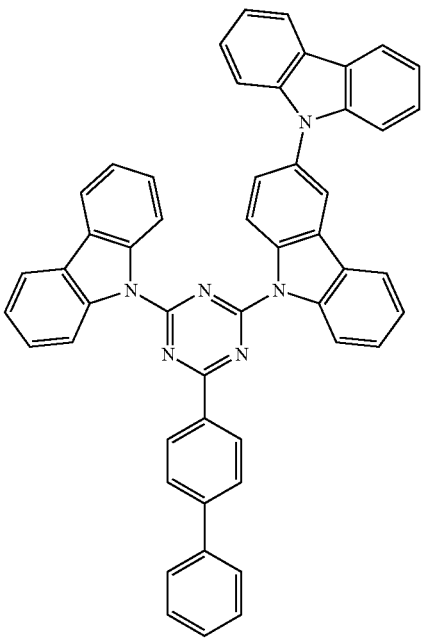
43
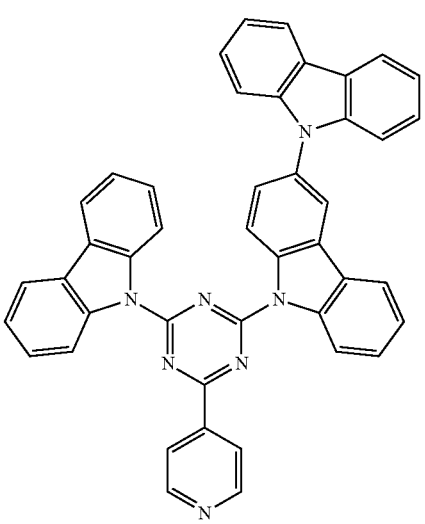

US 10,600,983 B2
44
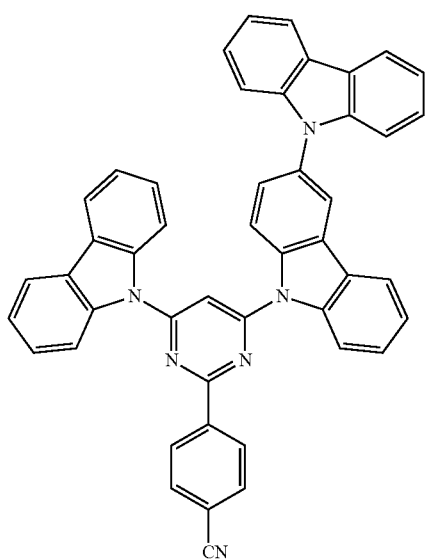
45
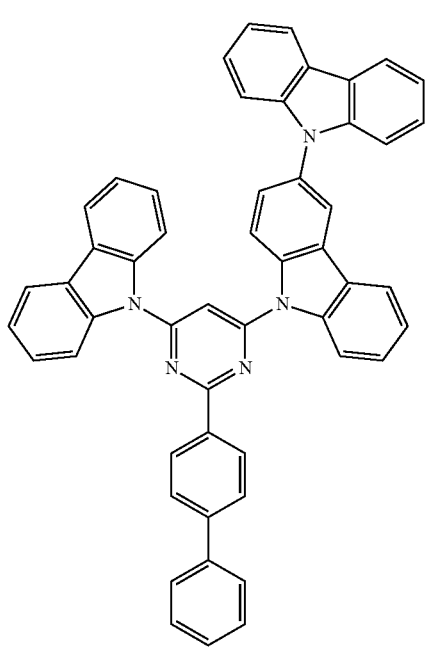
46
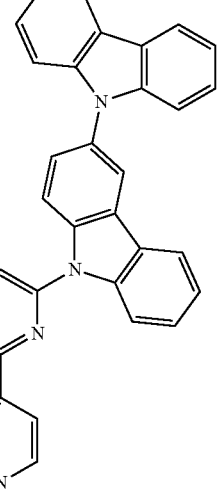
47
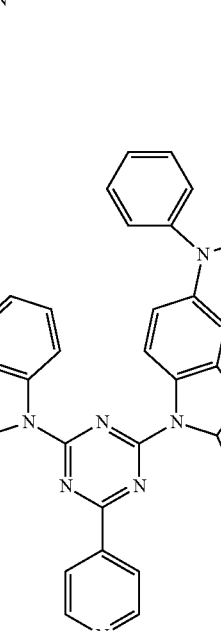
48

-continued
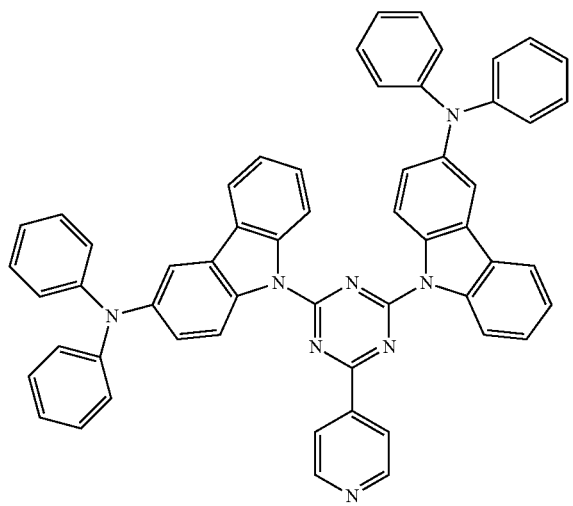
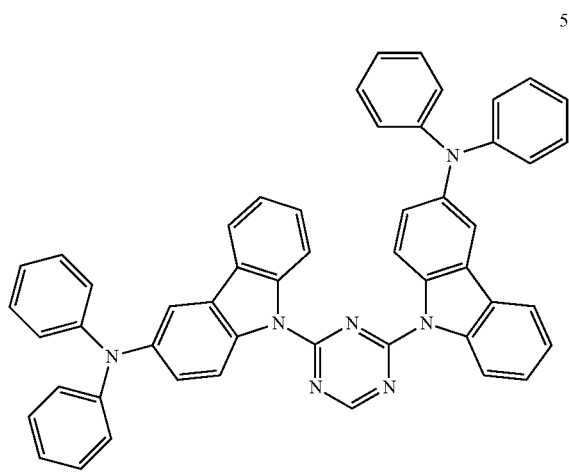
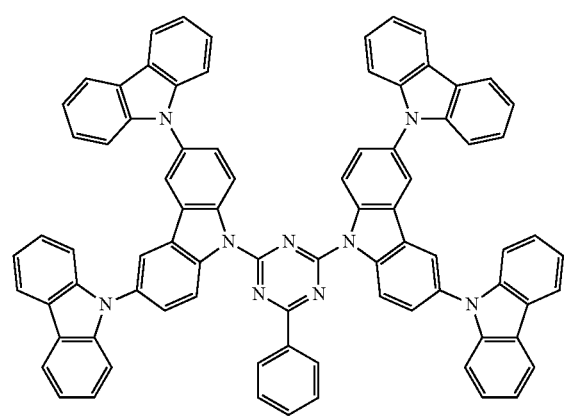
-continued
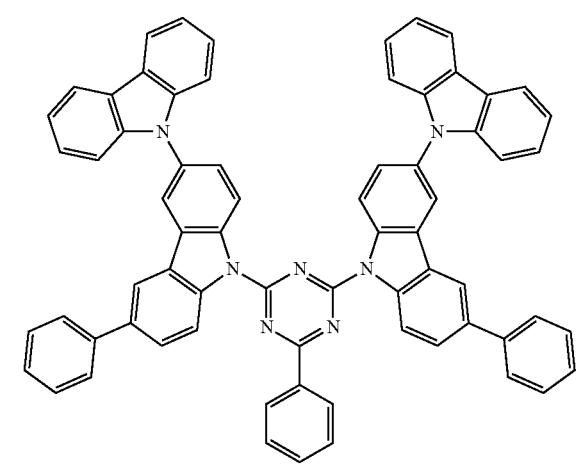
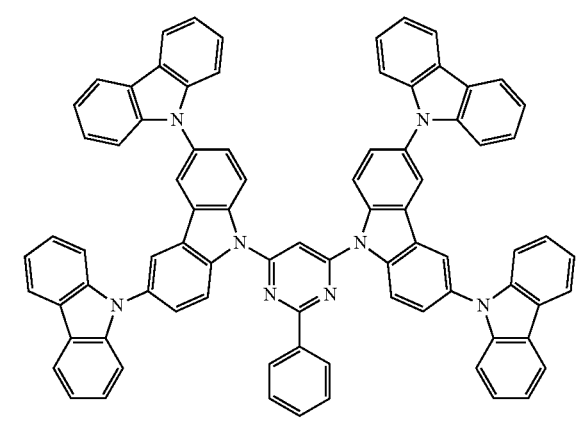
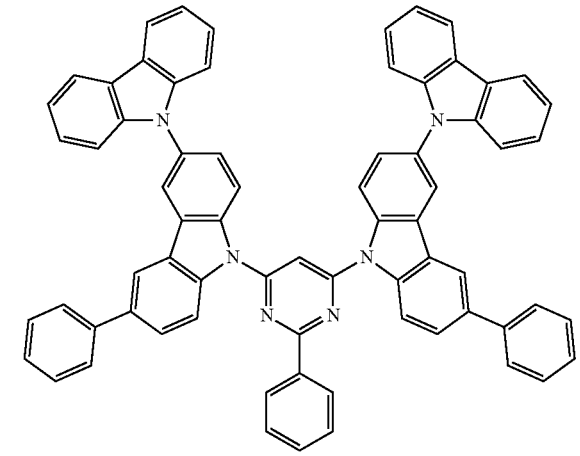

131
-continued
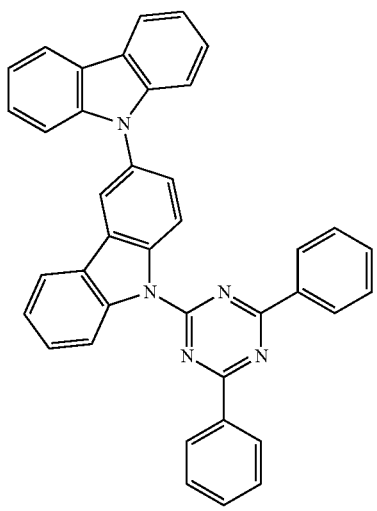
55
132
-continued
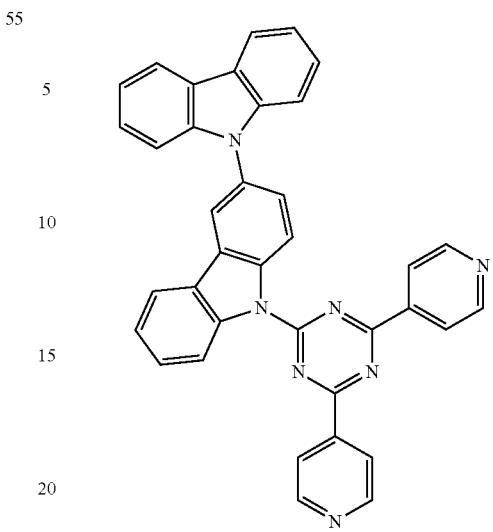
58
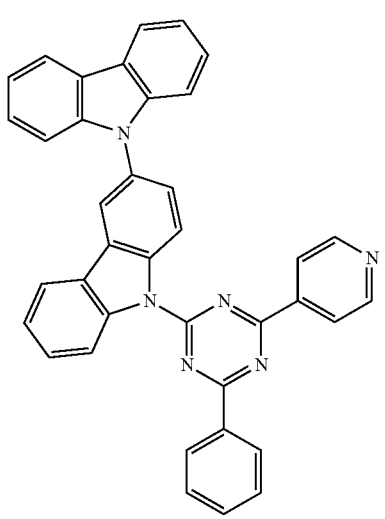
56
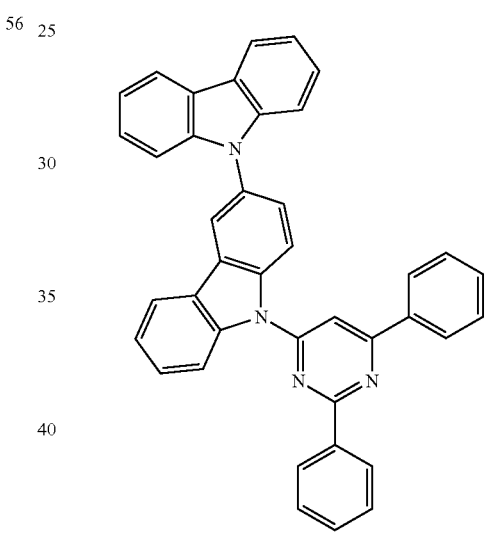
59
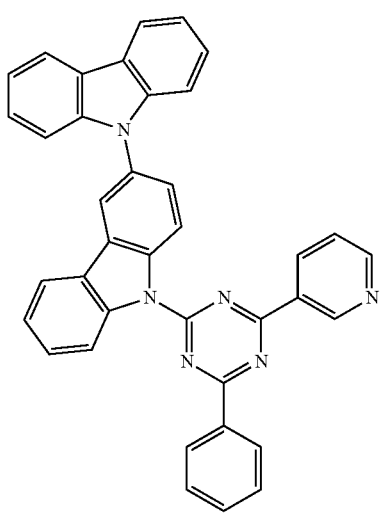
57
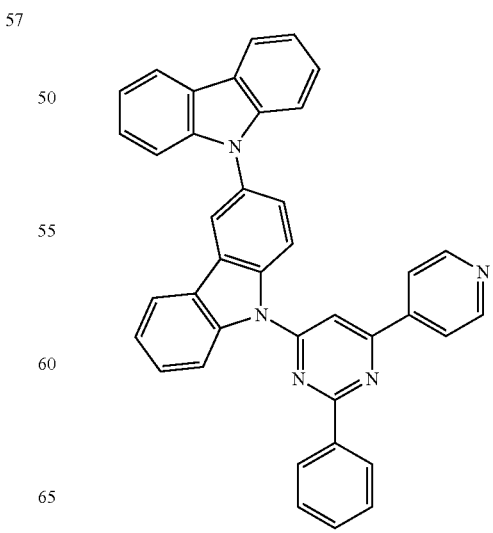
60

61
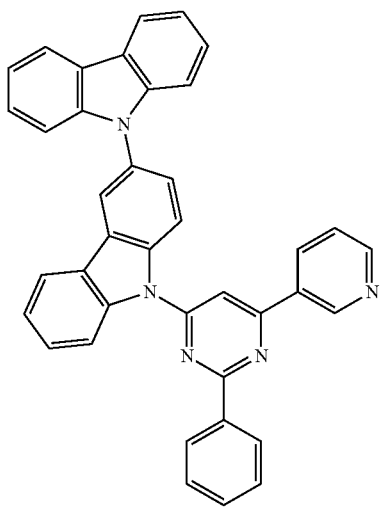
62
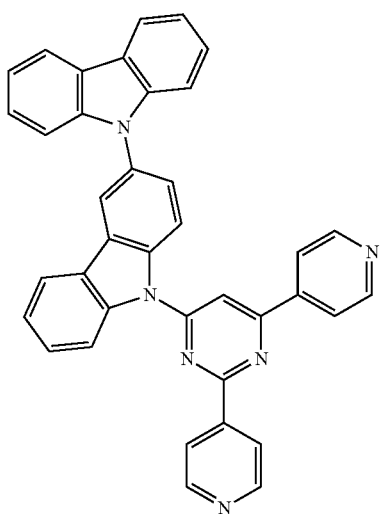
63
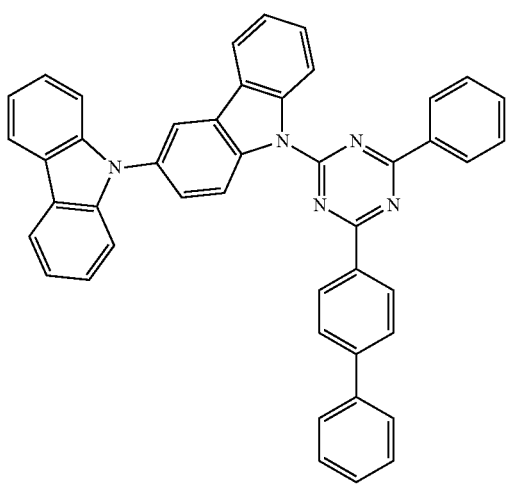
64
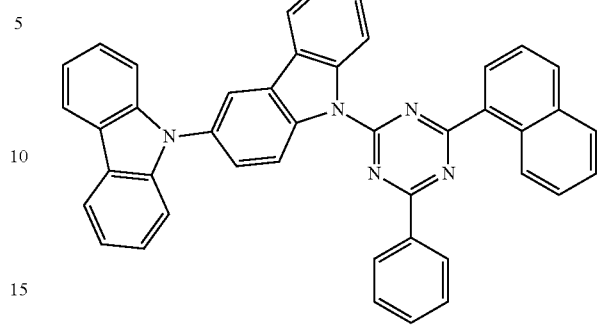
65
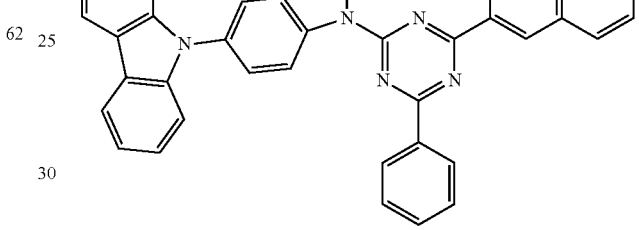
66
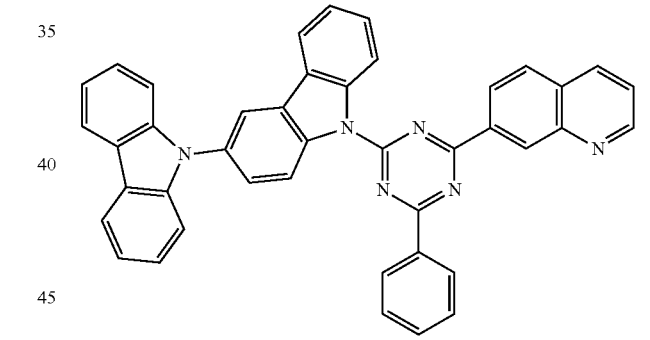
67
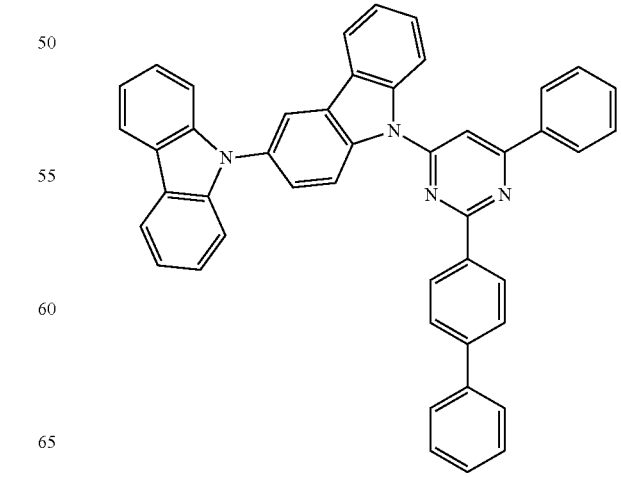

68
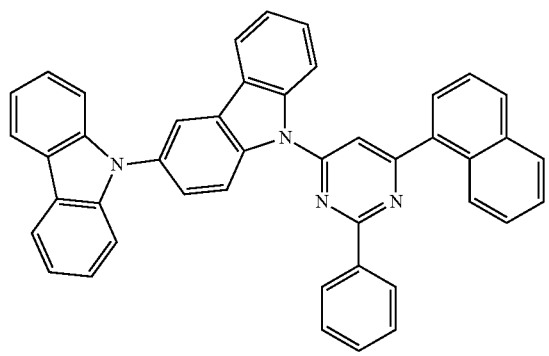
69
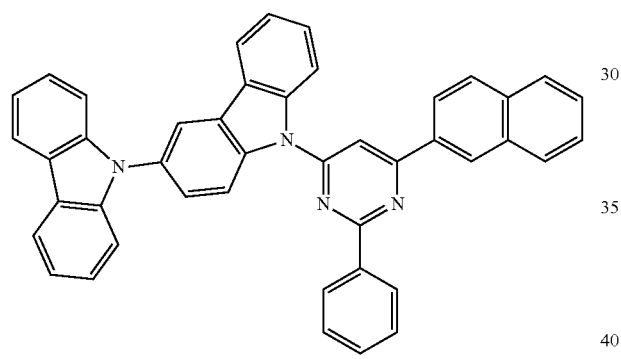
70
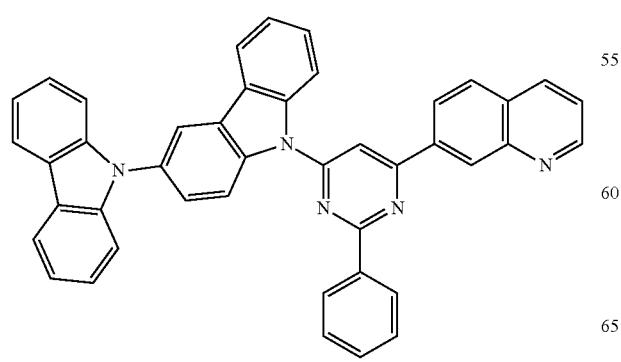
71
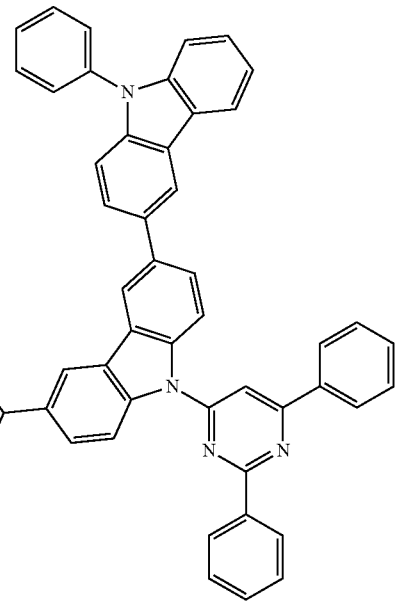
72
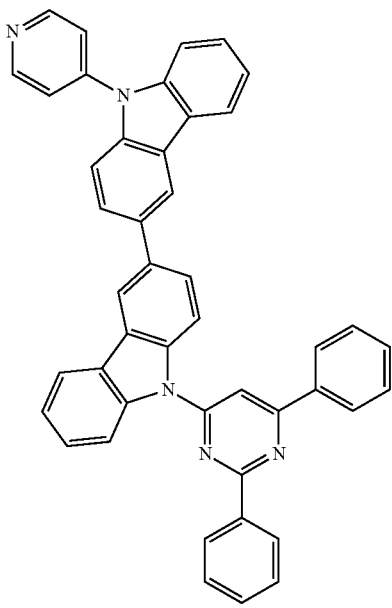

73
-continued
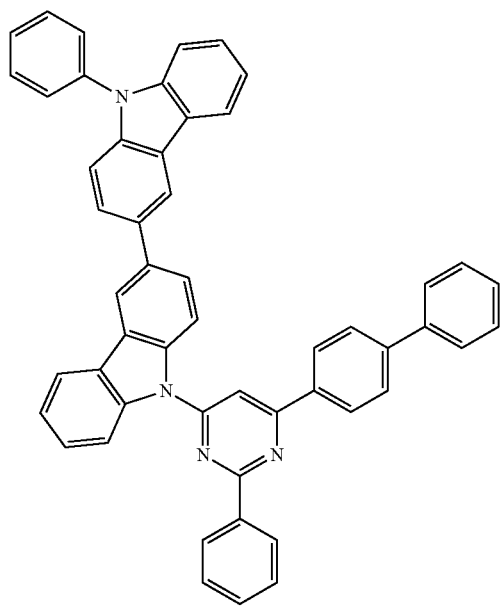
74
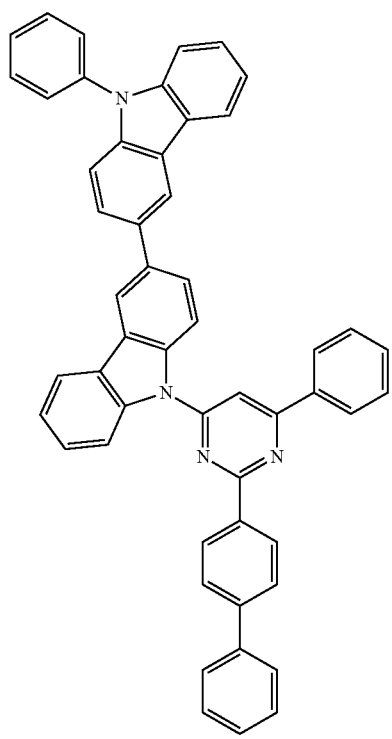
75
-continued
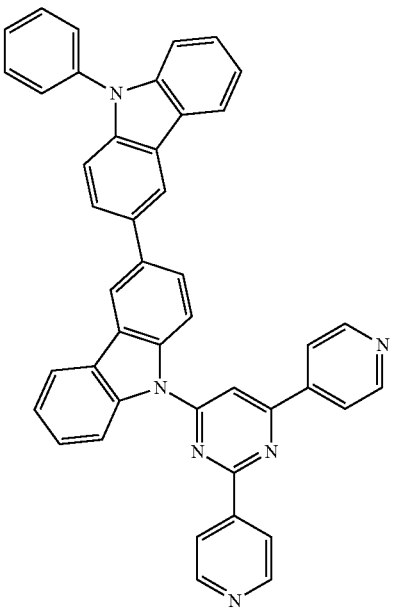
76
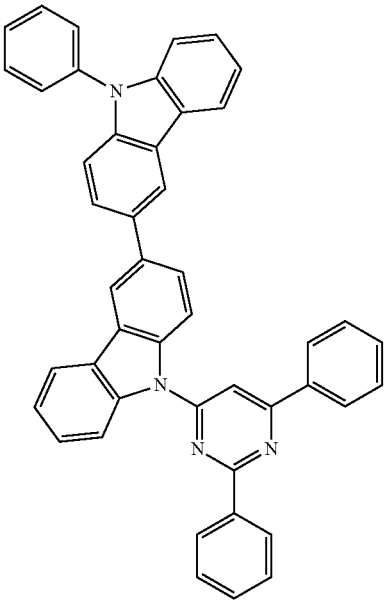

77
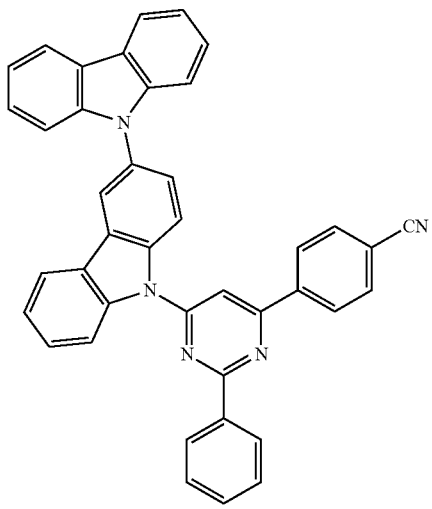
78
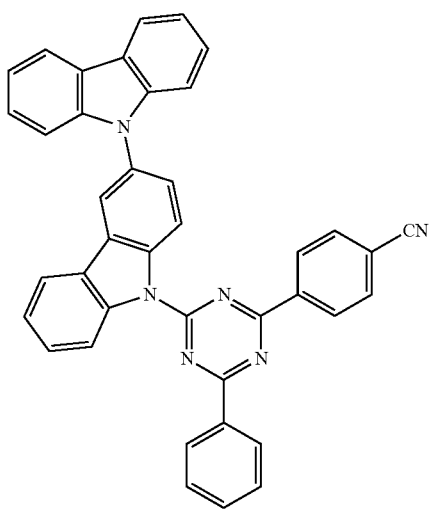
79
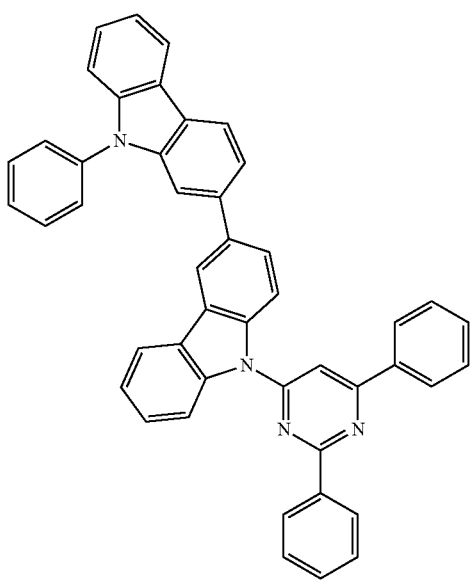
80
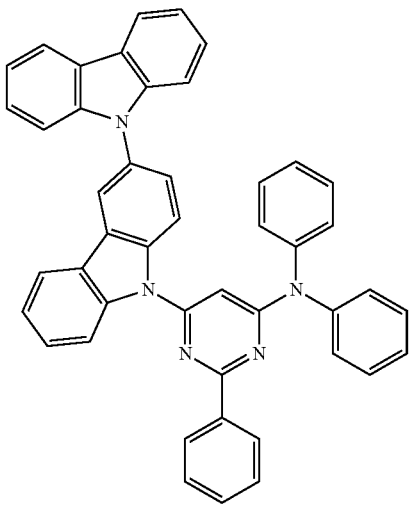
81
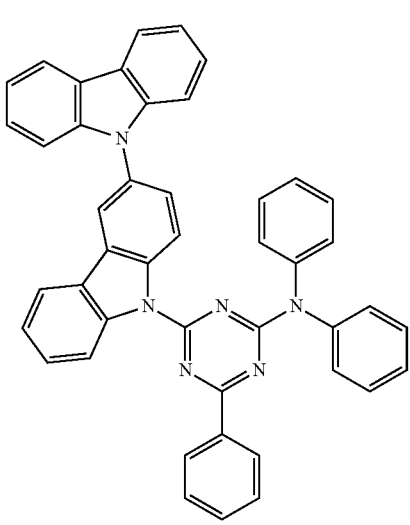
82
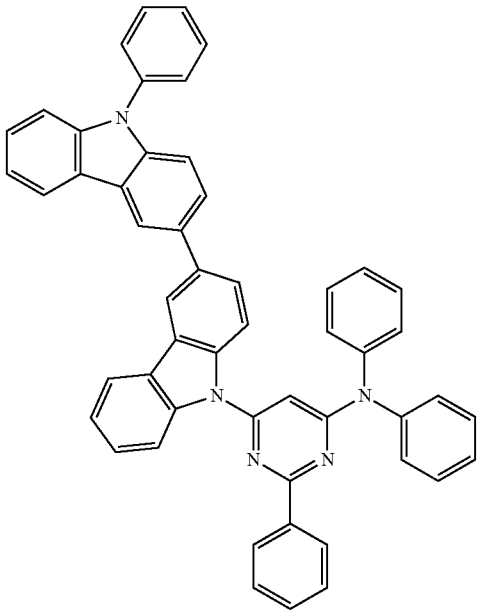

83
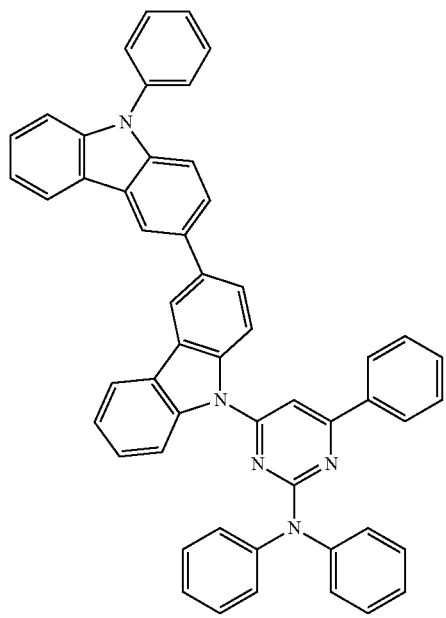
84
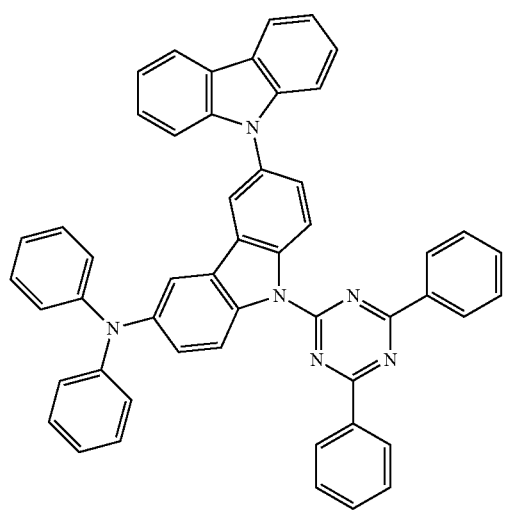
85
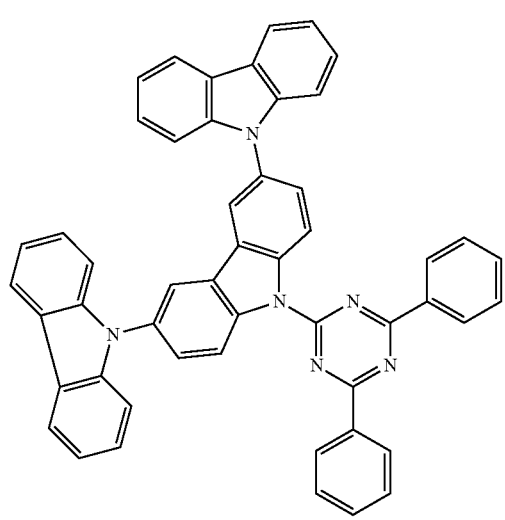
86
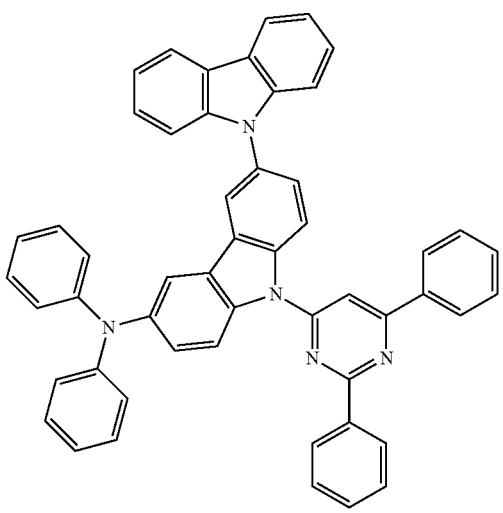
87
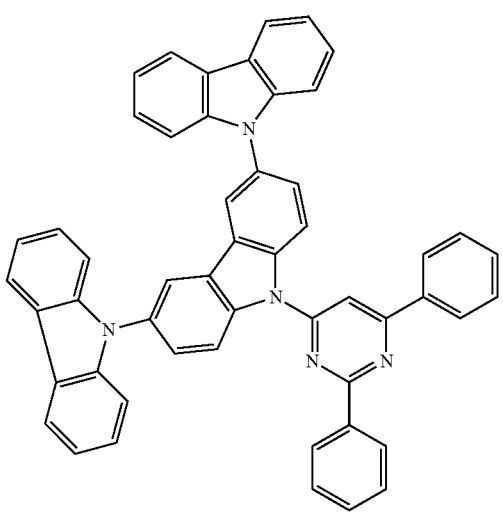
88
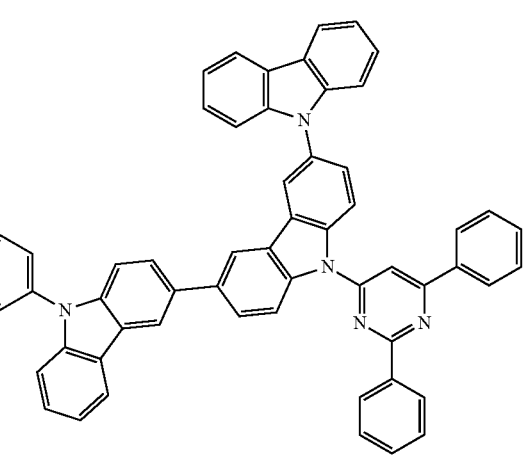

-continued

89

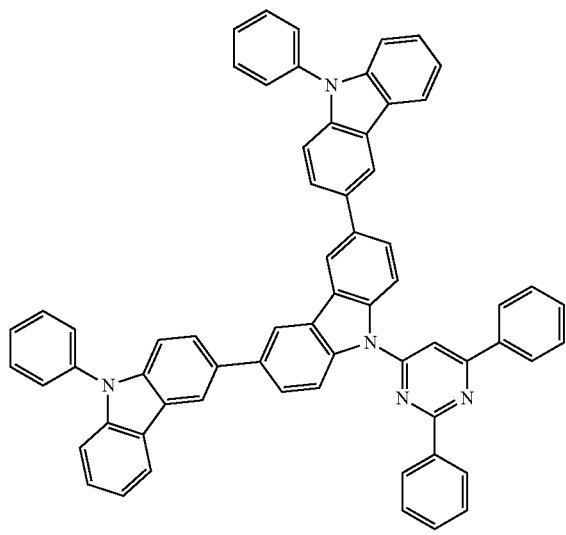

Examples of the preferred light emitting material capable of emitting delayed fluorescent light include compounds represented by the following general formula (171). The entire description of JP-A-2013-256490 including the paragraphs 0009 to 0046 and 0093 to 0134 is incorporated herein by reference.

General Formula (171)

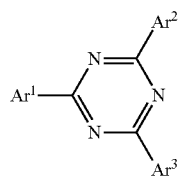

wherein in the general formula (171), $Ar^1$ to $Ar^3$ each independently represent a substituted or unsubstituted aryl group, provided that at least one thereof represents an aryl group substituted by a group represented by the following general formula (172):

General Formula (172)

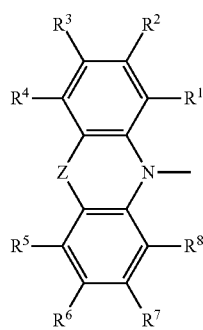

wherein in the general formula (172), $R^1$ to $R^8$ each independently represent, a hydrogen atom or a substituent; Z represents O, S, O=C or $Ar^4$—N; and $Ar^4$ represents a substituted or unsubstituted aryl group, provided that $R^1$ and $R^2$, $R^2$ and $R^3$, $R^3$ and $R^4$, $R^5$ and $R^6$, $R^6$ and $R^7$, and $R^7$ and $R^8$ each may be bonded to each other to form a ring structure.

Examples of the compound include the following compounds.

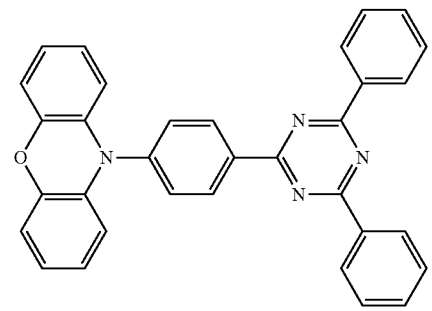

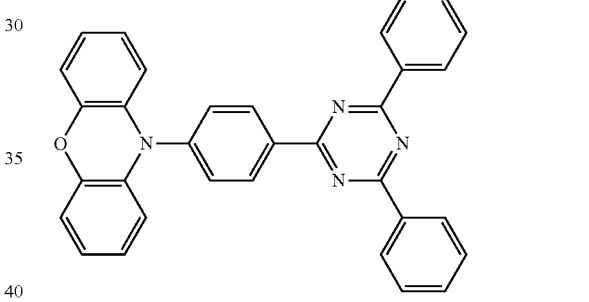

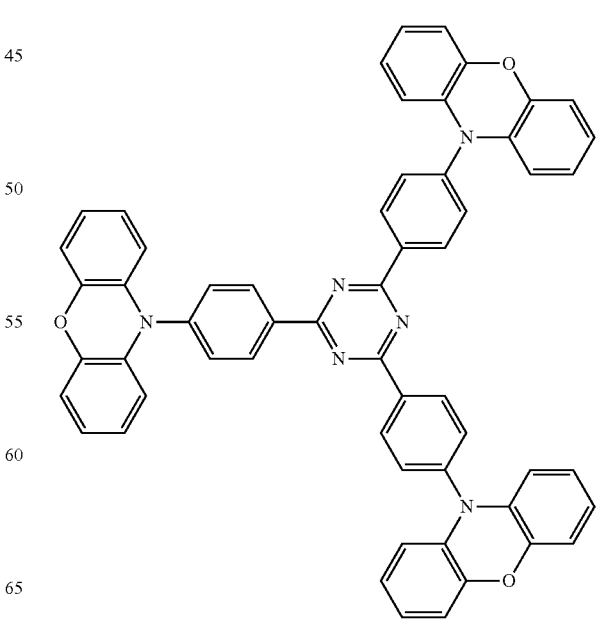

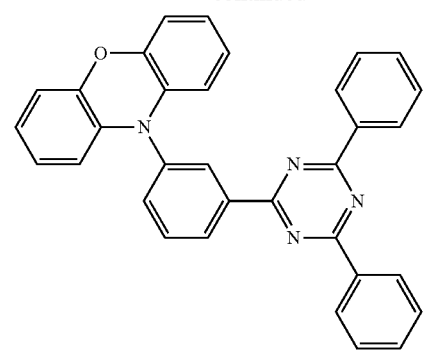
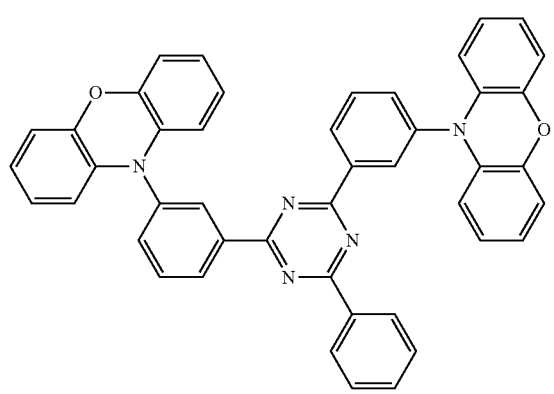
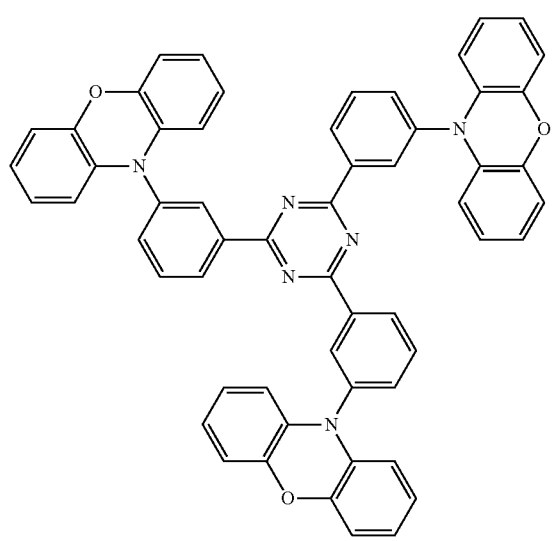
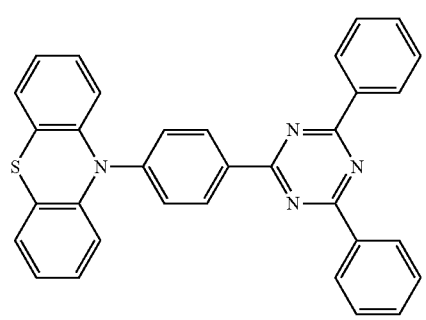
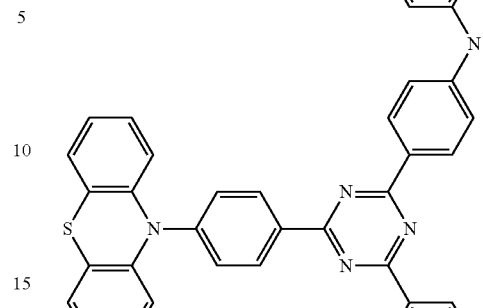
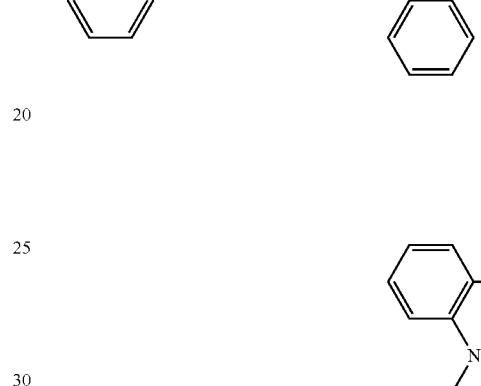
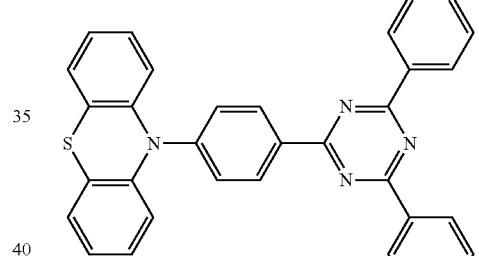
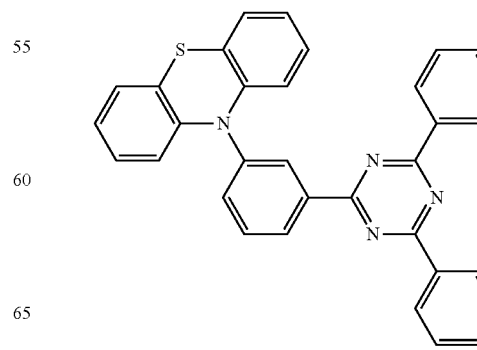

147
-continued
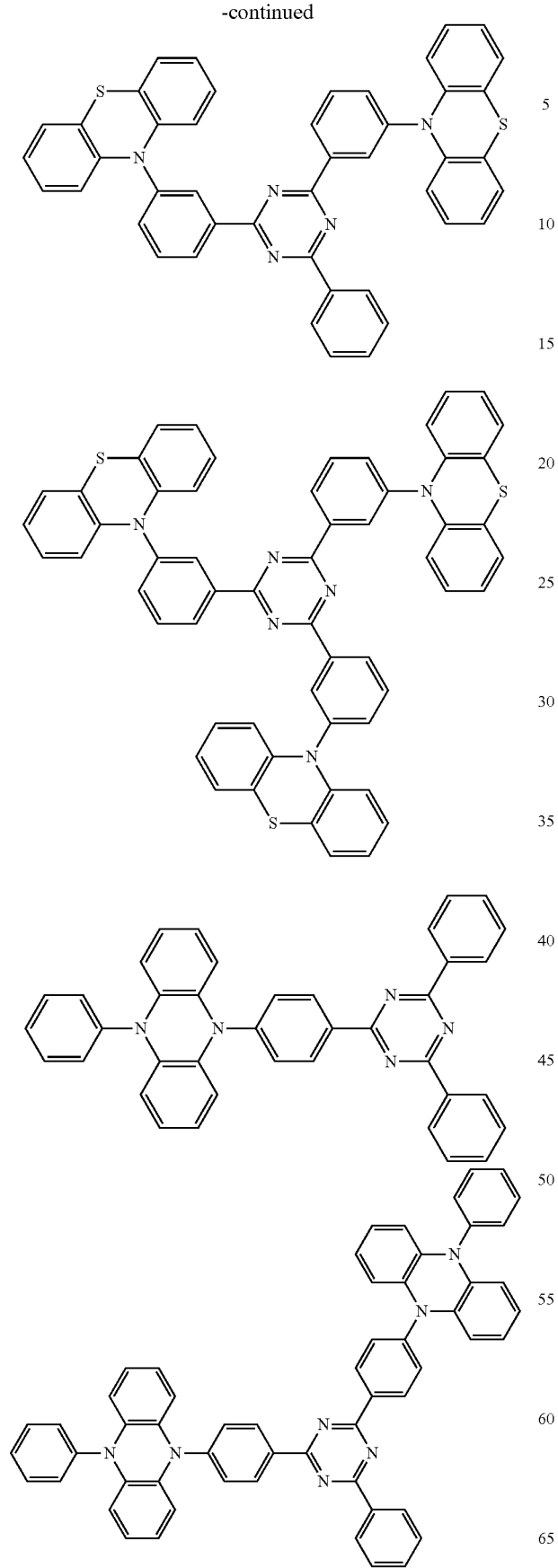
148
-continued
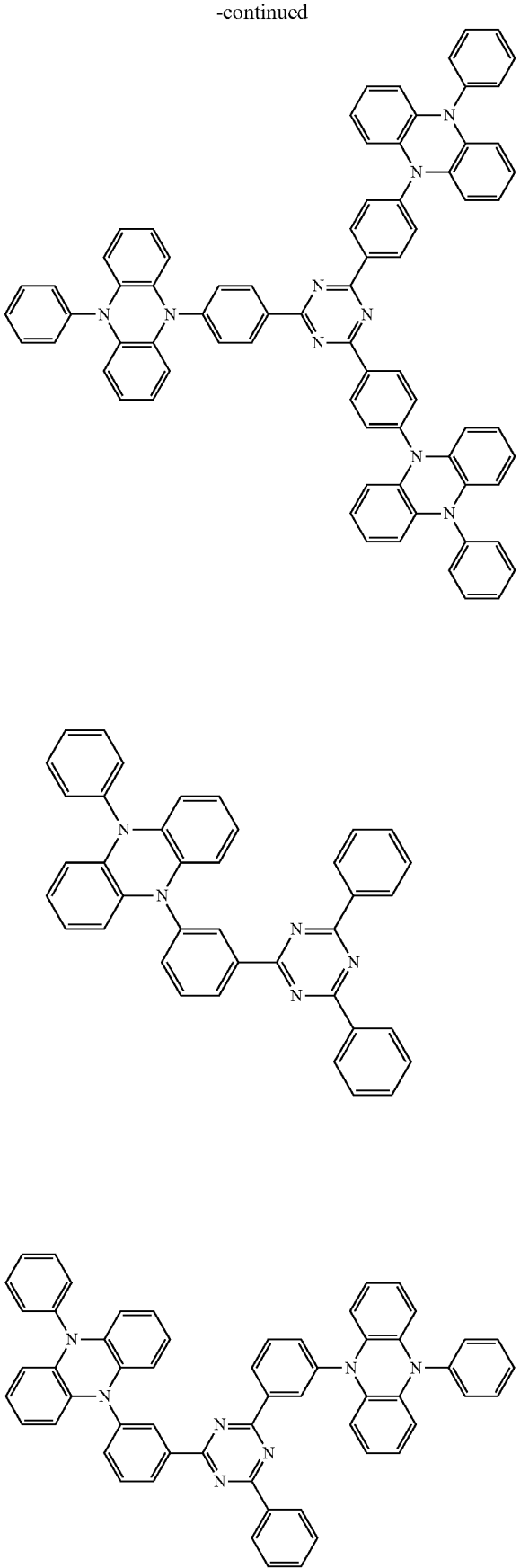

149
-continued
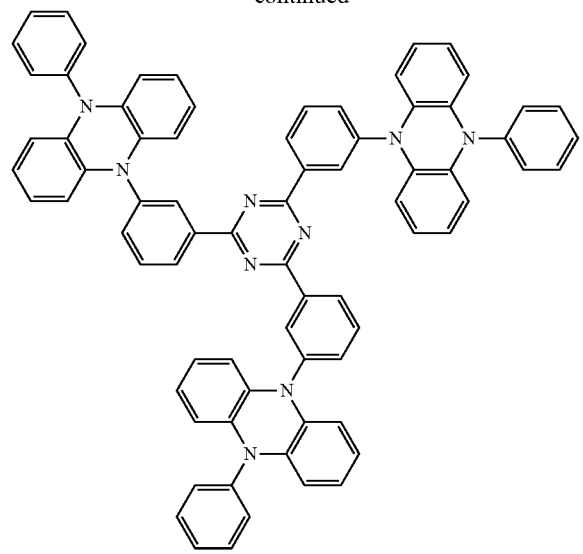
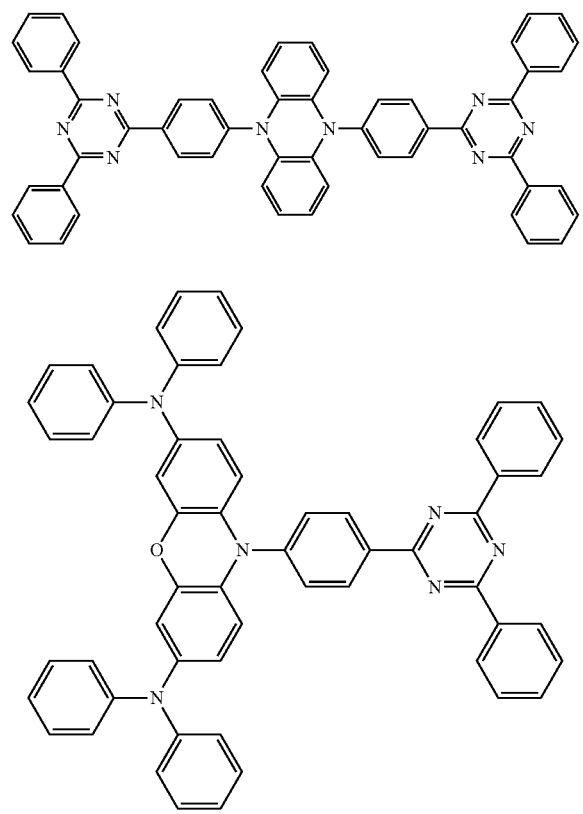
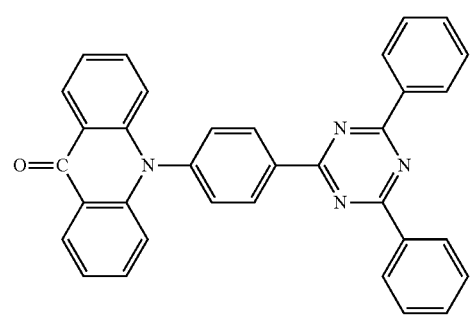
150
-continued
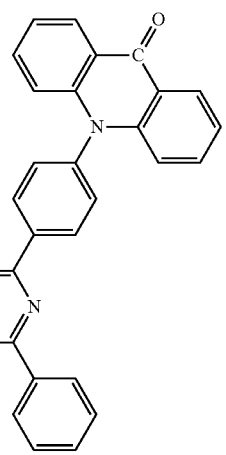
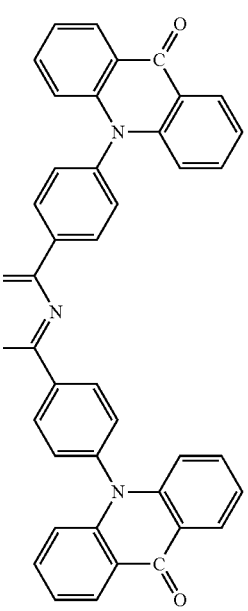
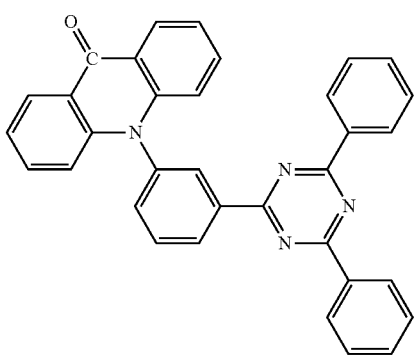

-continued

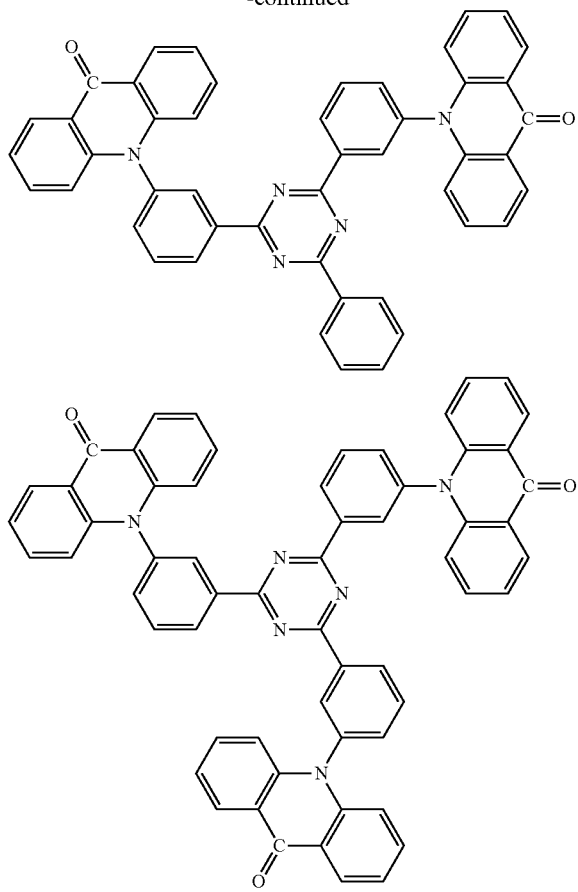

Examples of the preferred light emitting material capable of emitting delayed fluorescent light include compounds represented by the following general formula (181). The entire description of JP-A-2013-116975 including the paragraphs 0008 to 0020 and 0038 to 0040 is incorporated herein by reference.

General Formula (181)

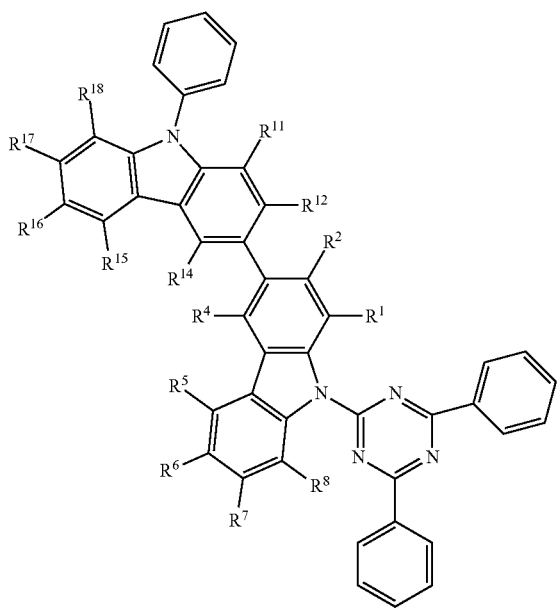

wherein in the general formula (181), $R^1$, $R^2$, $R^4$ to $R^8$, $R^{11}$, $R^{12}$ and $R^{14}$ to $R^{18}$ each independently represent a hydrogen atom or a substituent.

Examples of the compound include the following compound.

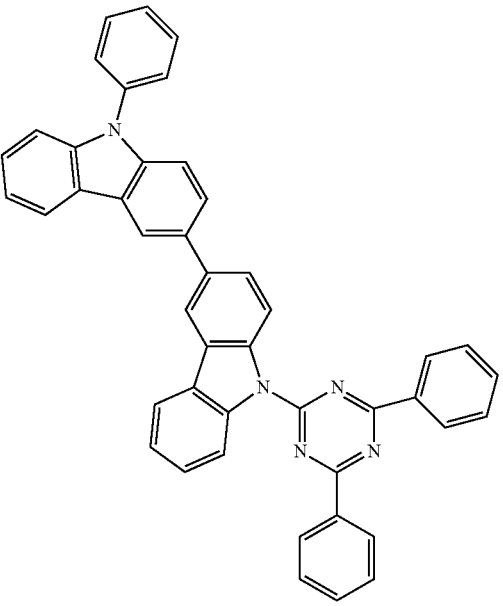 [SMILES: c1ccc(-c2nc(-c3ccccc3)nc(-n3c4ccccc4c4cc(-c5ccc6c(c5)c5ccccc5n6-c5ccccc5)ccc43)n2)cc1]

Examples of the preferred light emitting material capable of emitting delayed fluorescent light include the following compounds.

(1) A compound represented by the following general formula (191):

General Formula (191)

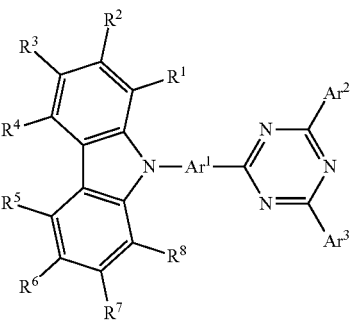

wherein in the general formula (191), $Ar^1$ represents a substituted or unsubstituted arylene group; $Ar^2$ and $Ar^3$ each independently represent a substituted or unsubstituted aryl group; and $R^1$ to $R^8$ each independently represent a hydrogen atom or a substituent, provided that at least one of $R^1$ to $R^8$ represents a substituted or unsubstituted diarylamino group, and $R^1$ and $R^2$, $R^2$ and $R^3$, $R^3$ and $R^4$, $R^5$ and $R^6$, $R^6$ and $R^7$, and $R^7$ and $R^8$ each may be bonded to each other to form a cyclic structure.

(2) The compound according to the item (1), wherein in the general formula (191), at least one of $R^1$ to $R^4$ represents a substituted or unsubstituted diarylamino group, and at least, one of R⁵ to R⁸ represents a substituted or unsubstituted diarylamino group.

(3) The compound according to the item (2), wherein in the general formula (191), $R^3$ and $R^6$ each represent a substituted or unsubstituted diarylamino group.

(4) The compound according to any one of the items (1) to (3), wherein in the general formula (191), at least one of $R^1$ to $R^8$ represents a substituted or unsubstituted diphenylamino group.

(5) The compound according to any one of the items (1) to (4), wherein in the general formula (191), $Ar^2$ and $Ar^3$ each independently represent a substituted or unsubstituted phenyl group.

(6) The compound according to any one of the items (1) to (5), wherein in the general formula (191), $Ar^1$ represents a substituted or unsubstituted phenylene group, a substituted or unsubstituted naphthylene group or a substituted or unsubstituted anthracenylene group.

(7) The compound according to the item (1), wherein the compound has a structure represented by the following general formula (192):

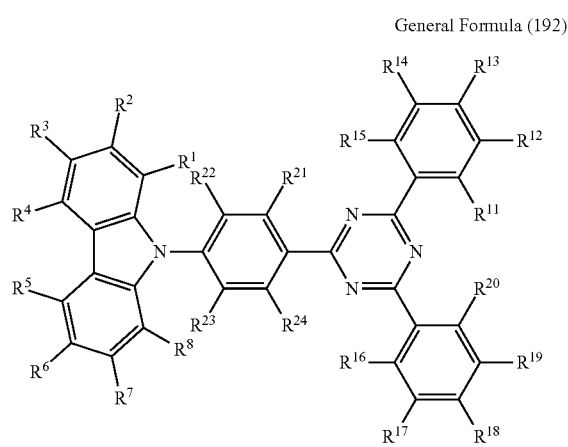

General Formula (192)

wherein in the general formula (192), $R^1$ to $R^8$ and $R^{11}$ to $R^{24}$ each independently represent a hydrogen atom or a substituent, provided that at least one of $R^1$ to $R^8$ represents a substituted or unsubstituted diarylamino group, and $R^1$ and $R^2$, $R^2$ and $R^3$, $R^3$ and $R^4$, $R^5$ and $R^6$, $R^6$ and $R^7$, $R^7$ and $R^8$, $R^{11}$ and $R^{12}$, $R^{12}$ and $R^{13}$, $R^{13}$ and $R^{14}$, $R^{14}$ and $R^{15}$, $R^{16}$ and $R^{17}$, $R^{17}$ and $R^{18}$, $R^{18}$ and $R^{19}$, $R^{19}$ and $R^{20}$, $R^{21}$ and $R^{22}$, and $R^{23}$ and $R^{24}$, each may be bonded to each other to form a ring structure.

(8) The compound according to the item (7), wherein in the general formula (192), at least one of $R^1$ to $R^4$ represents a substituted or unsubstituted diarylamino group, and at least one of $R^5$ to $R^6$ represents a substituted or unsubstituted diarylamino group.

(9) The compound according to the item (8), wherein in the general formula (192), $R^3$ and $R^6$ each represent a substituted or unsubstituted diarylamino group.

Specific examples of the compound include the following compounds. Ph represents a phenyl group.

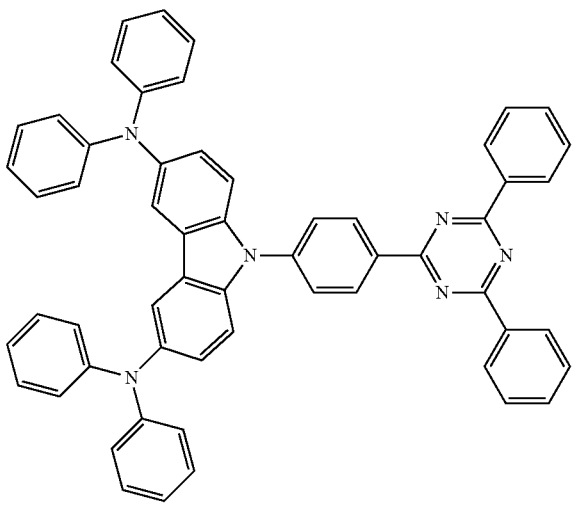

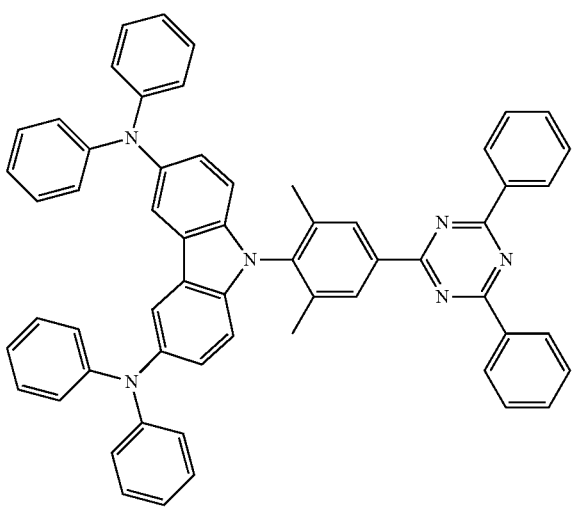

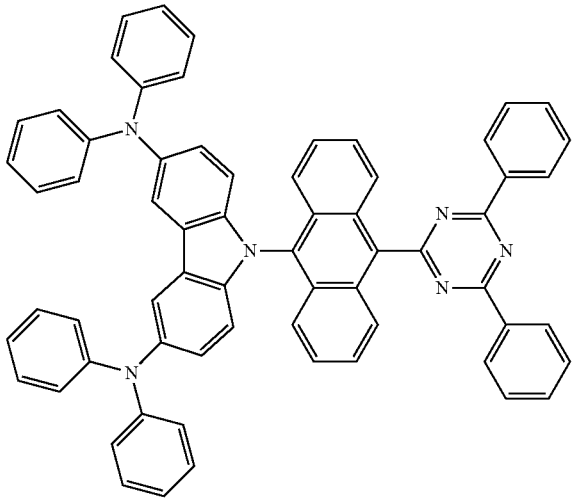

155
-continued
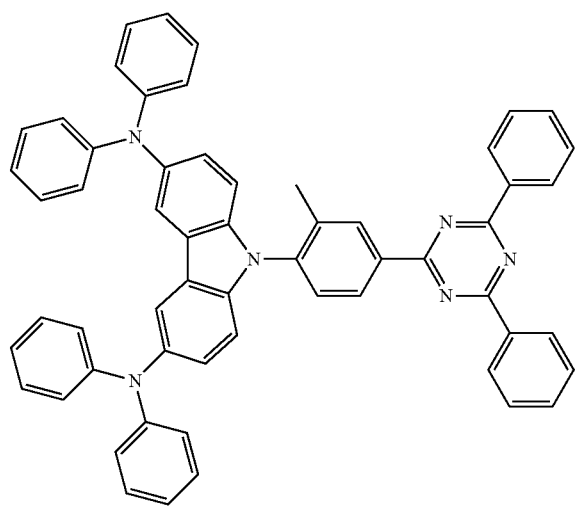
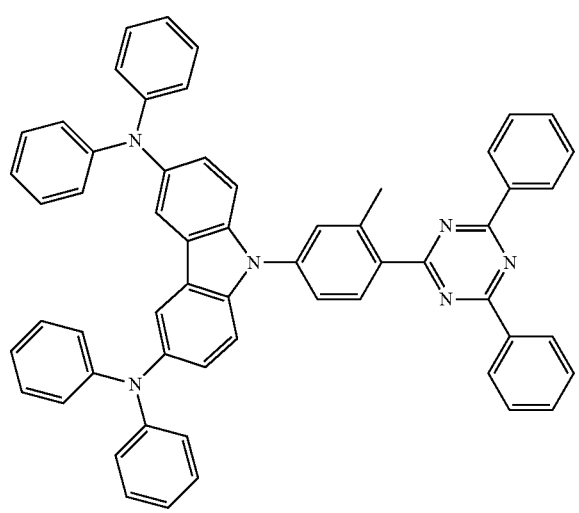
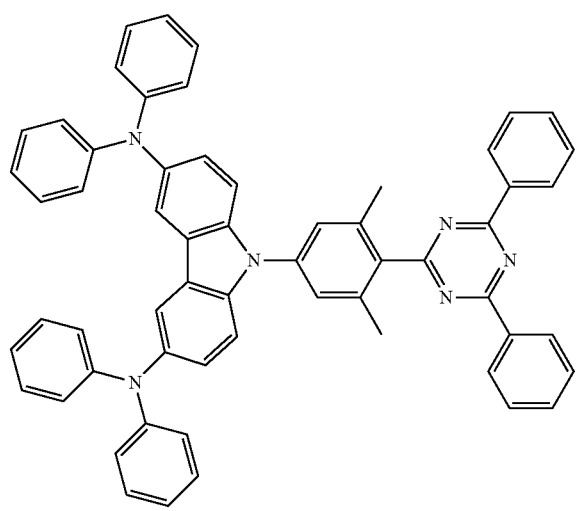
156
-continued
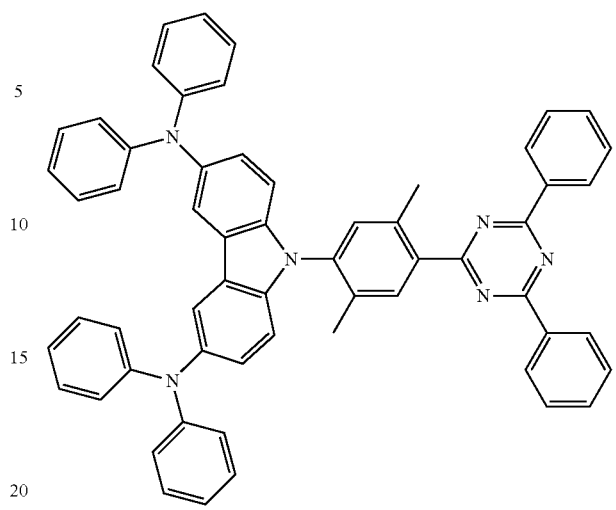
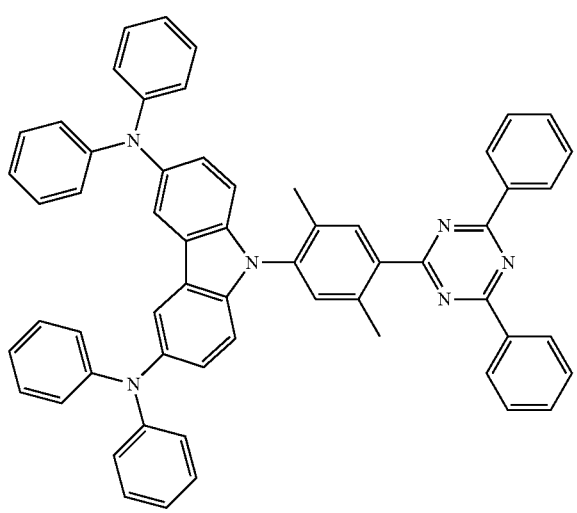
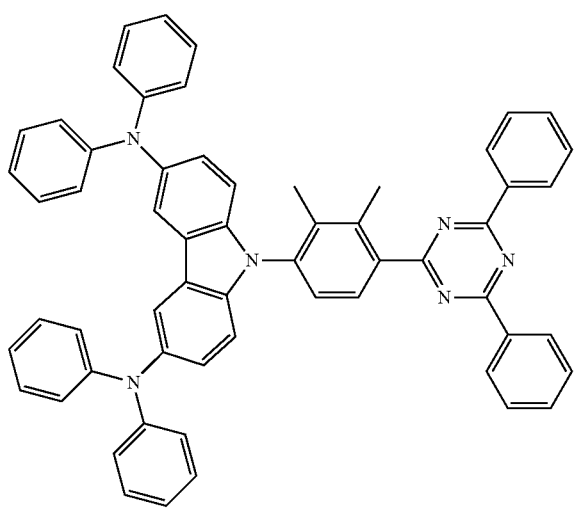

-continued

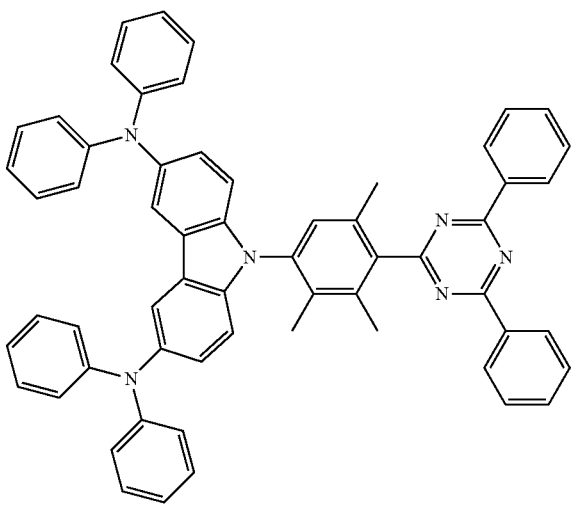

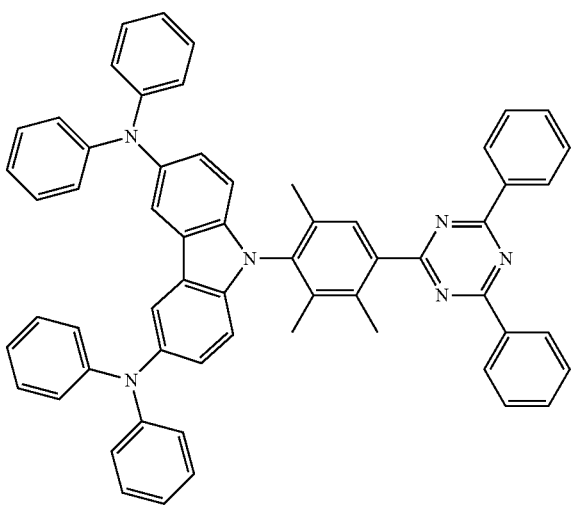

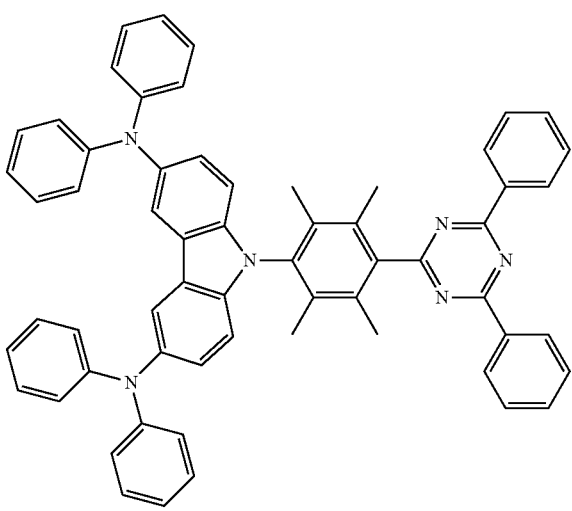

Examples of the preferred light emitting material capable of emitting delayed fluorescent light include the following compounds.

(1) A compound represented by the following general formula (201):

General Formula (201)

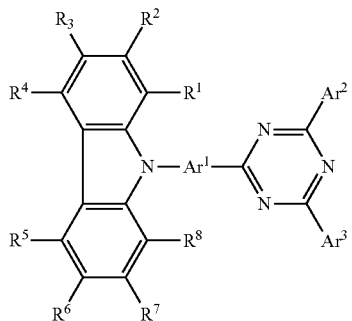

wherein in the general formula (201), $R^1$ to $R^8$ each independently represent a hydrogen atom or a substituent, provided that at least one of $R^1$ to $R^8$ represents a substituted or unsubstituted carbazolyl group; and $Ar^1$ to $Ar^3$ each independently represent a substituted or unsubstituted aromatic ring or a heteroaromatic ring.

(2) The compound according to the item (1), wherein in the general formula (201), at least one of $R^3$ and $R^6$ represents a substituted or unsubstituted carbazolyl group.

(3) The compound according to the item (1) or (2), wherein the carbazolyl group is a 1-carbazolyl group, a 2-carbazolyl group, a 3-carbazolyl group or a 4-carbazolyl group.

(4) The compound according to any one of the items (1) to (3), wherein the carbazolyl group has a substituent on the nitrogen atom in the carbazole ring structure.

(5) The compound according to any one of the items (1) to (4), wherein in the general formula (201), at least one of $Ar^1$, $Ar^2$ and $Ar^3$ represents a benzene ring or a naphthalene ring.

(6) The compound according to any one of the items (1) to (5), wherein in the general formula (201), $Ar^1$, $Ar^2$ and $Ar^3$ each represent the same aromatic ring or the same heteroaromatic ring.

(7) The compound according to any one of the items (1) to (6), wherein in the general formula (201), $Ar^1$, $Ar^2$ and $Ar^3$ each represent a benzene ring.

Specific examples of the compound include the following compounds.

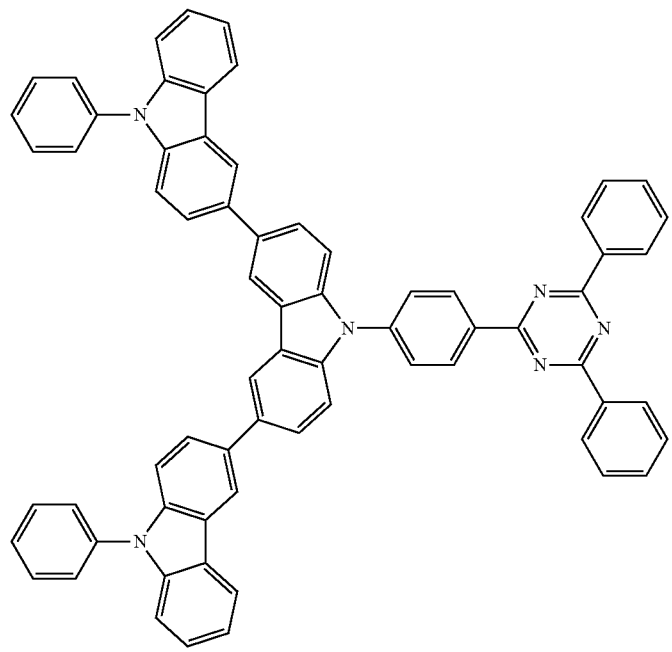
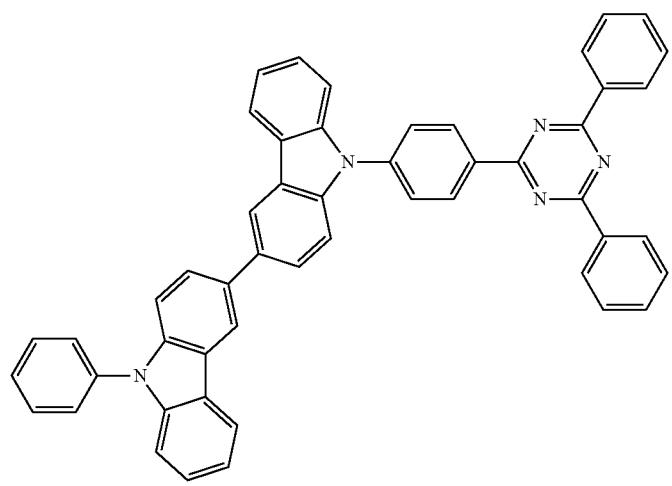
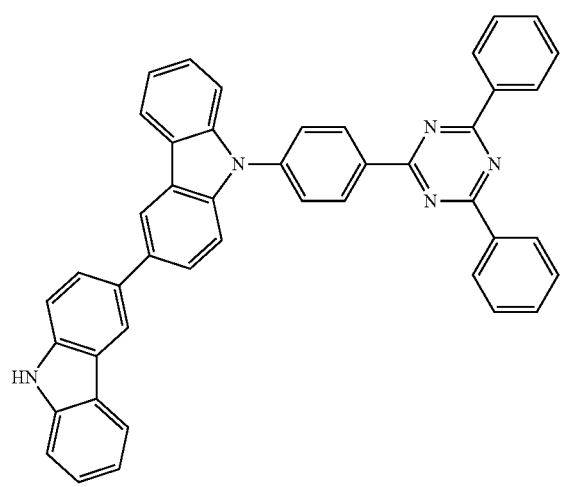

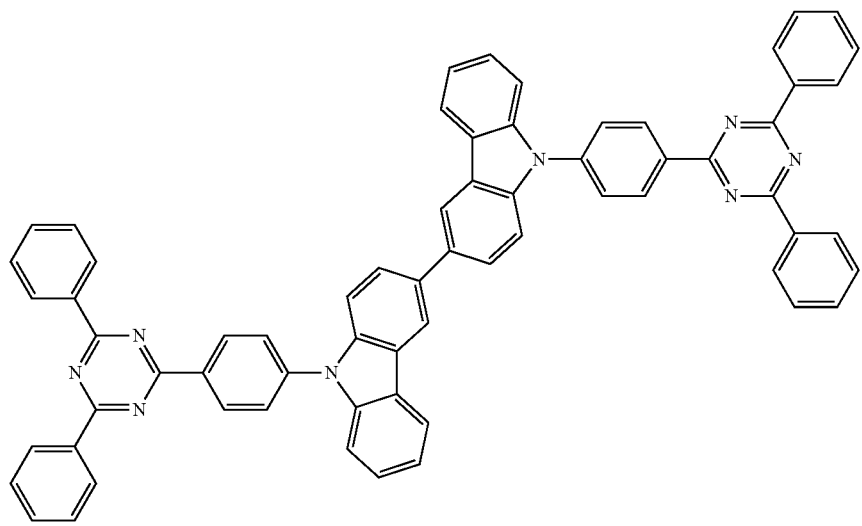
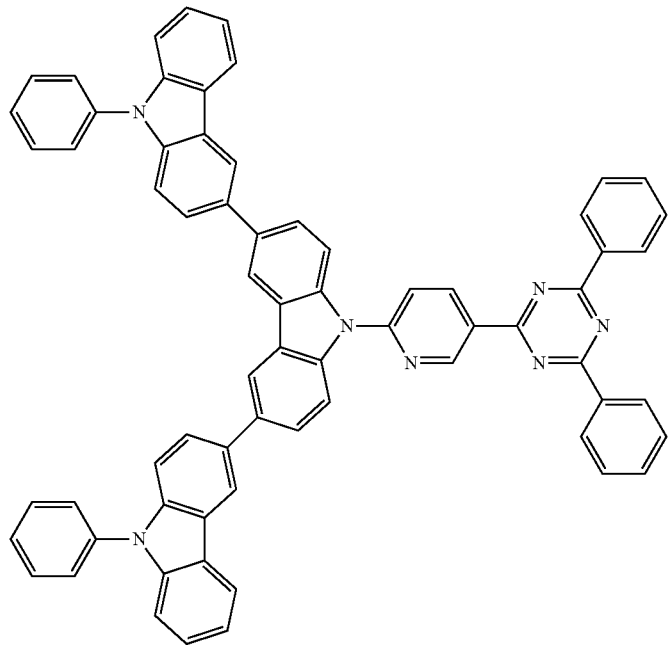
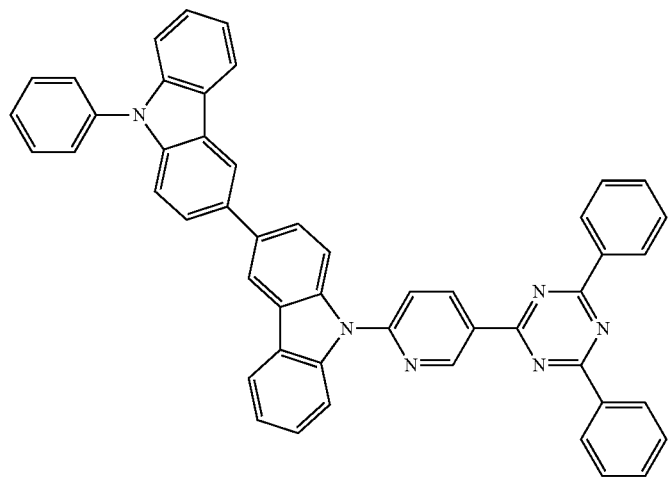

-continued
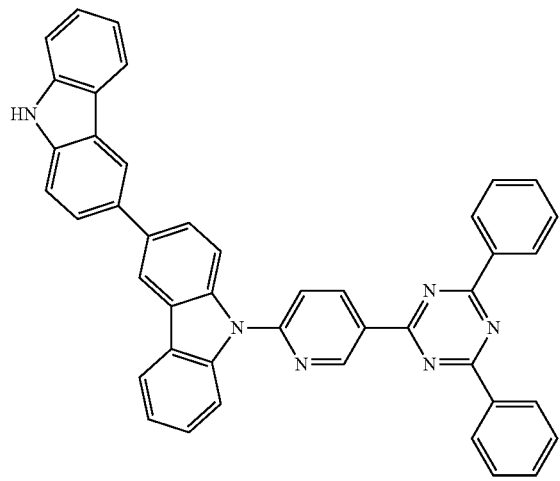
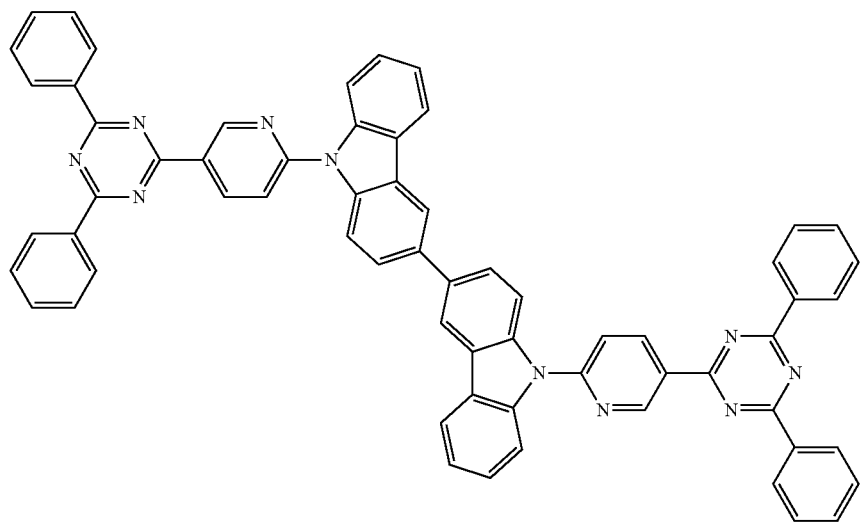
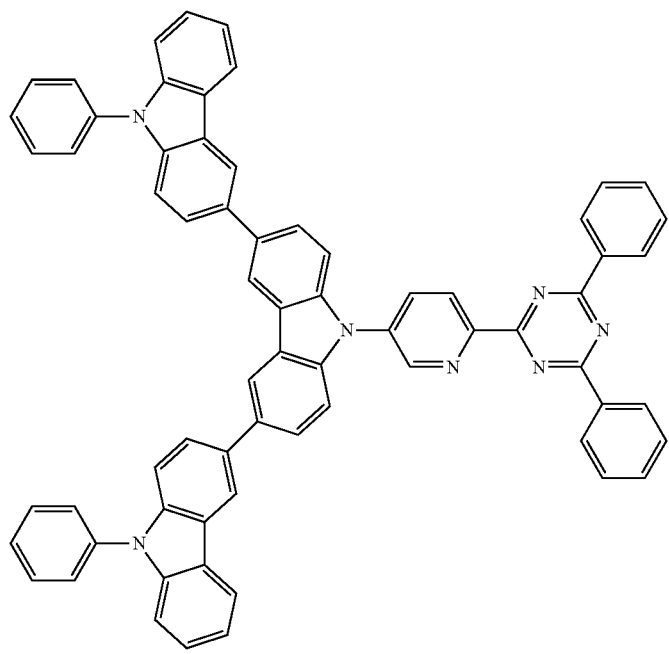

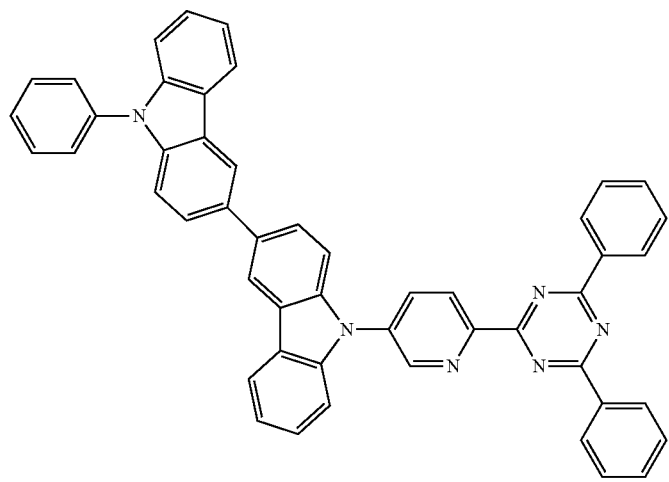
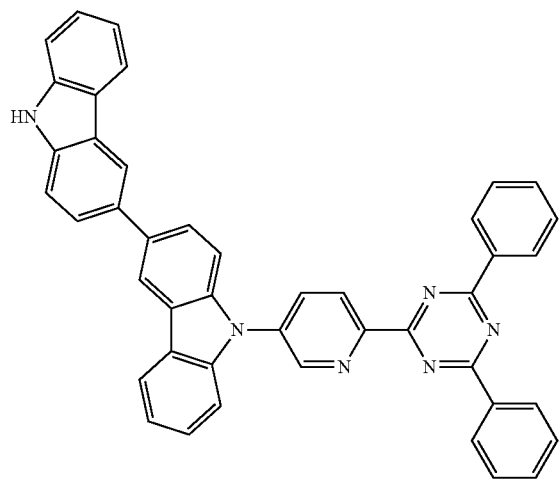
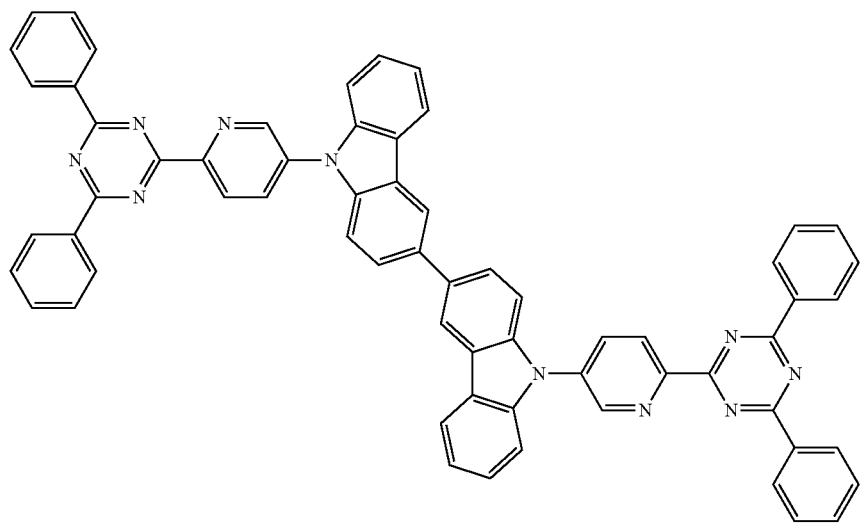

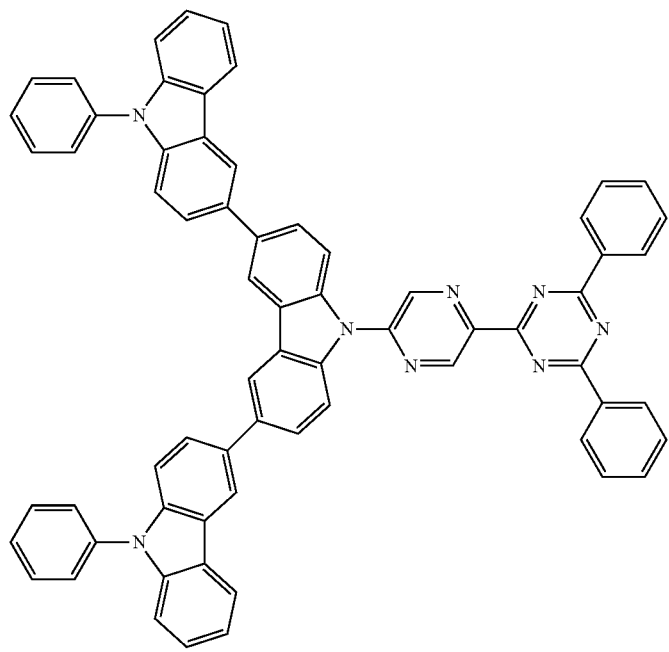
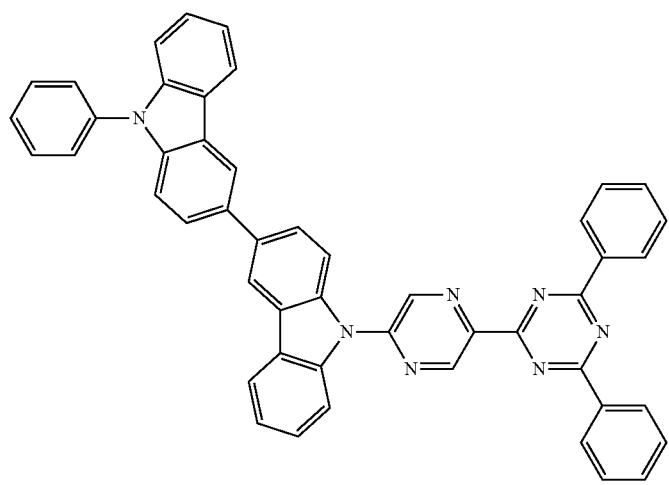
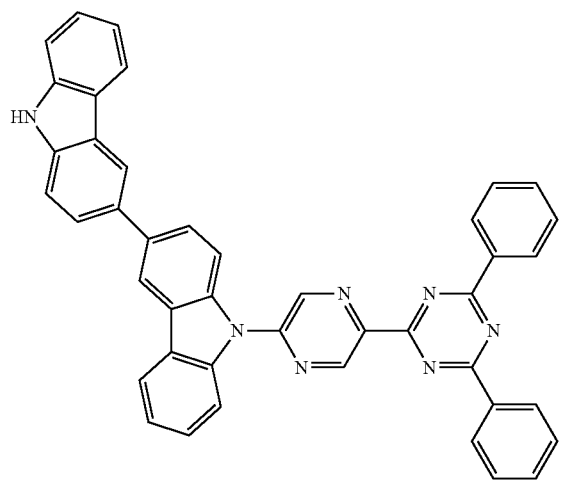

-continued
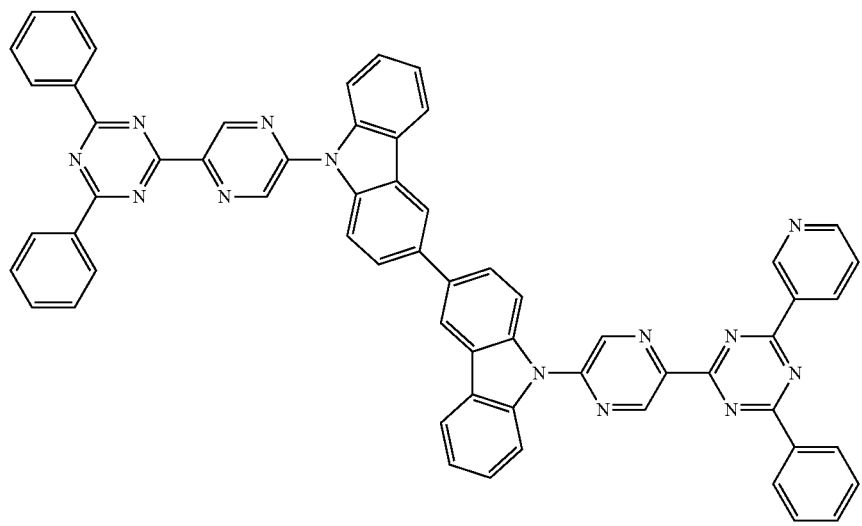
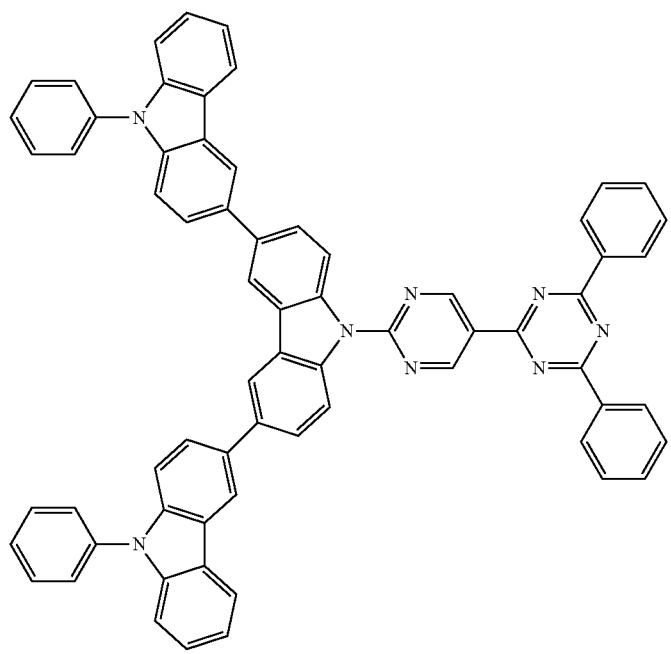
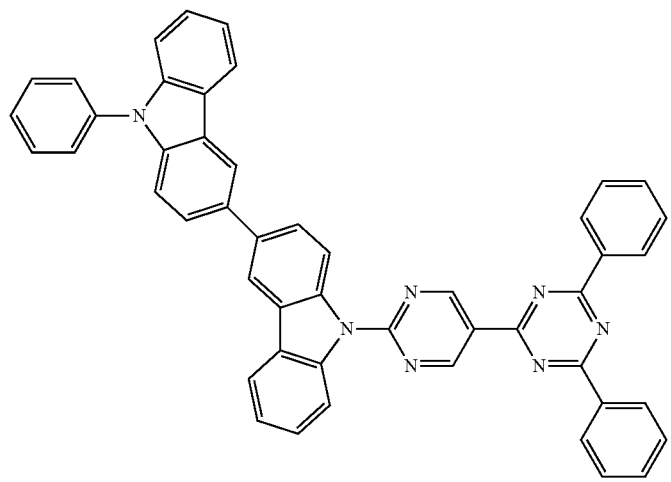

-continued
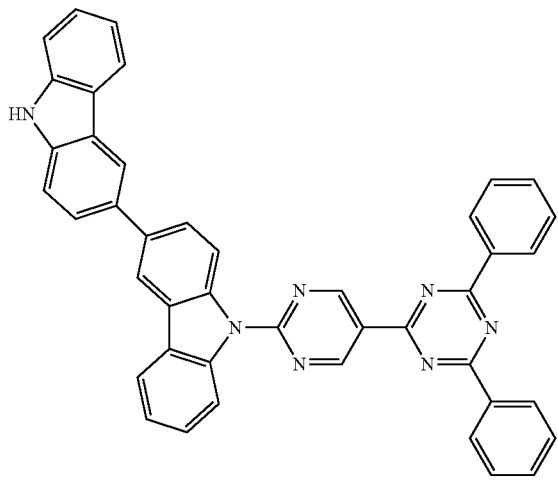
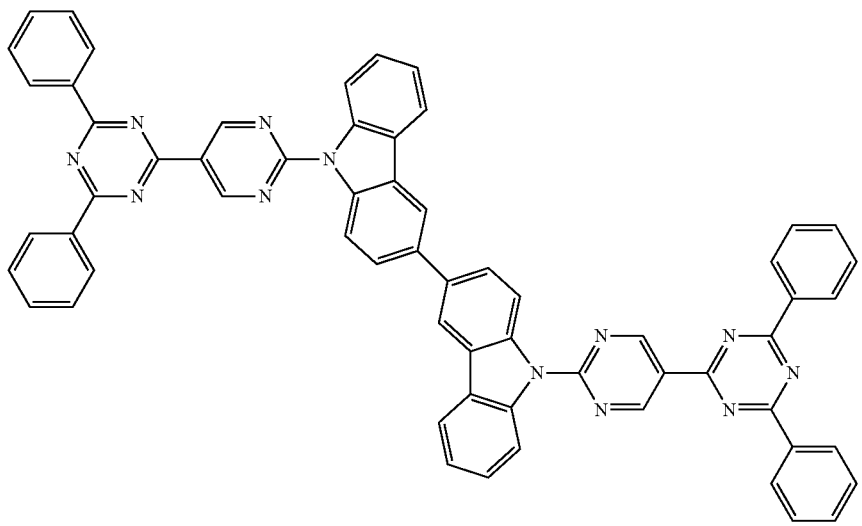
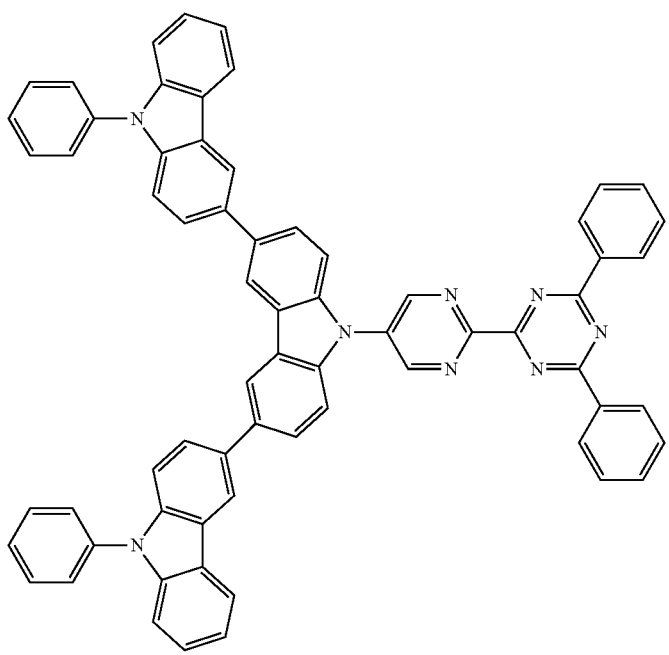

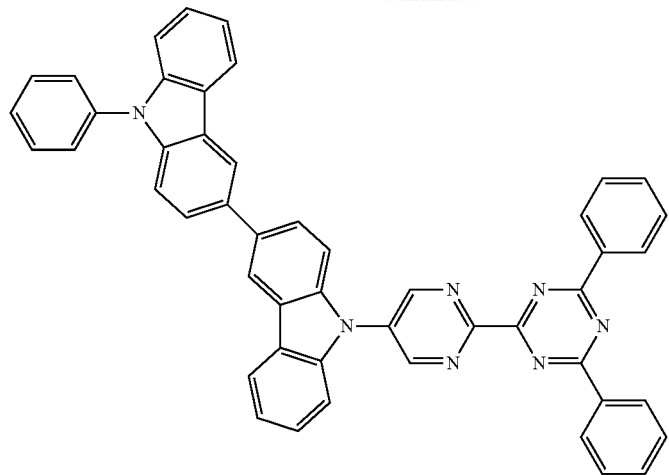
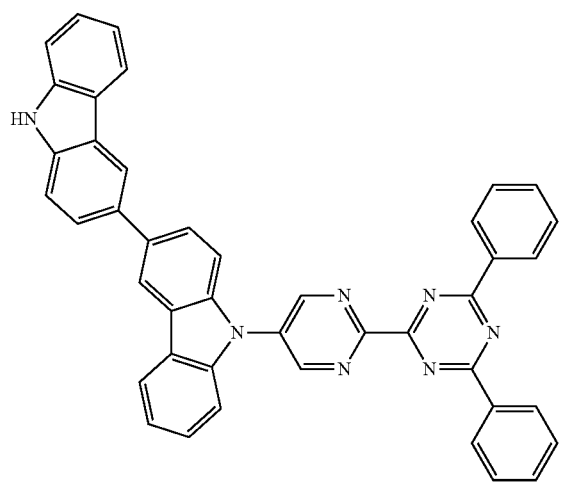
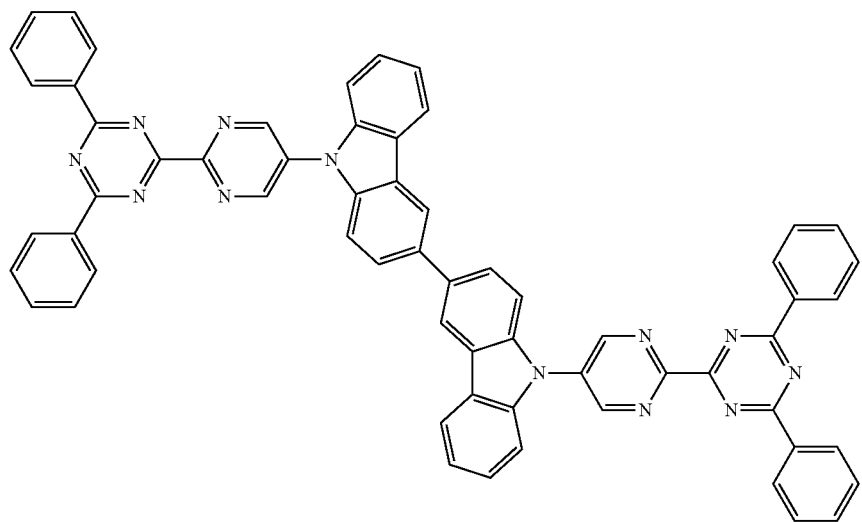

-continued
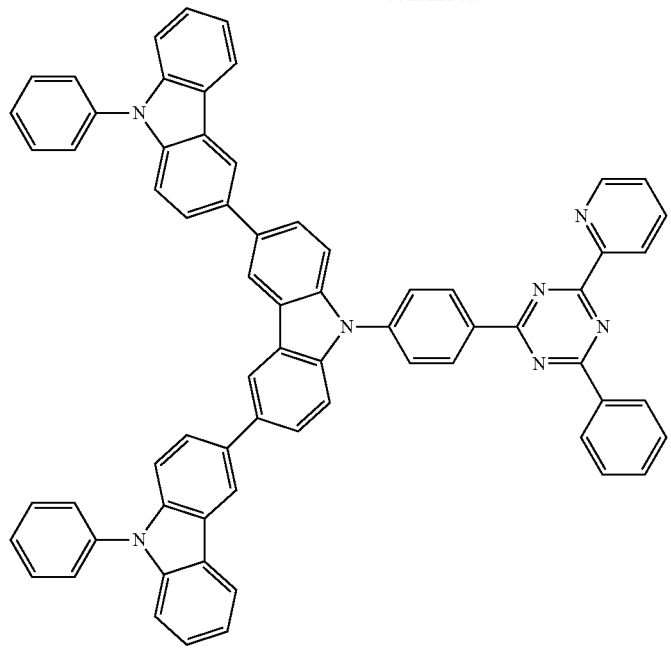
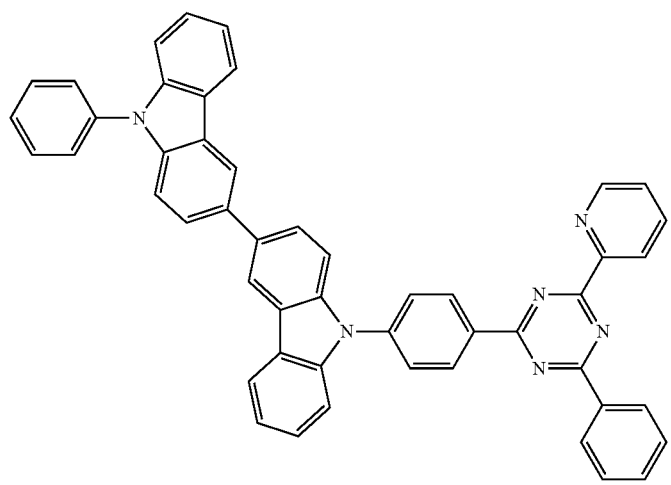
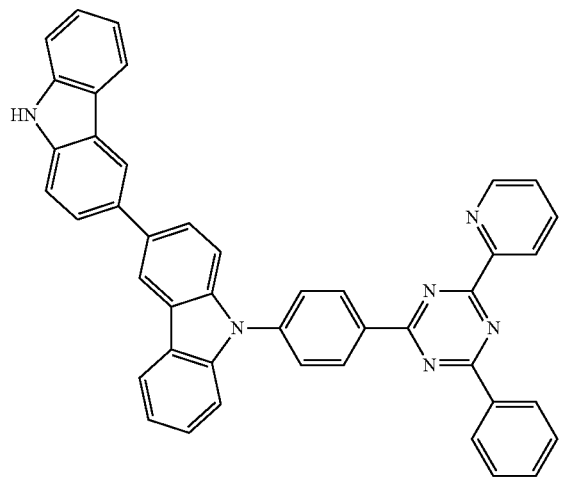

-continued
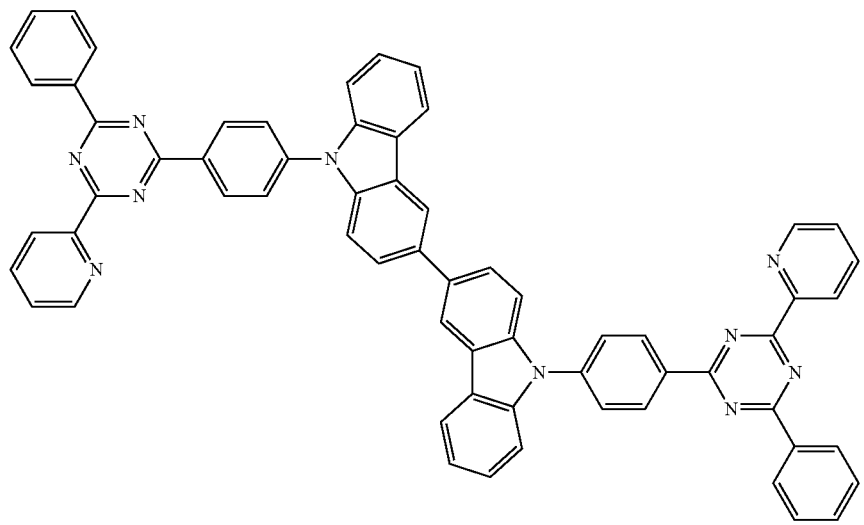
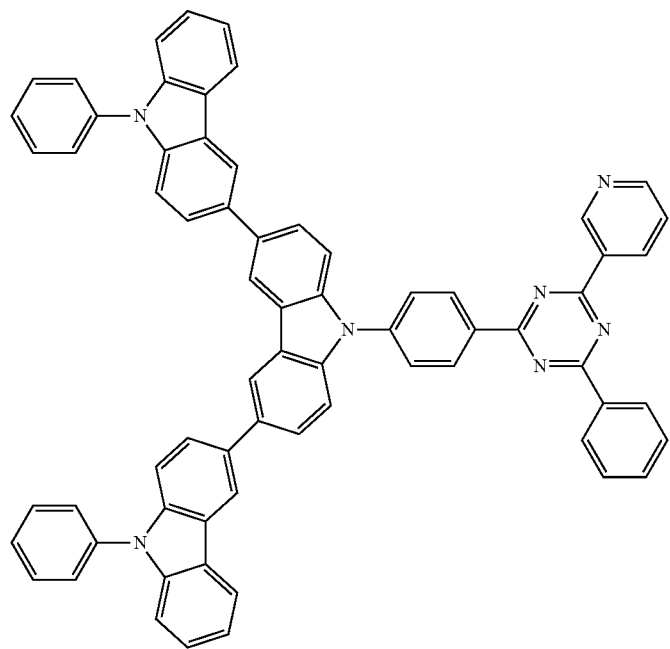
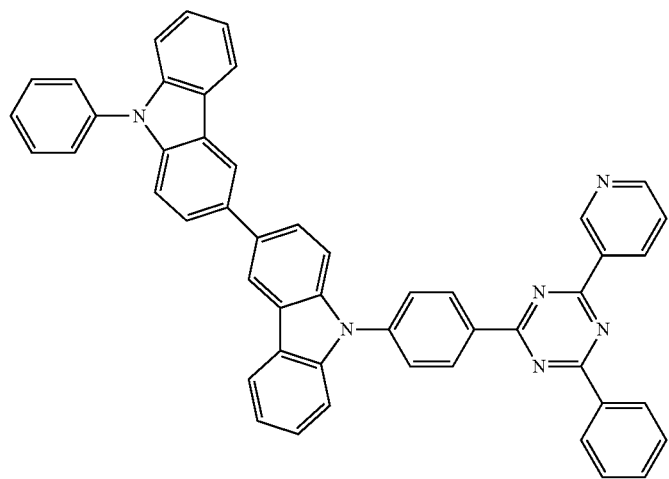

-continued
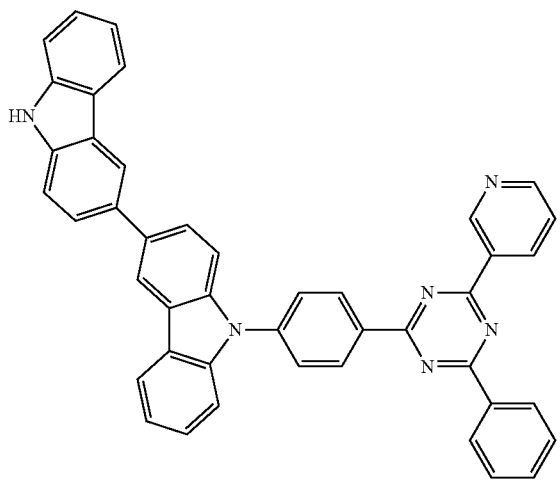
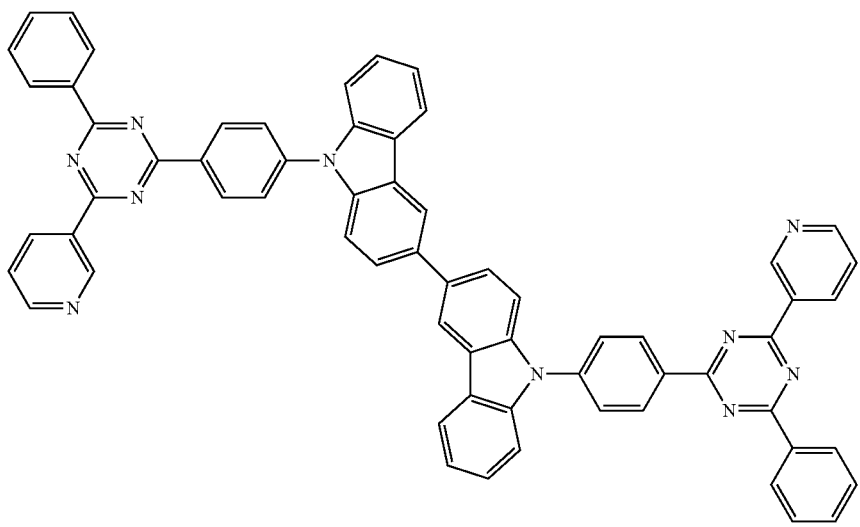
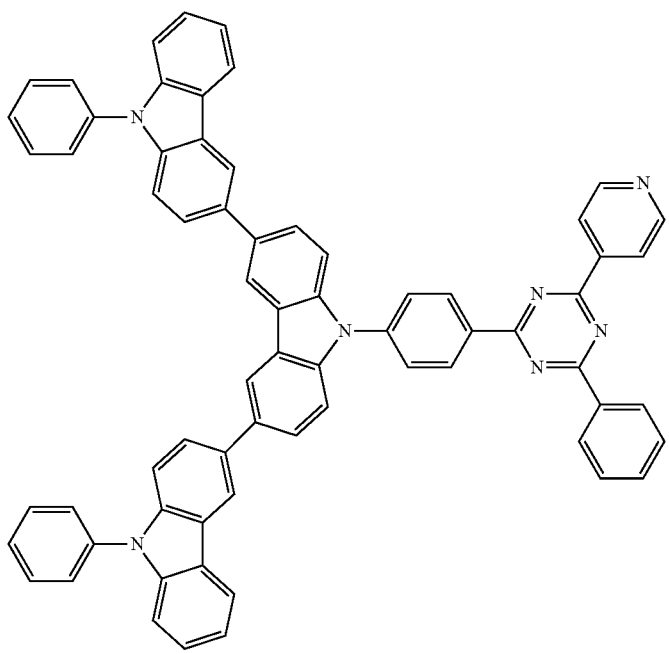

-continued
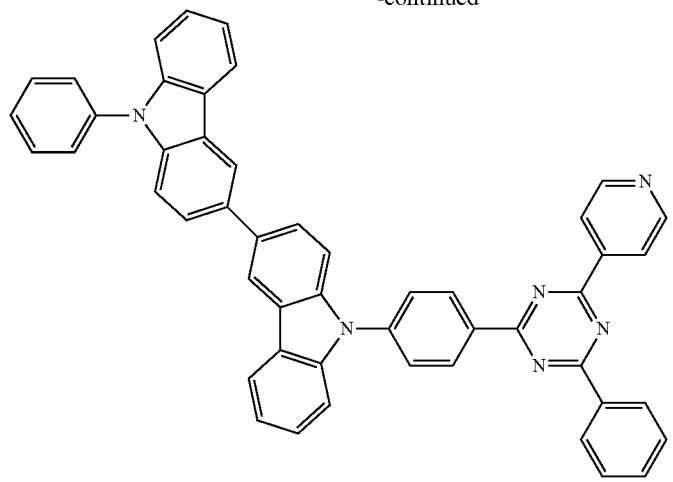
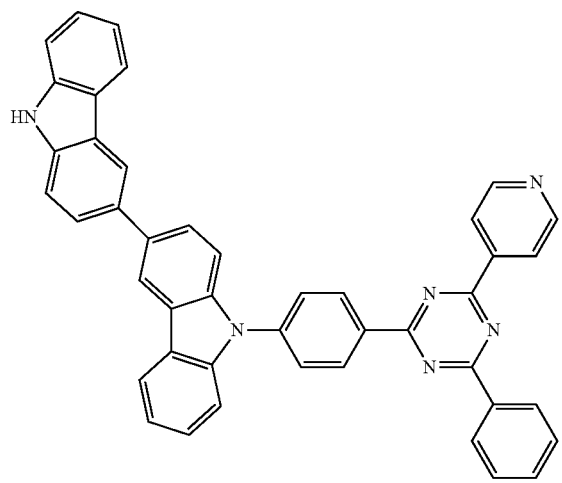
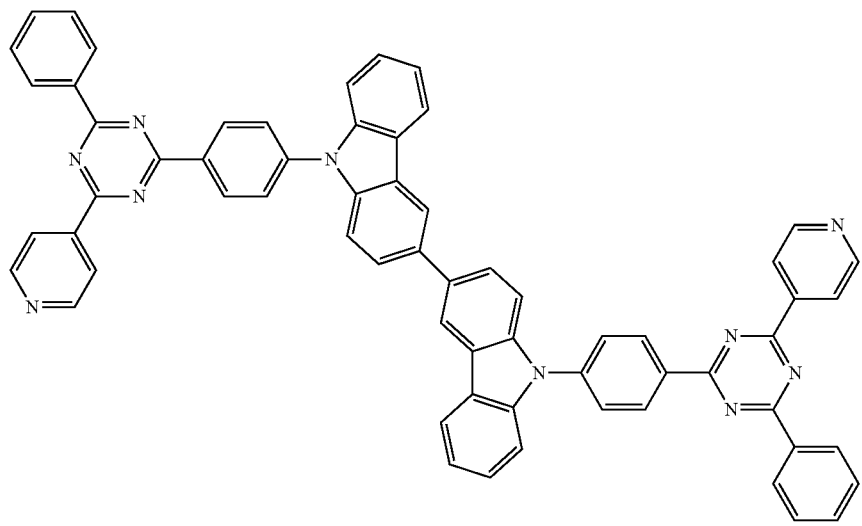

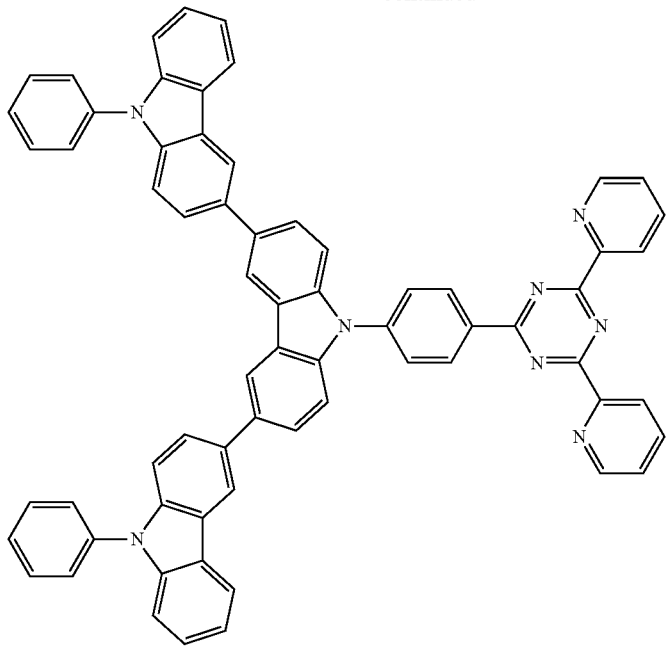
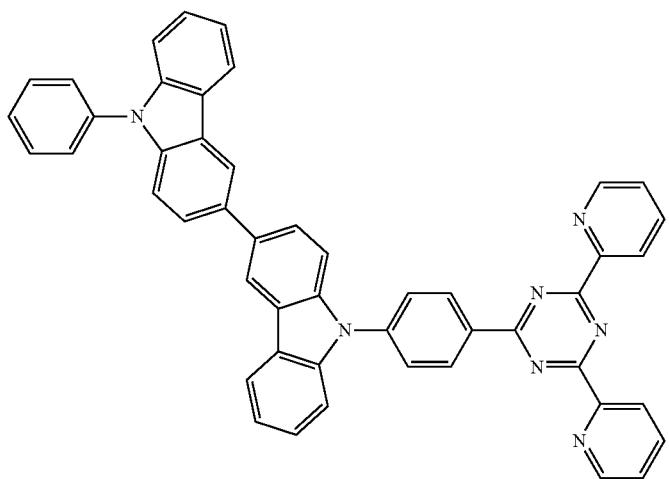
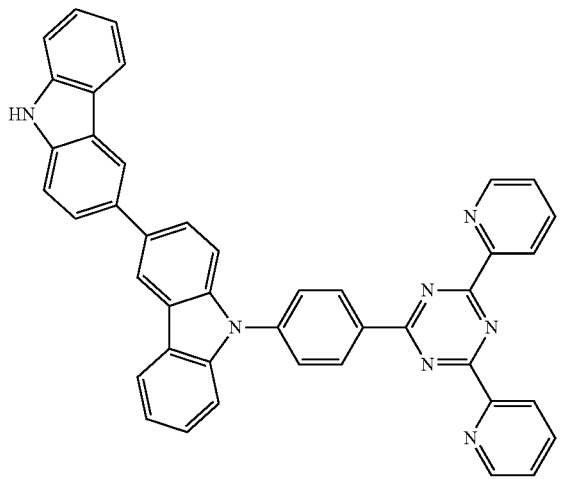

-continued
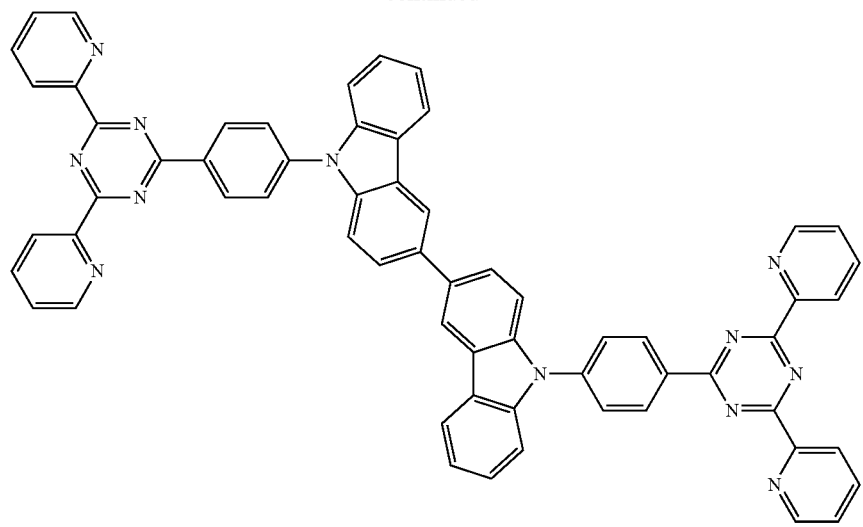
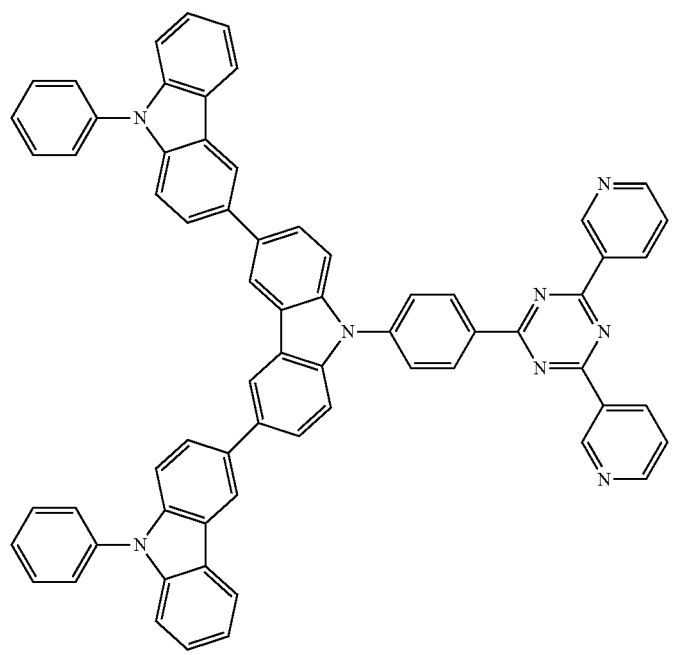
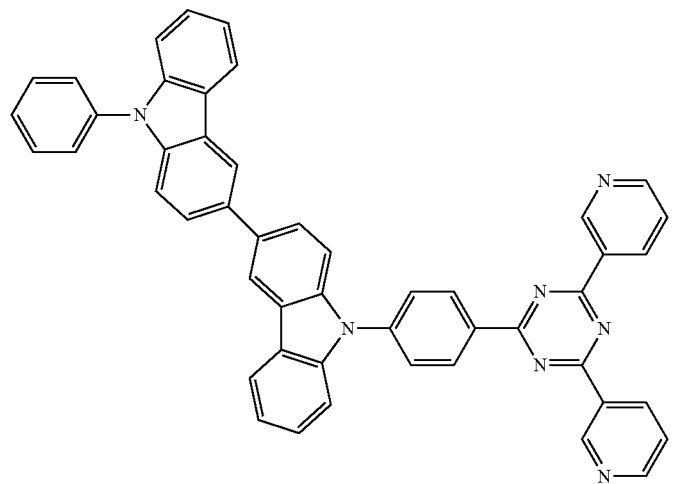

-continued
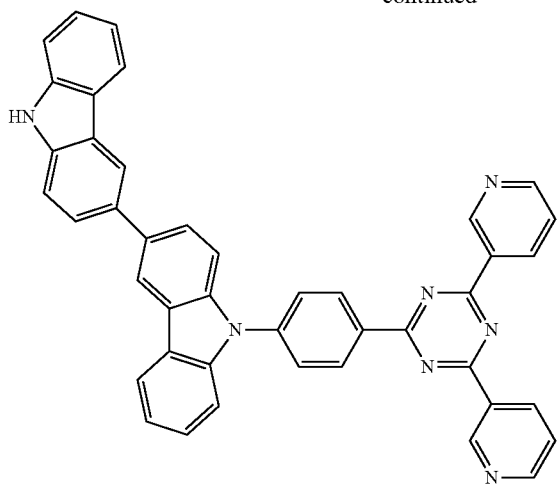
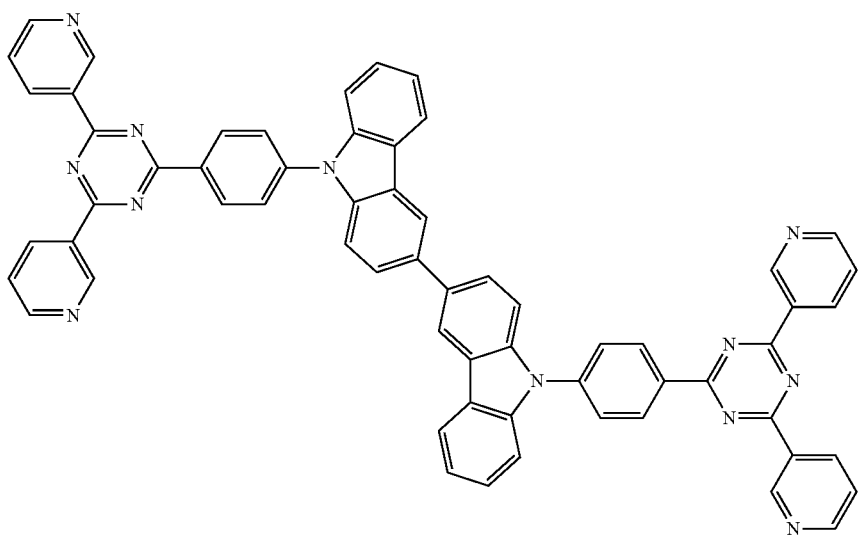
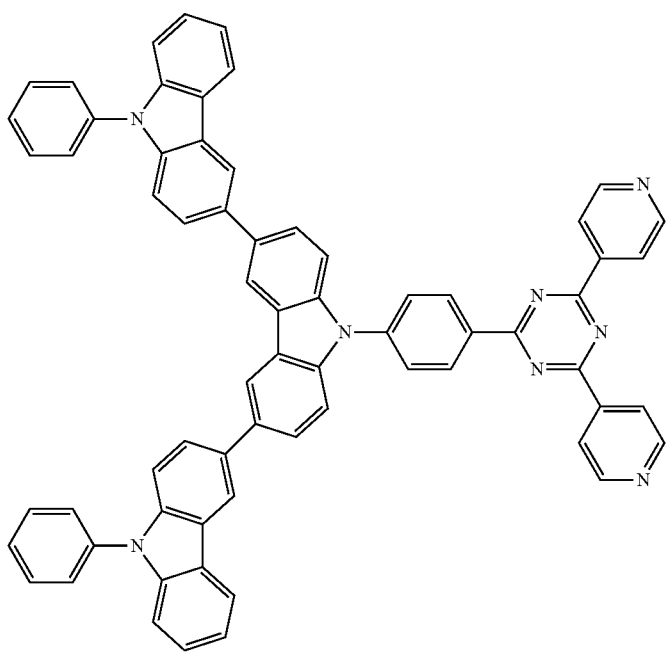

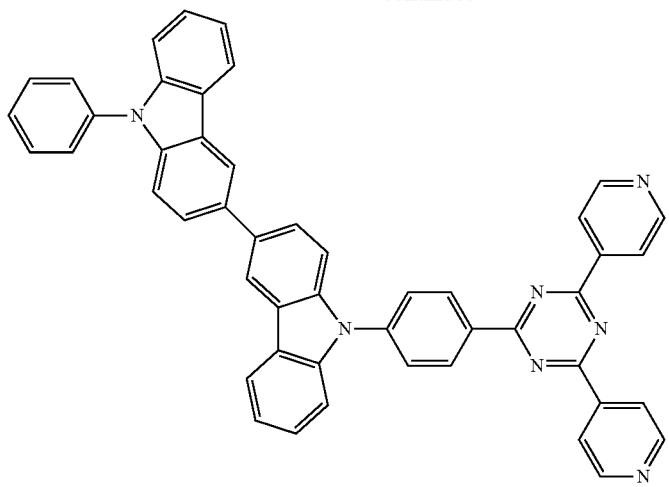
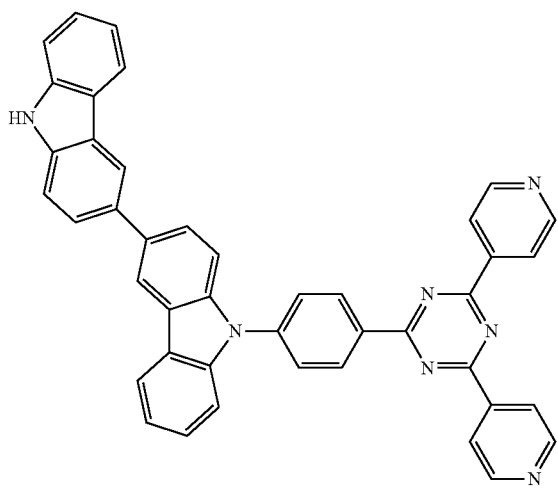
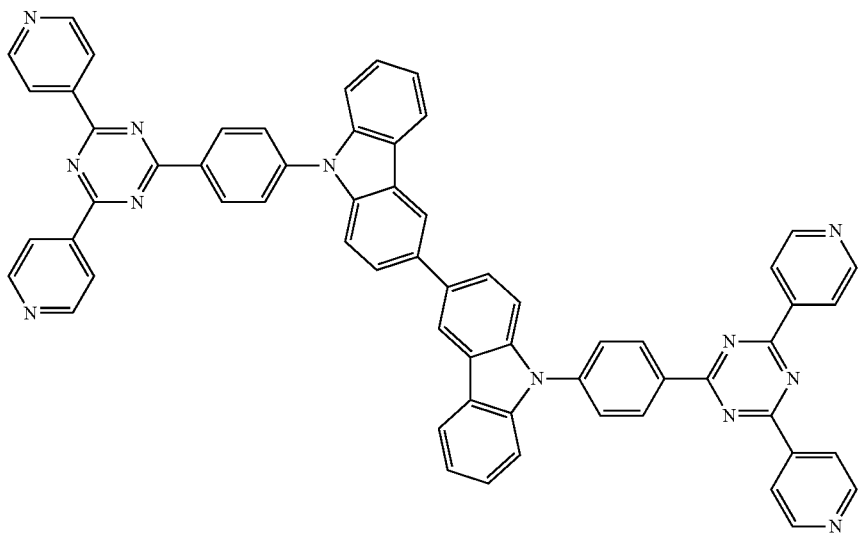

-continued
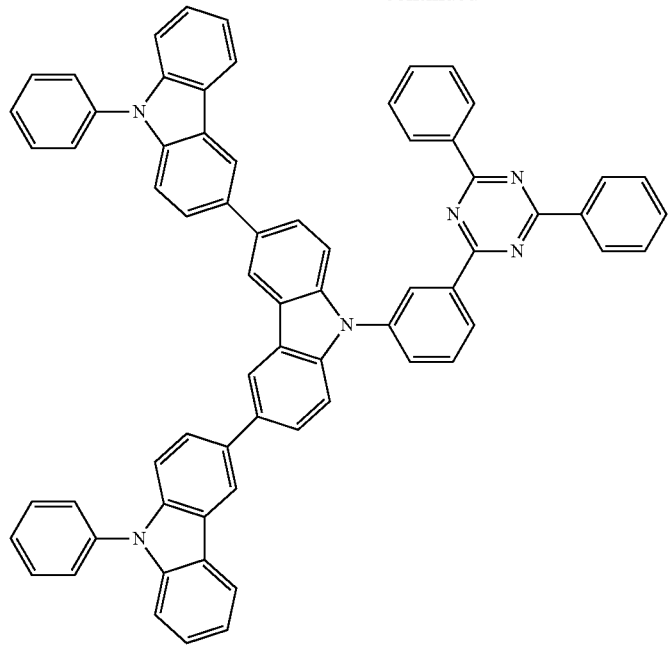
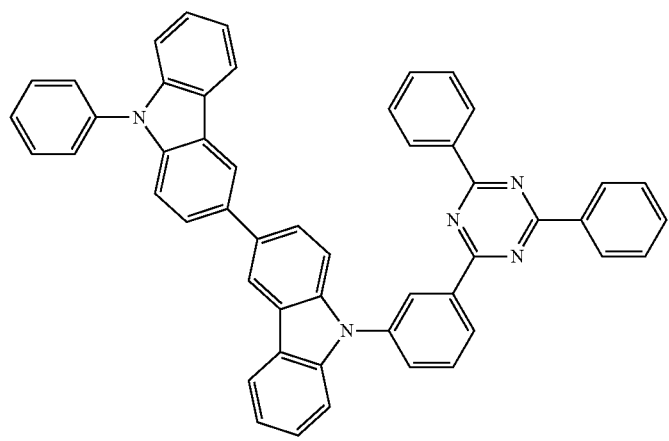
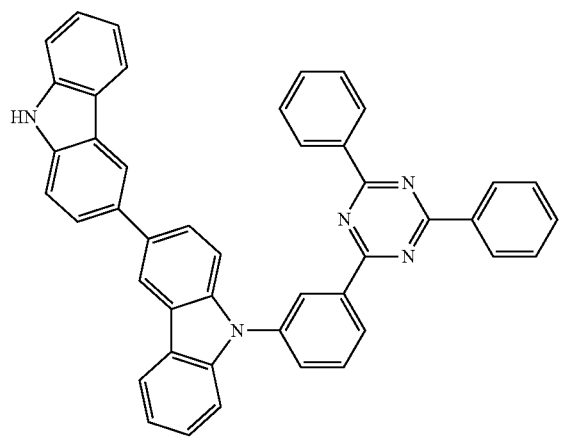

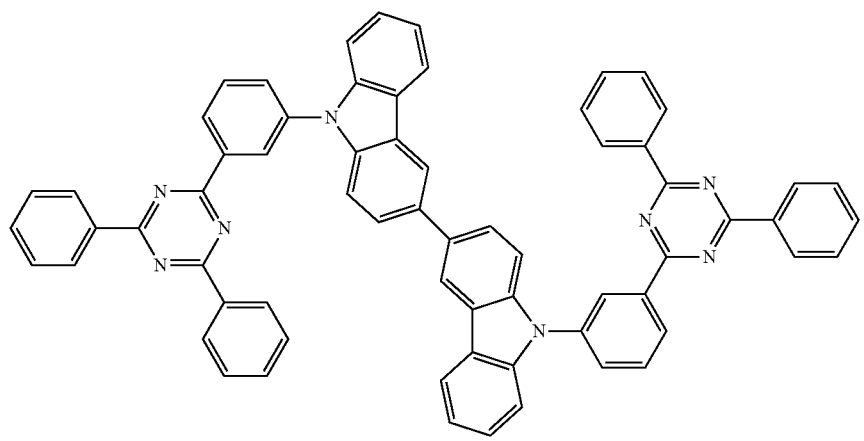
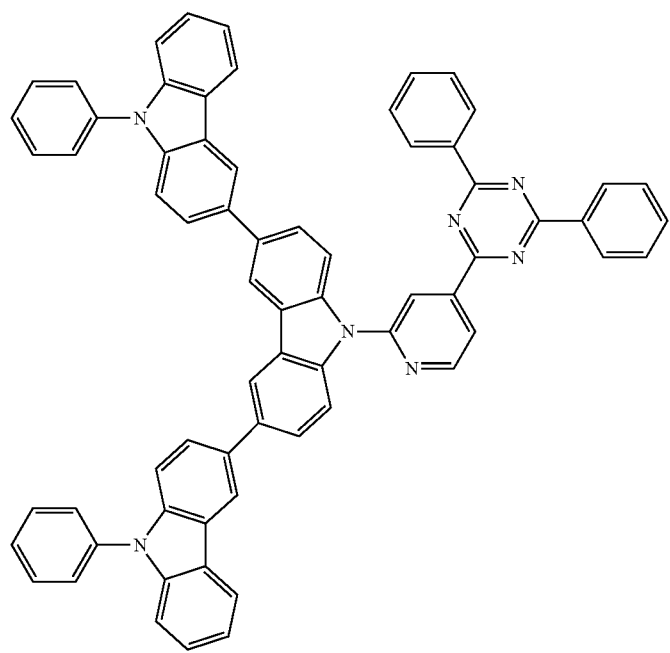
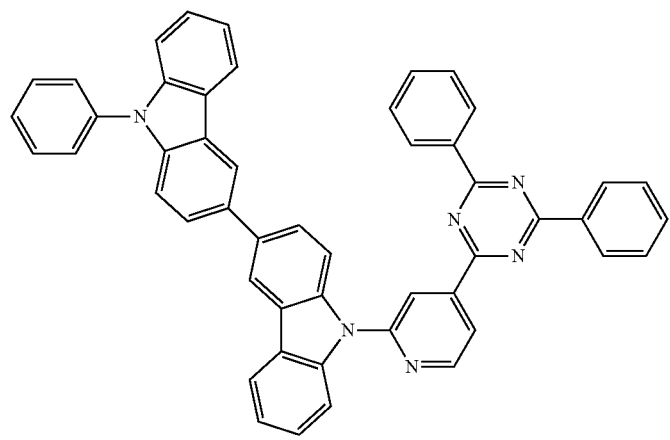

-continued
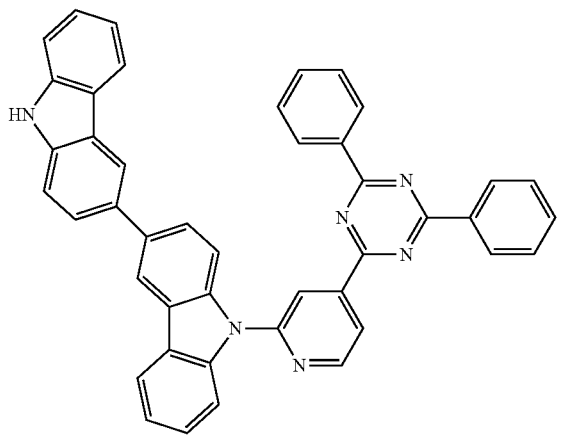
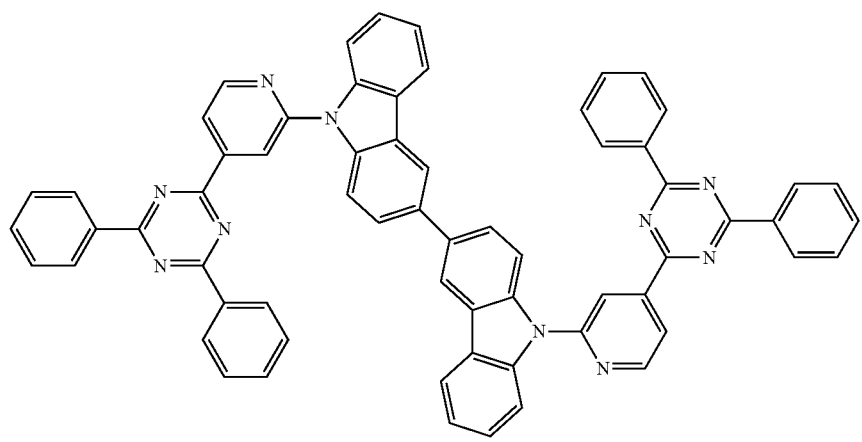
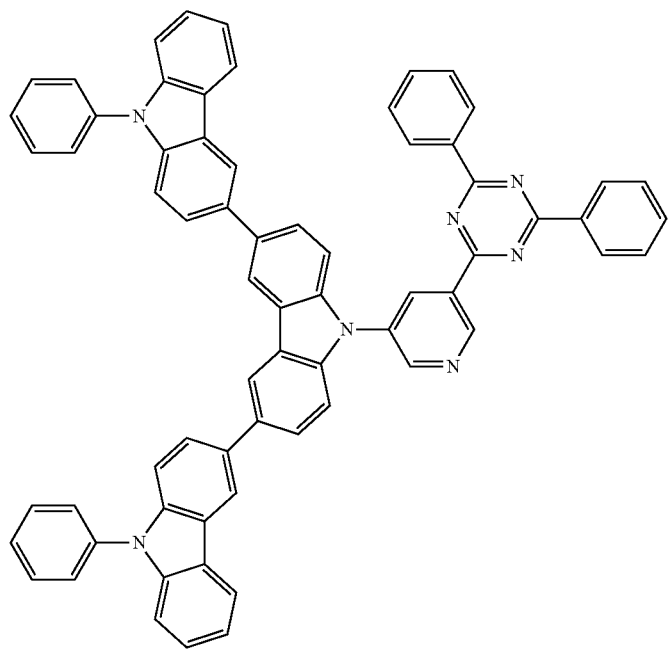

-continued
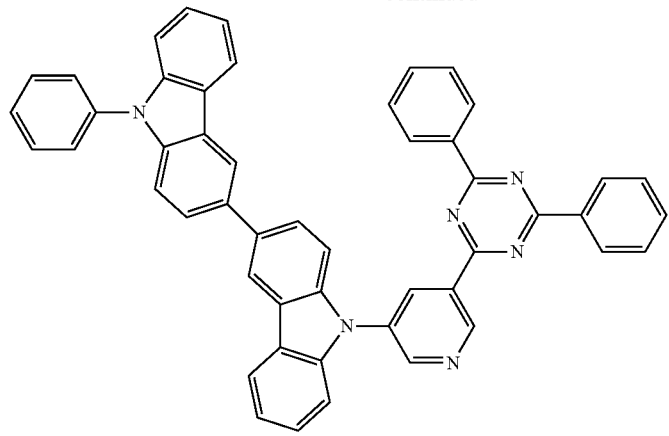
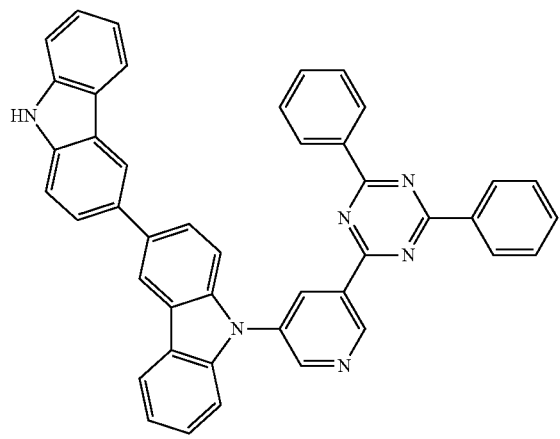
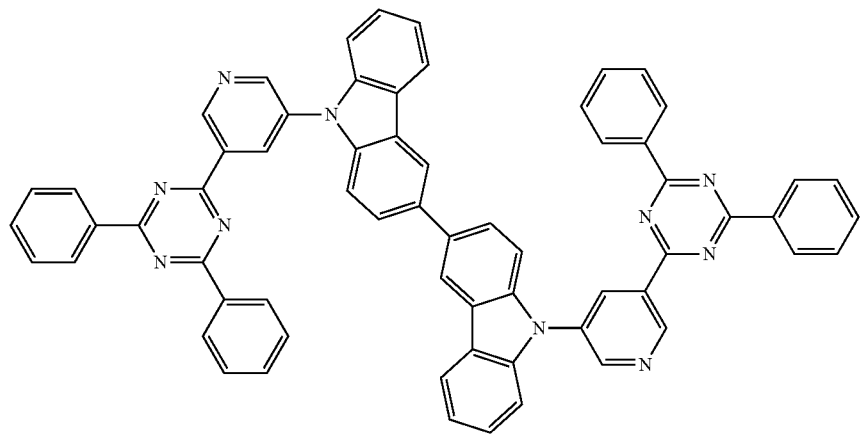

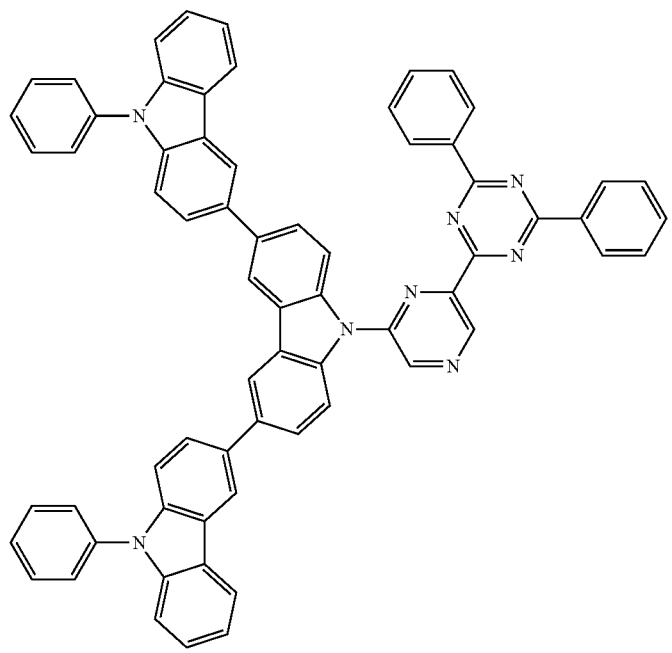
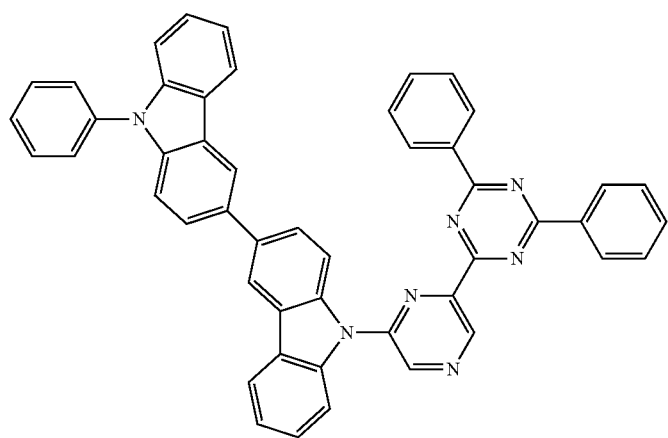
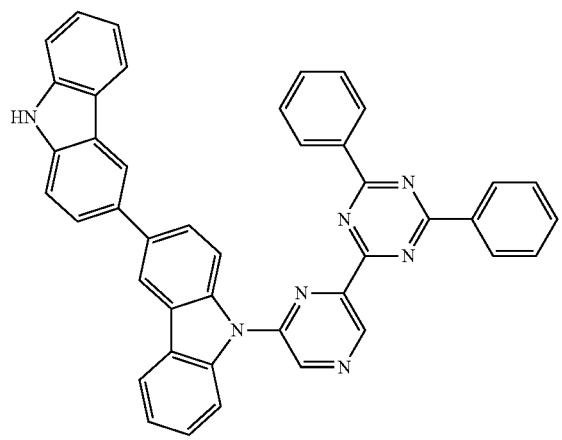

-continued
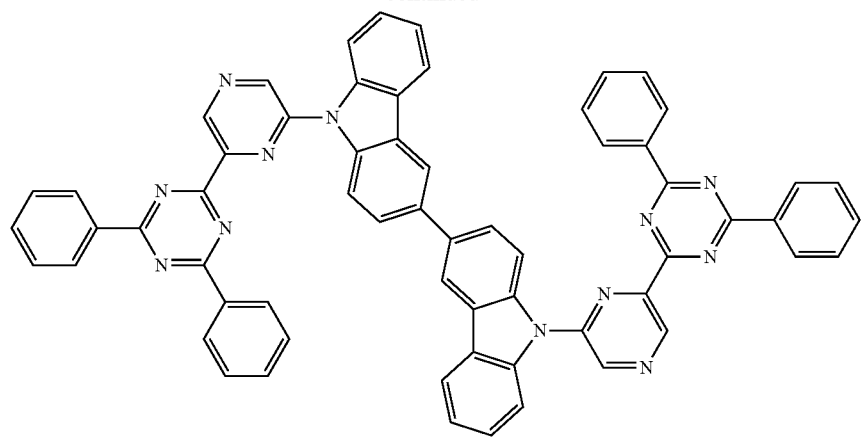
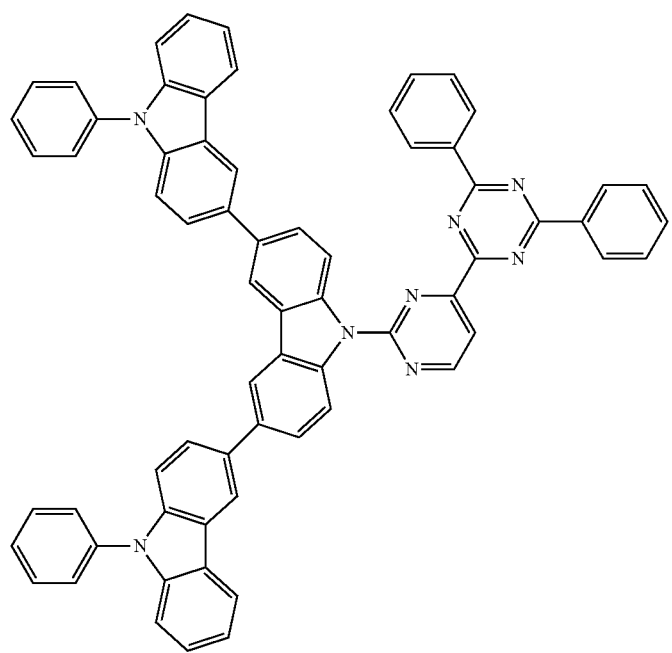
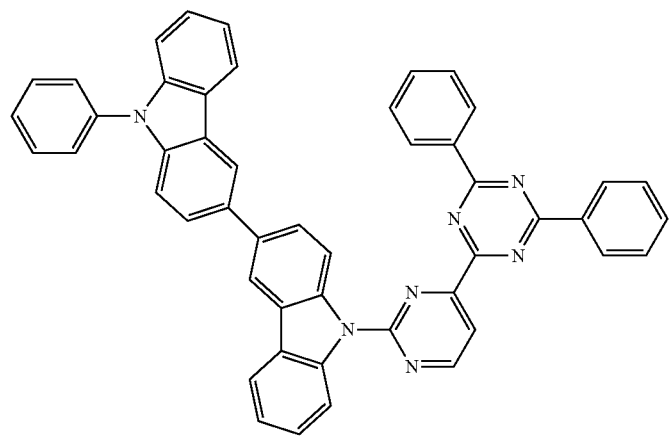

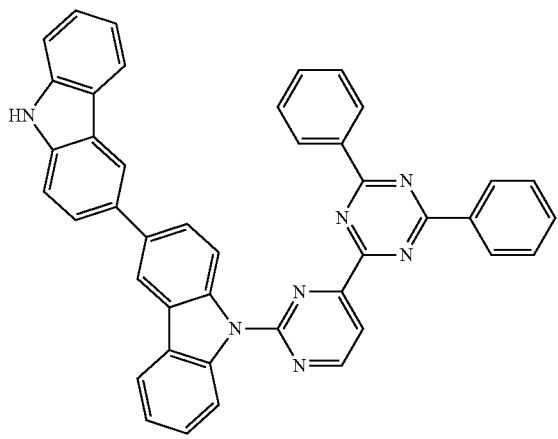
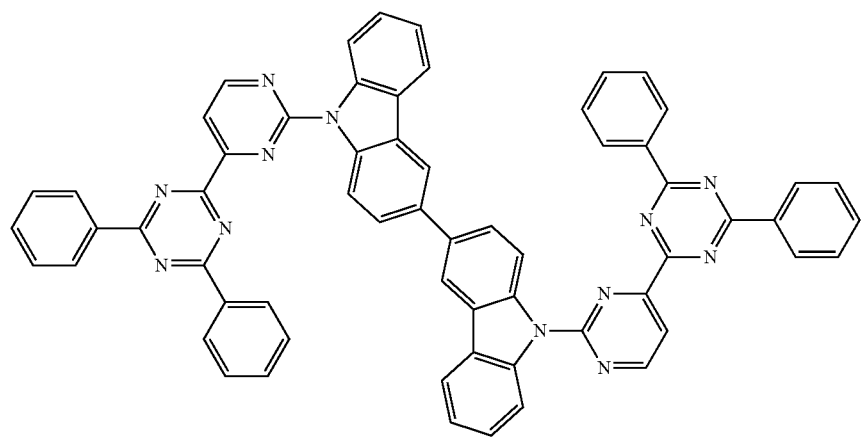
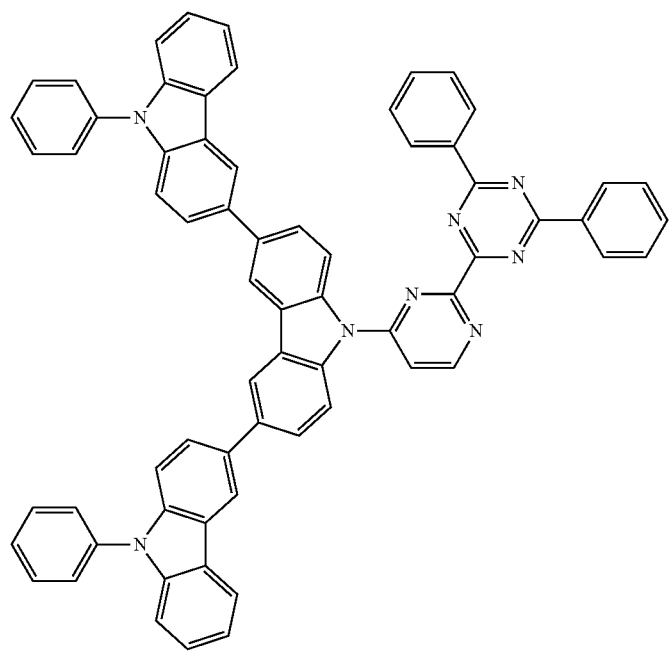

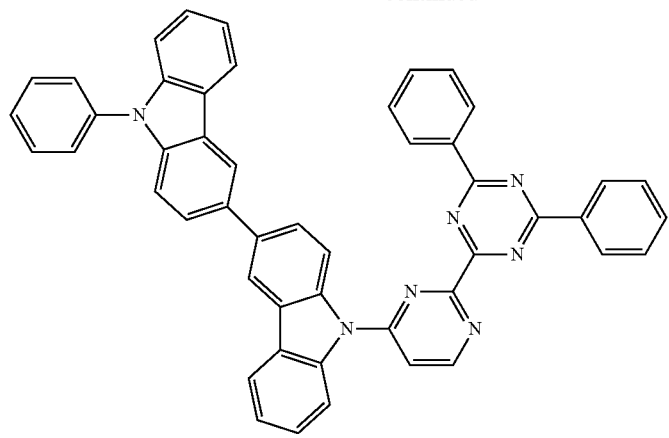
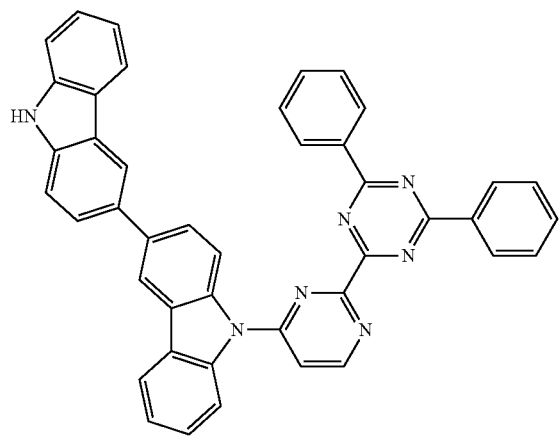
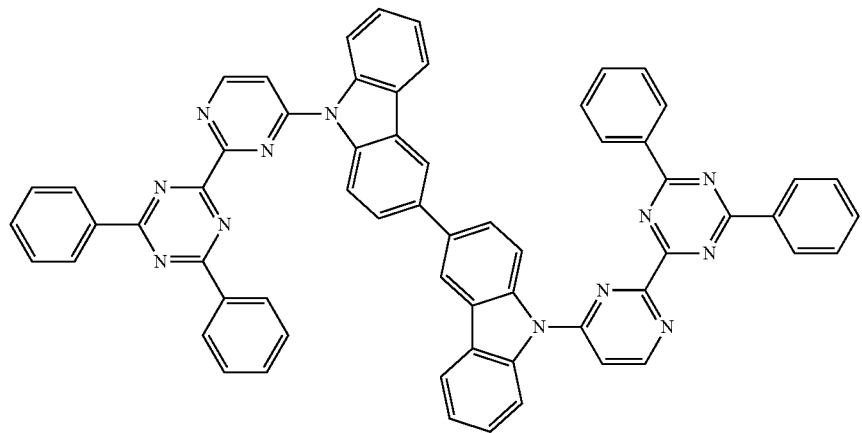

-continued
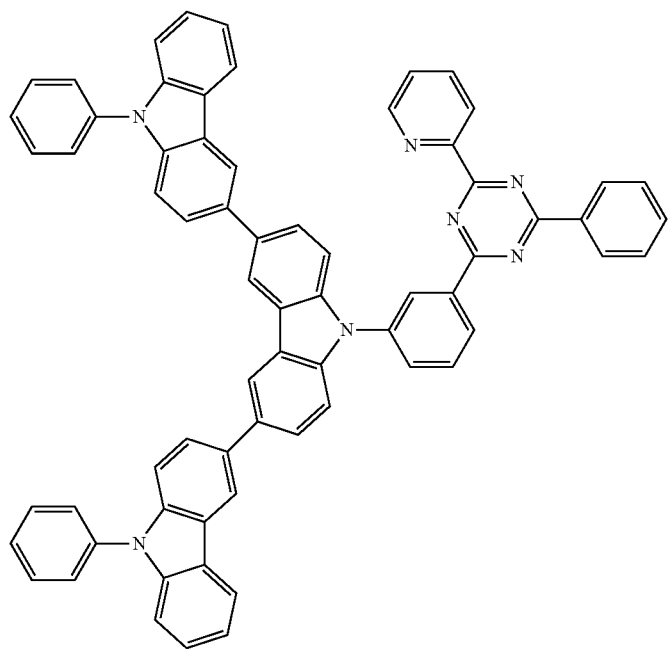
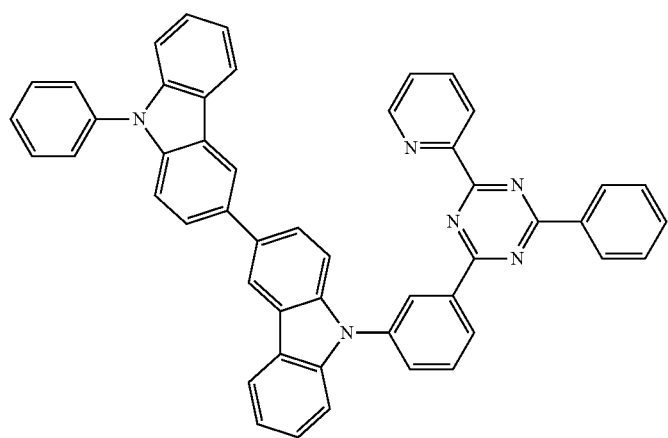
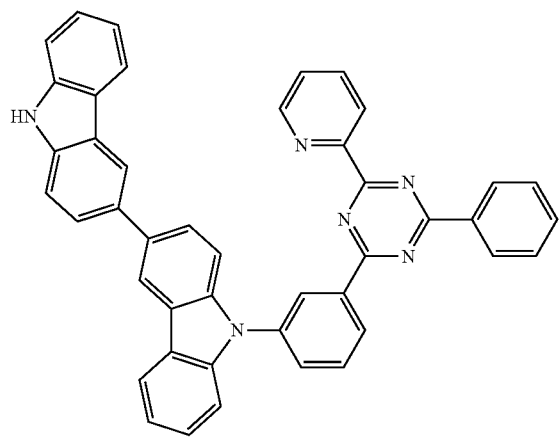

-continued
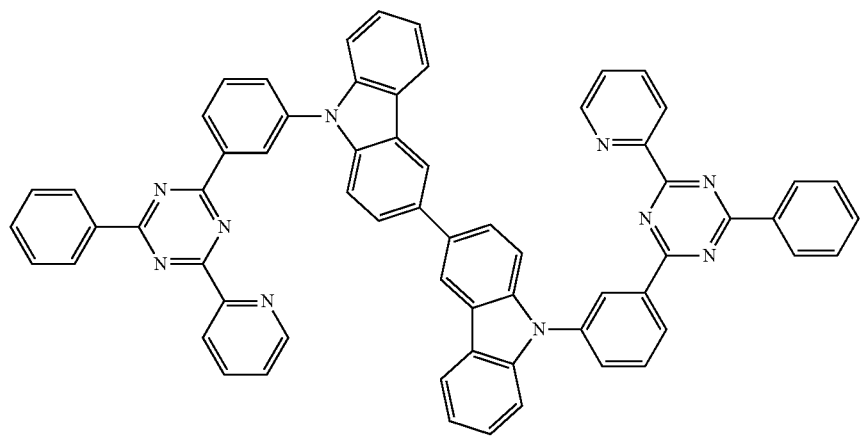
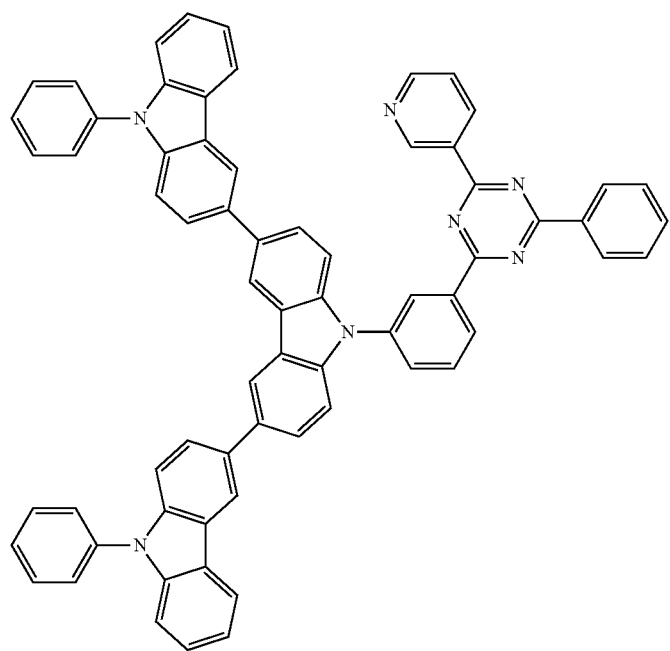
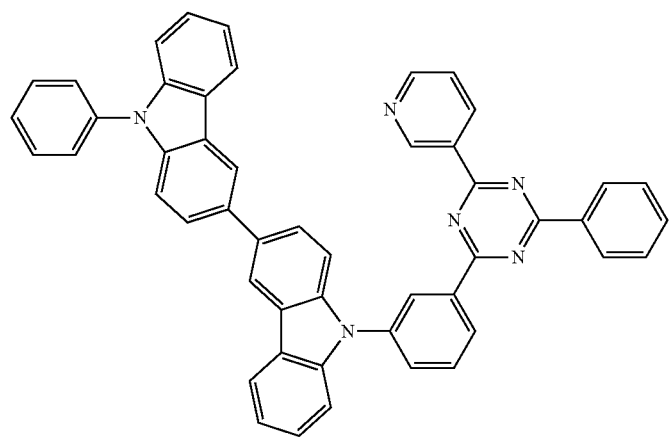

-continued
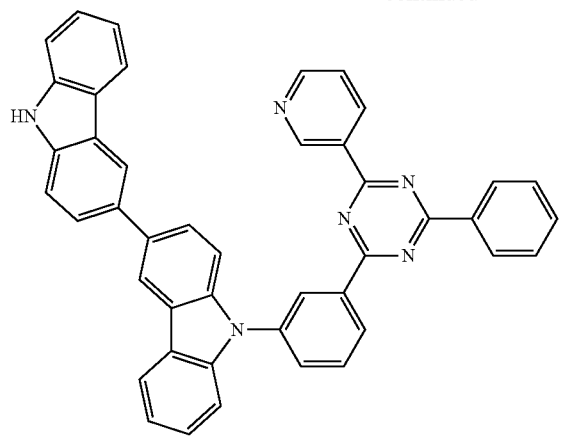
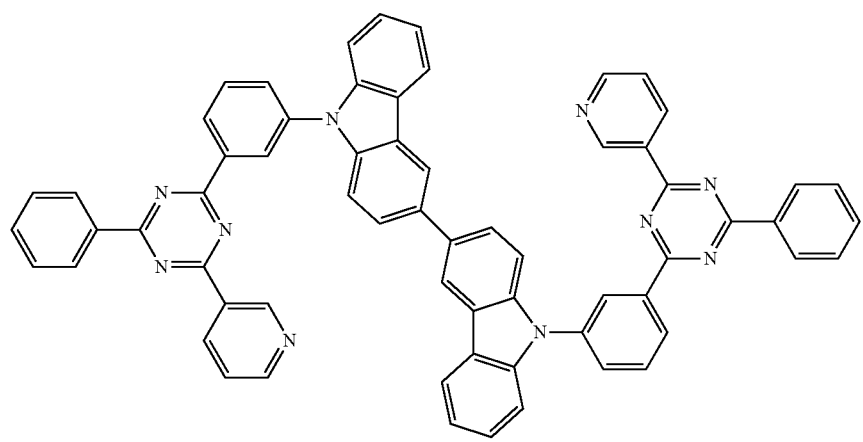
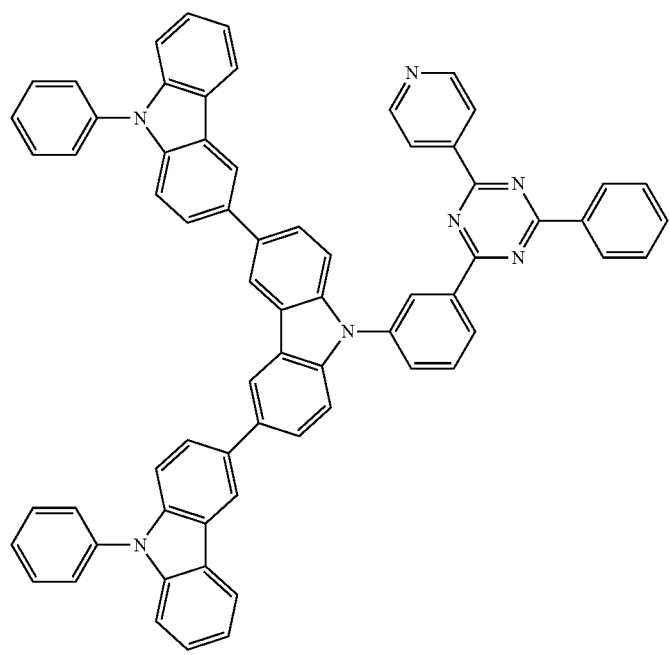

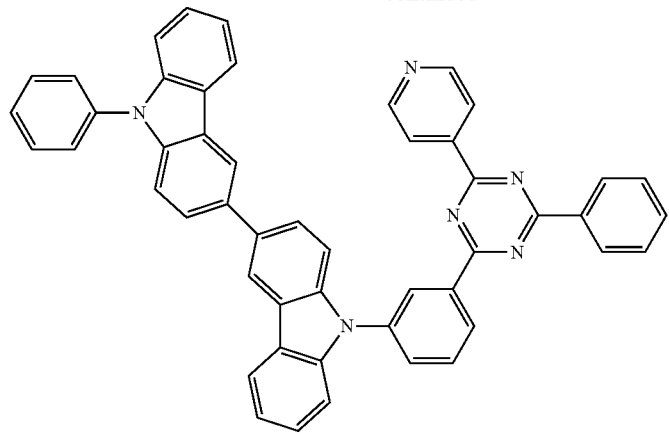
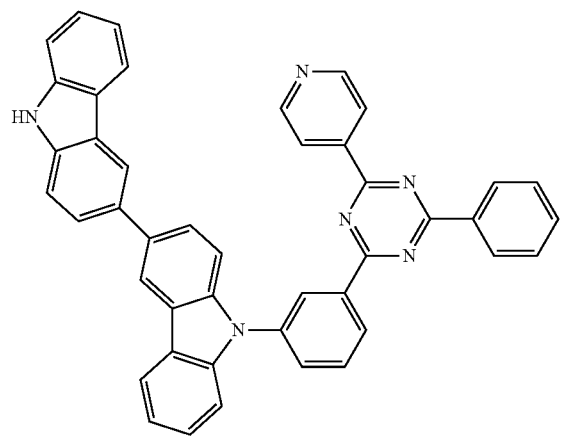
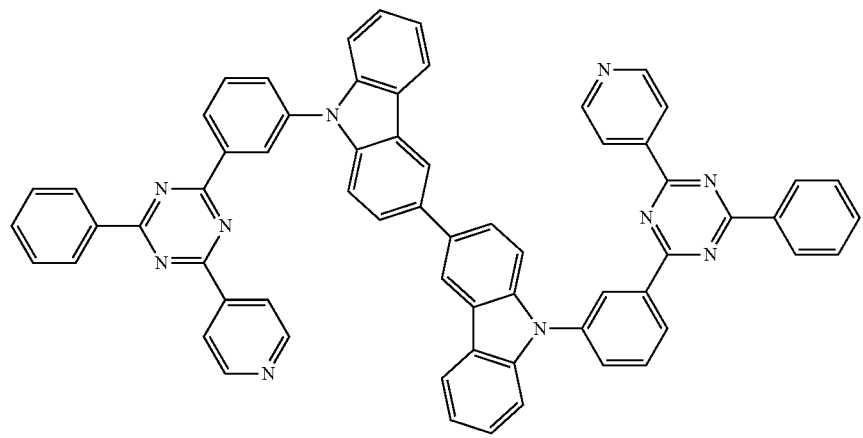

-continued
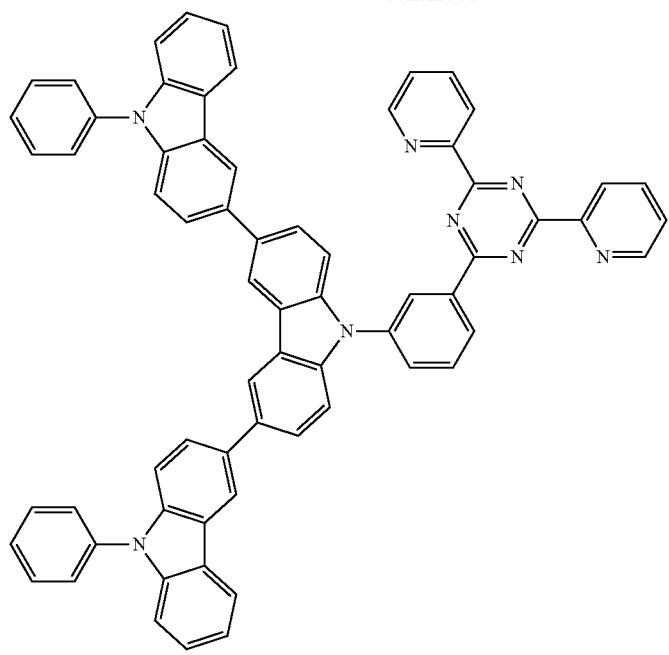
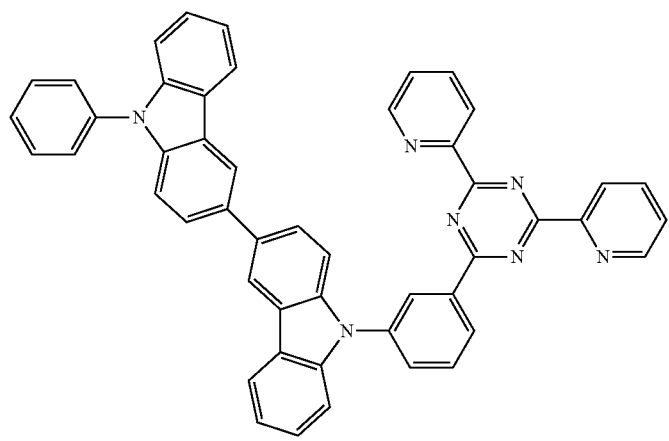
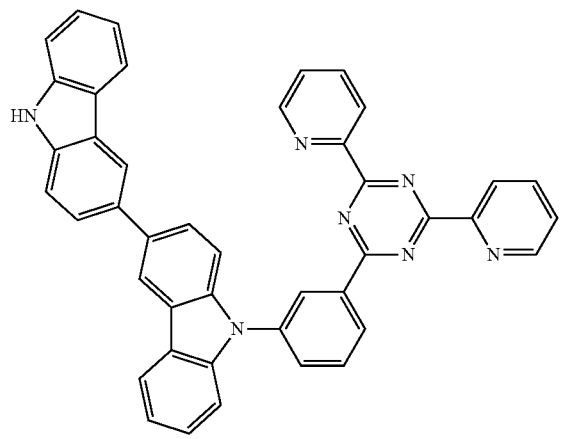

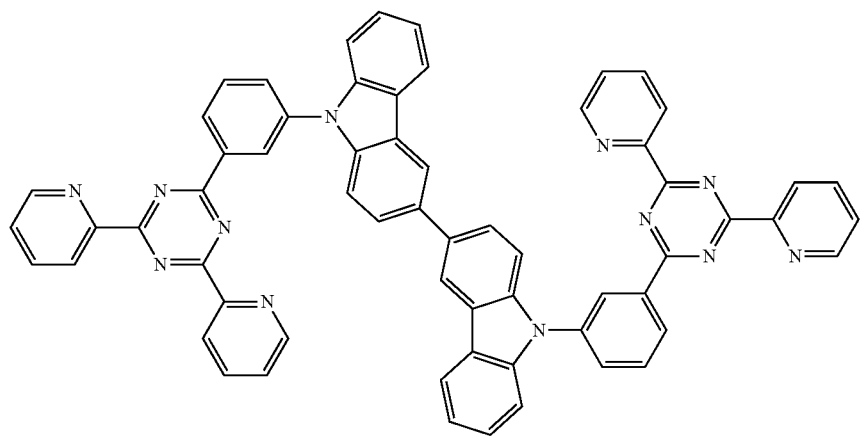
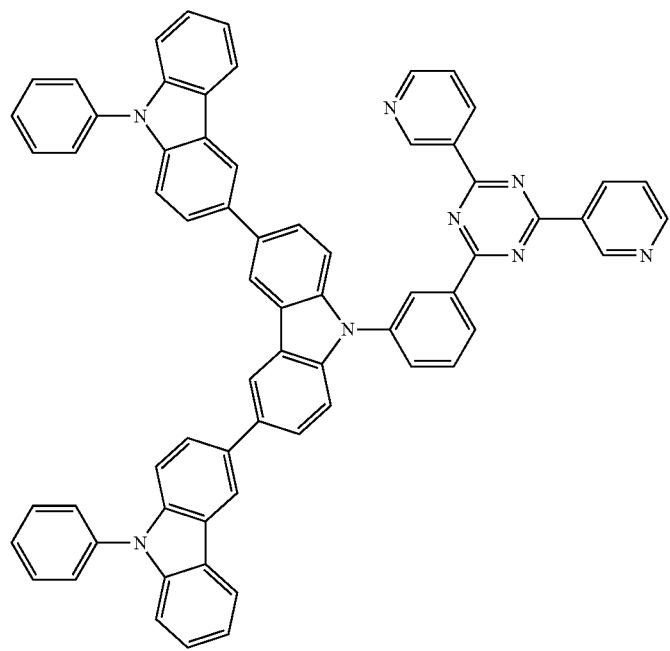
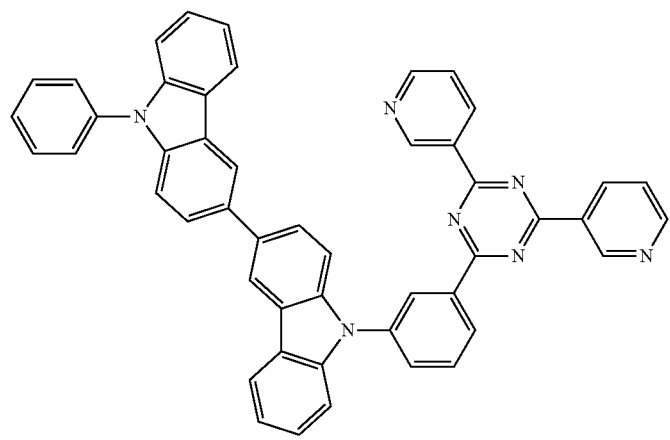

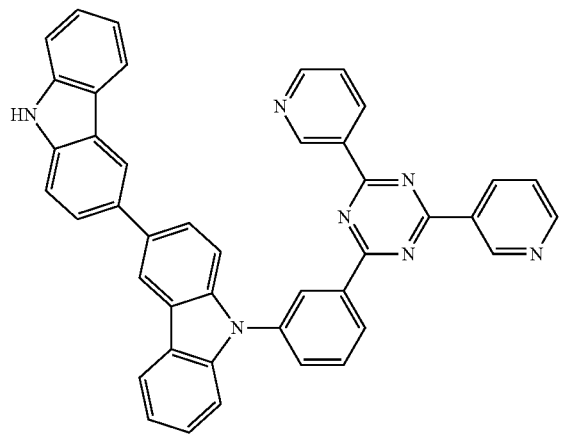
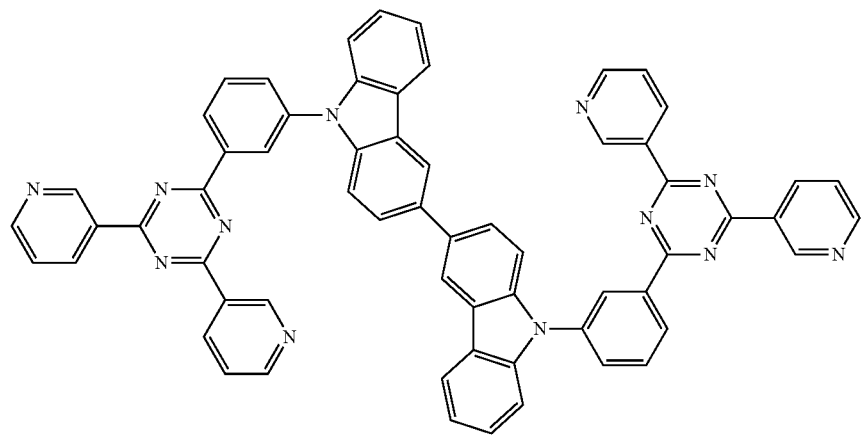
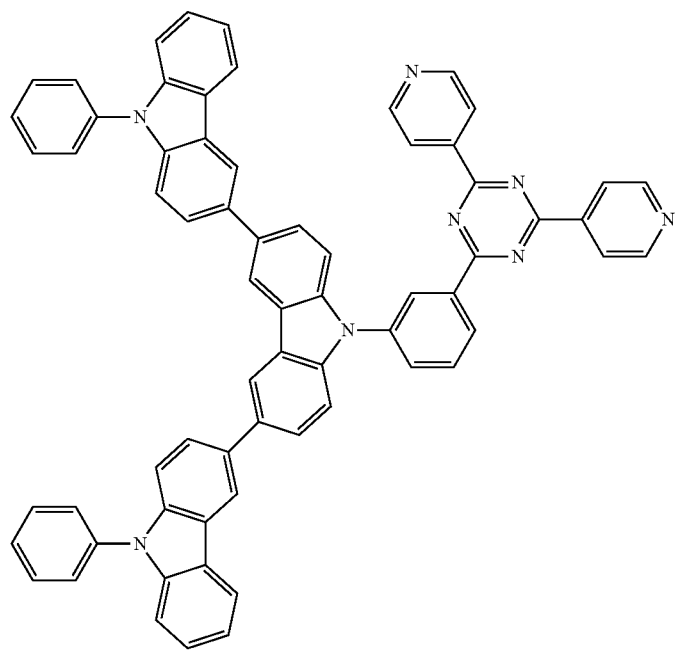

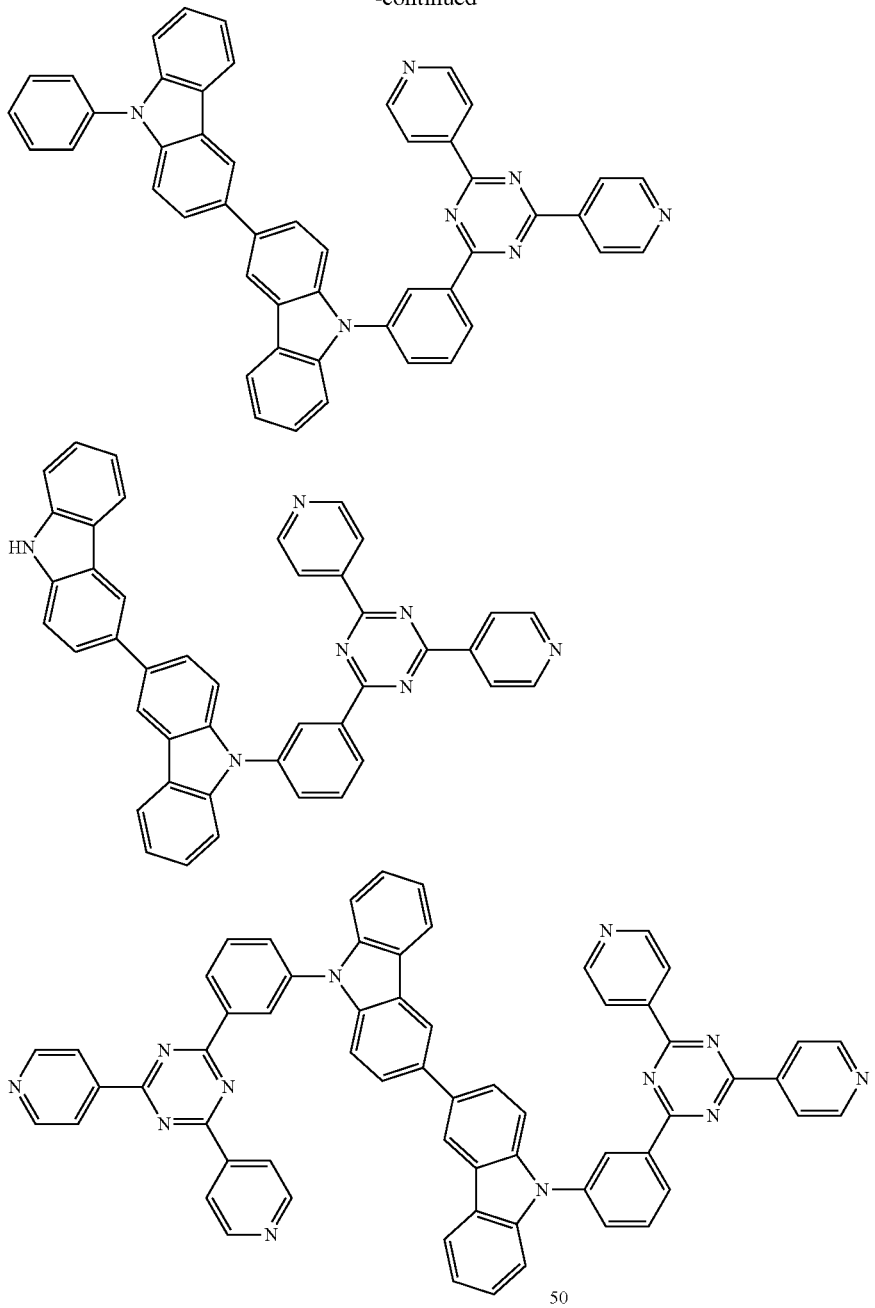

Examples of the preferred light emitting material capable of emitting delayed fluorescent light include compounds represented by the following general formulae (211) and (212). The entire description of WO 2013/133359 including the paragraphs 0007 to 0032 and 0079 to 0084 is incorporated herein by reference.

General Formula (211)

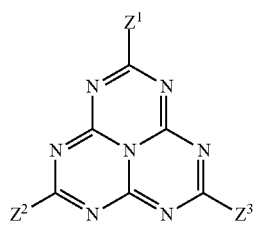

wherein in the general formula (211), $Z^1$, $Z^2$ and $Z^3$ each independently represent a substituent.

General Formula (212)

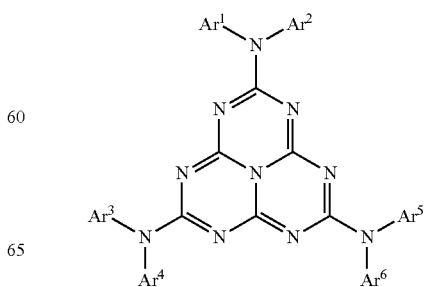

wherein in the general formula (212), $Ar^1$, $Ar^2$, $Ar^3$, $Ar^4$, $Ar^5$ and $Ar^6$ each independently represent a substituted or unsubstituted aryl group.

Specific examples of the compound represented by the general formula (212) include the compound represented by the following structural formula.

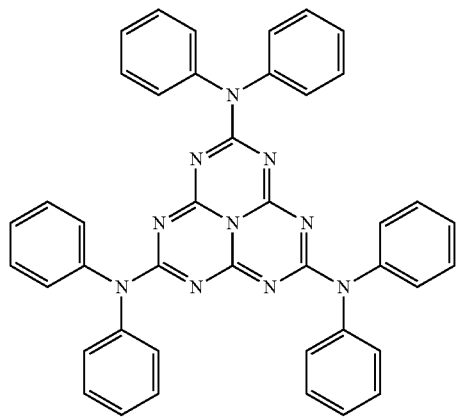

Compound 4001

Specific examples of the compound represented by the general formula (212) include the compounds shown in the following table. In the compounds shown in the table, $Ar^1$, $Ar^2$, $Ar^3$, $Ar^4$, $Ar^5$ and $Ar^6$ are the same as each other, and are expressed by Ar.

TABLE 21

| Compound No. | Ar |
| --- | --- |
| 4002 | 4-fluorophenyl |
| 4003 | 3-fluorophenyl |
| 4004 | 2-fluorophenyl |
| 4005 | 3,5-difluorophenyl |
| 4006 | 2,4,6-trifluorophenyl |
| 4007 | 4-methylphenyl |
| 4008 | 3-methylphenyl |
| 4009 | 2-methylphenyl |
| 4010 | 3,5-dimethylphenyl |
| 4011 | 2,4,6-trimethylphenyl |

TABLE 21-continued

| Compound No. | Ar |
| --- | --- |
| 4012 | 4-ethylphenyl |
| 4013 | 3-ethylphenyl |
| 4014 | 2-ethylphenyl |
| 4015 | 3,5-diethyphenyl |
| 4016 | 4-propylphenyl |
| 4017 | 3-propylphenyl |
| 4018 | 3,5-dipropylphenyl |
| 4019 | 4-tert-butylphenyl |
| 4020 | 3-tert-butylphenyl |
| 4021 | 3,5-di-tert-butylphenyl |
| 4022 | 1-naphthyl |
| 4023 | 2-naphthyl |

Examples of the preferred light emitting material capable of emitting delayed fluorescent light include compounds represented by the following general formula (221). The entire description of WO 2013/161437 including the paragraphs 0008 to 0054 and 0101 to 0121 is incorporated, herein by reference.

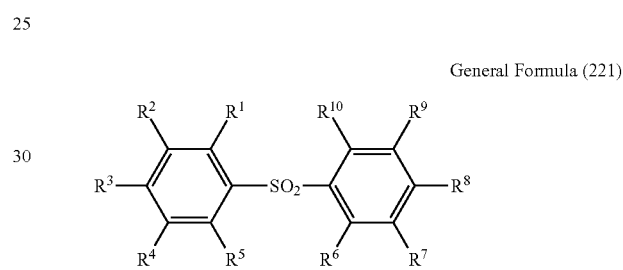

General Formula (221)

wherein in the general formula (221), $R^1$ to $R^{10}$ each independently represent a hydrogen atom or a substituent, provided that at least one of $R^1$ to $R^{10}$ represents a substituted or unsubstituted aryl group, a substituted or unsubstituted diarylamino group or a substituted or unsubstituted 9-carbazolyl group, and $R^1$ and $R^2$, $R^2$ and $R^3$, $R^3$ and $R^4$, $R^4$ and $R^5$, $R^5$ and $R^6$, $R^6$ and $R^7$, $R^7$ and $R^8$, $R^8$ and $R^9$, and $R^9$ and $R^{10}$ each may be bonded to each other to form a ring structure.

Specific examples of the compound include the following compounds.

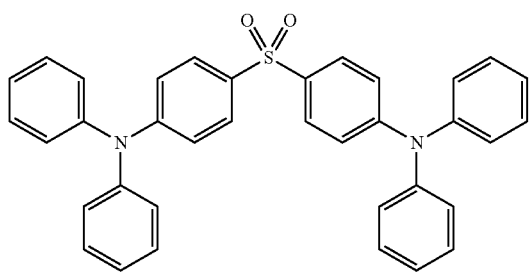

-continued
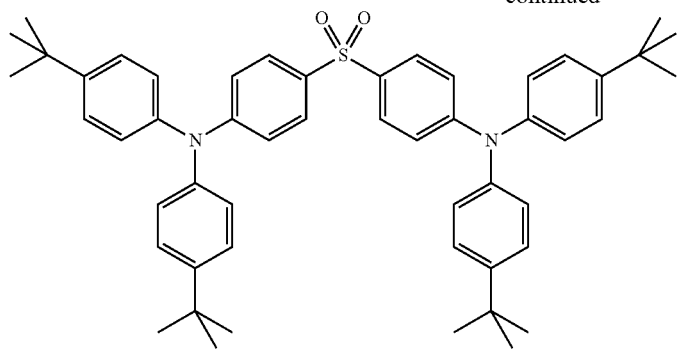
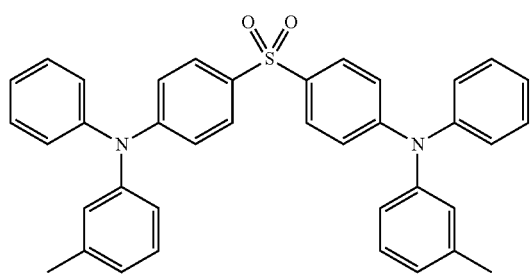
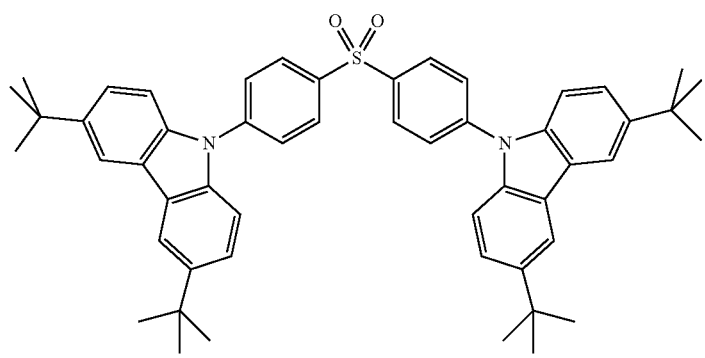
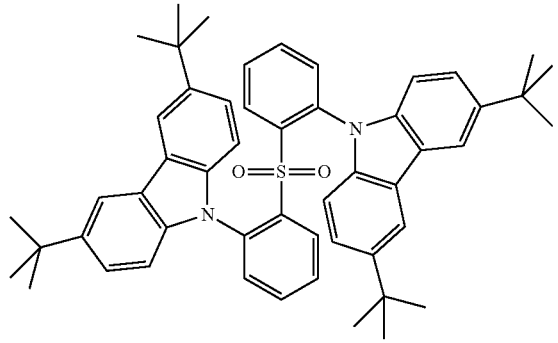
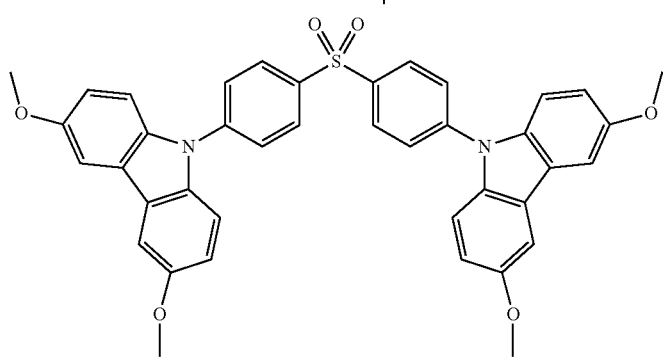

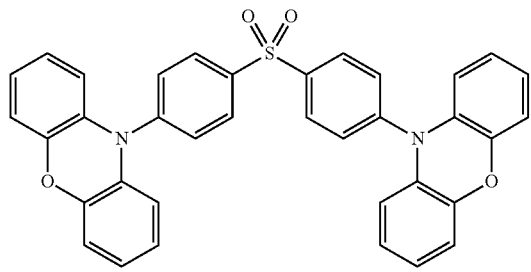
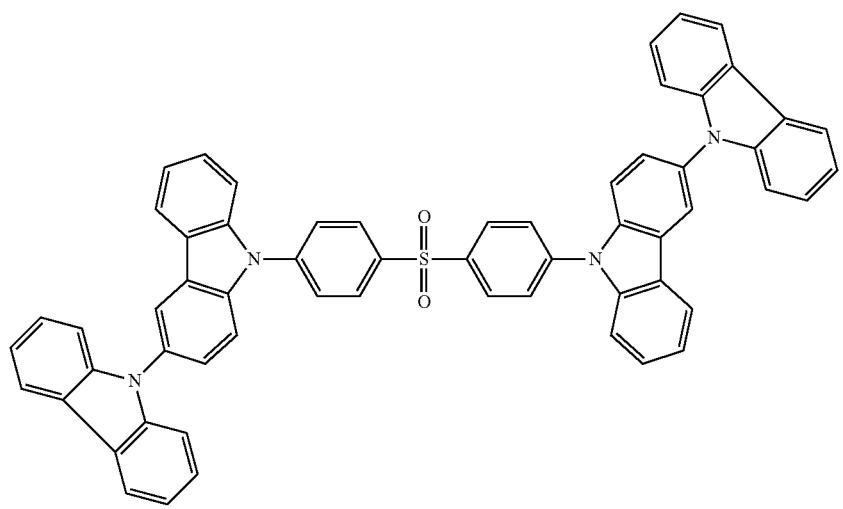
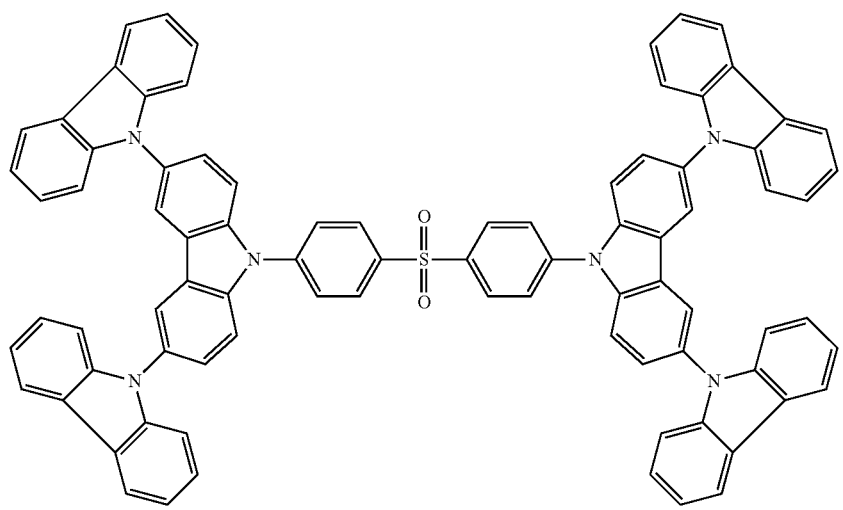

-continued
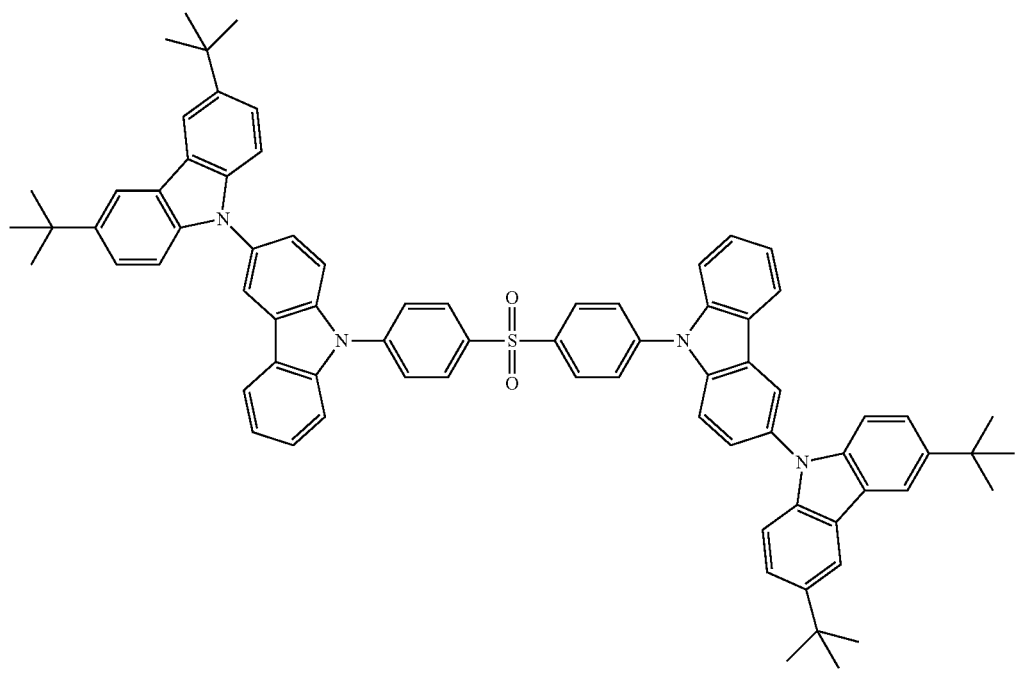
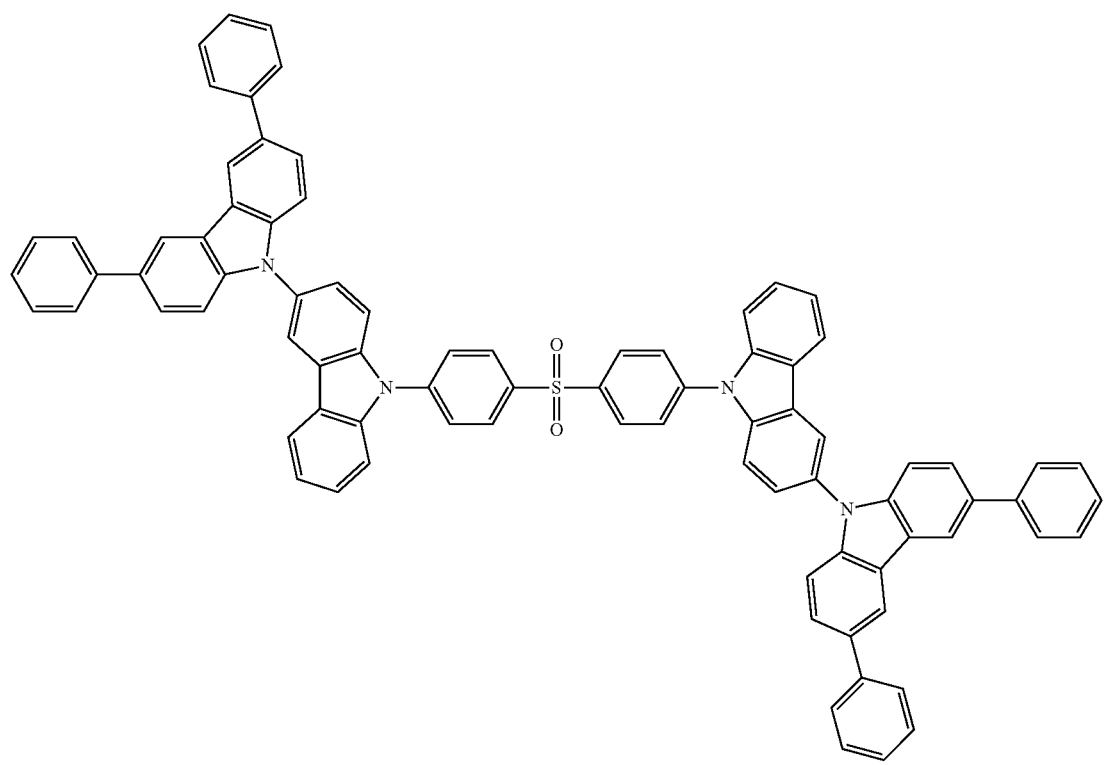

-continued

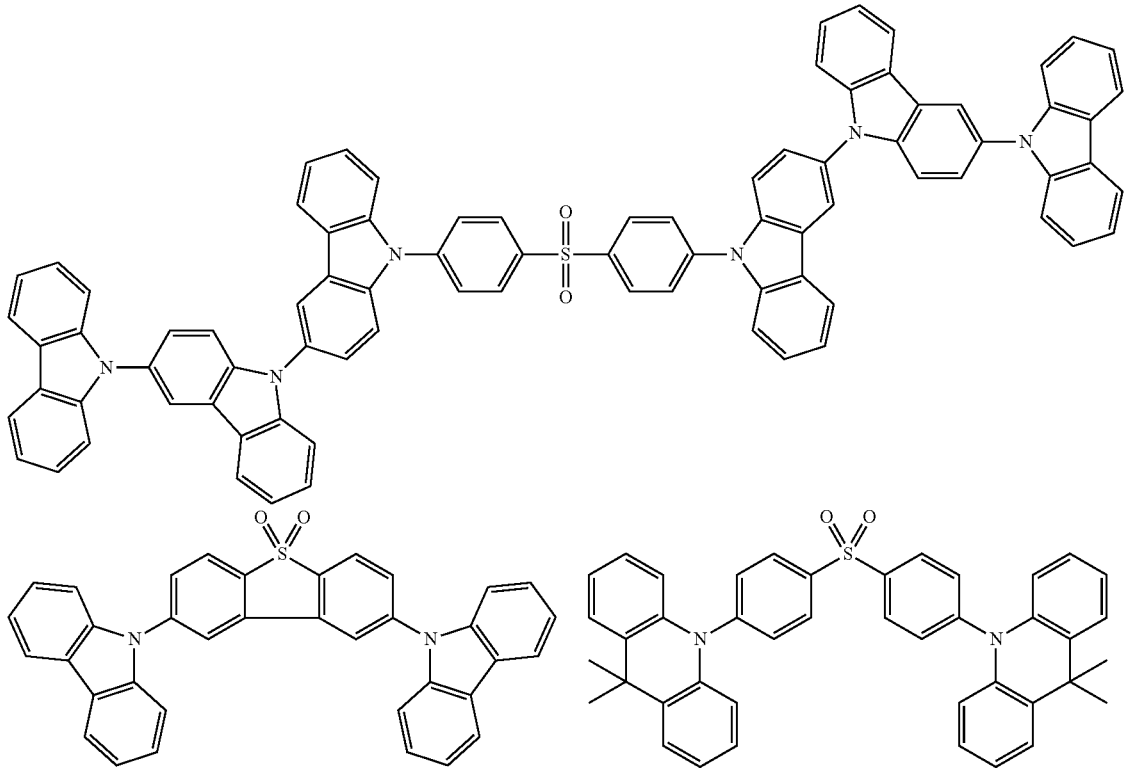

Examples of the preferred light, emitting material capable of emitting delayed fluorescent light include compounds represented by the following general formula (231). The entire description of JP-A-2014-9352 including the paragraphs 0007 to 0041 and 0060 to 0069 is incorporated herein by reference.

General Formula (231)

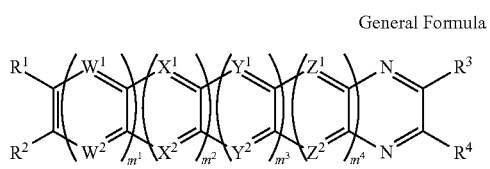

wherein in the general formula (231), $R^1$ to $R^4$ each independently represent a hydrogen atom or a substituted or unsubstituted (N,N-diarylamino)aryl group, provided that at least one of $R^1$ to $R^4$ represents a substituted or unsubstituted (N,N-diarylamino)aryl group, and two aryl groups constituting the diarylamino moiety of the (N,N-diarylamino)aryl group may be bonded to each other; $W^1$, $W^2$, $X^1$, $X^2$, $Y^1$, $Y^2$, $Z^1$ and $Z^2$ each independently represent a carbon atom or a nitrogen atom; and $m^1$ to $m^4$ each independently represent 0, 1 or 2.

Specific examples of the compound include the following compounds.

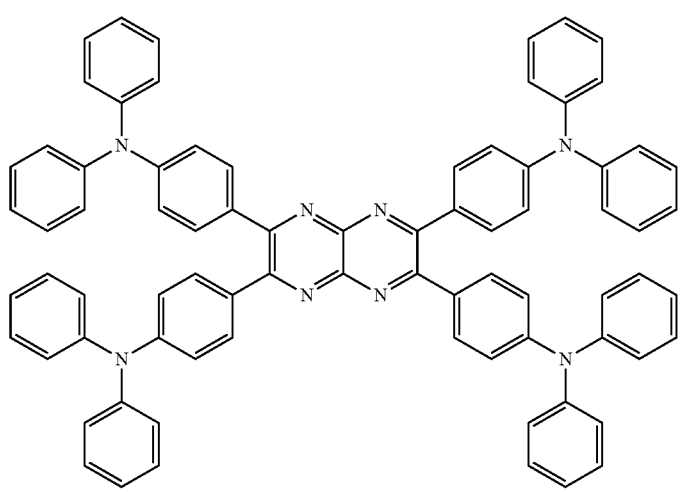

-continued
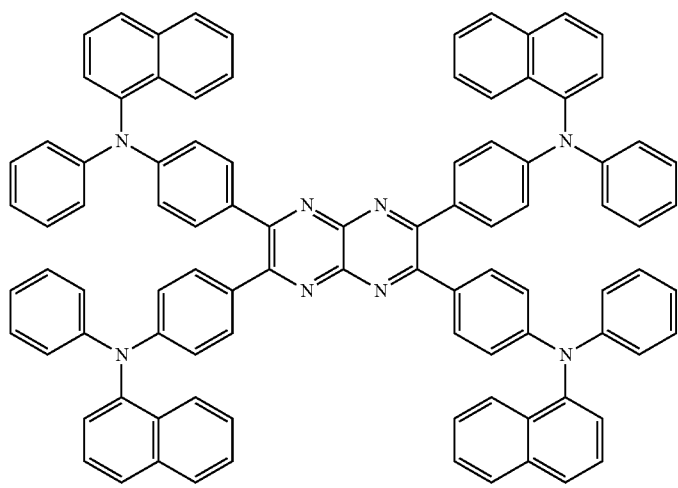
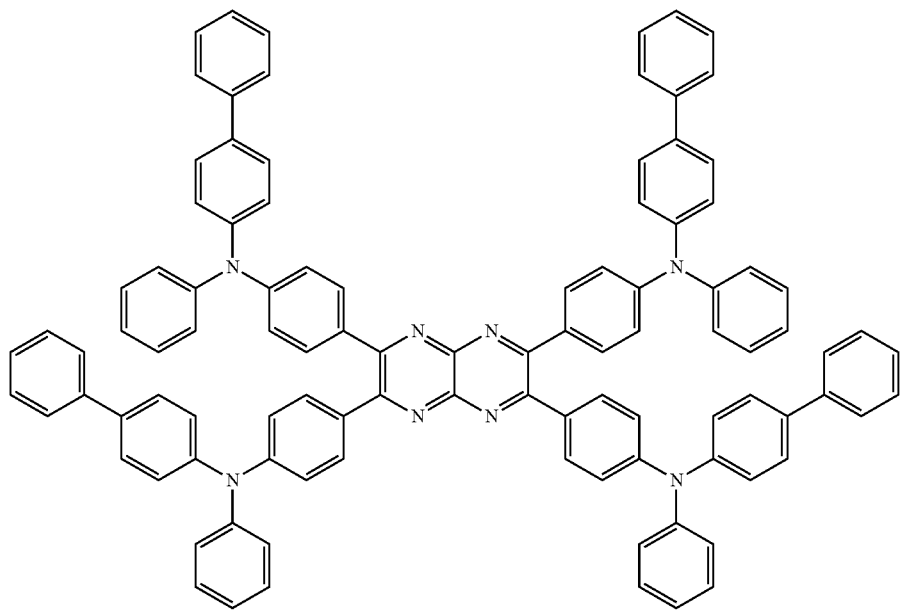
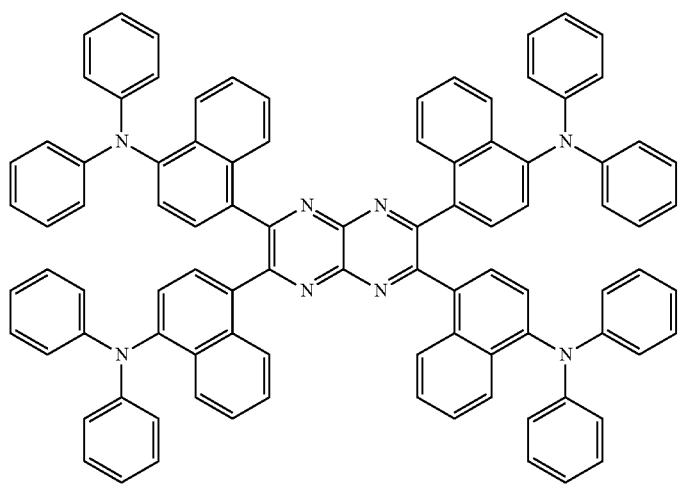

-continued
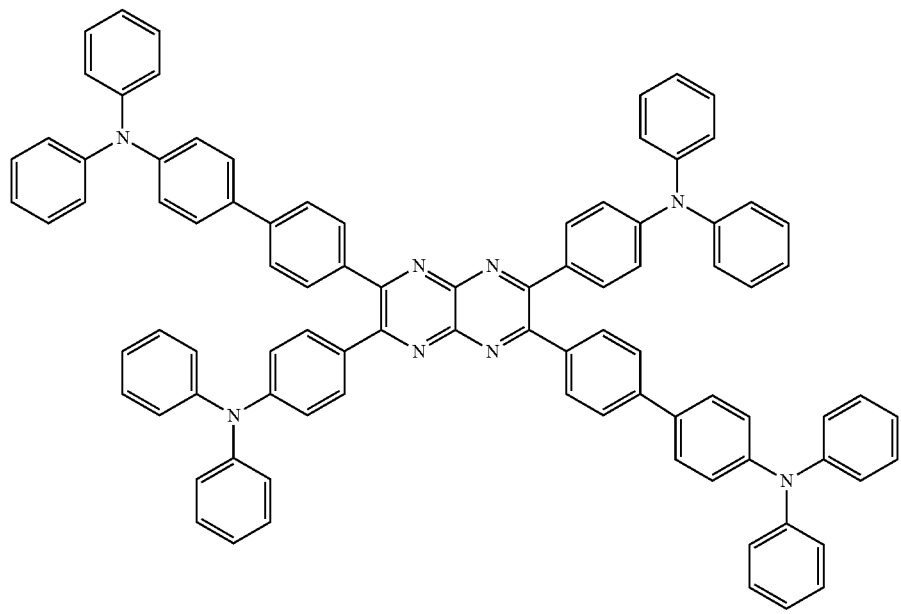
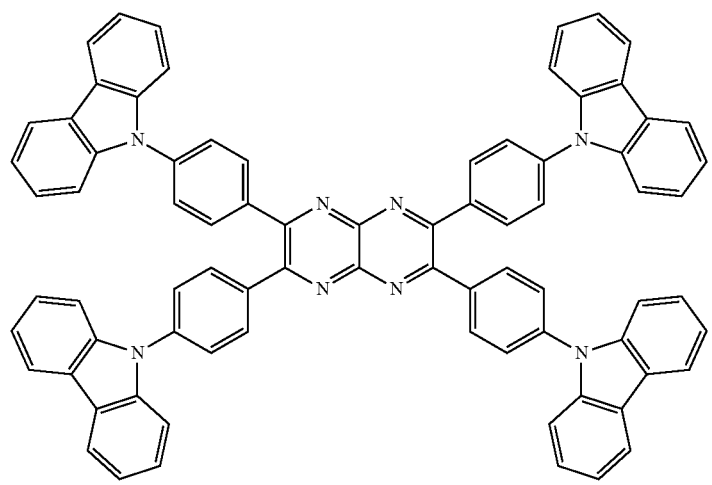
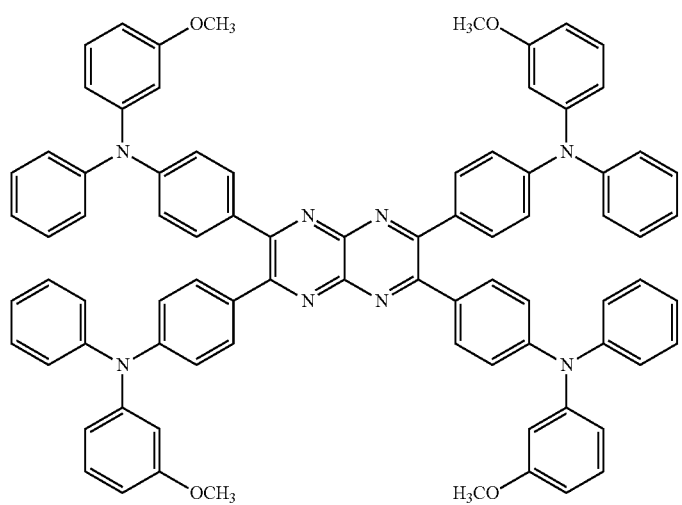

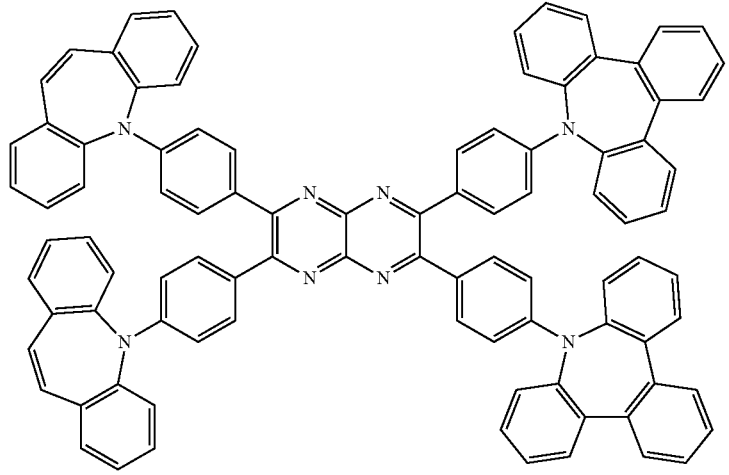
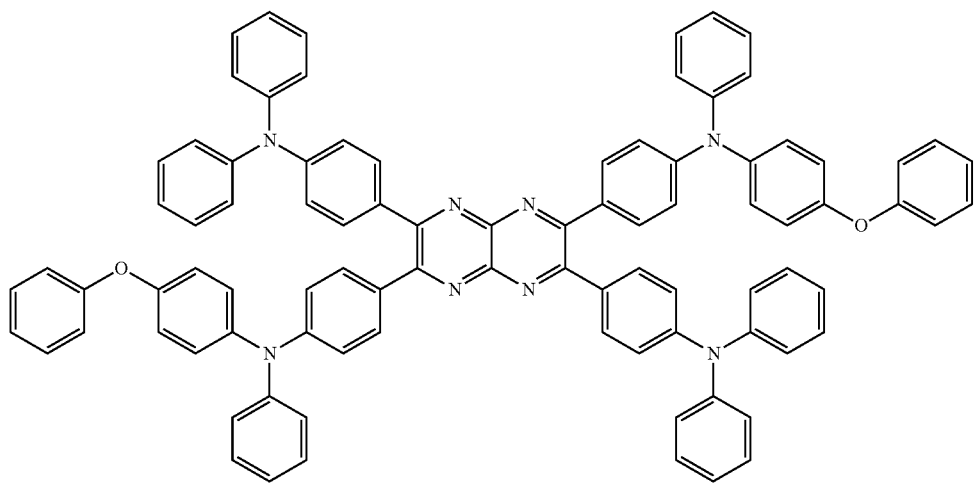
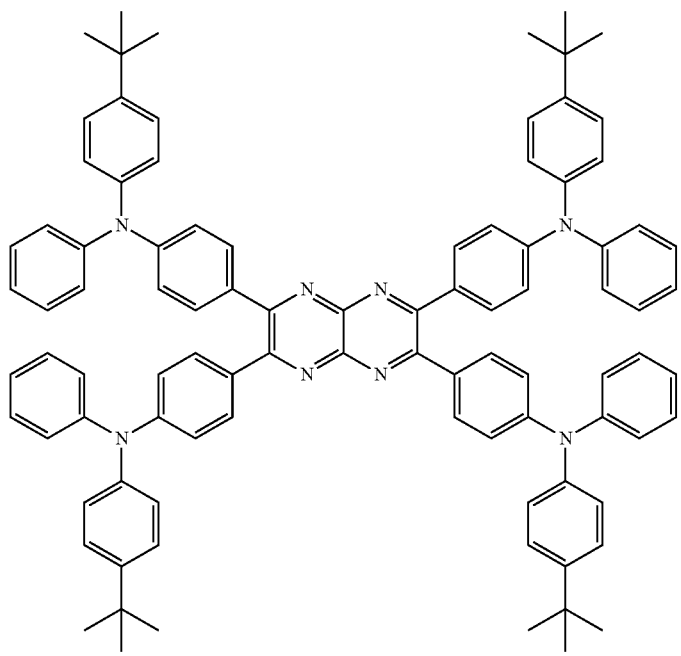

-continued
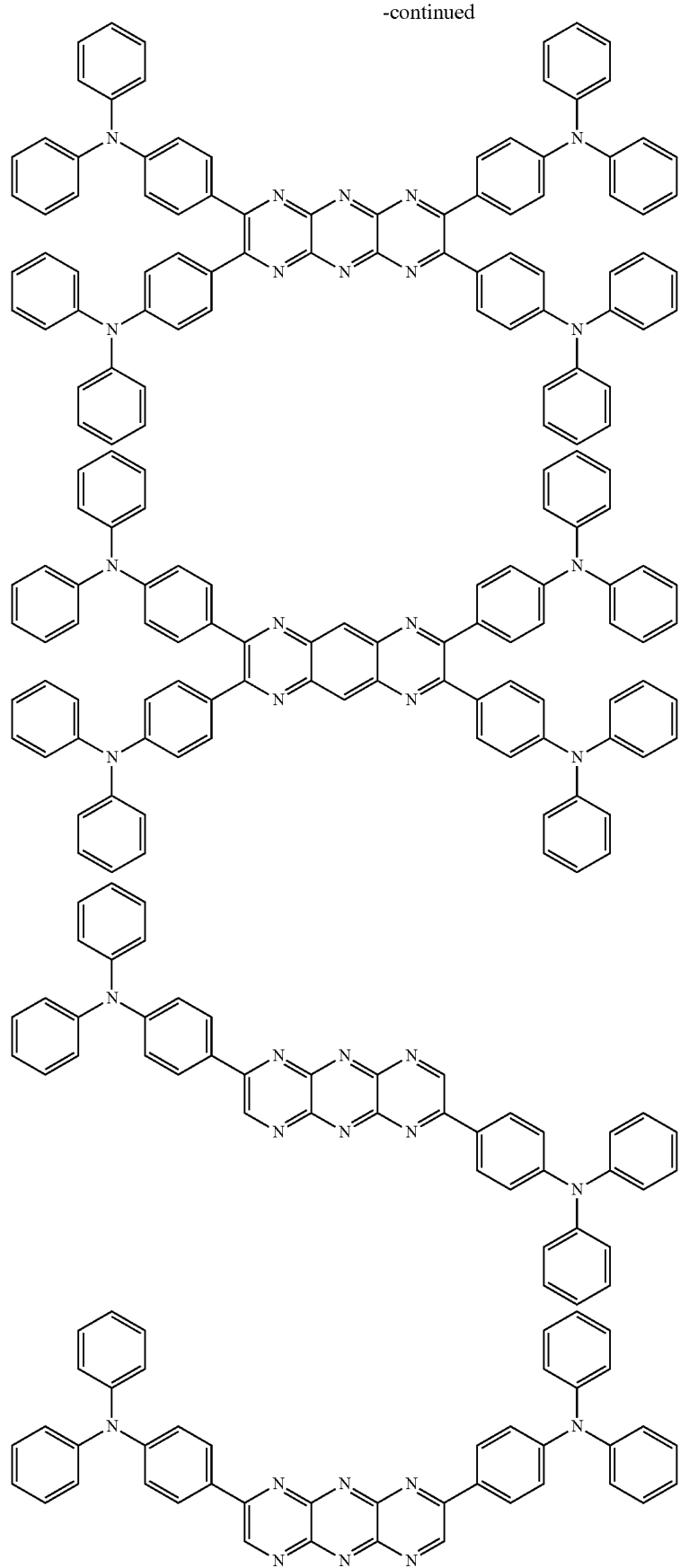

-continued
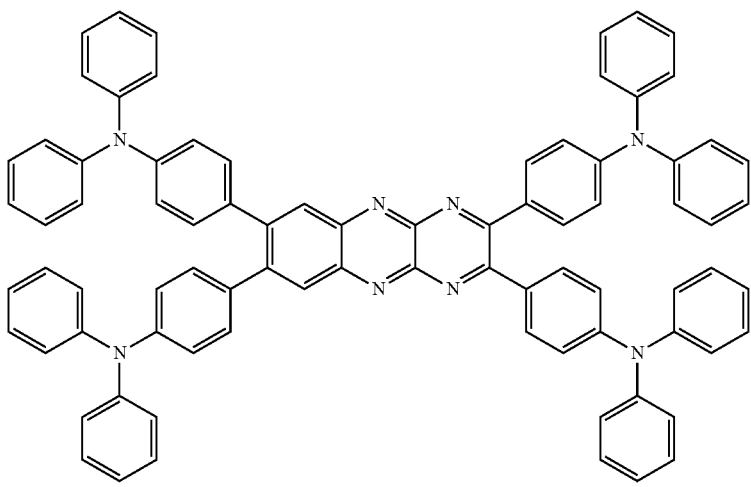
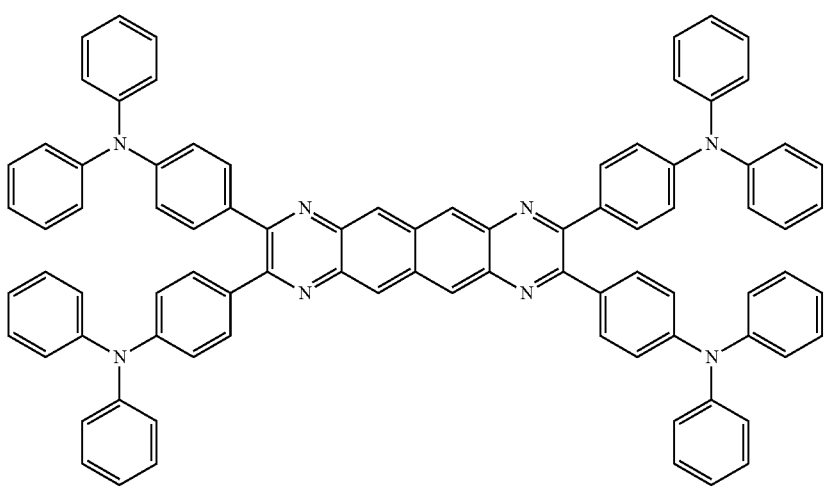
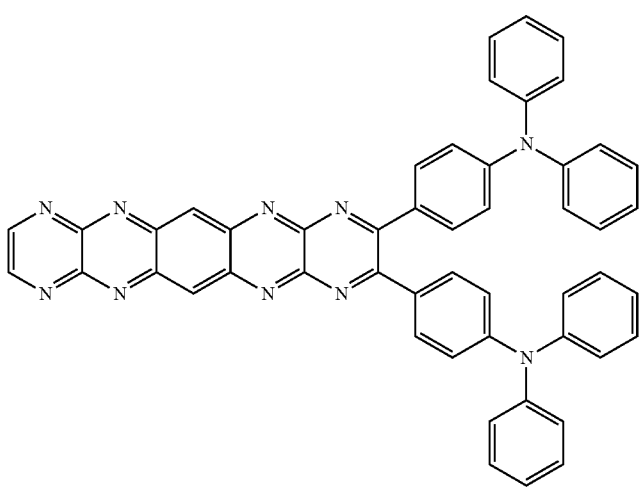

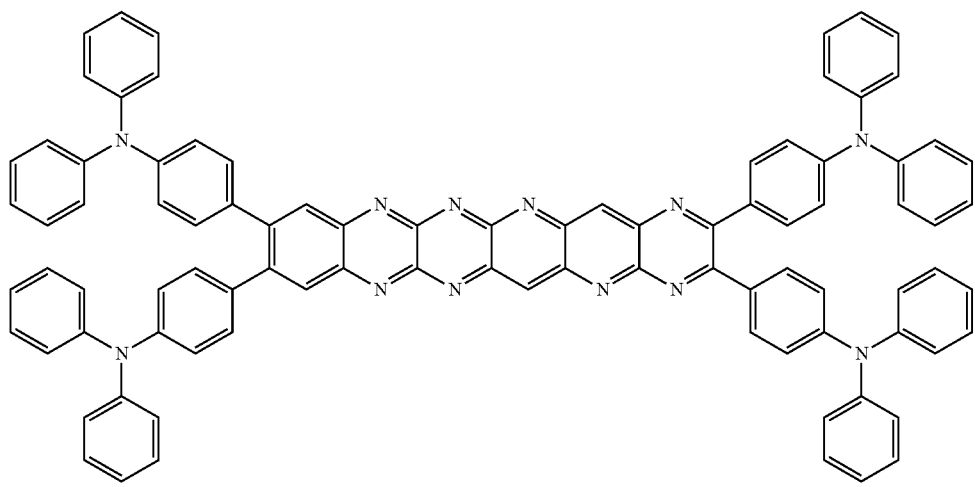
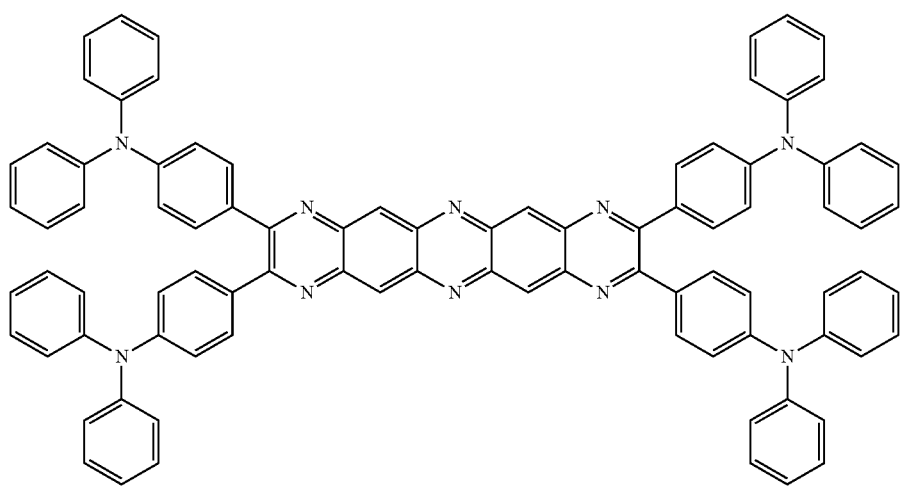
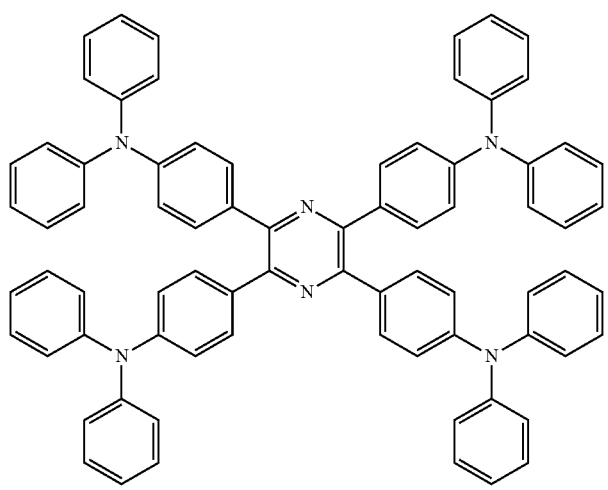

Examples of the preferred light emitting material capable of emitting delayed fluorescent light include compounds represented by the following general formula (241). The entire description of JP-A-2014-9224 including the paragraphs 0008 to 0048 and 0067 to 0076 is incorporated herein by reference.

General Formula (241)

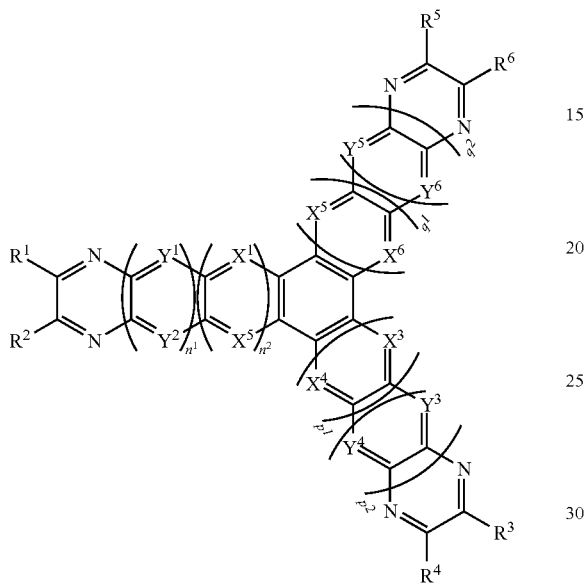

wherein in the general formula (241), $R^1$ to $R^6$ each independently represent a hydrogen atom or a substituent, provided that at least one of $R^1$ to $R^6$ represents a substituted or unsubstituted (N/N-diarylamino)aryl group, and two aryl groups constituting the diarylamino moiety of the (N,N-diarylamino)aryl group may be bonded to each other; $X^1$ to $X^6$ and $Y^1$ to $Y^6$ each independently represent a carbon atom or a nitrogen atom; and $n^1$, $n^2$, $p^1$, $p^2$, $q^1$ and $q^2$ each independently represent 0, 1 or 2.

Specific examples of the compound include the following compounds.

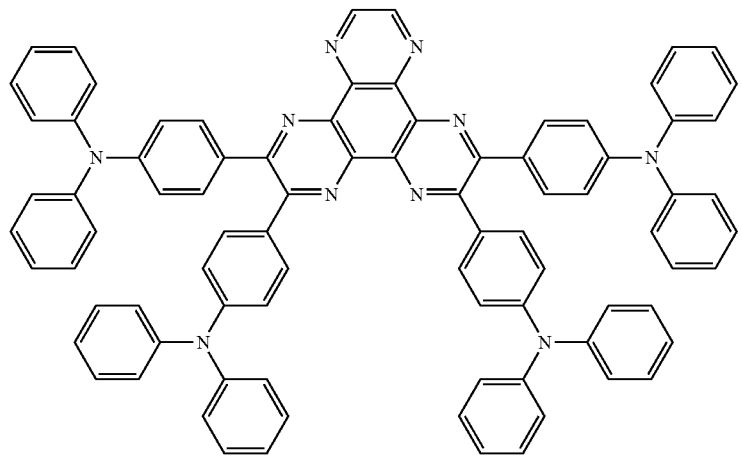

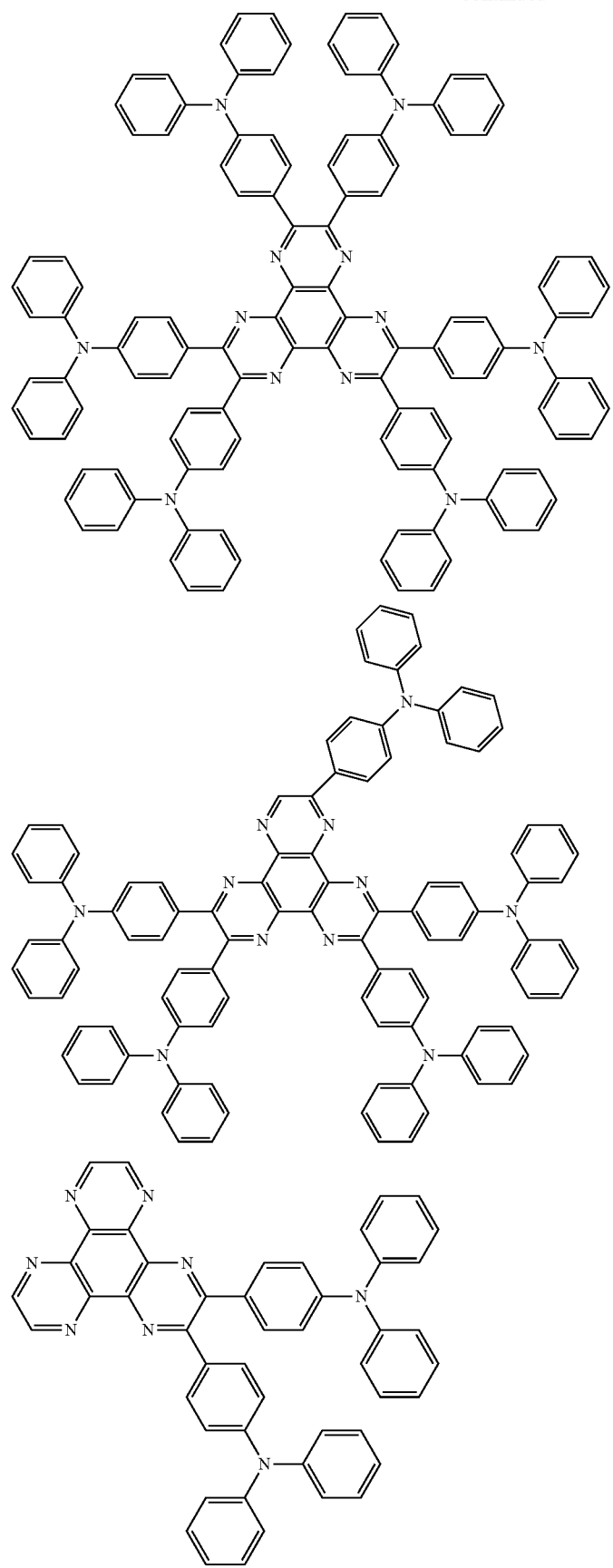

-continued
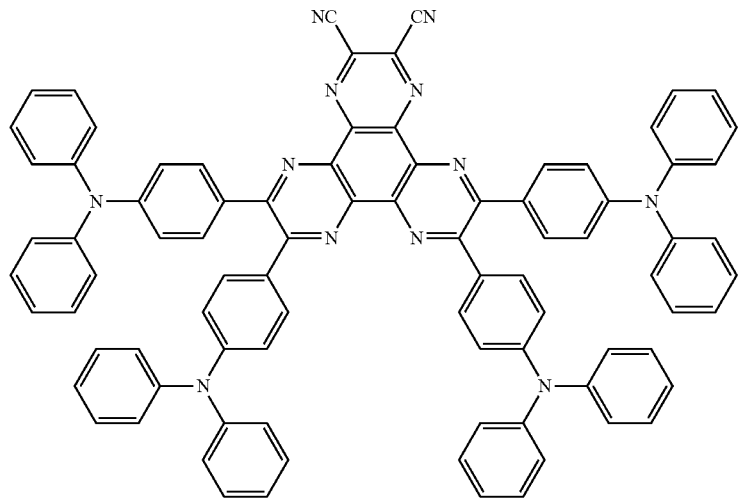
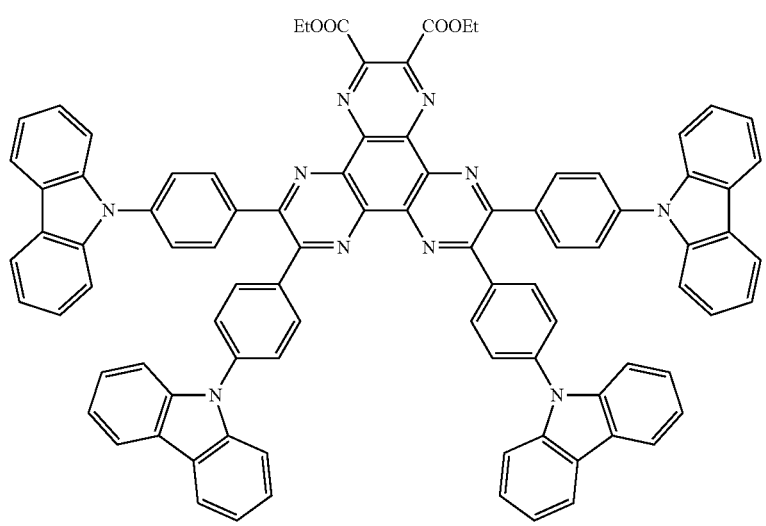
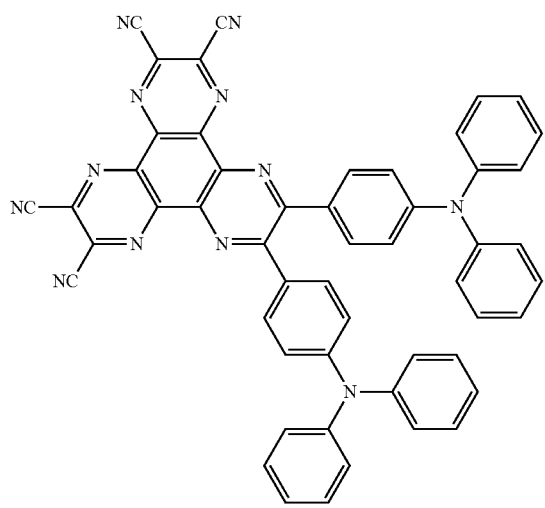

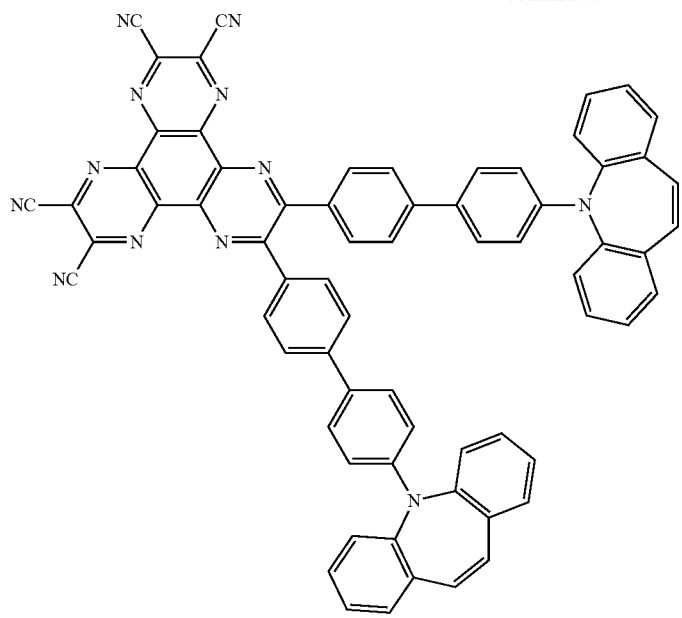
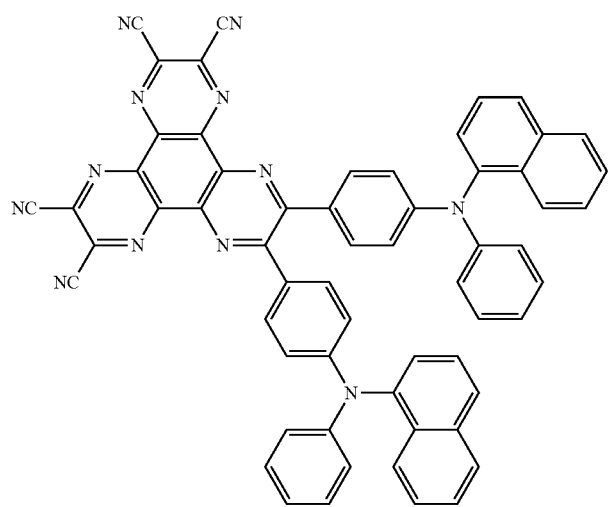
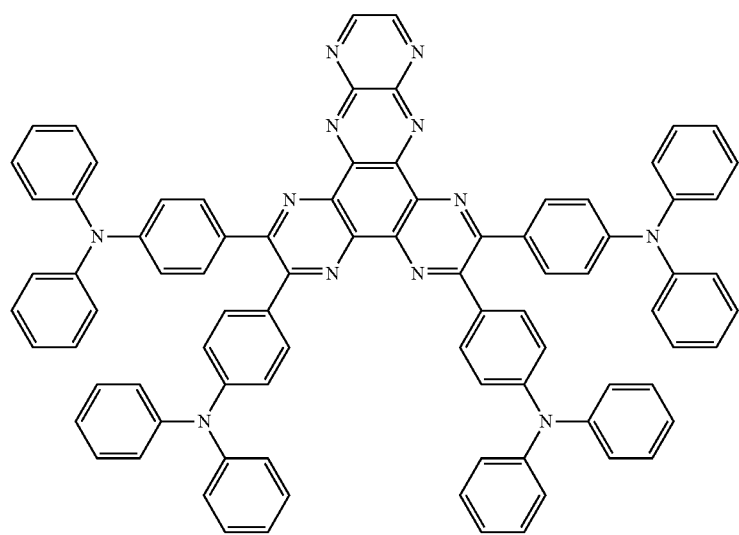

253 254
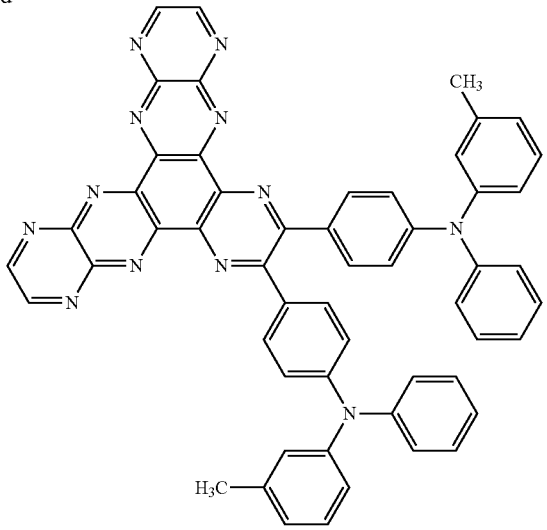
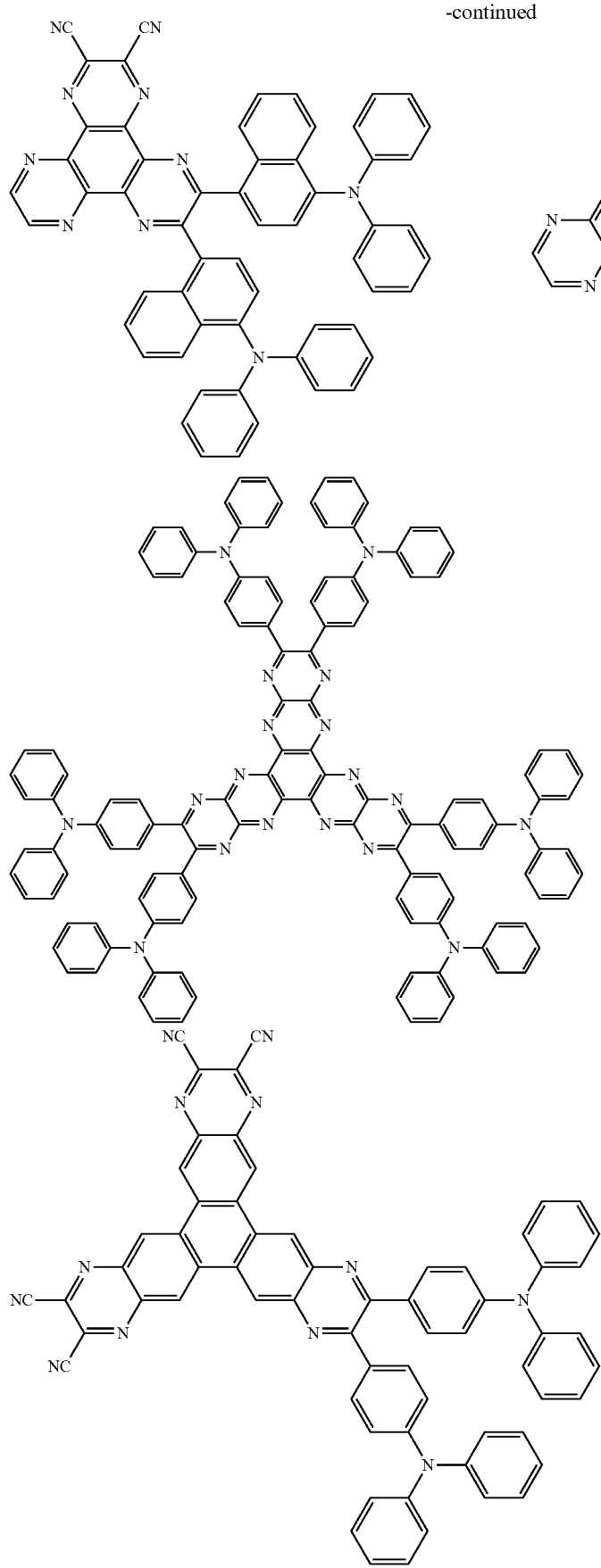

-continued

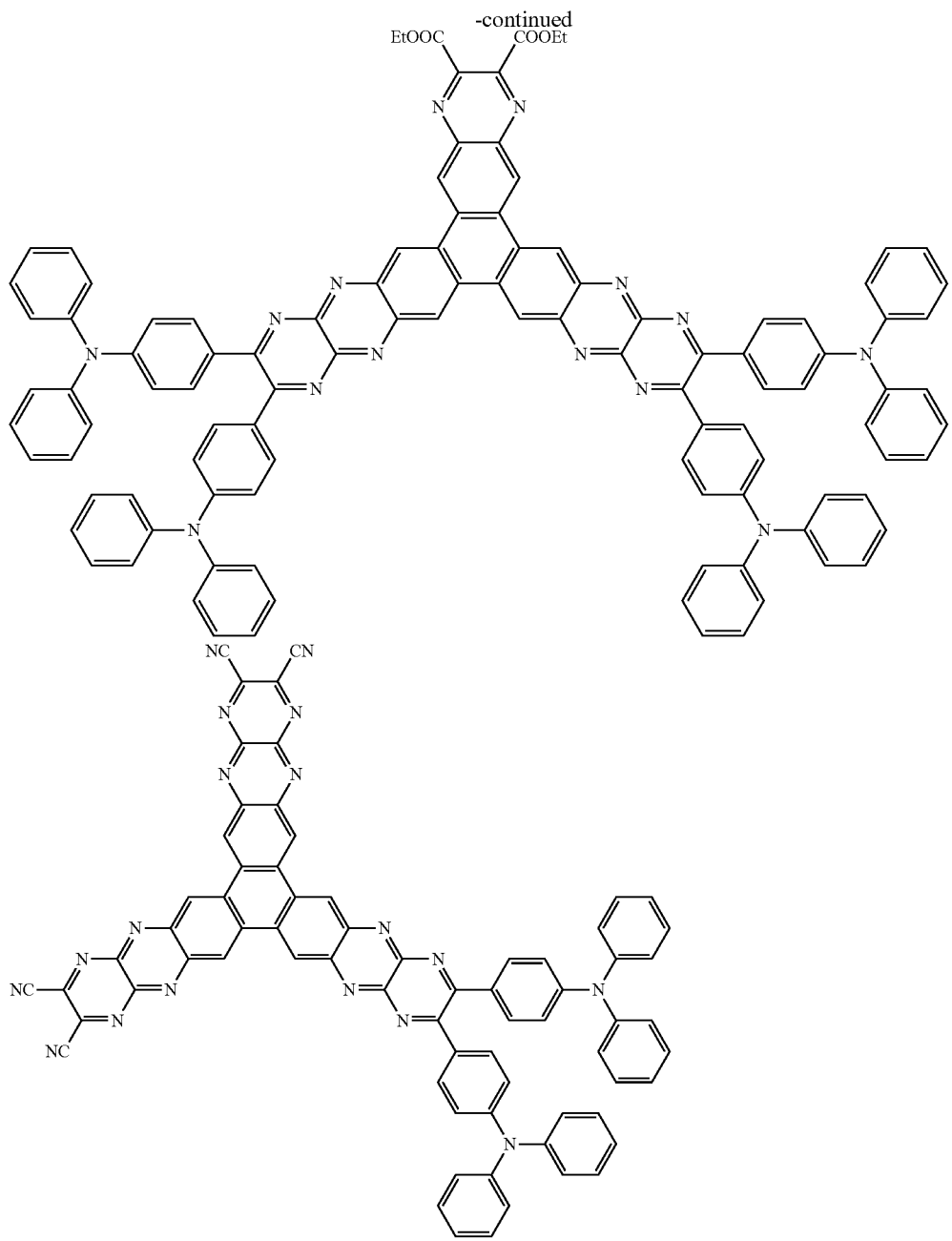

Structure of Light Emitting Layer

The structure of the light emitting layer in the organic electroluminescent device of the invention will be described.

The organic electroluminescent device of the invention uses plural light emitting materials. The light emitting materials may be contained together in one light emitting layer, or may be contained separately in different light emitting layers. The organic electroluminescent device of the invention may contain a light emitting layer that contain two or more light emitting materials and a light emitting layer that contains only one light emitting material.

Figure 2:
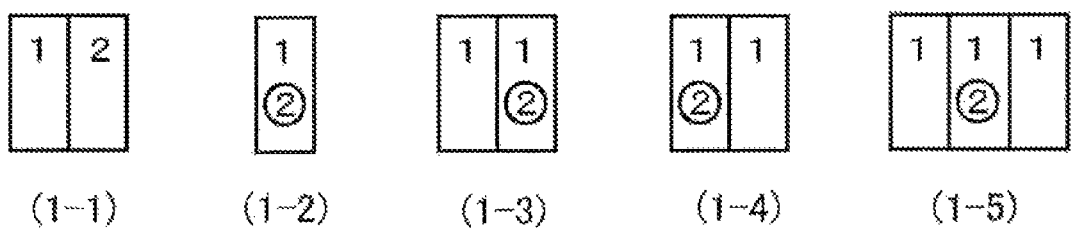
FIG. 2 is a schematic cross sectional illustration showing examples of the structure of the light emitting layer of the organic electroluminescent device of the invention.

For example, examples of the structure of the light emitting layers in the case where two kinds of light emitting materials ere used are shown in FIG. 2. Examples of the two kinds of light emitting materials include a combination of a blue light emitting material and a red light emitting material, and a combination of a blue light emitting material and a green light emitting material, but the light emitting materials are not limited to the combinations. It is necessary herein that at least the blue light emitting material that emits light having a short wavelength is a delayed fluorescent material. In FIG. 2, the numeral 1 denotes a light, emitting material that emits light having the shortest wavelength, and the numeral 2 denotes a light emitting material that emits light having a longer wavelength. In FIG. 2, the encircled numeral means that the light emitting material corresponding to the numeral that is not encircled is doped with the light emitting material corresponding to the encircled numeral. In FIG. 2, the anode is on the left side, and the cathode is on the right side.

For example, in the case where a blue light emitting material is selected as the light emitting material 1, and a red light emitting material is selected as the light emitting material 2, the type (1-1) in FIG. 2 means that a light emitting layer formed solely of the blue light emitting material and a light emitting layer formed solely of the red light emitting material are formed in this order from the anode side. The type (1-2) shows an embodiment, in which the blue light emitting material is doped with the red light emitting material in one light emitting layer. Herein, the blue light emitting material functions as a light emitting material that emits fluorescent light containing delayed fluorescent light, and also functions as a host material of the red light emitting material. The types (1-3) and (1-4) each show an embodiment, in which a light emitting layer formed solely of the blue light emitting material and a light emitting layer containing the blue light emitting material doped with the red light emitting material are laminated. The type (1-5) shows an embodiment, in which a light emitting layer containing the blue light emitting material doped with the red light emitting material is laminated between two layers each formed solely of the blue light emitting material. The invention may use the patterns of all the embodiments, and preferably uses the types (1-2) to (1-4), and more preferably the type (1-2), from the standpoint of the achievement of a high efficiency with a simple structure.

Figure 3:
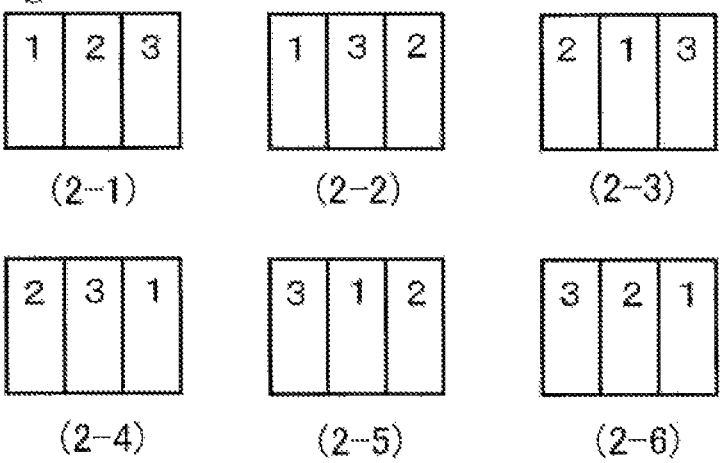
FIG. 3 is a schematic cross sectional illustration showing examples of the structure of the light emitting layer of the organic electroluminescent device of the invention.
Figure 4:
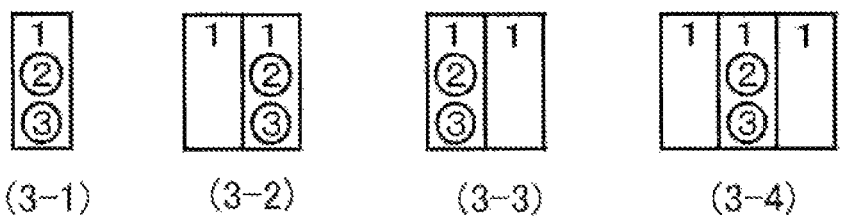
FIG. 4 is a schematic cross sectional illustration showing examples of the structure of the light emitting layer of the organic electroluminescent device of the invention.

Examples of the structure of the light emitting layer in the case where three kinds of light emitting materials are used are shown in FIGS. 3 to 6. Examples of the three kinds of light emitting materials include a combination of a blue light emitting material, a green light emitting material and a red light emitting material, but the light emitting materials are not limited to the combination. It is necessary herein that at least the blue light emitting material that emits light having a shortest wavelength is a delayed fluorescent material. In FIG. 3, the numeral 1 denotes a light emitting material that emits light having the shortest wavelength, the numeral 2 denotes a light emitting material that emits light having the next shortest wavelength, and the numeral 3 denotes a light emitting material that emits light having the longest wavelength. In FIGS. 3 to 6, the encircled numeral means that the light emitting material corresponding to the numeral that is not encircled is doped with the light emitting material corresponding to the encircled numeral. In FIGS. 3 to 6, the anode is on the left side, and the cathode is on the right side.

The types (2-1) to (2-6) each show an embodiment, in which the three light emitting materials are solely contained in separate light emitting layers respectively. Types (3-1) to (3-4) each show an embodiment having a light emitting layer that contains all the three light emitting materials. In the type (3-1) for example, the blue light emitting material functions as a light emitting that emits fluorescent light containing delayed fluorescent light, and also functions as a host material of the green light emitting material and the red light emitting material. The types (4-1) to (4-14) each show an embodiment having a light emitting layer containing the light emitting material 1 doped with the light emitting material 2, and a light emitting layer containing the light emitting material 1 doped with the light emitting material 3. The types (5-1) to (5-9) each show an embodiment having a light emitting layer containing the light emitting material 2 doped with the light emitting material 3, and a light emitting layer formed solely of the light emitting material 1.

In the invention, as represented by the types (3-4) and (4-5) both the light emitting layer that is the closest to the cathode and the light emitting layer that is the closest to the anode may be layers that, are formed of the light emitting material that emits light having the shortest wavelength. The light emitting layer containing the light emitting material that emits light having the shortest wavelength as a host material may be disposed between the light emitting layer that is the closest to the cathode and the light emitting layer that the closest to the anode. The structure may provide such an advantage that the light emission efficiency may be further enhanced.

The types (3-1) to (3-3) are preferably used, and the type (3-1) is more preferably used, from the standpoint of the achievement of a high efficiency with a simple structure.

The concentration of the light emitting material, with which the light emitting layer is doped, is preferably 0.01% by weight or more, and more preferably 0.1% by weight or more, is preferably 50% by weight or less, more preferably 20% by weight or less, and further preferably 10% by weight, or less, and may be, for example 1% by weight or less.

In the case where the light emitting layer is doped with the light emitting material, the host material may not be the aforementioned light emitting material. A host material that has been used for an ordinary light emitting material may be appropriately selected and used. In order that the organic electroluminescent device of the invention exhibits a high light emission efficiency, it is important that the singlet excitons and the triplet excitons formed in the light emitting material are confined in the light emitting material. The host material used may be an organic compound having excited singlet energy and excited triplet energy, at least one of which is higher than the light emitting material to be doped. As a result, the singlet excitons and the triplet excitons formed in the light emitting material can be confined in the molecule of the light emitting material, and thereby the light emission efficiency thereof may be sufficiently exploited. However, even though the singlet excitons and the triplet excitons cannot be sufficiently confined, there are cases where a high light emission efficiency is obtained, and therefore a host material that is capable of achieving a high light emission efficiency may be used in the invention without any particular limitation. In general, the host material preferably an organic compound that has a hole transporting function or an electron transporting function, prevents the light emission wavelength from being prolonged, and has a high glass transition temperature.

In the organic electroluminescent device of the invention, the light emission intensity of the light emitting material that emits light having the shortest wavelength is preferably 20% or more, more preferably 25% or more, and further preferably 30% or more, based on the total light emission. In particular, the blue light emission intensity is preferably 20% or more, more preferably 25% or more, and further preferably 30% or more, based on the total light emission.

Structure of Organic Electroluminescent Device

Figure 7:
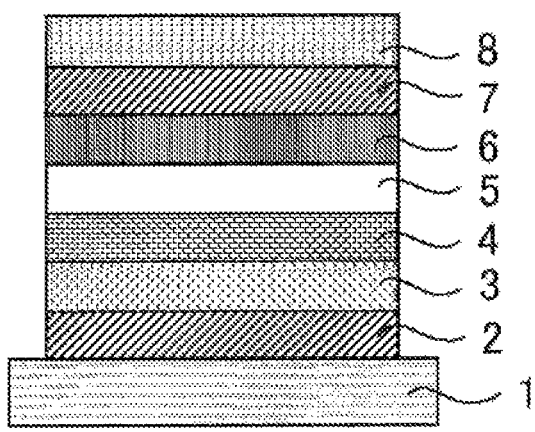
FIG. 7 is a schematic cross sectional illustration showing an example of the layer structure of the organic electroluminescent device.

The organic electroluminescent, device of the invention has a structure containing at least an anode, a cathode, and one or more organic layers formed between the anode and the cathode. The one or more organic layers contain a light emitting layer, and may be formed only of a light emitting layer, or may have one or more organic layers in addition to the light emitting layer. Examples of the one or more organic layers include a hole transporting layer, a hole injection layer, an electron barrier layer, a hole barrier layer, an electron injection layer, an electron transporting layer and an exciton barrier layer. The hole transporting layer may be a hole injection and transporting layer having a hole injection function, and the electron transporting layer may be an electron injection and transporting layer having an electron injection function. A specific structural example of an organic electroluminescent device is shown in FIG. 7. In FIG. 7, the numeral 1 denotes a substrate, 2 denotes an anode, 3 denotes a hole injection layer, 4 denotes a hole transporting layer, 5 denotes a light, emitting layer, 6 denotes an electron transporting layer, 7 denotes an electron injection layer, and 8 denotes a cathode.

The members and the layers of the organic electroluminescent device will be described below. For the light emitting layer, reference may be made to the aforementioned description relating to the light emitting layer.

Substrate

The organic electroluminescent device of the invention is preferably supported by a substrate. The substrate is not particularly limited and may be those that have been commonly used in an organic electroluminescent device, and examples thereof used include those formed of glass, transparent plastics, quartz and silicon.

Anode

The anode of the organic electroluminescent device used is preferably formed of as an electrode material a metal, an alloy or an electroconductive compound each having a large work function (4 eV or more), or a mixture thereof. Specific examples of the electrode material include a metal, such as Au, and an electroconductive transparent material, such as CuI, indium tin oxide (ITO), $SnO_2$ and ZnO. A material that is amorphous and is capable of forming a transparent electroconductive film, such as IDIXO ($In_2O_3$—ZnO), may also be used. The anode may be formed in such a manner that the electrode material is formed into a thin film by such a method as vapor deposition or sputtering, and the film is patterned into a desired pattern by a photolithography method, or in the case where the pattern may not require high accuracy (for example, approximately 100 μm or more), the pattern may be formed with a mask having a desired shape on vapor deposition or sputtering of the electrode material. In alternative, in the case where a material capable of being applied as a coating, such as an organic electroconductive compound, is used, a wet film forming method, such as a printing method and a coating method, may be used. In the case where emitted light is to be taken out through the anode, the anode preferably has a transmittance of more than 10%, and the anode preferably has a sheet resistance of several hundred ohm per square or less. The thickness thereof may be generally selected from a range of from 10 to 1,000 nm, and preferably from 10 to 200 nm, while depending on the material used.

Cathode

The cathode is preferably formed of as an electrode material a metal having a small work function (4 eV or less) (referred to as an electron injection metal), an alloy or an electroconductive compound each having a small work function (4 eV or less), or a mixture thereof. Specific examples of the electrode material include sodium, a sodium-potassium alloy, magnesium, lithium, a magnesium-cupper mixture, a magnesium-silver mixture, a magnesium-aluminum mixture, a magnesium-indium mixture, an aluminum-aluminum oxide ($Al_2O_3$) mixture, indium, a lithium-aluminum mixture, and a rare earth metal. Among these, a mixture of an electron injection metal and a second metal that is a stable metal having a larger work function than the electron injection metal, for example, a magnesium-silver mixture, a magnesium-aluminum mixture, a magnesium-indium mixture, an aluminum-aluminum oxide ($Al_2O_3$) mixture, a lithium-aluminum mixture, and aluminum, are preferred from the standpoint of the electron injection property and the durability against oxidation and the like. The cathode may be produced by forming the electrode material into a thin film by such a method as vapor deposition or sputtering. The cathode preferably has a sheet resistance of several hundred ohm per square or less, and the thickness thereof may be generally selected from a range of from 10 nm to 5 μm, and preferably from 50 to 200 nm. For transmitting the emitted light, any one of the anode and the cathode of the organic electroluminescent device is preferably transparent or translucent, thereby enhancing the light emission luminance.

The cathode may be formed with the electroconductive transparent materials described for the anode, thereby forming a transparent or translucent cathode, and by applying the cathode, a device having an anode and a cathode, both of which have transmittance, may be produced.

Injection Layer

The injection layer is a layer that is provided between the electrode and the organic layer, for decreasing the driving voltage and enhancing the light emission luminance, and includes a hole injection layer and an electron injection layer, which may be provided between the anode and the light emitting layer or the hole transporting layer and between the cathode and the light emitting layer or the electron transporting layer. The injection layer may be provided depending on necessity.

Barrier Layer

The barrier layer is a layer that is capable of inhibiting charges (electrons or holes) and/or excitons present in the light emitting layer from being diffused outside the light emitting layer. The electron barrier layer may be disposed between the light emitting layer and the hole transporting layer, and inhibits electrons from passing through the light emitting layer toward the hole transporting layer. Similarly, the hole barrier layer may be disposed between the light emitting layer and the electron transporting layer, and inhibits holes from passing through the light emitting layer toward the electron transporting layer. The barrier layer may also be used for inhibiting excitons from being diffused outside the light emitting layer. Thus, the electron barrier layer and the hole barrier layer each may also have a function as an exciton barrier layer. The term "the electron barrier layer" or "the exciton barrier layer" referred herein is intended to include a layer that has both the functions of an electron barrier layer and an exciton barrier layer by one layer.

Hole Barrier Layer

The hole barrier layer has the function of an electron transporting layer in a broad sense. The hole barrier layer has a function of inhibiting holes from reaching the electron transporting layer while transporting electrons, and thereby enhances the recombination probability of electrons and holes in the light emitting layer. As the material for the hole barrier layer, the materials for the electron transporting layer described later may be used depending on necessity.

Electron Barrier Layer

The electron barrier layer has the function of transporting holes in a broad sense. The electron barrier layer has a function of inhibiting electrons from reaching the hole transporting layer while transporting holes, and thereby enhances the recombination probability of electrons and holes in the light emitting layer.

Exciton Barrier Layer

The exciton barrier layer is a layer for inhibiting excitons generated through recombination of holes and electrons in the light emitting layer from being diffused to the charge transporting layer, and the use of the layer inserted enables effective confinement of excitons in the light emitting layer, and thereby enhances the light emission efficiency of the device. The exciton barrier layer may be inserted adjacent to the light emitting layer on any of the side of the anode and the side of the cathode, and on both the sides. Specifically, in the case where the exciton barrier layer Is present on the side of the anode, the layer may be inserted between the hole transporting layer and the light emitting layer and adjacent to the light emitting layer, and in the case where the layer is inserted on the side of the cathode, the layer may be inserted between the light emitting layer and the cathode and adjacent to the light emitting layer. Between the anode and the exciton barrier layer that is adjacent to the light emitting layer on the side of the anode, a hole injection layer, an electron barrier layer and the like may be provided, and between the cathode and the exciton barrier layer that is adjacent to the light emitting layer on the side of the cathode, an electron injection layer, an electron transporting layer, a hole barrier layer and the like may be provided. In the case where the barrier layer is provided, the material used for the barrier layer preferably has excited singlet energy and excited triplet energy, at least one of which is higher than the excited singlet energy and the excited triplet energy of the light emitting material, respectively.

Hole Transporting Layer

The hole transporting layer is formed of a hole transporting material having a function of transporting holes, and the hole transporting layer may be provided as a single layer or plural layers.

The hole transporting material has one of injection or transporting property of holes and barrier property of electrons, and may be any of an organic material and an inorganic material. Examples of known hole transporting materials that may be used herein include a triazole derivative, an oxadiazole derivative, an imidazole derivative, a carbazole derivative, an indolocarbazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline copolymer and an electroconductive polymer oligomer, particularly a thiophene oligomer. Among these, a porphyrin compound, an aromatic tertiary amine compound and a styrylamine compound are preferably used, and an aromatic tertiary amine compound is more preferably used.

Electron Transporting Layer

The electron transporting layer is formed of a material having a function of transporting electrons, and the electron transporting layer may be provided as a single layer or plural layers.

The electron transporting material (which may also function as a hole barrier material in some cases) needs only to have a function of transporting electrons, which are injected from the cathode, to the light emitting layer. Examples of the electron transporting layer that may be used herein include a nitro-substituted fluorene derivative, a diphenylquinone derivative, a thiopyran dioxide derivative, carbodiimide, a fluorenylidene methane derivative, anthraquinodimethane and anthrone derivatives, and an oxadiazole derivative. The electron transporting material used may be a thiadiazole derivative obtained by replacing the oxygen atom of the oxadiazole ring of the oxadiazole derivative by a sulfur atom, or a quinoxaline derivative having a quinoxaline ring, which is known as an electron attracting group. Furthermore, polymer materials having these materials introduced to the polymer chain or having these materials used as the main chain of the polymer may also be used.

In the production of the organic electroluminescent device, the compound represented by the general formula (1) not only may be used in the light emitting layer, but also may be used in the other layers than the light emitting layer. In this case, the compound represented by the general formula (1) used in the light emitting layer and the compound represented by the general formula (1) used in the other layers than the light emitting layer may be the same as or different from each other. For example, the compound represented by the general formula (1) may be used in the injection layer, the barrier layer, the hole barrier layer, the electron barrier layer, the exciton barrier layer, the hole transporting layer, the electron transporting layer and the like described above. The film forming method of the layers are not particularly limited, and the layers may be produced by any of a dry process and a wet process.

Specific examples of preferred materials that may be used in the organic electroluminescent device are shown below, but the materials that may be used in the invention are not construed as being limited to the example compounds. The compound that is shown as a material having a particular function may also be used as a material having another function. In the structural formulae of the example compounds, R, R' and $R_1$ to $R_{10}$ each independently represent a hydrogen atom or a substituent, X represents a carbon atom or a hetero atom constituting the ring skeleton, n represents an integer of from 3 to 5, Y represents a substituent, and m represents an integer of 0 or more.

Preferred examples of a compound that may be used as the host material of the light emitting layer are shown below.

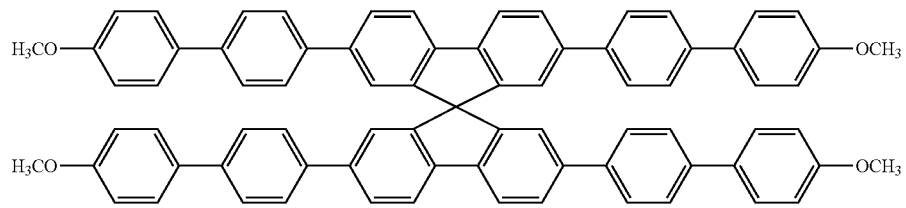

-continued
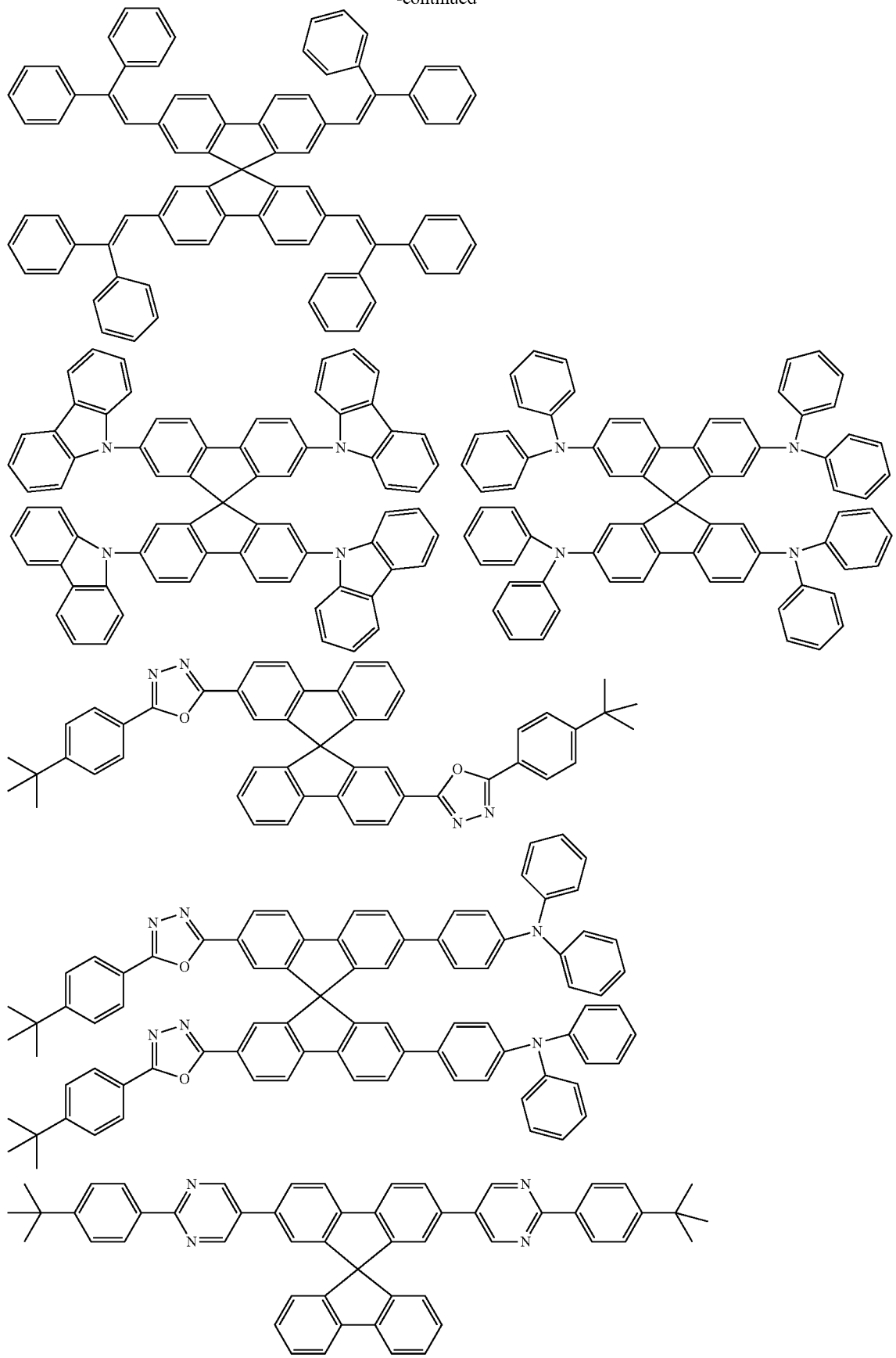

-continued
265
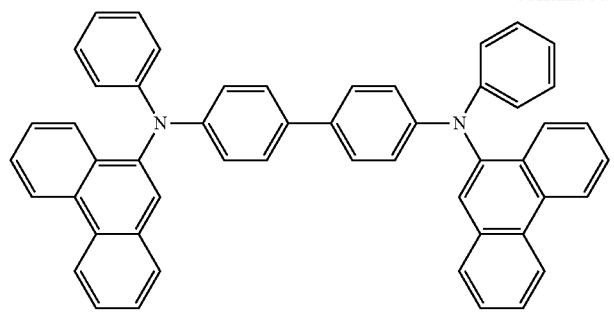
266
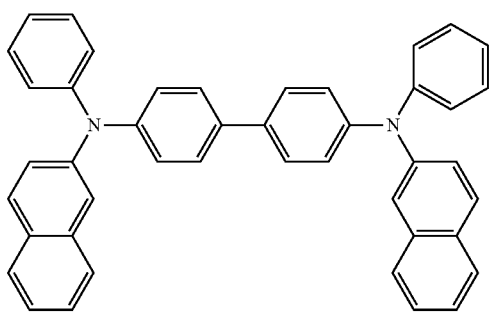
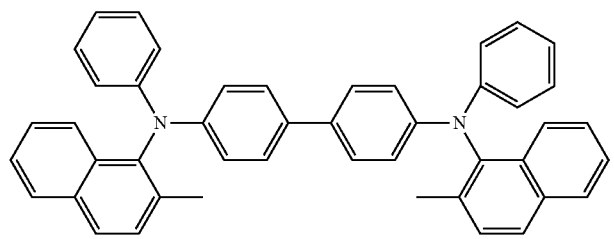
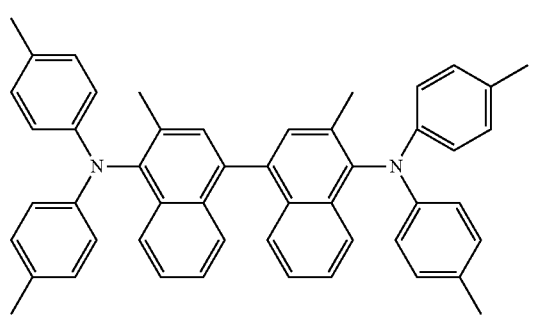
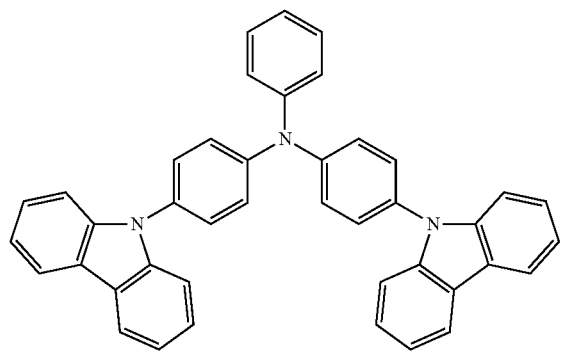
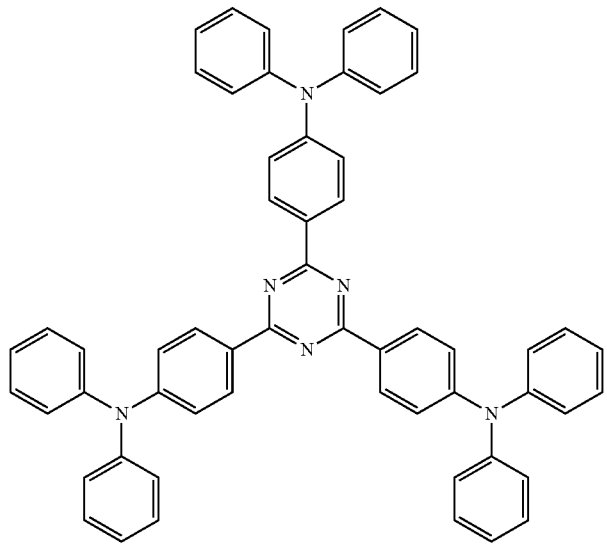
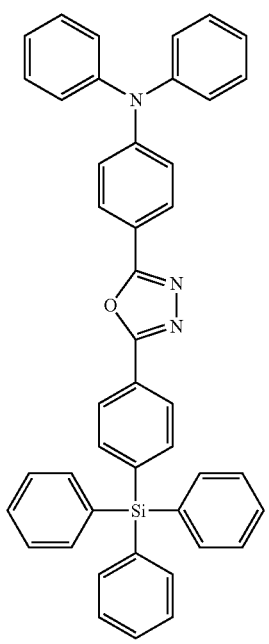

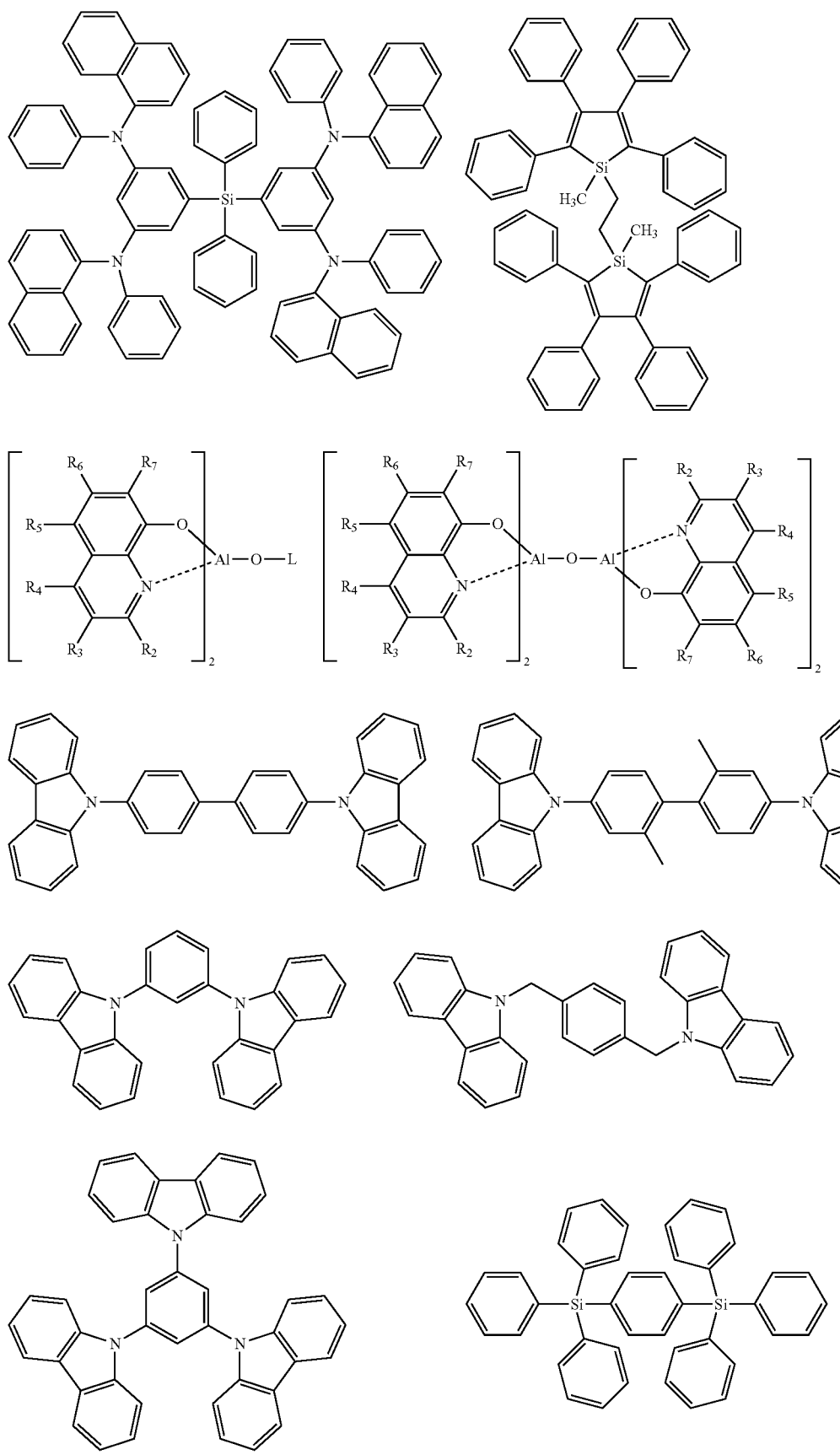

-continued
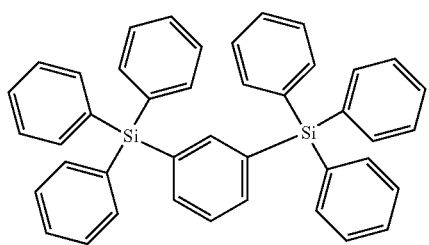
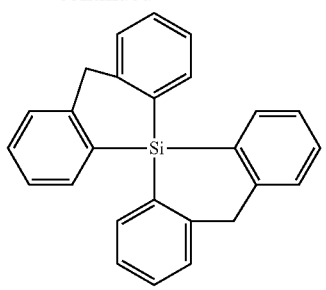
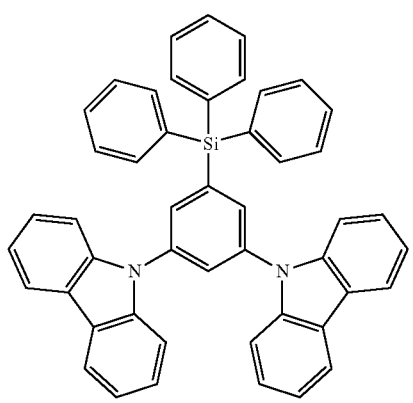
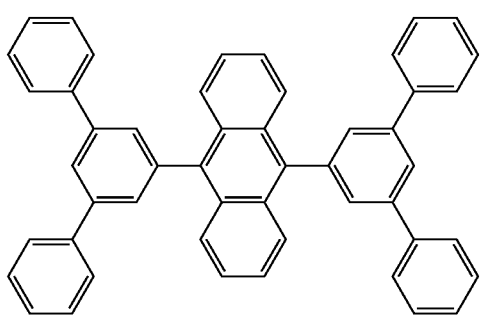
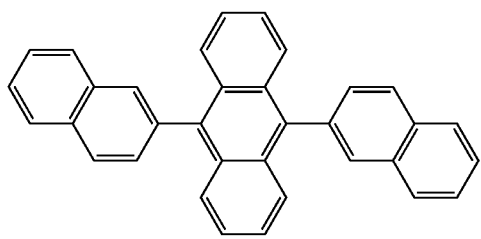
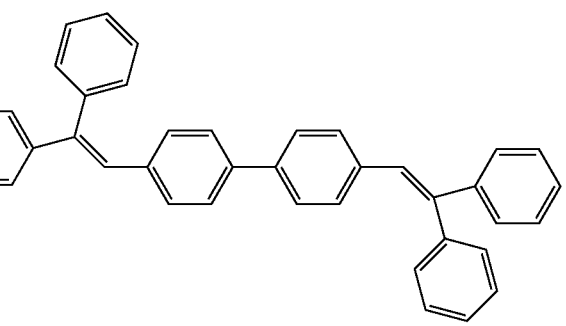
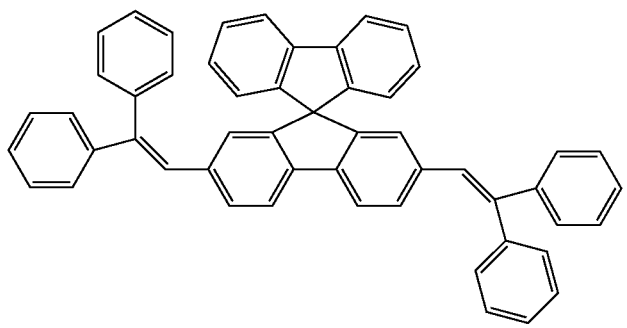
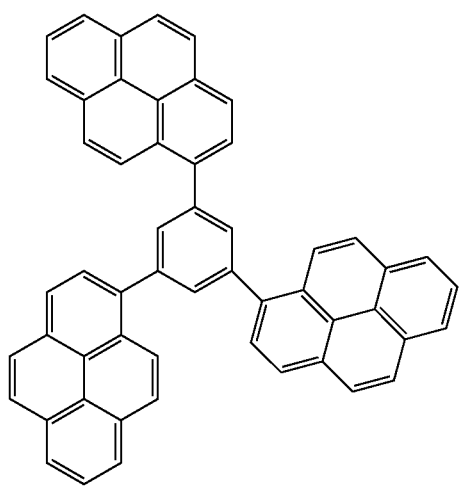

-continued
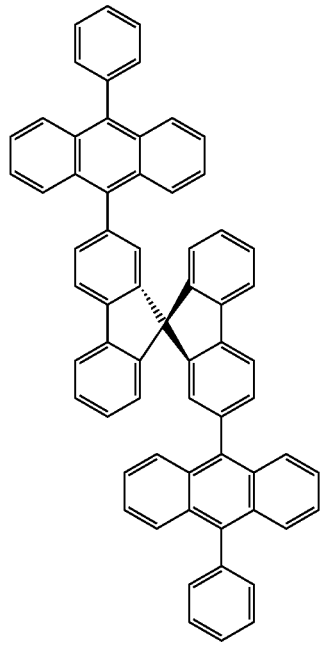
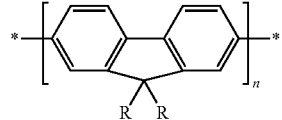
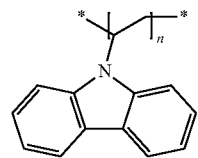
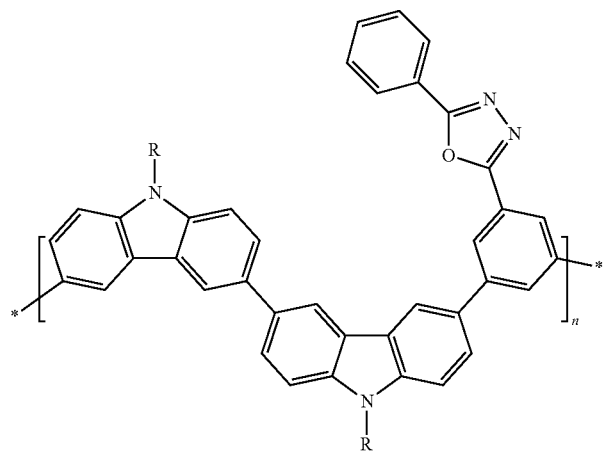
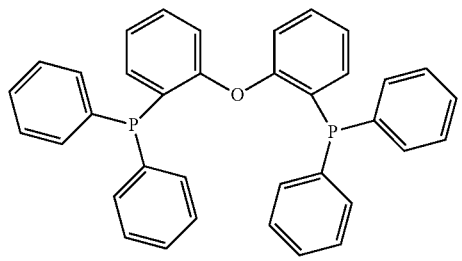
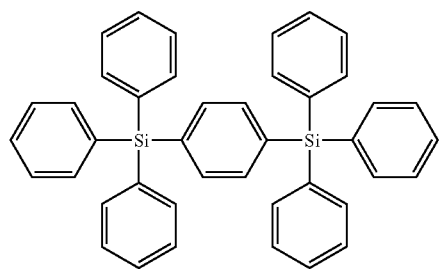
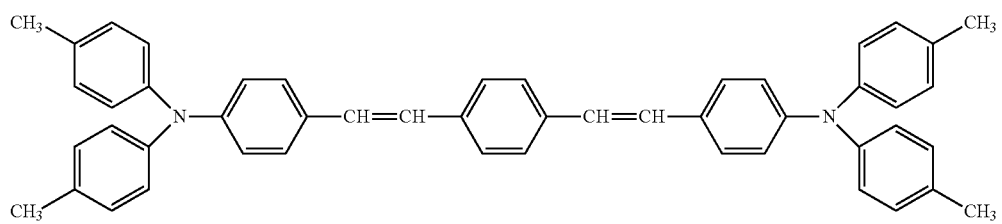

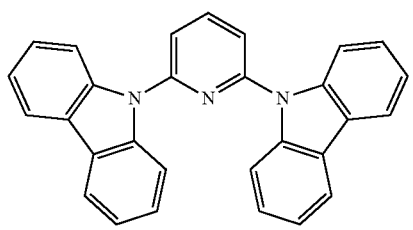
Preferred examples of a compound that may be used as the hole injection material are shown below.
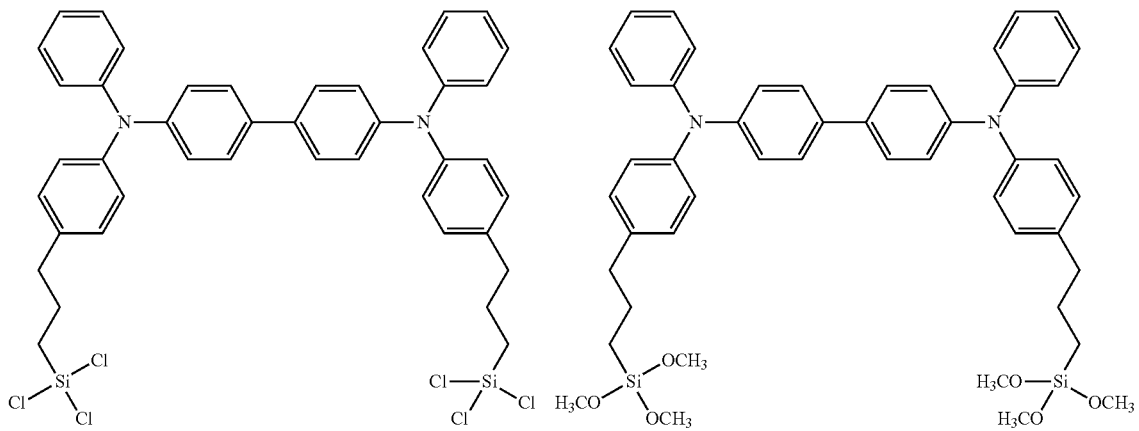
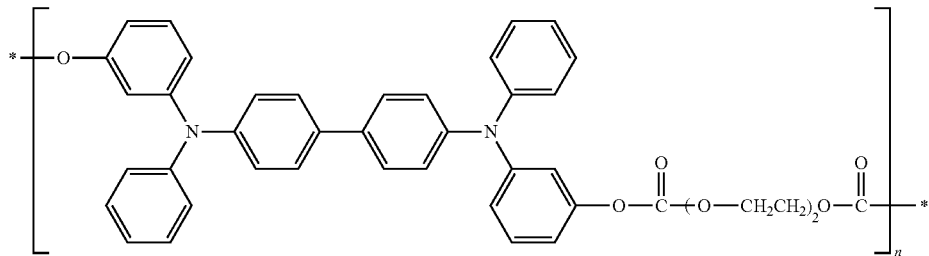
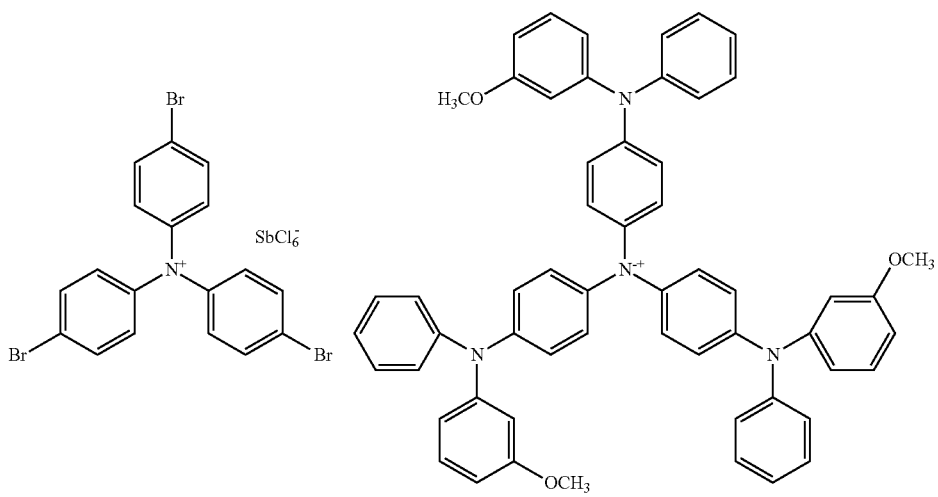

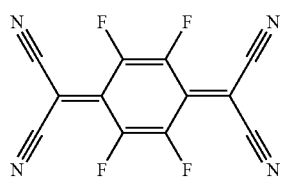
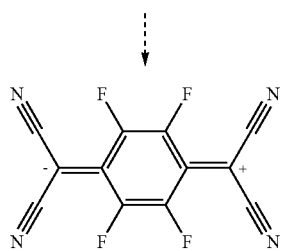
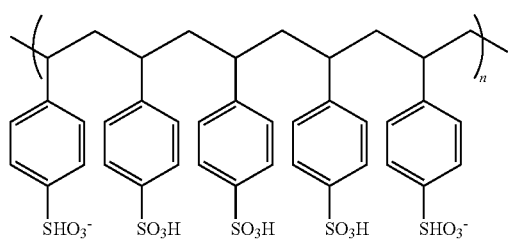
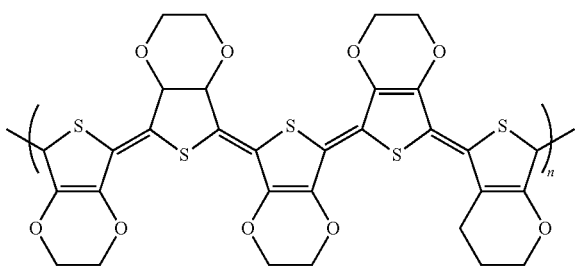
Preferred examples of a compound that may be used as the hole transporting material are shown below.
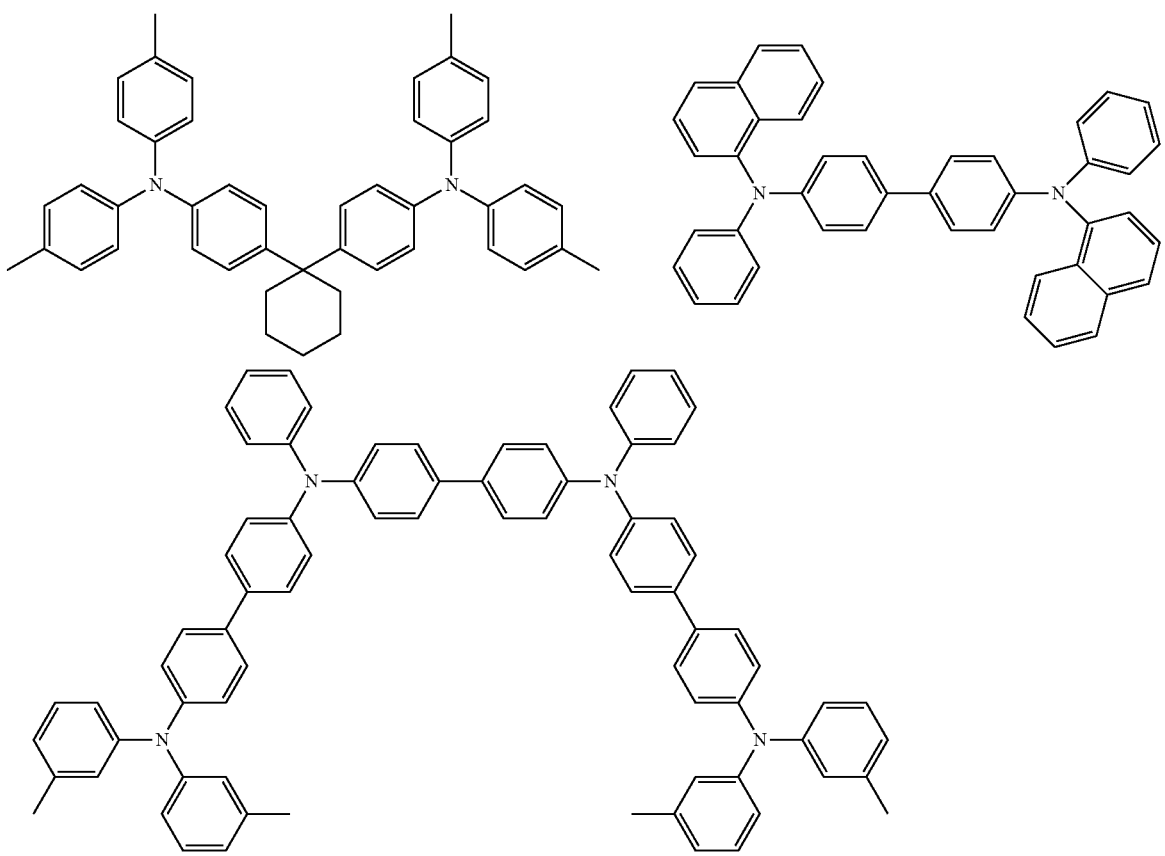

-continued
277 278
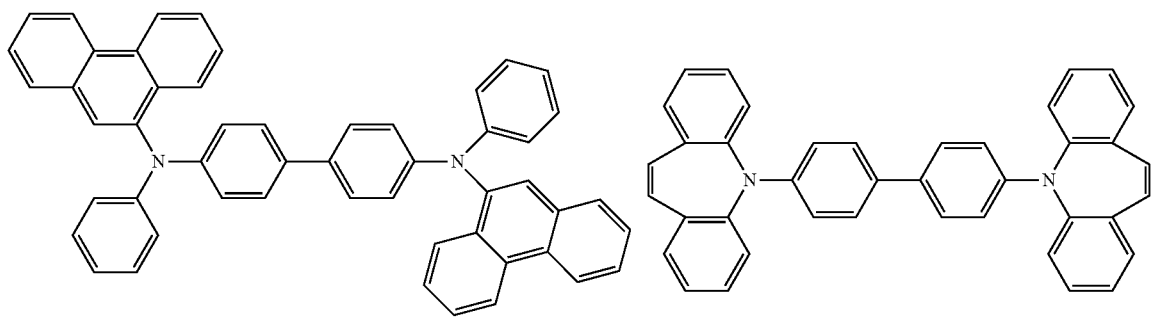
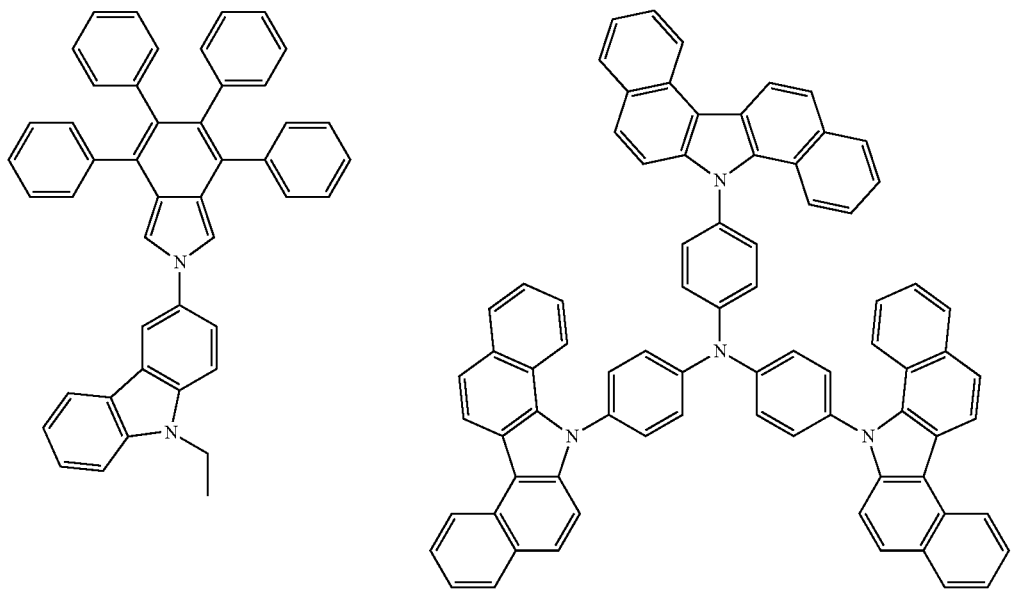
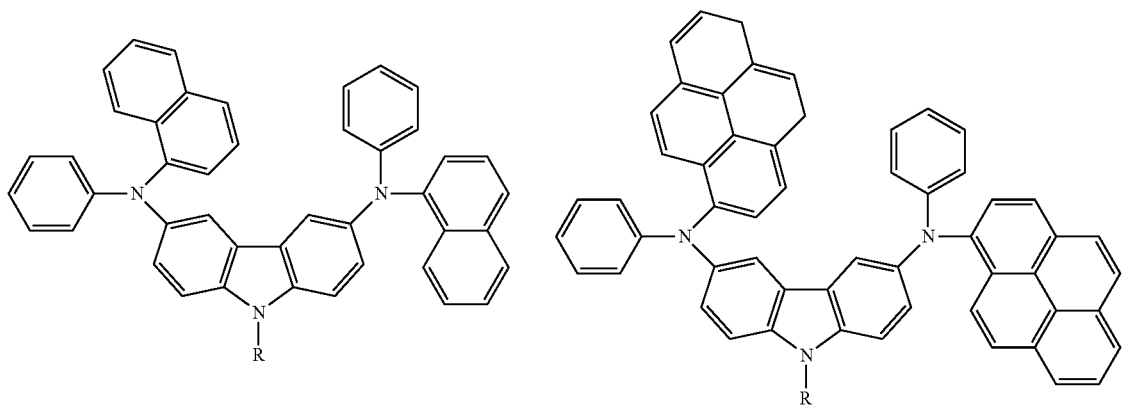

-continued
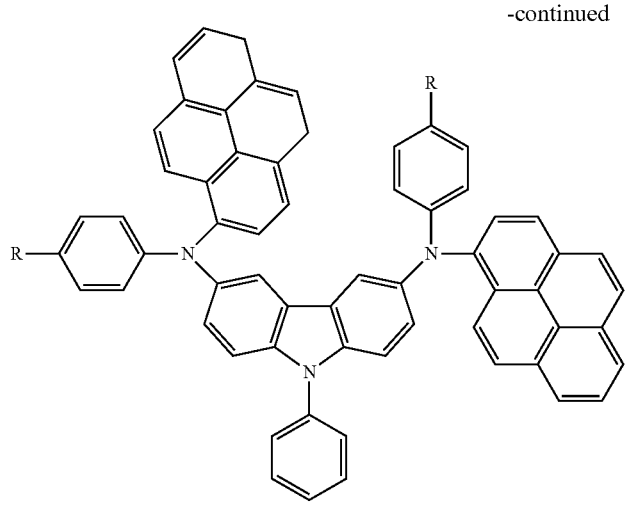
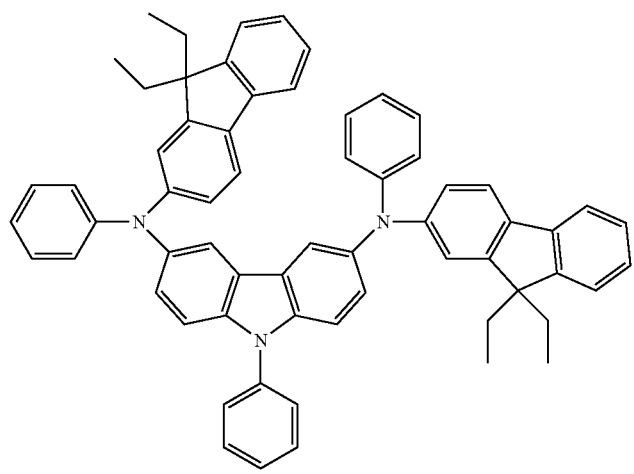
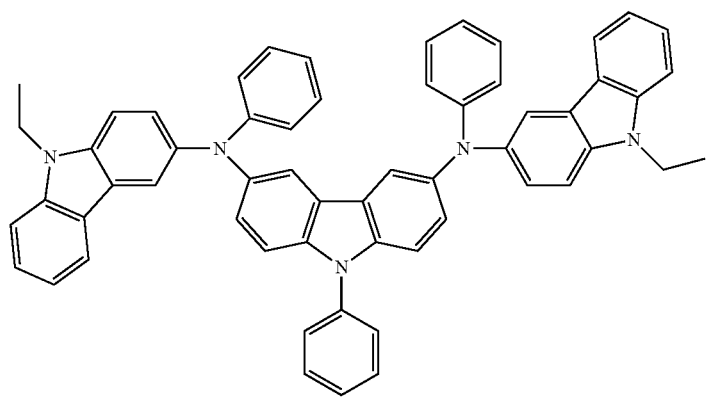

-continued
| 281 | 282 |
|---|---|
| 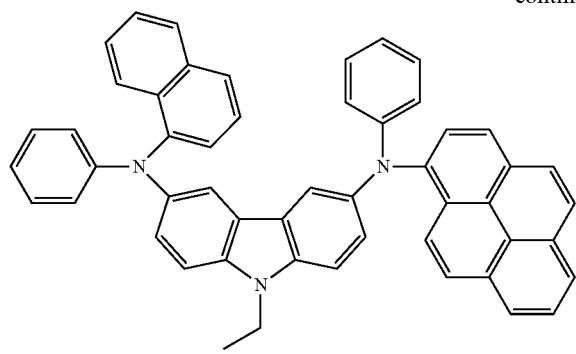 | 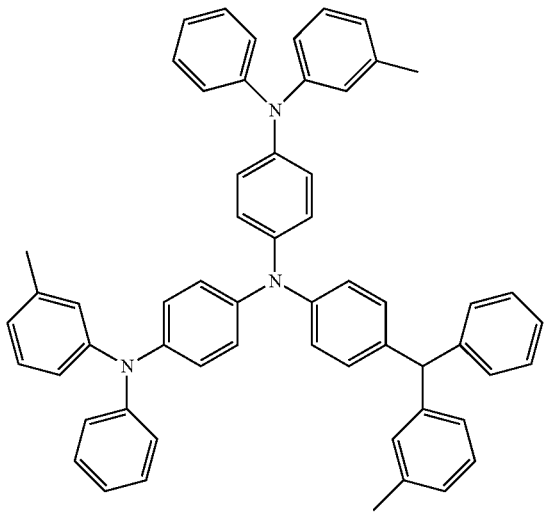 |
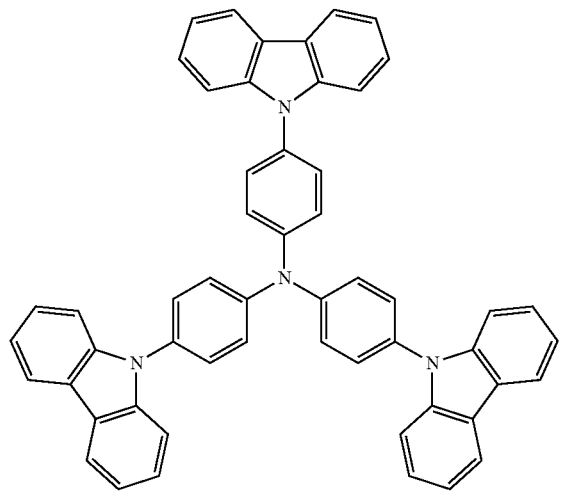
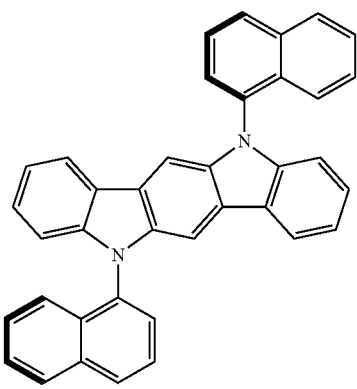
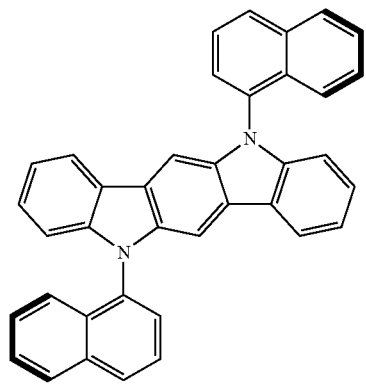
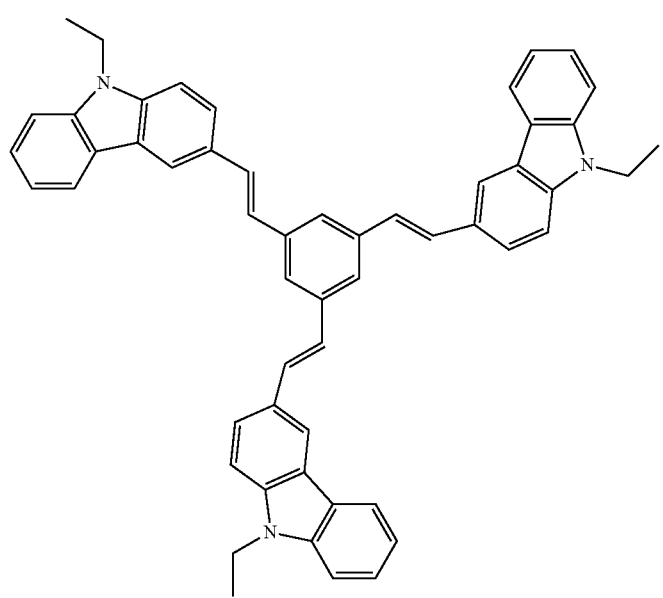

-continued
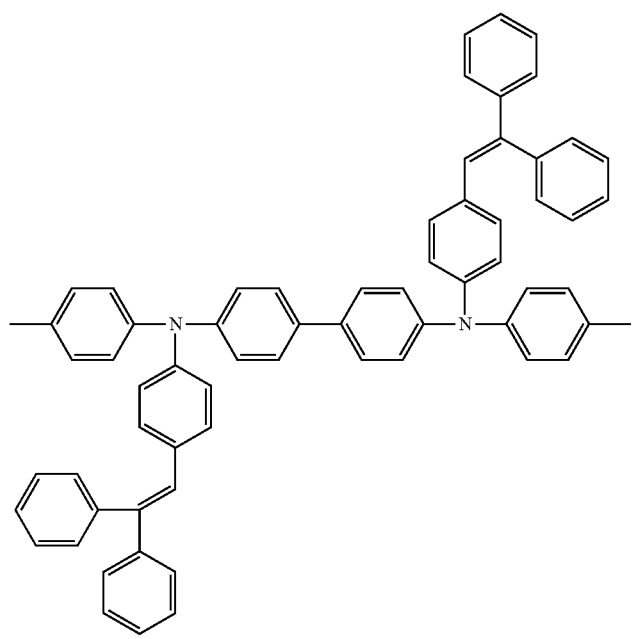
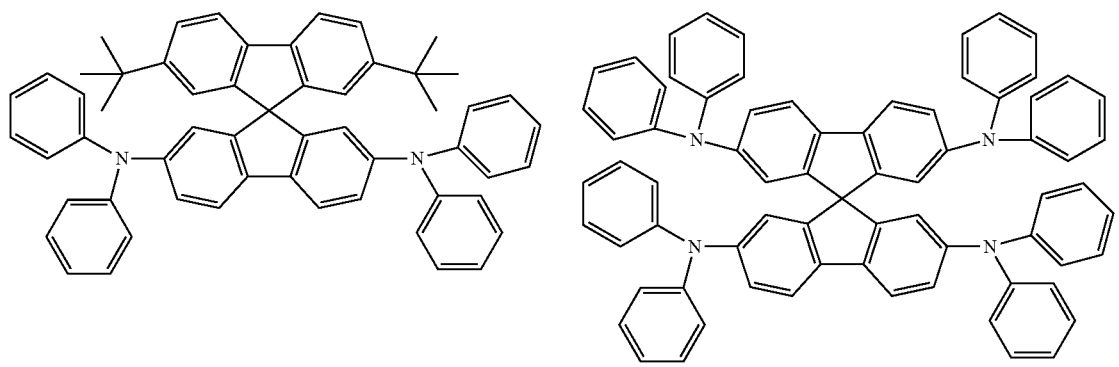
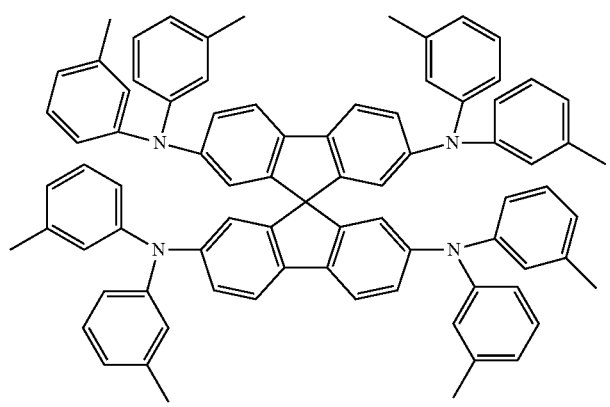

-continued
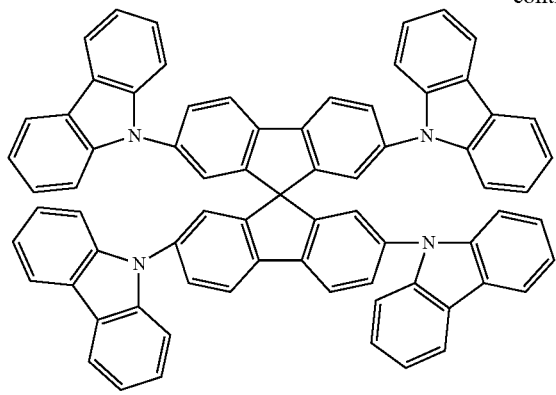
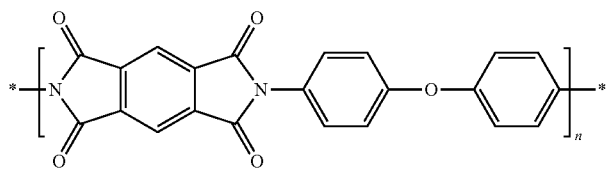
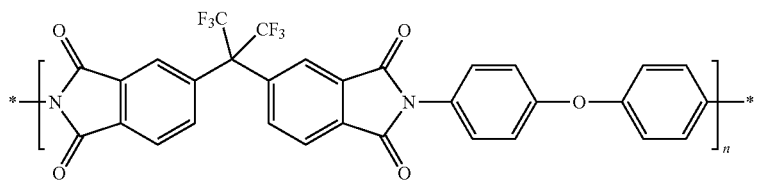
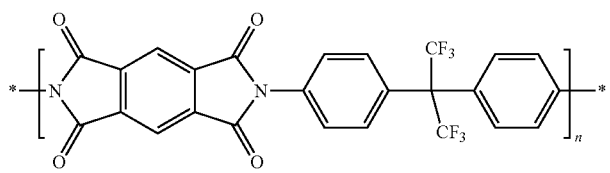
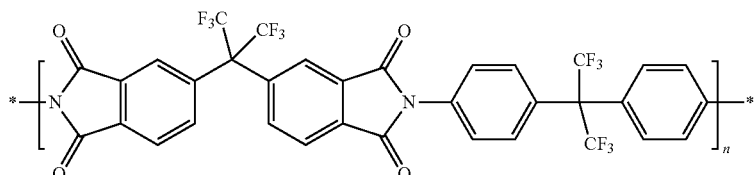
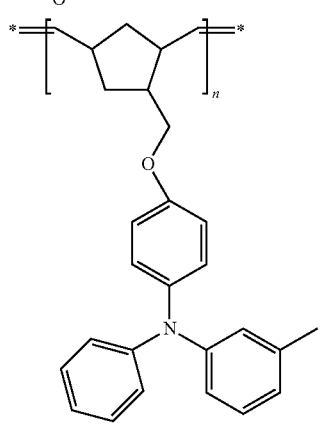
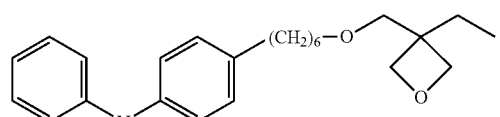
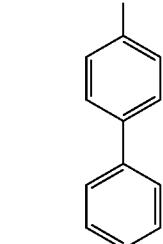
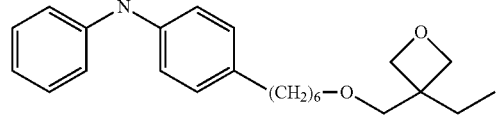

287
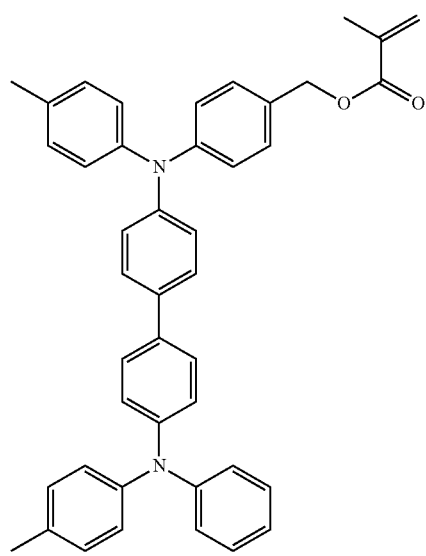
288
-continued
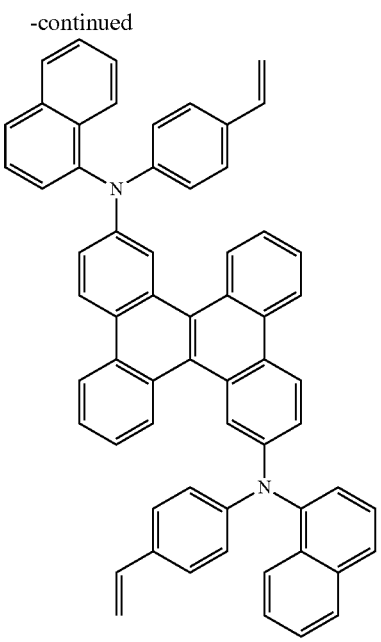
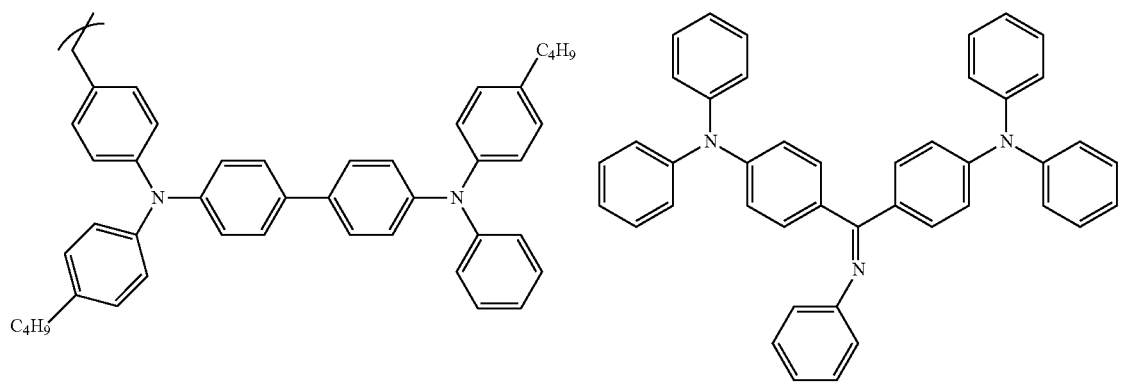
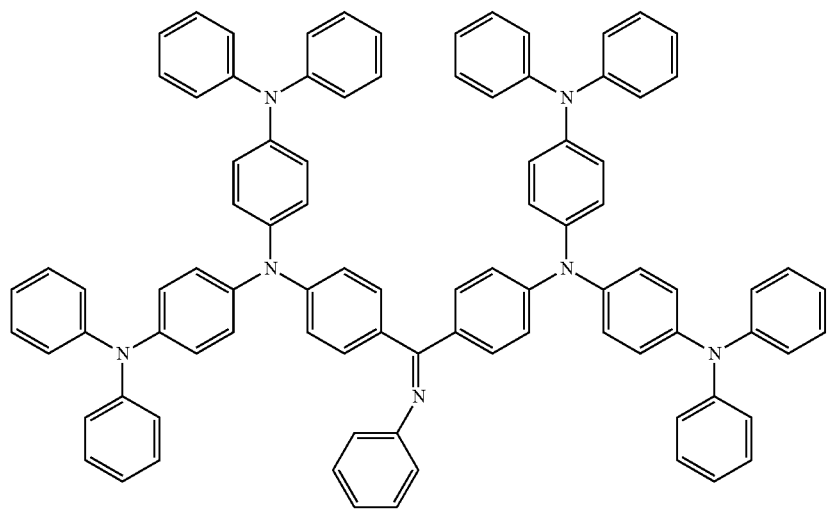

-continued
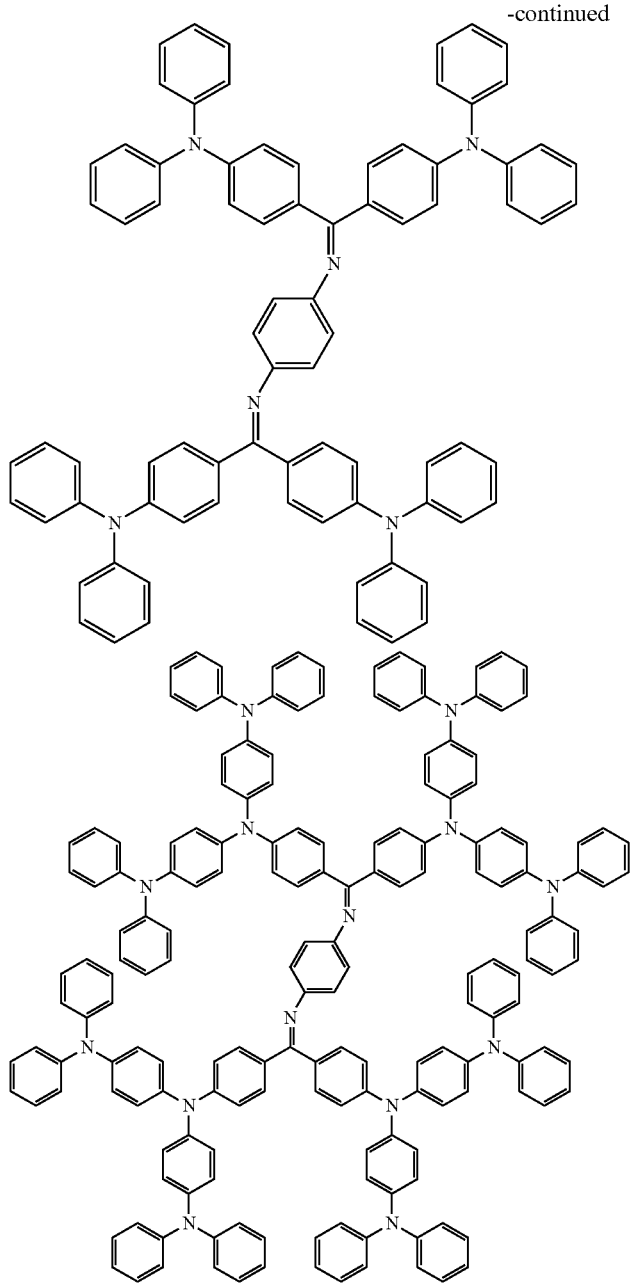
Preferred examples of a compound that may be used as the electron barrier material are shown below.
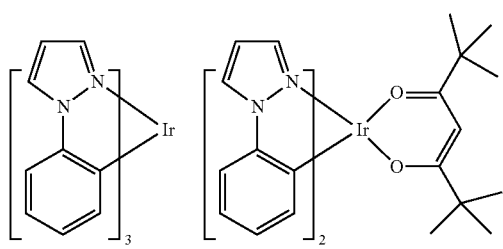
-continued
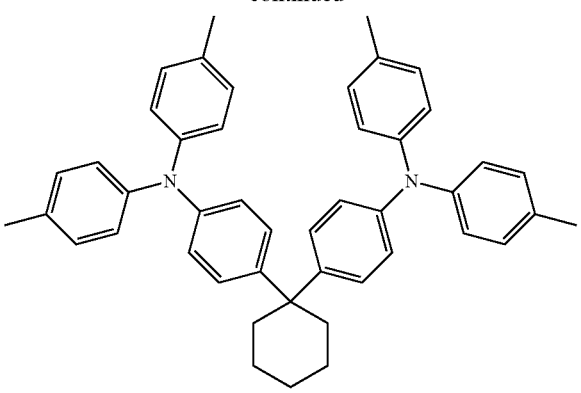

Preferred examples of a compound that may be used as the hole barrier material are shown below.
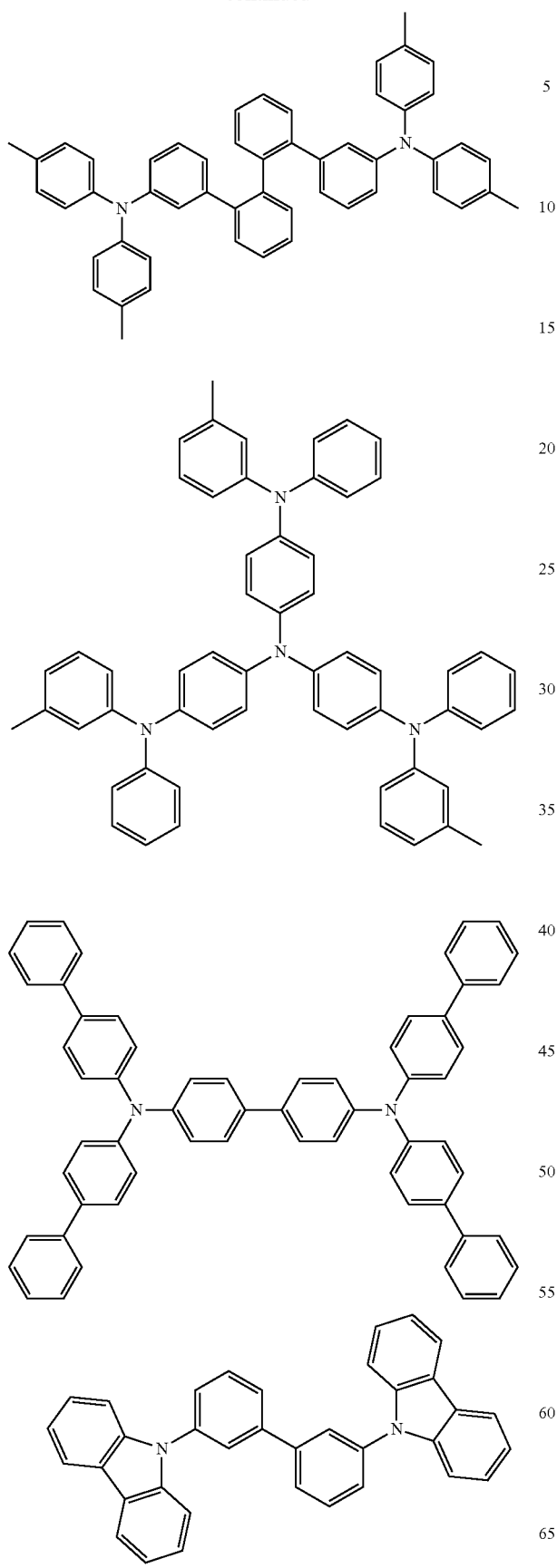
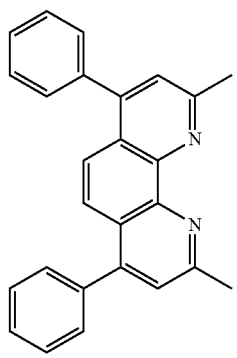
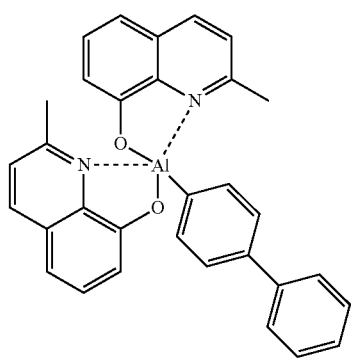
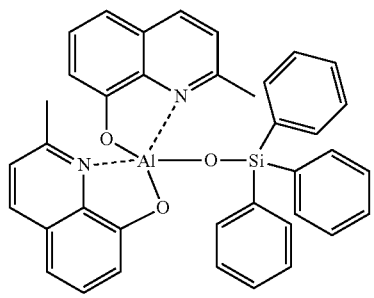
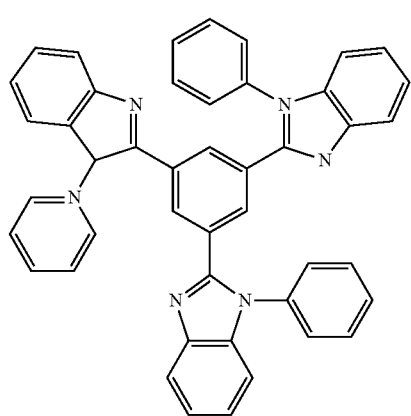

293
-continued
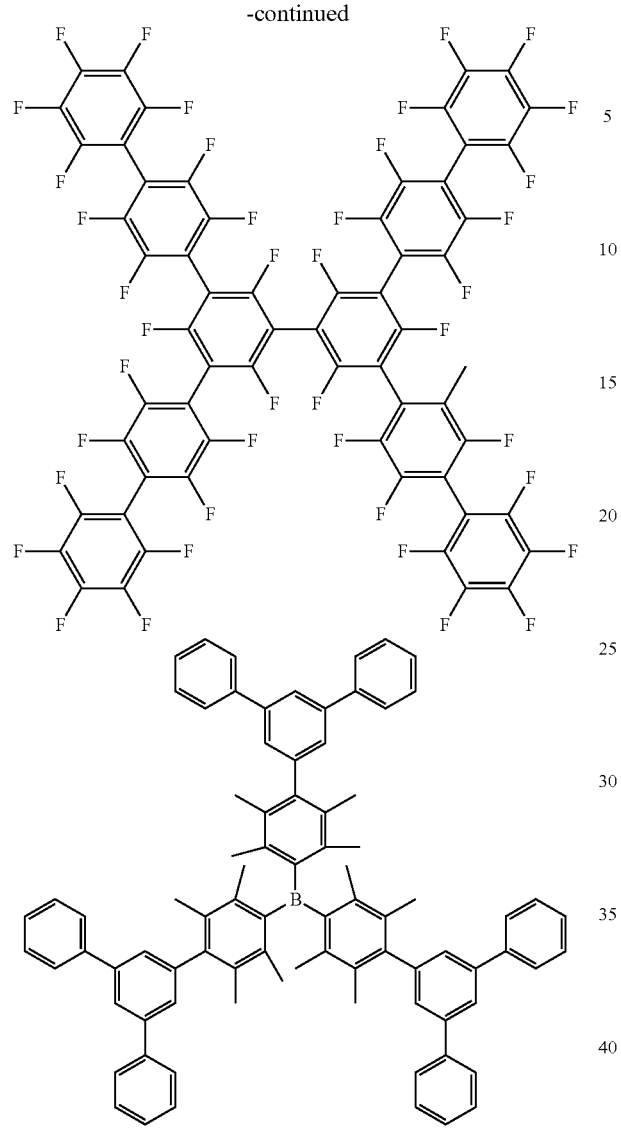
294
-continued
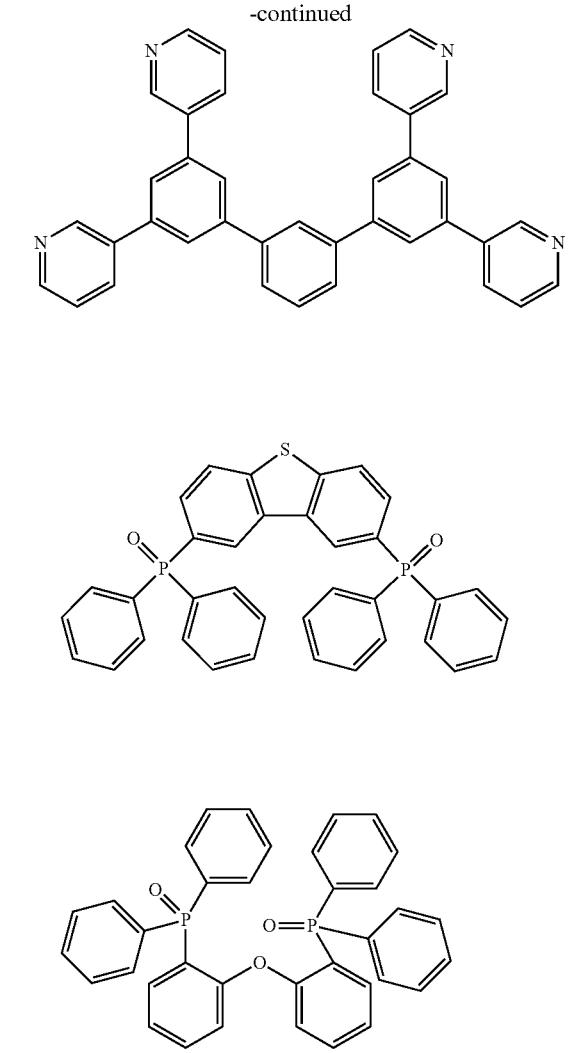
Preferred examples of a compound that may be used as the electron transporting material are shown below.
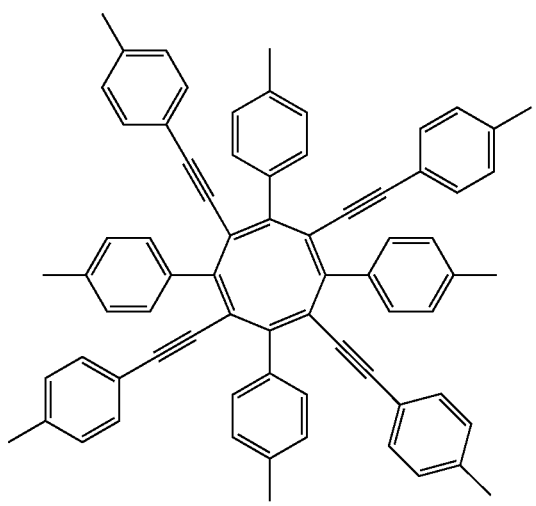

295 296
-continued
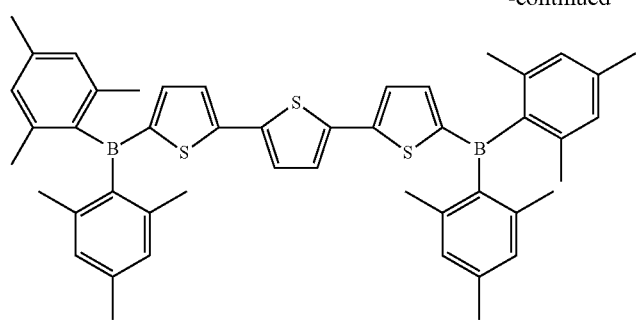
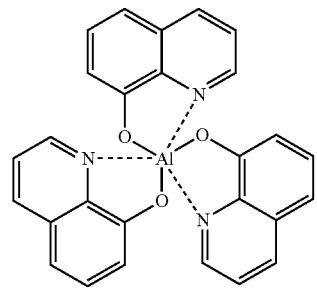
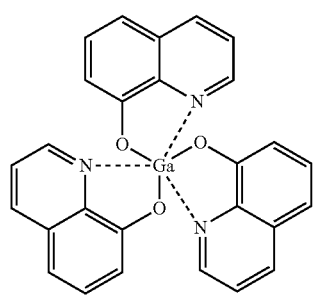
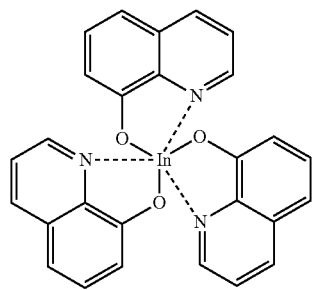
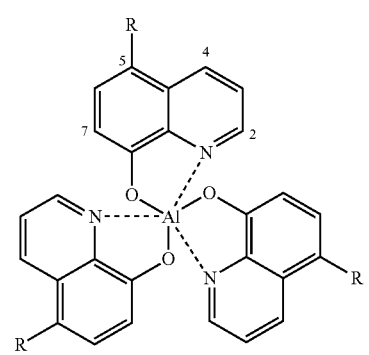
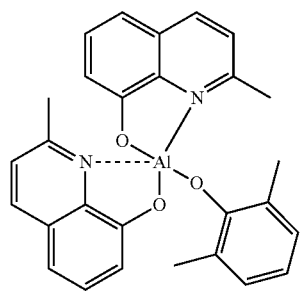
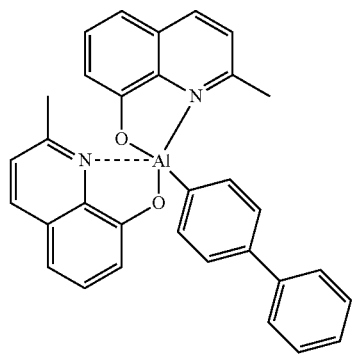
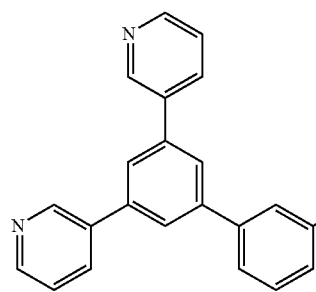
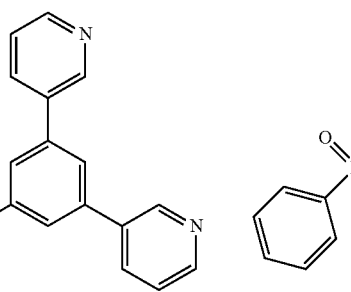
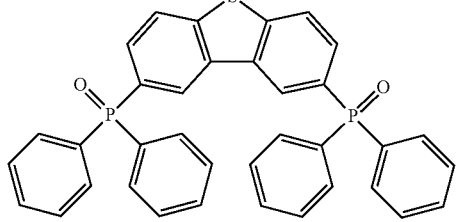
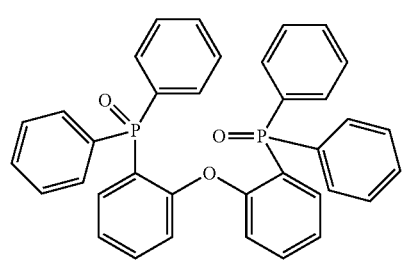
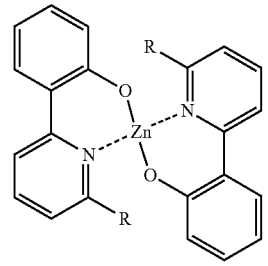
R = H
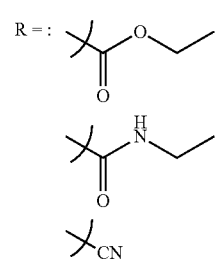

297
-continued
298
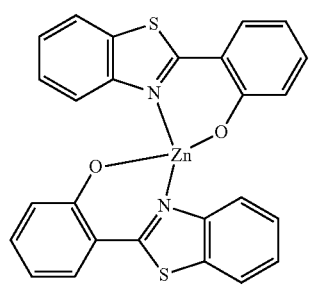 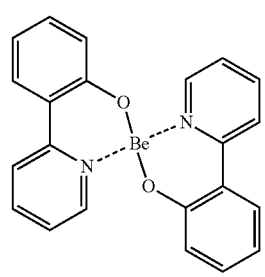 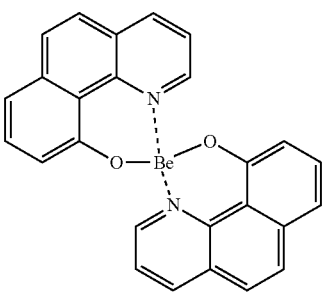 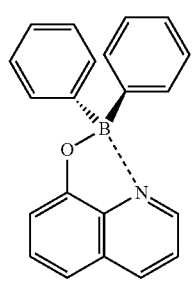
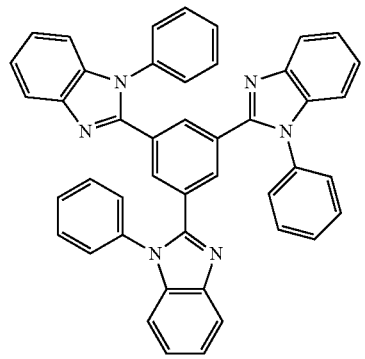
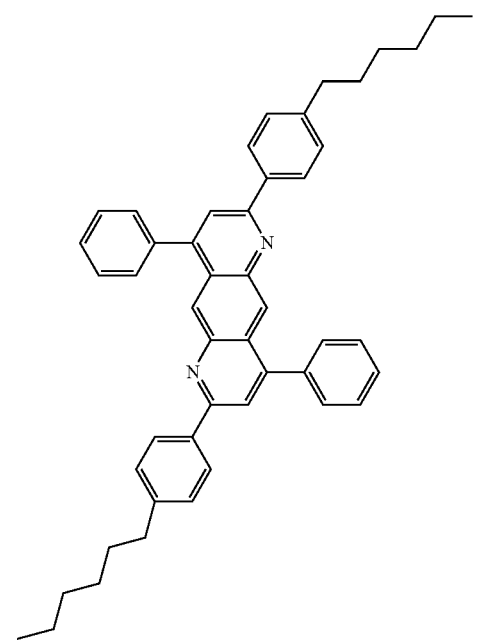
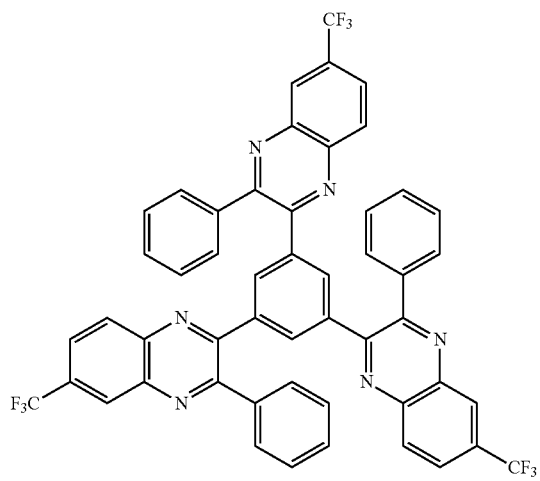
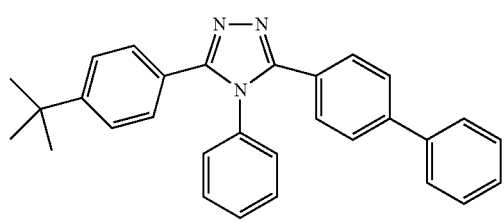
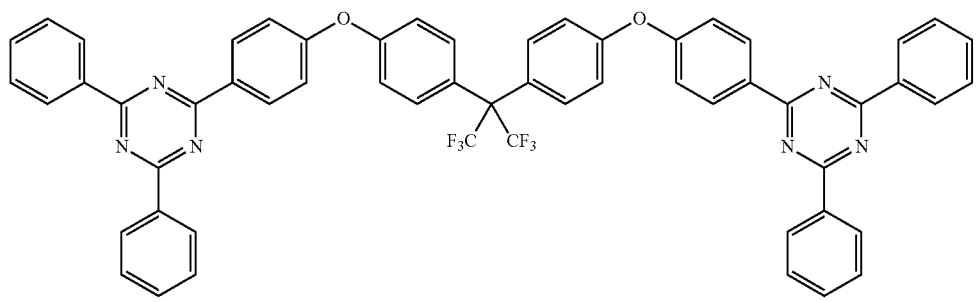

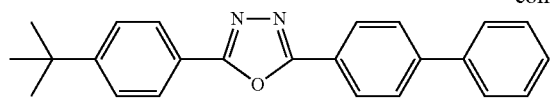
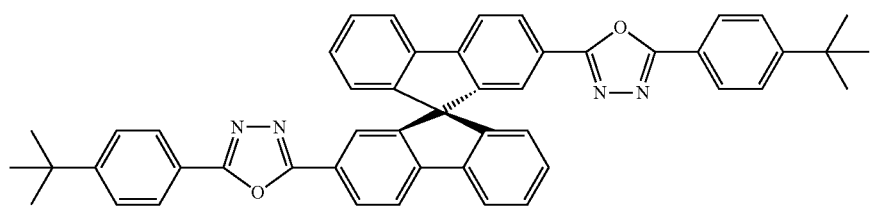
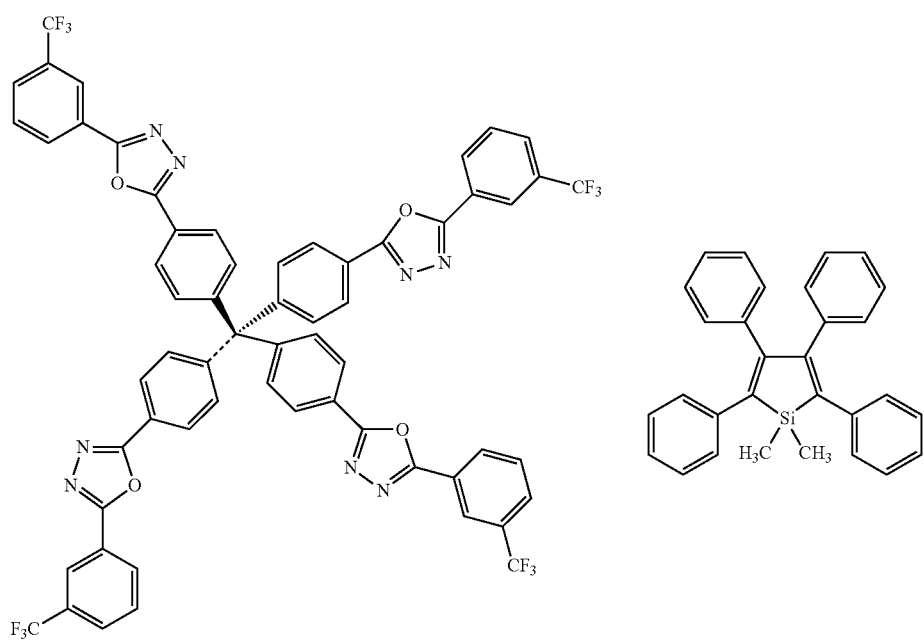
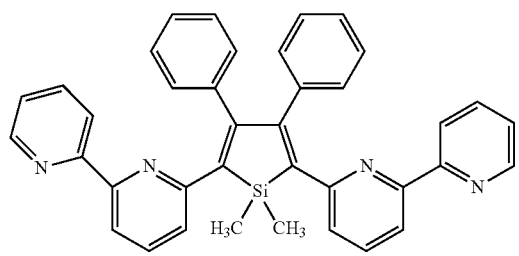
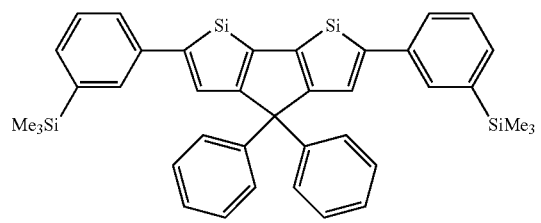
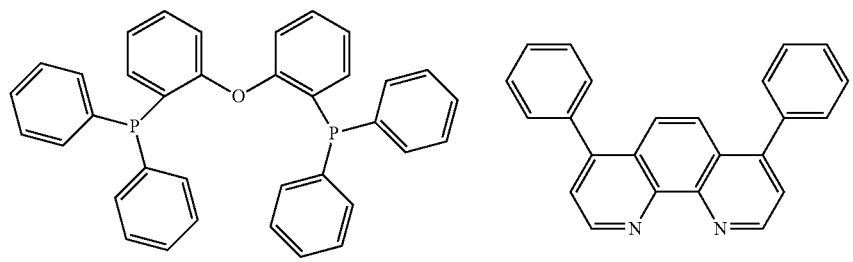

301
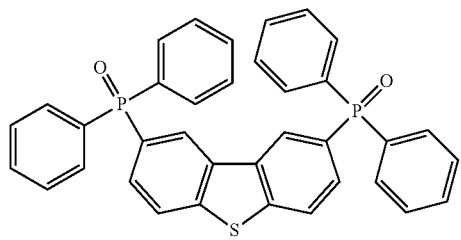
302
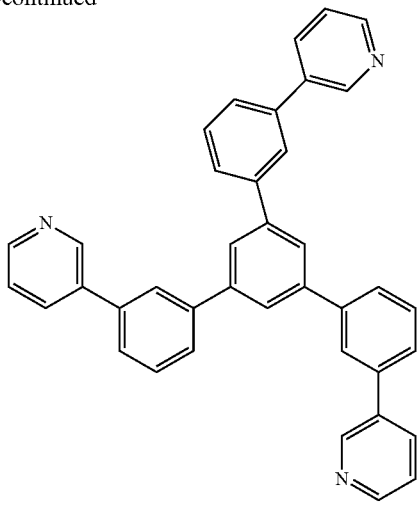
Preferred examples of a compound that may be used as the electron injection material are shown below.
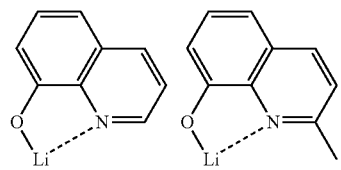
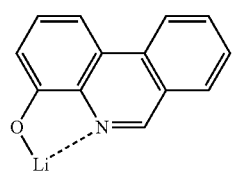
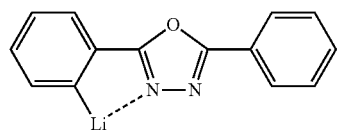
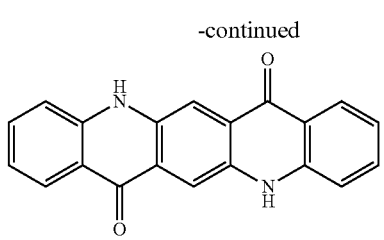
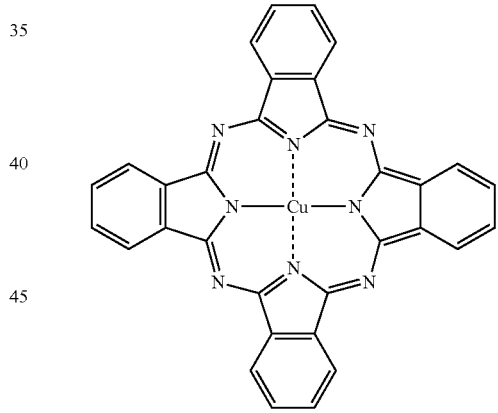
Preferred examples of a compound as a material that may be added are shown below. For example, the compound may be added as a stabilizing material.
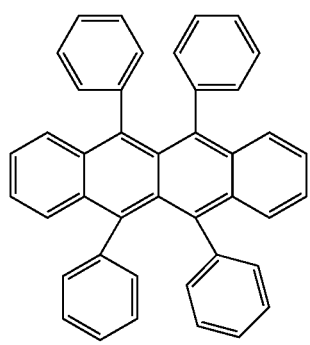
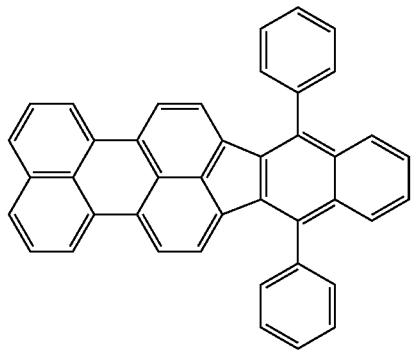

-continued

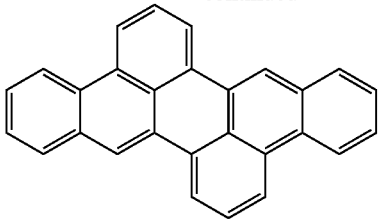

The organic electroluminescent device thus produced by the aforementioned method emits light on application of an electric field between the anode and the cathode of the device. In this case, when the light emission is caused by the excited single energy, light having a wavelength that corresponds to the energy level thereof may be confirmed as fluorescent light and delayed fluorescent light. When the light emission is caused by the excited triplet energy, light hawing a wavelength that corresponds to the energy level thereof may be confirmed as phosphorescent light. The normal fluorescent light has a shorter light emission lifetime than the delayed fluorescent light, and thus the light emission lifetime may be distinguished between the fluorescent light and the delayed fluorescent light.

The organic electroluminescent device of the invention may be applied to any of a single device, a structure with plural devices disposed in an array, and a structure having anodes and cathodes disposed in an X-Y matrix. According to the invention, an organic light emitting device that is largely improved in light emission efficiency may be obtained. The organic light emitting device, such as the organic electroluminescent device, of the invention may be applied to a further wide range of purposes. For example, an organic electroluminescent display apparatus may be produced with the organic electroluminescent, device of the invention, and for the details thereof, reference may be made to S. Tokito, C. Adachi and H. Murata, "Yuki EL Display" (Organic EL Display) (Ohmsha, Ltd.). In particular, the organic electroluminescent device of the invention may be applied to organic electroluminescent illumination and backlight which are highly demanded.

EXAMPLE

The features of the invention will be described more specifically with reference to examples below. The materials, processes, procedures and the like shown below may be appropriately modified unless they deviate from the substance of the invention. Accordingly, the scope of the invention is not construed as being limited to the specific examples shown below. The organic, electroluminescent devices were measured by using Semiconductor Parameter Analyzer (E5273A, produced by Agilent Technologies, Inc.), Optical Power Meter (1930C, produced by Newport Corporation) and Fiber Optic Spectrometer (USB2000, produced by Ocean Optics, Inc.).

Test Example 1

The difference ($\Delta E_{ST}$) between the singlet energy ($E_{S1}$) and the triplet energy ($E_{T1}$) of the light emitting materials used in the following examples was obtained in such a manner that the singlet energy ($E_{S1}$) and the triplet energy ($E_{T1}$) were measured in the following manners, and the difference ($\Delta E_{ST}$) was obtained by the expression, $\Delta E_{ST}=E_{S1}-E_{T1}$. The measurement results are shown in Table 22.

(1) Singlet Energy $E_{S1}$

The compound to be measured and DPEPO were vapor-co-deposited to a thickness of 100 nm on a Si substrate to make a concentration of the compound to be measured of 6% by weight, which was designated as a specimen. The specimen was measured for a fluorescent spectrum at ordinary temperature (300 K). The light emission was accumulated from immediately after the incidence of excitation light to 100 nsec after the incidence, thereby providing a fluorescent, spectrum with the fluorescence intensity as the ordinate and the wavelength as the abscissa. In the fluorescent spectrum, the ordinate is the light emission, and the abscissa is the wavelength. A tangent line was drawn for the downfalling part of the light emission spectrum on the short wavelength side, and the wavelength λedge (nm) of the intersection point of the tangent line and the abscissa was obtained. The wavelength value was converted to an energy value according to the following conversion expression to provide the singlet energy $E_{S1}$.

$E_{S1}$ (eV)=1239.85/λedge      Conversion Expression

The light emission spectrum was measured with a nitrogen laser (MNL200, produced by Lasertechnik Berlin GmbH) as an excitation light source and a streak camera (C4334, produced by Hamamatsu Photonics K.K.) as a detector.

(2) Triplet Energy $E_{T1}$

The same specimen as used for the singlet energy $E_{S1}$ was cooled to 5 K, the specimen for measuring phosphorescent light was irradiated with excitation light (337 nm), and the phosphorescence intensity was measured with a streak camera. The light emission was accumulated from 1 msec after the incidence of excitation light to 10 msec after the incidence of excitation light, thereby providing a phosphorescent spectrum with the phosphorescence intensity as the ordinate and the wavelength as the abscissa. A tangent line was drawn for the upstanding part of the phosphorescent spectrum on the short wavelength side, and the wavelength λedge (nm) of the intersection point of the tangent line and the abscissa was obtained. The wavelength value was converted to an energy value according to the following conversion expression to provide the singlet energy $E_{T1}$.

$E_{T1}$ (eV)=1239.85/λedge      Conversion Expression

The tangent line for the upstanding part of the phosphorescent spectrum on the short wavelength side was drawn in the following manner. Over the range in the phosphorescent spectrum curve of from the short wavelength end to the maximum peak value closest to the short wavelength end among the maximum peak values of the spectrum, a tangent line was assumed while moving within the range toward the long wavelength side. The gradient of the tangent line was increased while the curve was standing up (i.e., the value of the ordinate was increased). The tangent line that was drawn at the point where the gradient thereof became maximum was designated as the tangent line for the upstanding part of the phosphorescent spectrum on the short wavelength side.

A maximum peak having a peak intensity that was 10% or less of the maximum peak point intensity of the spectrum was not included in the maximum peak values and thus was not designated as the maximum peak value closest to the short wavelength end, and the tangent line that was drawn, at the point where the gradient became maximum that was closest to the maximum peak, value closest to the short wavelength end was designated as the tangent line for the upstanding part of the phosphorescent spectrum on the short wavelength side.

TABLE 22

| Light emitting material | $\Delta E_{ST}$ (eV) |
|---|---|
| ZHS02 | 0.22 |
| 2CzPN | 0.25 |
| 4CzIPN | 0.11 |
| 4CzTPN-Ph | 0.06 |

Example 1

In this example, a multiple wavelength light emitting organic, electroluminescent device containing light emitting materials of three colors, i.e., a blue light emitting material, a green light emitting material and a red light emitting material, that were mixed in one light emitting layer was produced and evaluated.

Thin films were laminated on a glass substrate having formed thereon an anode formed of indium tin oxide (ITO) having a thickness of 100 nm, by a vacuum vapor deposition method at a vacuum degree of $5\times10^{-4}$ Pa or less. Firstly, α-NPD was formed to a thickness of 35 nm on ITO, and thereon mCBP was formed to a thickness of 10 nm. ZHS02 as a blue light emitting material, 4CzIPN as a green light emitting material and 4CzTPN-Ph as a red light emitting material were vapor-co-deposited from separate vapor deposition sources to form a layer having a thickness of 15 nm, which was designated as a light emitting layer. At this time, the concentrations of 4CzIPN and 4CzTPN-Ph each were 0.1% by weight, and the balance was ZHS02. PPT was then formed to a thickness of 10 nm, TPBi was formed to a thickness of 40 nm, then lithium fluoride (LiF) was vacuum vapor-deposited to a thickness of 0.8 nm, and then aluminum (Al) was vapor-deposited to a thickness of 100 nm to form a cathode, thereby producing an organic electroluminescent device.

Figure 8:
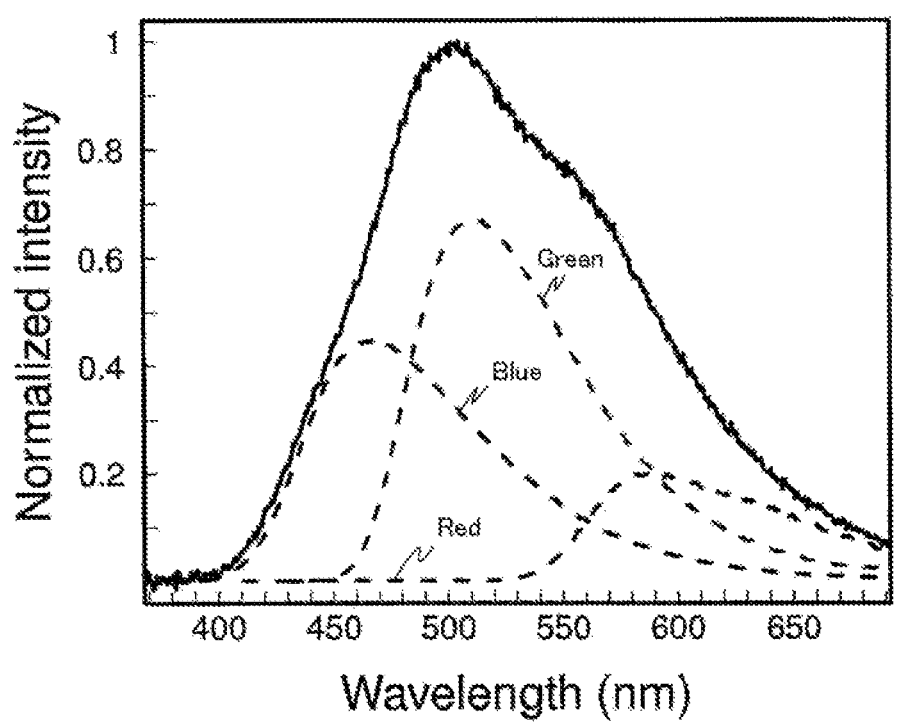
FIG. 8 is a graph showing the light emission spectra of the organic electroluminescent device of Example 1.
Figure 9:
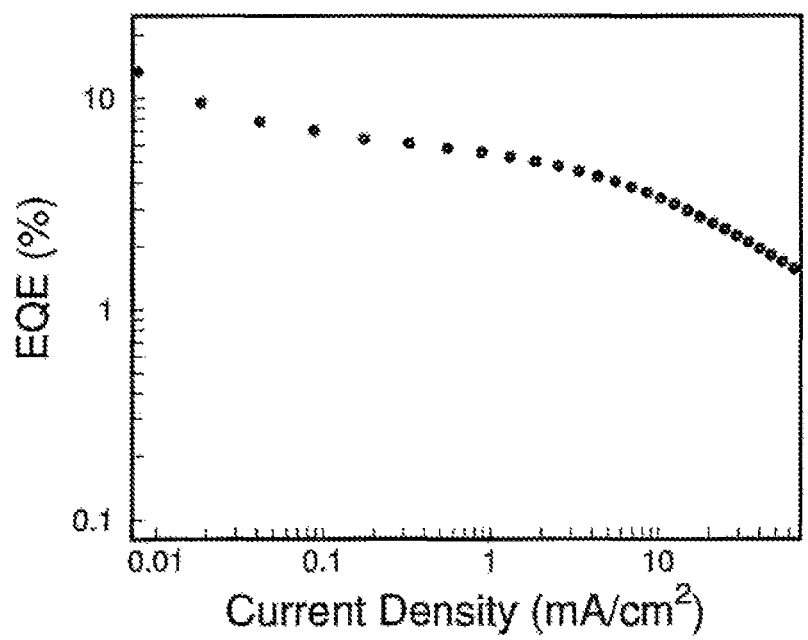
FIG. 9 is a graph showing the electric current density-external quantum efficiency characteristics of the organic electroluminescent device of Example 1.
Figure 10:
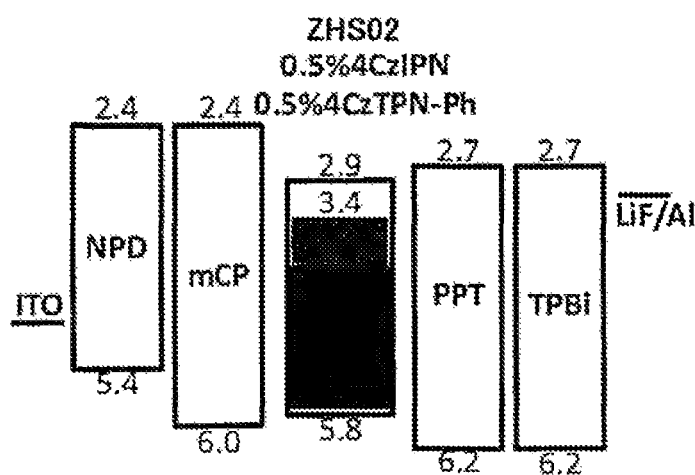
FIG. 10 is a graph showing the energy band diagram of the organic electroluminescent device of Example 1.

The light emission spectrum of the organic electroluminescent device thus produced is shown in FIG. 8, the electric current density-external quantum efficiency characteristics thereof are shown in FIG. 9, and the energy band diagram thereof is shown in FIG. 10. The external quantum efficiency and the chromaticity thereof thus obtained were as shown in Table 23. The light emission intensity ratio was 32% for blue light emission, 49% for green light emission and 19% for red light emission. The intensity ratio of blue light emission was enhanced by the blue delayed fluorescent light, and thereby both favorable blue color and a high light emission efficiency were simultaneously achieved.

Examples 2 to 4

In these examples, multiple wavelength light emitting organic electroluminescent devices each containing light emitting materials of two colors, i.e., a blue light emitting material and a red light emitting material, that were mixed in one light emitting layer at three different concentrations were produced and evaluated.

Thin films were laminated on a glass substrate having formed thereon an anode formed of indium tin oxide (ITO) having a thickness of 100 nm, by a vacuum vapor deposition method at a vacuum degree of 5×10−4 Pa or less. Firstly, α-NPD was formed to a thickness of 35 nm on ITO, and thereon mCBP was formed to a thickness of 10 nm. 2CzPN as a blue light emitting material and 4CzTPN-Ph as a red light emitting material were vapor-co-deposited from separate vapor deposition sources to form a layer having a thickness of 15 nm, which was designated as a light emitting layer. At this time, the concentration of 4CzTPS-Ph was 0.1% by weight (Example 2), 0.2% by weight (Example 3) or 0.5% by weight (Example 4). TmPyPb was then formed to a thickness of 50 nm, then lithium fluoride (LiF) was vacuum vapor-deposited to a thickness of 0.8 nm, and then aluminum (Al) was vapor-deposited to a thickness of 100 nm to form a cathode, thereby producing an organic electroluminescent device.

Figure 11:
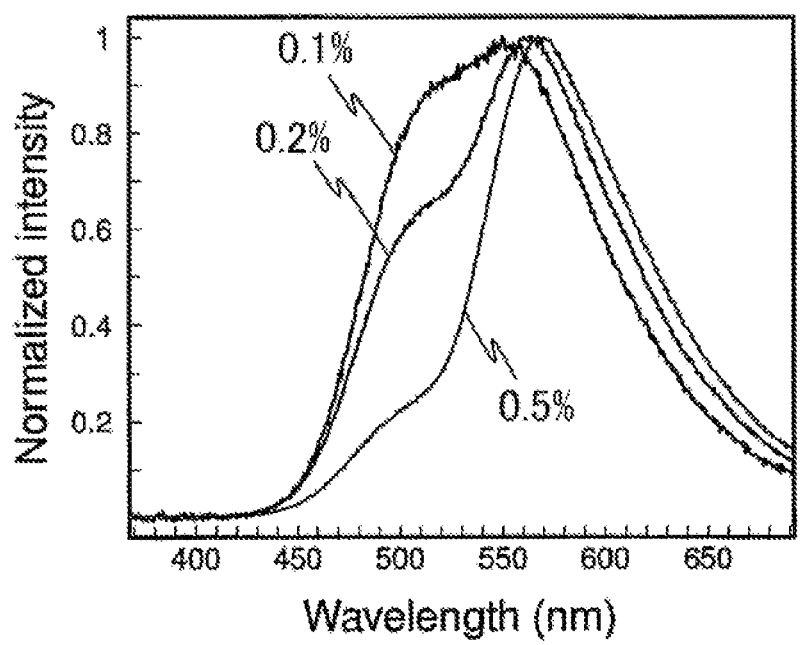
FIG. 11 is a graph showing the light emission spectra of the organic electroluminescent devices of Examples 2 to 4.
Figure 12:
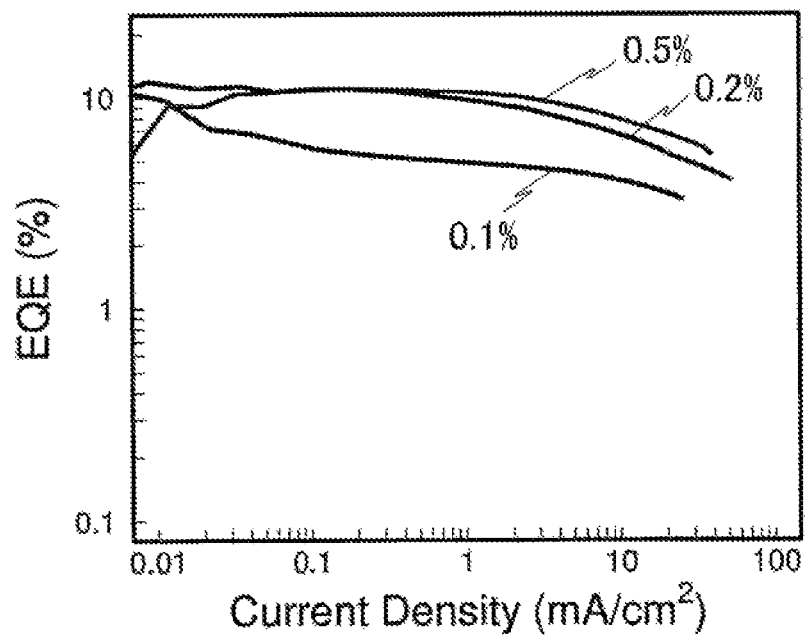
FIG. 12 is a graph showing the electric current density-external quantum efficiency characteristics of the organic electroluminescent devices of Examples 2 to 4.
Figure 13:
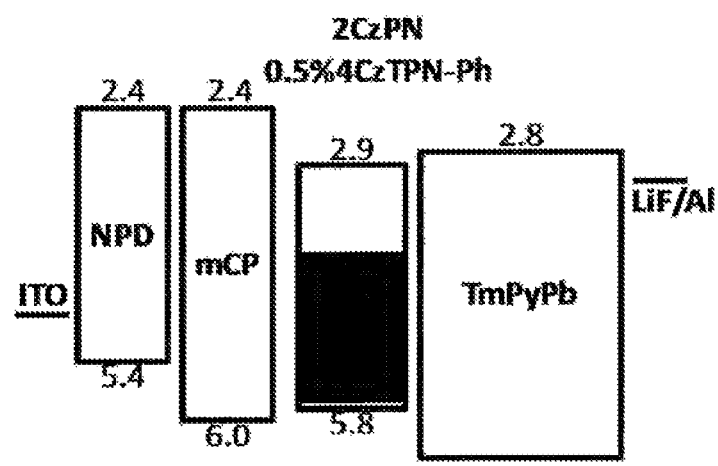
FIG. 13 is a graph showing the energy band diagram of the organic electroluminescent devices of Examples 2 to 4.

The light emission spectra of the organic electroluminescent devices thus produced are shown in FIG. 11, the electric current density-external quantum efficiency characteristics thereof are shown in FIG. 12, and the energy band diagram thereof is shown in FIG. 13. The external quantum efficiency and the chromaticity thereof thus obtained were as shown in Table 23. Both favorable blue color and a high light emission efficiency were simultaneously achieved.

Example 5

In this example, a multiple wavelength, light emitting organic electroluminescent device having a light emitting layer containing a blue light emitting material doped with a red light emitting material that was held between light emitting layers each formed only of a blue light emitting material was produced and evaluated.

Thin films were laminated on a glass substrate having formed thereon an anode formed of indium tin oxide (ITO) having a thickness of 100 nm, by a vacuum vapor deposition method at a vacuum degree of $5\times10^{-4}$ Pa or less. Firstly, α-NPD was formed to a thickness of 35 nm on ITO, then mCBP was formed thereon to a thickness of 10 nm, and ZHS02 as a blue light emitting material was formed to a thickness of 7 nm. ZHS02 and 4CzTPN-Ph as a red light emitting material were vapor-co-deposited from separate vapor deposition sources to form a layer having a thickness of 1 nm, which was designated as a light emitting layer. At this time, the concentration of 4CzTPN-Ph was 0.2% by weight. ZHS02 was then formed to a thickness of 7 nm, TmPyPb was formed to a thickness of 50 nm, then lithium fluoride (LiF) was vacuum vapor-deposited to a thickness of 0.8 nm, and then aluminum (Al) was vapor-deposited to a thickness of 100 nm to form a cathode, thereby producing an organic electroluminescent device.

Figure 14:
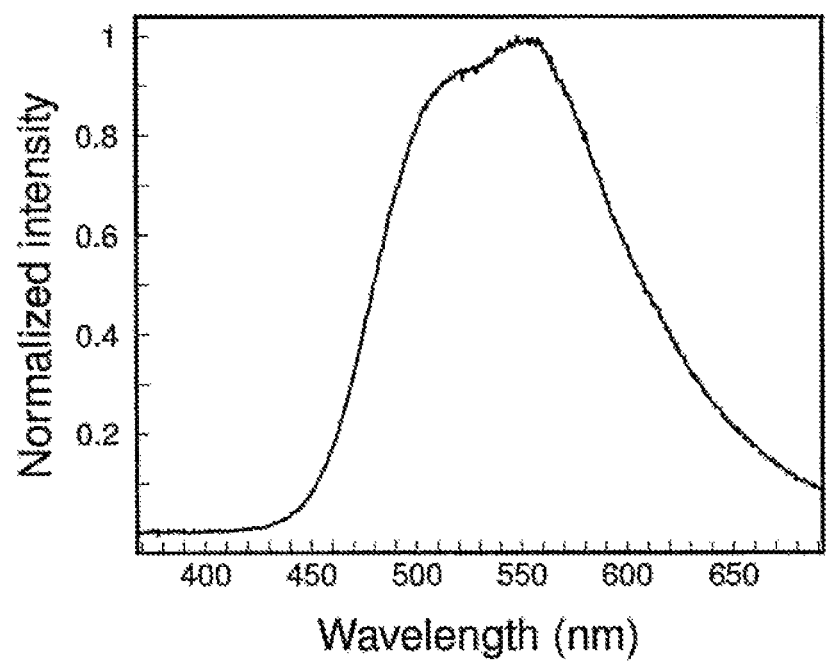
FIG. 14 is a graph showing the light emission spectrum of the organic electroluminescent device of Example 5.
Figure 15:
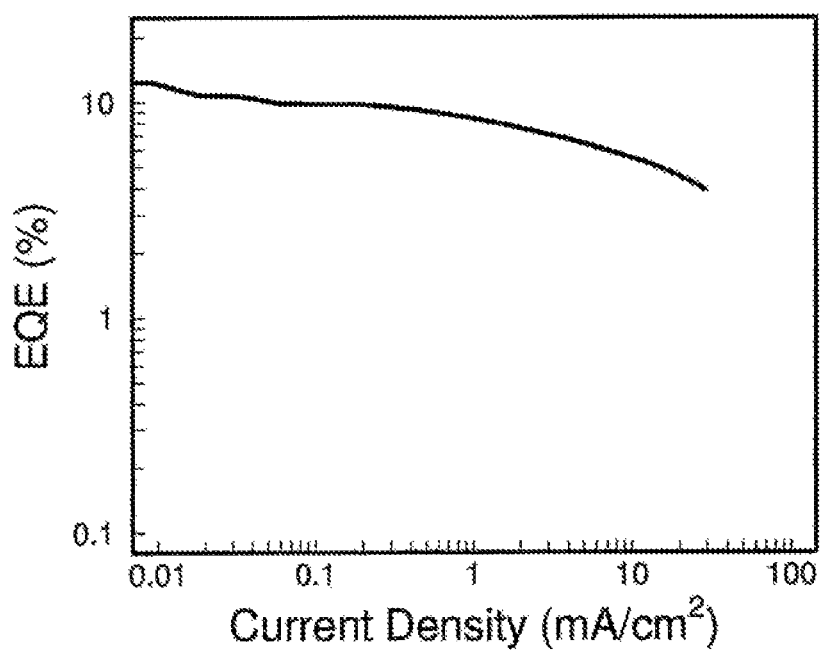
FIG. 15 is a graph showing the electric current density-external quantum efficiency characteristics of the organic electroluminescent device of Example 5.
Figure 16:
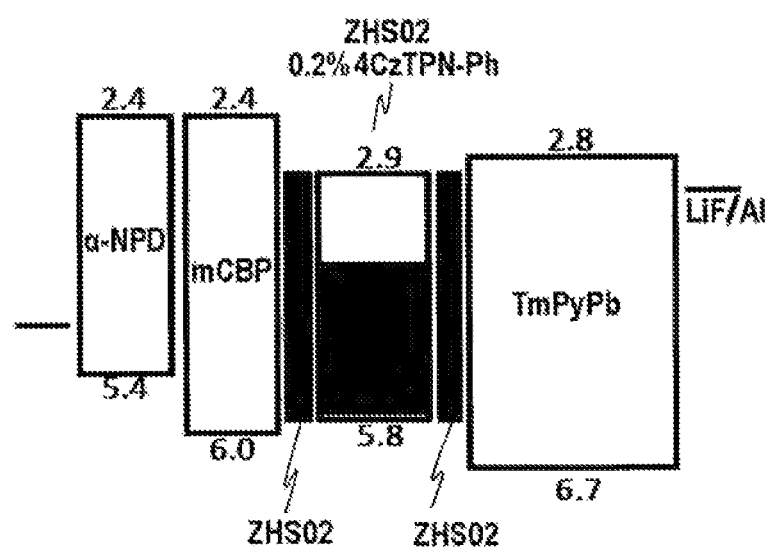
FIG. 16 is a graph showing the energy band diagram of the organic electroluminescent device of Example 5.

The light emission spectrum of the organic electroluminescent device thus produced is shown in FIG. 14, the electric current density-external quantum efficiency characteristics thereof are shown in FIG. 15, and the energy band diagram thereof is shown in FIG. 16. The external quantum efficiency and the chromaticity thereof thus obtained were as shown in Table 23. Both favorable blue color and a high light emission efficiency were simultaneously achieved.

TABLE 23

|  | Maximum external quantum efficiency (%) | External quantum efficiency at 10 mA/cm$^2$ (%) | Voltage at 10 mA/cm$^2$ (V) | Chromaticity |
|---|---|---|---|---|
| Example 1 | 9.5 | 3.4 | 9 | 0.28, 0.41 |
| Example 2 | 9.7 | 4.0 | 8 | 0.36, 0.51 |
| Example 3 | 11.1 | 6.5 | 7 | 0.42, 0.50 |
| Example 4 | 10.5 | 7.8 | 7.8 | 0.47, 0.49 |
| Example 5 | 10.77 | 5.5 | 7 | 0.37, 0.51 |

Examples 6 to 8

In these examples, multiple wavelength light emitting organic electroluminescent devices each containing a blue light emitting material, a green light emitting material and a red light emitting material that were all delayed fluorescent materials were produced and evaluated.

Thin films were laminated on a glass substrate having formed thereon an anode formed of indium tin oxide (ITO) having a thickness of 100 nm, by a vacuum vapor deposition method at a vacuum degree of $5 \times 10^{-4}$ Pa or less. Firstly, HATCN was formed to a thickness of 10 nm on ITO, and thereon TrisPCz was formed to a thickness of 35 nm. PXZ-TRZ as a green light emitting material and mCBP were vapor-co-deposited from separate vapor deposition sources to form a layer having a thickness of 6 nm, which was designated as a first light emitting layer (the concentration of PXZ-TRZ was 10% by weight). Subsequently, PXZ-TRZ, 4CzTPN-Ph as a red light emitting material, and mCBP were vapor-co-deposited from separate vapor deposition sources to form a layer having a thickness of 3 nm, which was designated as a second light emitting layer (the concentration of PXZ-TRZ was 6% by weight, and the concentration of 4CzTPN-Ph was 2% by weight). SHT02 as a blue light emitting material and DPEPO were vapor-co-deposited from separate vapor deposition sources to form a layer having a thickness of 6 nm, which was designated as a third light emitting layer (the concentration of SHT02 was 6% by weight). DPEPO was then formed to a thickness of 10 nm, and TmPyPb was formed to a thickness of 40 nm. Lithium fluoride (LiF) was vacuum vapor-deposited to a thickness of 0.6 nm, and then aluminum (Al) was vapor-deposited to a thickness of 100 nm to form a cathode, thereby producing an organic electroluminescent device A (Example 6).

An organic electroluminescent device B was produced in the same production process as the organic electroluminescent device A except that a PPT layer having a thickness of 10 nm was formed instead of the DPEPO layer having a thickness of 10 nm (Example 7).

An organic electroluminescent device C was produced in the same production process as the organic electroluminescent device A except that the DPEPO layer having a thickness of 10 nm was not formed (Example 8).

Figure 17:
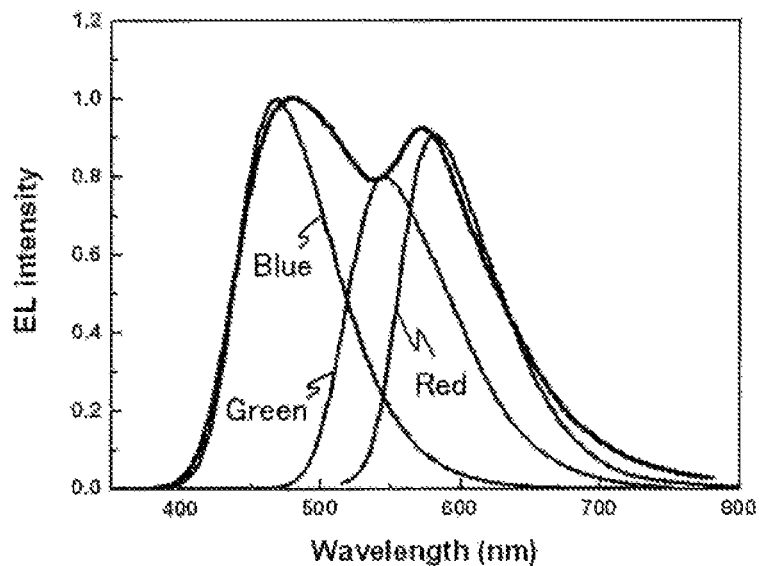
FIG. 17 is a graph showing the light, emission spectra of the organic electroluminescent device A of Example 6.
Figure 18:
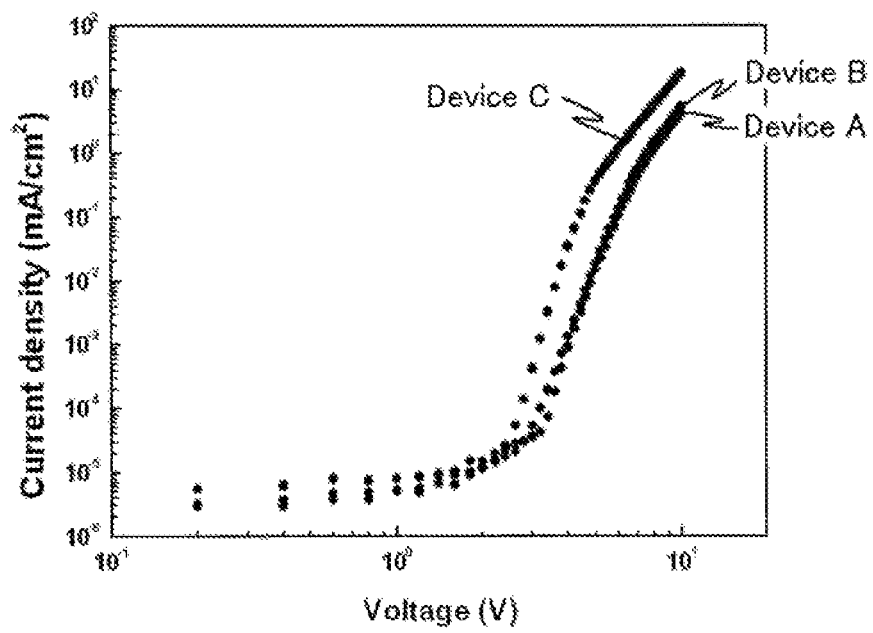
FIG. 18 is a graph showing the voltage-electric current density characteristics of the organic electroluminescent devices A to C of Examples 6 to 8.
Figure 19:
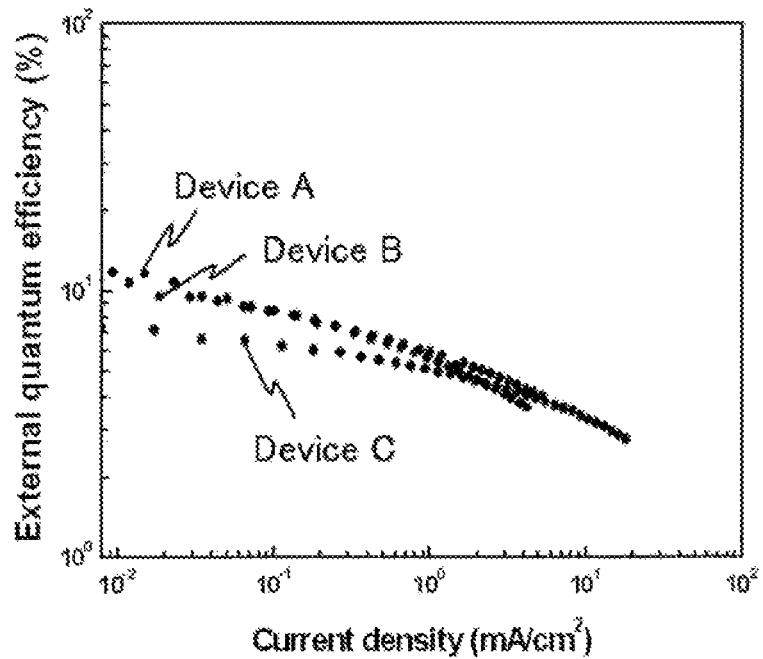
FIG. 19 is a graph showing the electric current density-external quantum efficiency characteristics of the organic electroluminescent devices A to G of Examples 6 to 8.
Figure 20:
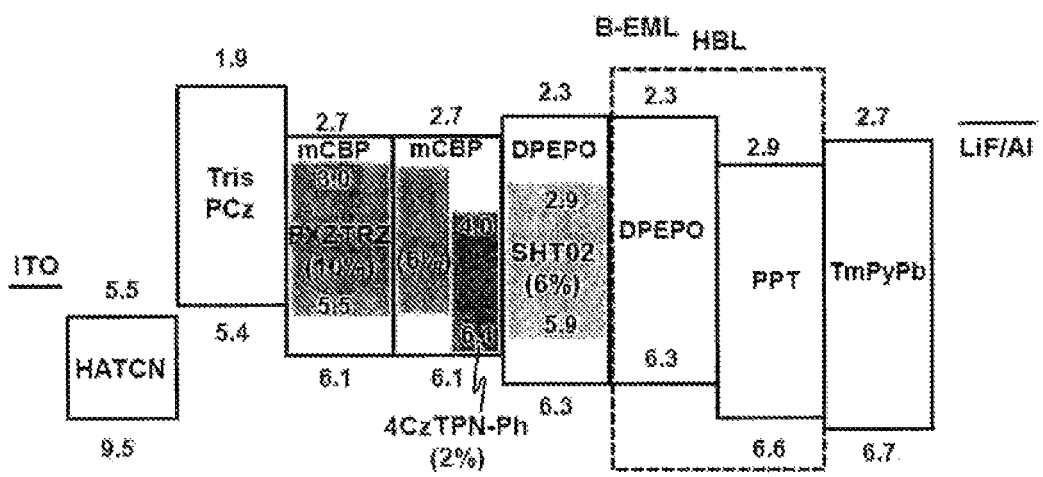
FIG. 20 is a graph showing the energy band diagram of the organic electroluminescent devices of Examples 6 to 8.

The light emission spectra of the organic electroluminescent device A thus produced are shown in FIG. 17. The chromaticity thereof was 0.31, 0.36. The voltage-electric current density characteristics of the organic electroluminescent devices A to C are shown in FIG. 18, the electric current density-external quantum efficiency characteristics thereof are shown in FIG. 19, and the energy band diagram thereof is shown in FIG. 20. The organic electroluminescent devices A to C exhibited favorable light emission characteristics as a white light emitting device, and the organic electroluminescent device A achieved an external quantum efficiency of 11.8%.

Examples 9 to 11

In these examples, multiple wavelength light emitting organic electroluminescent devices each containing a blue light, emitting material, a green light emitting material and a red light emitting material that were all delayed fluorescent materials with the use of another green light emitting material were produced and evaluated.

Organic electroluminescent devices D to F were produced in the same production process as the organic electroluminescent device A in Example 6 except that 4CzPN was used as a green light emitting material instead of PXZ-TRZ, and the thicknesses of the first light emitting layer, the second light emitting layer and the third light emitting layer were changed as follows.

Device D: first light emitting layer (6 nm), second light emitting layer (3 nm), third light emitting layer (6 nm)

Device E: first light emitting layer (4 nm), second light emitting layer (3 nm), third light emitting layer (8 nm)

Device F: first light emitting layer (3 nm), second light emitting layer (2 nm), third light emitting layer (15 nm)

Figure 21:
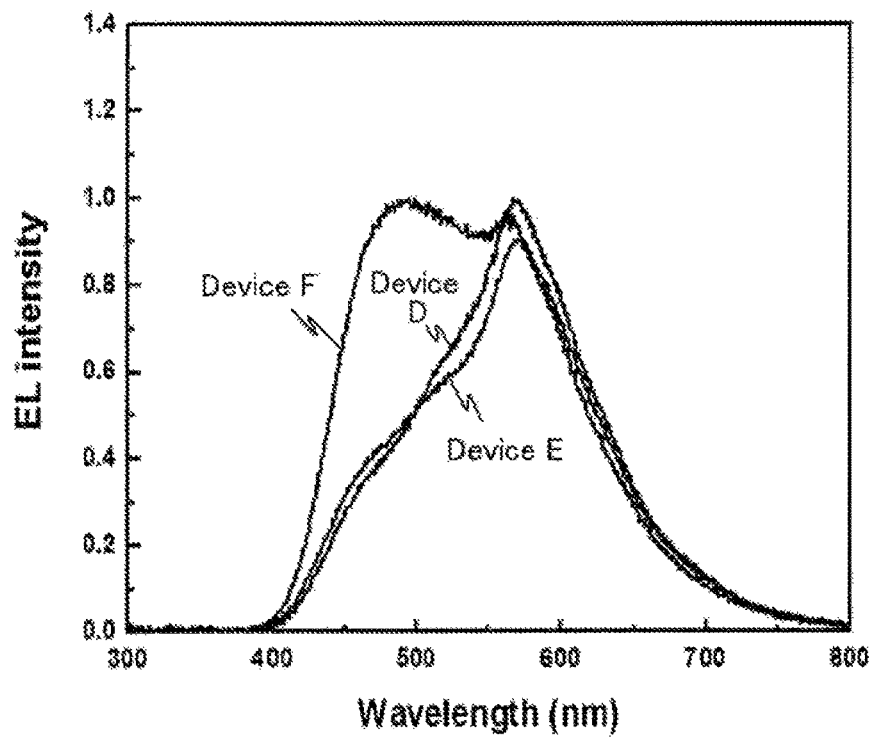
FIG. 21 is a graph showing the light emission spectra of the organic electroluminescent devices D to F of Examples 9 to 11.
Figure 22:
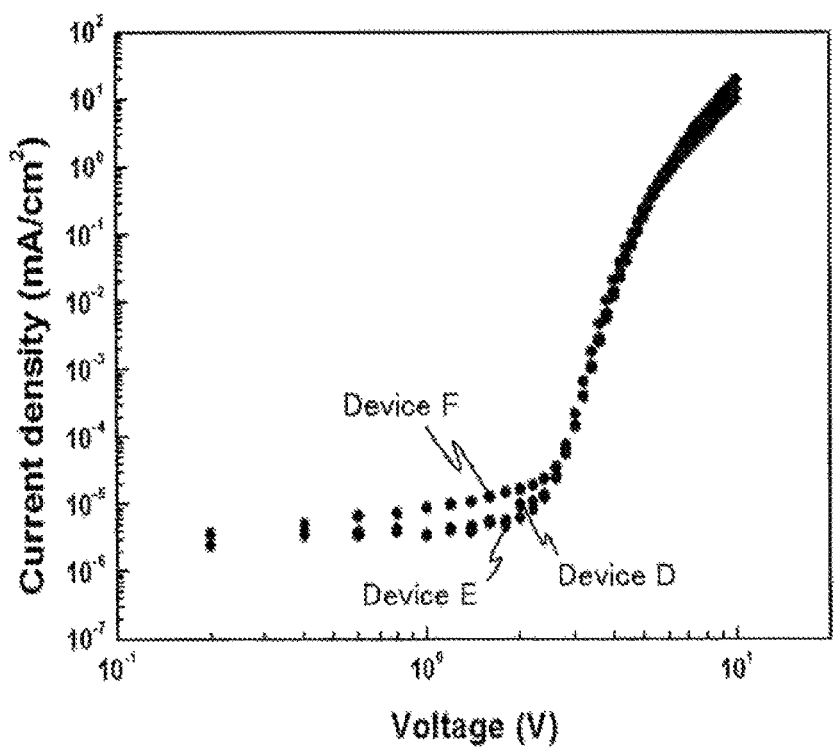
FIG. 22 is a graph showing the voltage-electric current density characteristics of the organic electroluminescent devices D to F of Examples 9 to 11.
Figure 23:
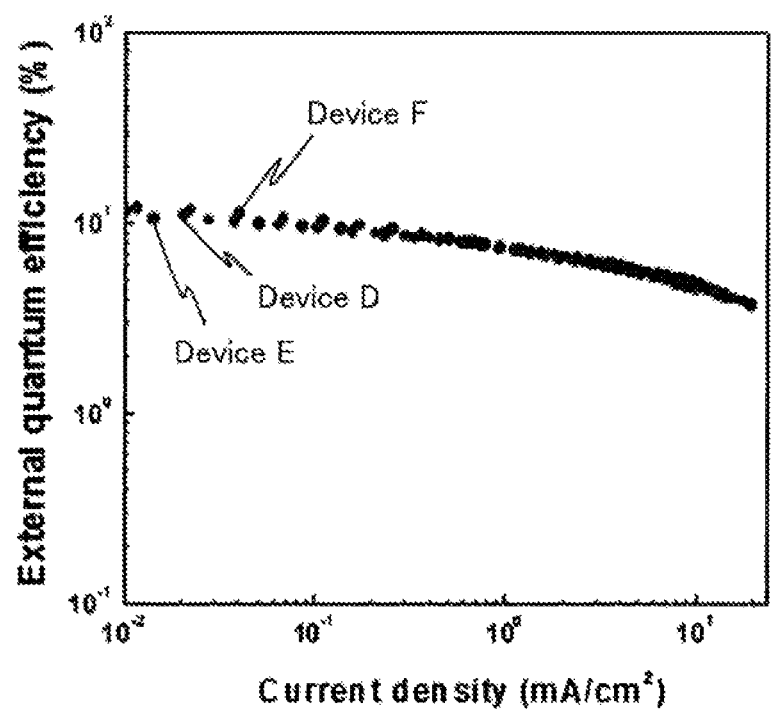
FIG. 23 is a graph showing the electric current density-external quantum efficiency characteristics of the organic electroluminescent devices D to F of Examples 9 to 11.

The light emission spectra of the organic electroluminescent devices D to F thus produced are shown in FIG. 21. The chromaticity of the organic electroluminescent light emitting device F was 0.30, 0.39. The voltage-electric current density characteristics of the organic electroluminescent devices D to F are shown in FIG. 22, and the electric current density-external quantum efficiency characteristics thereof are shown in FIG. 23. The organic electroluminescent device F exhibited favorable light emission characteristics as a white light emitting device and achieved an external, quantum efficiency of 12.1%.

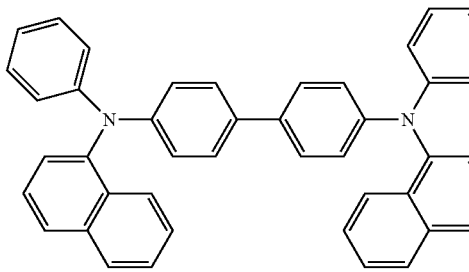

a-NPD

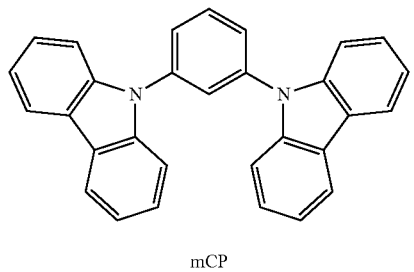

mCP

-continued
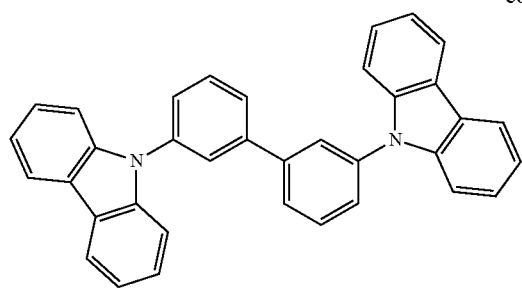
mCBP
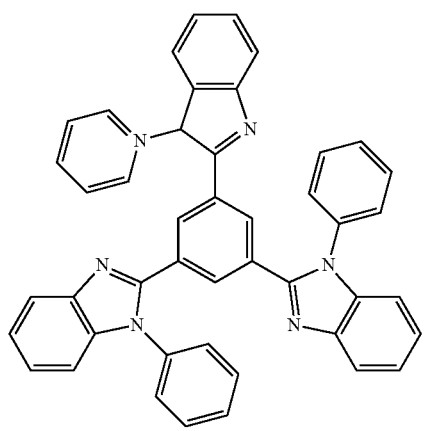
TPBii
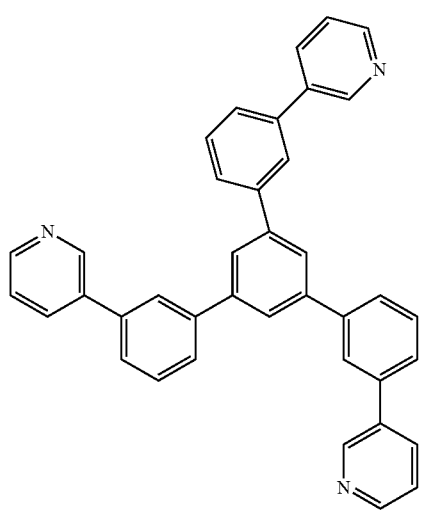
TmPyPb
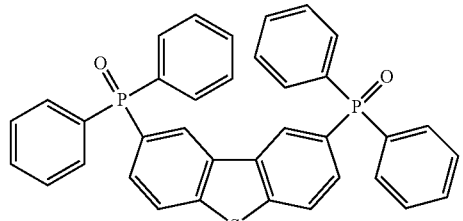
PPT
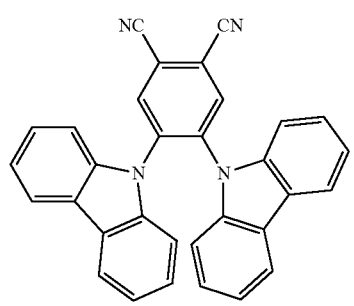
2CzPN
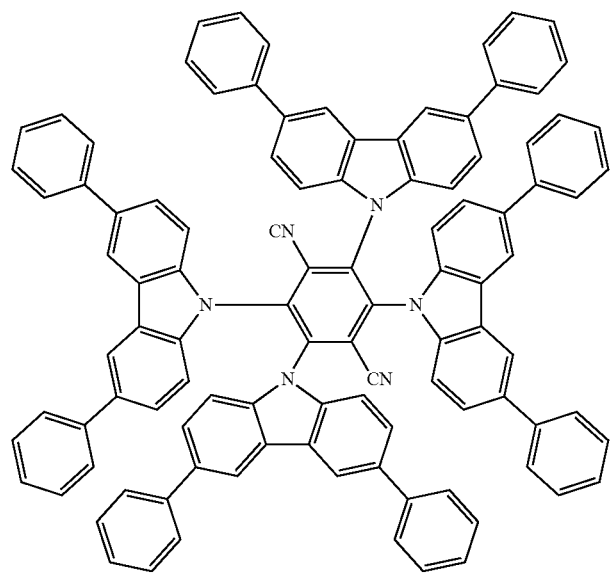
4CzTPN-Ph -continued
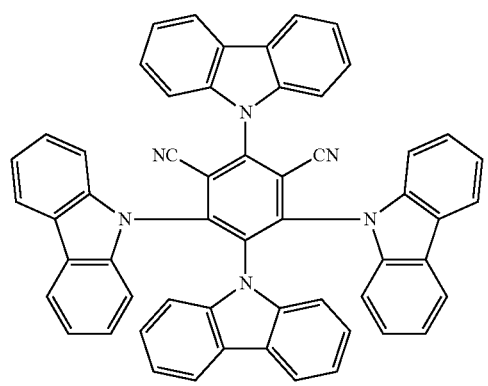
4CzIPN
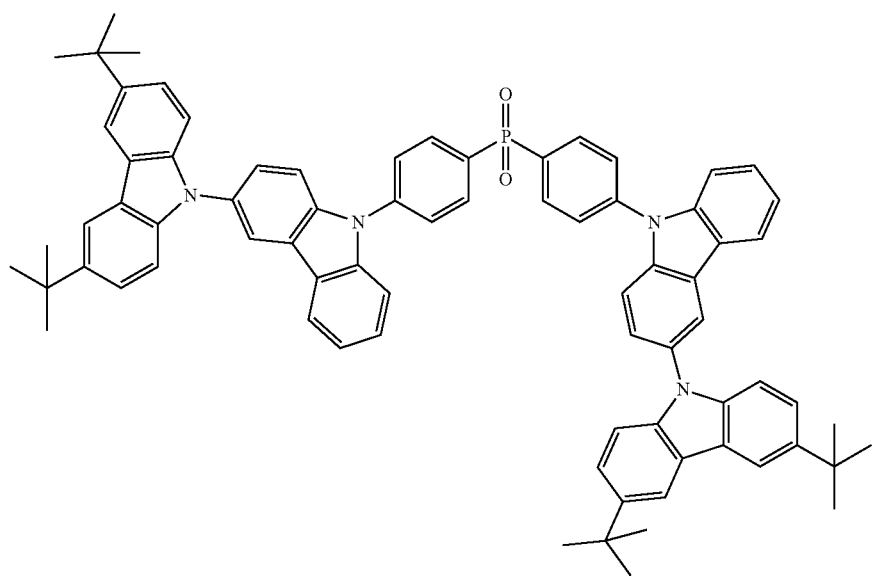
ZHSO2
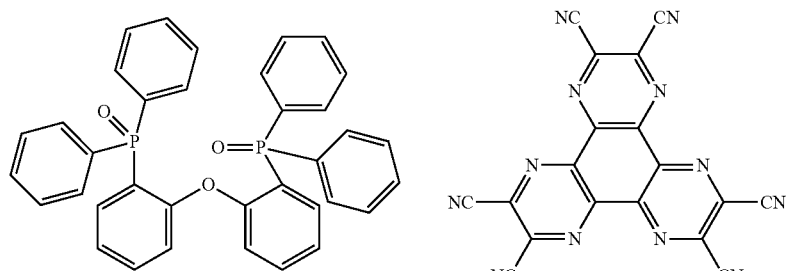
DPEPO                HATCN -continued

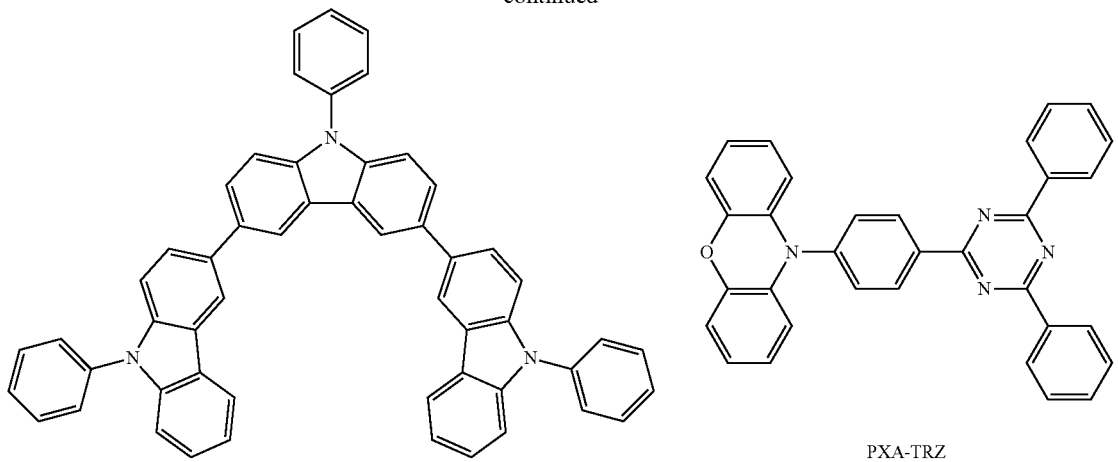

TrisPCz

PXA-TRZ

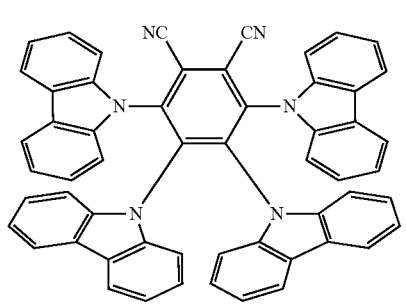

4CzPN

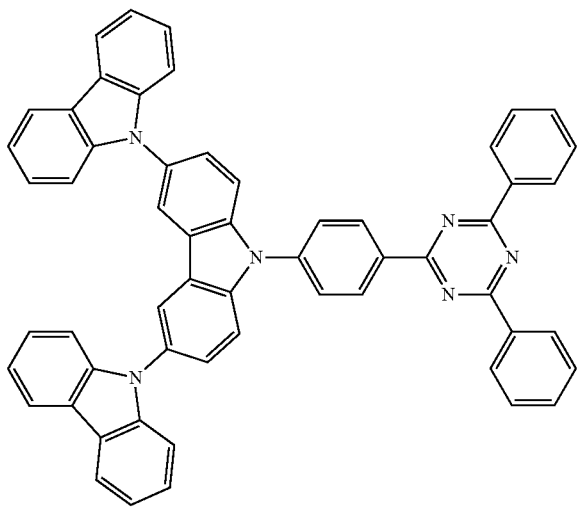

SHT02

INDUSTRIAL APPLICABILITY

The organic electroluminescent device of the invention is designed in such a manner that in the light emitted from the plural light emitting materials contained in the device, the light that has the shortest wavelength contains delayed fluorescent light. According to the design, the color tone of the device is improved through the enhancement of the light emission efficiency of light having a relatively short wavelength, such as blue light. The organic electroluminescent device of the invention has a large degree of freedom in design to achieve a simple structure, and thereby the intended multiple wavelength light emitting organic electroluminescent device may be produced. Therefore, the invention has high industrial applicability.

REFERENCE SIGNS LIST 1 substrate
2 anode
3 hole injection layer
4 hole transporting layer
5 light emitting layer
6 electron transporting layer
7 electron injection layer
8 cathode

The invention claimed is:

1. An organic electroluminescent device containing a cathode, an anode, and one or more organic layers that include at least one light emitting layer containing plural light emitting materials between the cathode and the anode, provided that when two or more light emitting layers exist, they are laminated to each other, wherein the organic electroluminescent device is a multiple wavelength light emitting organic electroluminescent device emitting light from the plural light emitting materials, which satisfies the following A, B and C:

A. all light emitting materials contained in the layers between the cathode and anode are fluorescent materials, B. in the light thus emitted from the light emitting materials, light that has the shortest wavelength contains delayed fluorescent light, and C. the light emitting material that emits light having the shortest wavelength also functions as a host material of another light emitting material; or one of the organic layers consists of only the material that emits light having the shortest wavelength.

2. The organic electroluminescent device according to claim 1, wherein the light emitting material that emits light having the shortest wavelength has an energy difference ($\Delta E_{ST}$) between the lowest excitation triplet energy level and the lowest excitation singlet energy level at 5 L of 0.3 eV or less.

3. The organic electroluminescent device according to claim 1, wherein the light emitting material that emits light having the shortest wavelength is a blue light emitting material.

4. The organic electroluminescent device according to claim 1, wherein the light emitting material that emits light having the shortest wavelength has a light emission intensity of more than 20% based on the total light emission.

5. The organic electroluminescent device according to claim 1, wherein one of the organic layers contains the light emitting material that emits light having the shortest wavelength and at least one kind of a light emitting material that emits light having a different wavelength, and the light emitting material that emits light having the shortest wavelength also functions as a host material.

6. The organic electroluminescent device according to claim 1, wherein one of the organic layers contains the light emitting material that emits light having the shortest wavelength and at least two kinds of light emitting materials that each emit light having a different wavelength, and the light emitting material that emits light having the shortest wavelength also functions as a host material.

7. The organic electroluminescent device according to claim 1, wherein one of the organic layers consists of only the material that emits light having the shortest wavelength.

8. The organic electroluminescent device according to claim 1, wherein the organic electroluminescent device contains two or more layers each containing a light emitting material, and among the layers, a layer that is the closest to the cathode and a layer that is the closest to the anode each contain the light emitting material that emits light having the shortest wavelength.

9. The organic electroluminescent device according to claim 8, wherein the organic electroluminescent device contains a layer that contains the light emitting material that emits light having the shortest wavelength as a host material between the layer that is the closest to the cathode and the layer that is the closest to the anode.

10. The organic electroluminescent device according to claim 1, wherein the organic electroluminescent device contains a layer containing a blue light emitting material doped with a green light emitting material or a red light emitting material.

11. The organic electroluminescent device according to claim 1, wherein the organic electroluminescent device contains a laminate of a layer containing a blue light emitting material, a layer containing a blue light emitting material doped with a green light emitting material or a red light emitting material, and a layer containing a blue light emitting material.

12. The organic electroluminescent device according to claim 1, wherein the plural light emitting materials contain a blue light emitting material, a green light emitting material, and a red light emitting material.

13. The organic electroluminescent device according to claim 1, wherein the organic electroluminescent device contains a layer containing a blue light emitting material doped with a green light emitting material and a red light emitting material.

14. The organic electroluminescent device according to claim 1, wherein the organic electroluminescent device contains a laminate of a layer containing a green light emitting material, a layer containing a green light emitting material doped with a red light emitting material, and a layer containing a blue light emitting material.

15. The organic electroluminescent device according to claim 1, wherein all the plural light emitting materials emit delayed fluorescent light.

16. The organic electroluminescent device according to claim 1, wherein the organic electroluminescent device emits white light through color mixing of light emitted from the plural light emitting materials.

17. The organic electroluminescent device according to claim 1, wherein the light emitting material that emits light having the shortest wavelength also functions as a host material of another light emitting material; or one of the organic layers consists of only the material that emits light having the shortest wavelength and among the layers containing a light emitting material, a layer that is the closest to the anode is a layer containing the light emitting material that emits light having the shortest wavelength.

* * * * *